United States Patent
Dai et al.

(10) Patent No.: US 12,463,664 B2
(45) Date of Patent: Nov. 4, 2025

(54) POLAR CODE RATE MATCHING METHOD AND APPARATUS FOR SATELLITE COMMUNICATION AND TERRESTRIAL COMMUNICATION

(71) Applicant: HUAWEI TECHNOLOGIES CO., LTD., Guangdong (CN)

(72) Inventors: Shengchen Dai, Hangzhou (CN); Rong Li, Hangzhou (CN); Jiajie Tong, Hangzhou (CN); Huazi Zhang, Hangzhou (CN); Xianbin Wang, Hangzhou (CN); Jun Wang, Hangzhou (CN); Wei Huang, Shanghai (CN); Yourui Huangfu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 75 days.

(21) Appl. No.: 18/065,479

(22) Filed: Dec. 13, 2022

(65) Prior Publication Data

US 2023/0113448 A1 Apr. 13, 2023

Related U.S. Application Data

(63) Continuation of application No. PCT/CN2021/099903, filed on Jun. 12, 2021.

(30) Foreign Application Priority Data

Jun. 17, 2020 (CN) .......................... 202010554330.0

(51) Int. Cl.
*H03M 13/13* (2006.01)
*H03M 13/00* (2006.01)
*H03M 13/27* (2006.01)

(52) U.S. Cl.
CPC ........... *H03M 13/13* (2013.01); *H03M 13/27* (2013.01); *H03M 13/6362* (2013.01)

(58) Field of Classification Search
CPC ... H03M 13/13; H03M 13/27; H03M 13/6362
See application file for complete search history.

(56) References Cited

U.S. PATENT DOCUMENTS

| 10,637,609 B2 * | 4/2020 | Xu ..................... H03M 13/6356 |
| 10,673,466 B2 * | 6/2020 | Chen ................. H03M 13/3944 |

(Continued)

FOREIGN PATENT DOCUMENTS

| CN | 108288969 A | 7/2018 |
| CN | 108574562 A | 9/2018 |

(Continued)

OTHER PUBLICATIONS

International Search Report and Written Opinion in International Appln. No. PCT/CN2021/099903, mailed on Sep. 13, 2021, 18 pages (with English translation).

(Continued)

*Primary Examiner* — Justin R Knapp
(74) *Attorney, Agent, or Firm* — Fish & Richardson P.C.

(57) ABSTRACT

The present disclosure relates to polar code rate matching methods, apparatuses, and mediums. One example method includes obtaining K to-be-coded bits and a mother code length N, where $N=2^n$, performing polar code encoding on the K to-be-coded bits based on the mother code length N to obtain an encoded bit sequence, performing rate matching on the polar-encoded bit sequence based on a rate matching sequence to obtain a rate matched sequence with a length of M, and outputting the rate matched sequence.

17 Claims, 5 Drawing Sheets

(56) References Cited

U.S. PATENT DOCUMENTS

| | | | |
|---|---|---|---|
| 10,938,422 B2* | 3/2021 | Chen .................... | H03M 13/13 |
| 10,938,506 B2* | 3/2021 | Zhang ................... | H03M 13/13 |
| 11,005,504 B2* | 5/2021 | Chen .................... | H04L 1/0045 |
| 11,750,217 B2* | 9/2023 | Qiao .................... | H04L 1/0057 |
| | | | 714/758 |
| 2023/0113448 A1* | 4/2023 | Dai ................... | H03M 13/6362 |
| | | | 714/746 |
| 2023/0123058 A1* | 4/2023 | Dai ................... | H03M 13/6368 |
| | | | 370/316 |

FOREIGN PATENT DOCUMENTS

| | | |
|---|---|---|
| CN | 108631916 A | 10/2018 |
| CN | 108809486 A | 11/2018 |
| CN | 109391353 A | 2/2019 |
| CN | 110198200 A | 9/2019 |
| CN | 111200476 A | 5/2020 |

OTHER PUBLICATIONS

Samsung, "Design of Unified Rate-Matching for Polar Codes," 3GPP TSG RAN WG1 NR Ad-Hoc#2, R1-1710750, Qingdao, P.R. China, Jun. 27-30, 2017, 6 pages.

Extended European Search Report in European Appln. No. 21826123. 8, mailed on Sep. 19, 2023, 14 pages.

* cited by examiner

POLAR CODE RATE MATCHING METHOD AND APPARATUS FOR SATELLITE COMMUNICATION AND TERRESTRIAL COMMUNICATION

CROSS-REFERENCE TO RELATED APPLICATIONS

This application is a continuation of International Patent Application No. PCT/CN2021/099903, filed on Jun. 12, 2021, which claims priority to Chinese Patent Application No. 202010554330.0, filed on Jun. 17, 2020. The disclosures of the aforementioned applications are hereby incorporated by reference in their entireties.

TECHNICAL FIELD

Embodiments of this application relate to the field of communication technologies, and in particular, to a polar code rate matching method and apparatus.

BACKGROUND

As a most basic radio access technology, channel encoding plays a crucial role in ensuring reliable transmission of data. In an existing wireless communication system, turbo codes, low density parity check (LDPC) codes, and polar codes are usually used for channel encoding. The turbo codes cannot support information transmission at an excessively low or excessively high encoding rate. In addition, for transmission of medium and short packets, it is quite difficult for the turbo codes and the LDPC codes to achieve ideal performance under a limited code length due to their own encoding and decoding characteristics. In terms of implementation, the turbo codes and the LDPC codes have high computational complexity in implementation processes of encoding and decoding. It is theoretically proven that the polar codes can achieve a Shannon capacity, and the polar codes have relatively simple encoding and decoding complexity. Therefore, the polar codes are good codes and are increasingly widely applied. In a 5th generation (5G) communication system, the polar codes are determined as an encoding scheme of control channels.

However, in satellite communication, it is not clear which channel encoding scheme is used. If the polar codes are to be introduced to a satellite communication system, what kind of design needs to be carried out to meet a requirement becomes a problem that needs to be resolved.

SUMMARY

Embodiments of this application provide a rate matching method in polar code encoding and apparatus applied to satellite communication, having an advantage of being simple to implement.

Specific technical solutions provided in embodiments of this application are as follows.

According to a first aspect, a polar code encoding rate matching method is provided, including
obtaining K to-be-encoded bits, a target code length M, and a mother code length N, where $N=2^n$ and M, K, n, and N are positive integers;
performing polar code encoding on the K to-be-encoded bits based on the mother code length N, to obtain an encoded bit sequence;
performing rate matching on the encoded bit sequence based on a rate matching sequence, to obtain a rate matched sequence; and
outputting the rate matched sequence.

This design is in line with characteristics of satellite communication, and a nesting characteristic of the rate matching sequence also provides a plurality of possible manners for specific implementation, thereby being easy to implement, simplifying a rate matching operation, and reducing difficulty of implementation.

In a possible design, the rate matching sequence is a subsequence of a first sequence, and the first sequence is a sequence 1, a sequence 2, or a sequence 3 in appendix I, where the sequence 1 includes $N_2$ polarized sub-channel sequence numbers, the sequence 2 includes $N_2/2$ polarized sub-channel sequence numbers, the sequence 3 includes $N_2$ different values, the polarized sub-channel sequence number starts from 0, and $N_2$ is greater than or equal to N.

In a possible design, when N=8192, the rate matching sequence is a sequence 1a, a sequence 2a, or a sequence 3a in the specification; or
when N=4096, the rate matching sequence is a sequence 1b, a sequence 2b, or a sequence 3b in the specification; or
when N=2048, the rate matching sequence is a sequence 1c, a sequence 2c, or a sequence 3c in the specification; or
when N=1024, the rate matching sequence is a sequence 1d, a sequence 2d, or a sequence 3d in the specification; or
when N=512, the rate matching sequence is a sequence 1e, a sequence 2e, or a sequence 3e in the specification, where
the sequence 1a, the sequence 1b, the sequence 1c, the sequence 1d, and the sequence 1e are subsequences of the sequence 1;
the sequence 2a, the sequence 2b, the sequence 2c, the sequence 2d, and the sequence 2e are subsequences of the sequence 2; and
the sequence 3a, the sequence 3b, the sequence 3c, the sequence 3d, and the sequence 3e are subsequences of the sequence 3.

In a possible design, a rate matching manner is a puncturing operation, where
if the first sequence is the sequence 1, the puncturing operation is as follows: taking, based on the target code length M, bits carried by sub-channels corresponding to last M polarized sub-channel sequence numbers in the rate matching sequence, or deleting, based on the target code length M, bits carried by sub-channels corresponding to first N-M polarized sub-channel sequence numbers in the rate matching sequence; or
if the first sequence is the sequence 2, the puncturing operation is as follows: deleting, based on the target code length M, bits carried by sub-channels corresponding to first N-M polarized sub-channel sequence numbers in the rate matching sequence; or
if the first sequence is the sequence 3, the puncturing operation is as follows: deleting, based on the target code length M, bits carried by polarized sub-channels at which N-M smallest values in the rate matching sequence are located, or taking, based on the target code length M, bits carried by polarized sub-channels corresponding to M largest values in the rate matching sequence.

In a possible design, the performing polar code encoding on the K to-be-encoded bits based on the mother code length N is as follows: mapping the K to-be-encoded bits to K polarized sub-channels with high reliability in M-P non-punctured polarized sub-channels, so that reliability of the polarized sub-channels on which the K to-be-encoded bits are located is higher than reliability of remaining M-P-K polarized sub-channels, where P represents a quantity of pre-frozen polarized sub-channels, and P is greater than or equal to 0.

In a possible design, before the performing rate matching on the encoded bit sequence based on a rate matching sequence, to obtain a rate matched sequence, interleaving is performed on the encoded bit sequence.

In a possible design, the K to-be-encoded bits include cyclic redundancy check bits.

In a possible design, the K to-be-encoded bits include parity check bits.

In a possible design, the rate matching method is performed by a network device or a terminal.

According to a second aspect, a polar code rate matching apparatus is provided. The apparatus has a function of implementing the method according to any one of the first aspect and the possible designs of the first aspect. The function may be implemented by hardware, or may be implemented by hardware executing corresponding software. The hardware or the software includes one or more modules corresponding to the foregoing function.

In a possible design, when some or all of the function is implemented by hardware, the polar code rate matching apparatus includes: an input interface circuit, configured to obtain to-be-encoded bits; a logic circuit, configured to perform behaviors described in any one of the first aspect and the possible designs of the first aspect; and an output interface circuit, configured to output a rate matched sequence.

Optionally, the polar code rate matching apparatus may be a chip or an integrated circuit.

In a possible design, when some or all of the function is implemented by software, the polar code rate matching apparatus includes: a memory, configured to store a program; and a processor, configured to execute the program stored in the memory. When the program is executed, the polar code rate matching apparatus can implement the method according to any one of the first aspect and the possible designs of the first aspect.

Optionally, the memory may be a physically independent unit, or may be integrated with the processor.

In a possible design, when some or all of the function is implemented by software, the polar code rate matching apparatus includes a processor. A memory configured to store a program is located outside the rate matching apparatus. The processor is connected to the memory by a circuit/an electric wire, and configured to read and execute the program stored in the memory.

In a possible design, the apparatus is a network device or a terminal.

According to a third aspect, a communication system is provided. The communication system includes a network device and a terminal. The network device or the terminal may perform the method according to the first aspect and the possible designs of the first aspect.

According to a fourth aspect, a computer storage medium is provided. The computer storage medium stores a computer program. The computer program includes instructions used to execute the method according to any one of the first aspect and the possible designs of the first aspect.

According to a fifth aspect, an embodiment of this application provides a computer program product including instructions. When the computer program product is run on a computer, the computer is enabled to perform the methods according to the foregoing aspects.

According to a sixth aspect, a wireless device is provided, including a transceiver and a rate matching apparatus that is configured to implement any one of the first aspect and the possible designs of the first aspect, where
the transceiver is configured to receive or transmit a signal.

In a possible design, the wireless device is a terminal or a network device.

DESCRIPTION OF EMBODIMENTS

Figure 1:
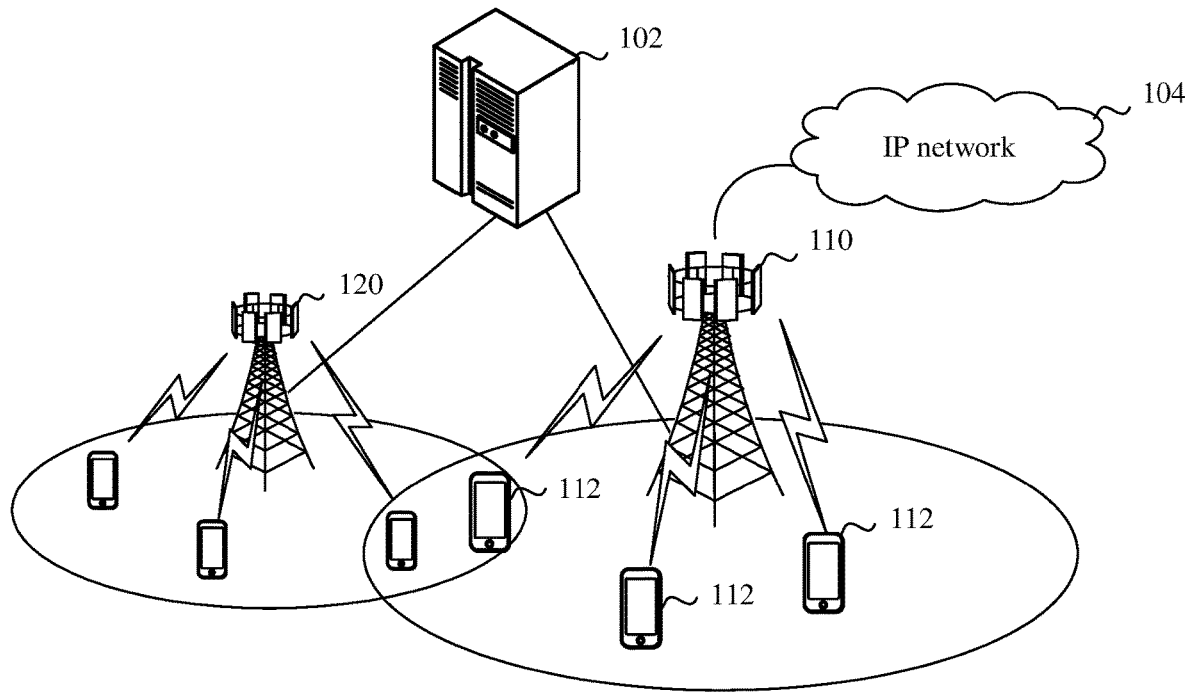
FIG. 1 is a schematic diagram of an architecture of an applied communication system according to an embodiment of this application.

The following describes in detail embodiments of this application with reference to accompanying drawings.

If a polar code encoding scheme in an existing 5G standard is directly applied to satellite communication without considering characteristics of satellite communication, there will be at least the following problems: (1) In the current 5G standard, polar codes are used only for control channels, and therefore, may not be fully applicable to data channels; and (2) in the current 5G standard, a maximum mother code length of the polar codes is 1024, and therefore, a data packet length that can be supported is limited. Therefore, it is necessary to redesign the polar code encoding scheme, to be more adaptable to satellite communication and also applicable to terrestrial communication.

Embodiments of this application provide a polar code rate matching method and apparatus. Based on reliability of polarized sub-channels, reliability rankings are computed online, or stored in advance. Sequence numbers of polarized sub-channels used to transmit information bits are selected based on the reliability rankings, polar code encoding is performed based on selected information bit sequence numbers, a rate matching operation is then performed on an encoded sequence based on a rate matching sequence, and a rate matched sequence is output. Embodiments of this application are more applicable to satellite communication, especially a messaging service in satellite communication. The following describes in detail the rate matching method and apparatus provided in embodiments of the present invention with reference to the accompanying drawings.

For ease of understanding of embodiments of this application, the following briefly describes the polar codes.

An encoding policy of the polar codes is as follows: using a noiseless channel to transmit useful information of a user, and using a pure noisy channel to transmit agreed information or not transmitting information on a pure noisy channel. The polar code is also a linear block code. An encoding matrix of the polar code is $G_N$, and an encoding process of the polar code is $x_1^N = u_1^N G_N$, where $u_1^N = (u_1, u_2, \ldots, u_N)$ is a binary row vector with a length of N (that is, a code length; and it can be learned that lengths of a pre-encoding sequence x and a post-encoding sequence u are both N, and n is also referred to as a mother code length), $G_N$ is an N×N matrix, and $G_N = F_2^{\otimes(log_2(N))}$. $F_2^{\otimes(log_2(N))}$ is defined as a Kronecker product of $log_2 N$ matrices $F_2$. The matrix $$F_2 = \begin{bmatrix} 1 & 0 \\ 1 & 1 \end{bmatrix}.$$

In the encoding process of the polar code, some bits in $u_1^N$ are used to carry information and referred to as an information bit set. A set of indices of these bits is denoted as A. Other bits in $u_1^N$ are set to fixed values agreed on in advance between a receive end and a transmit end, and referred to as a frozen bit set. A set of indices of the frozen bits is represented by a complementary set $A^c$ of A. The encoding process of the polar code is equivalent to $x_1^N = u_A G_N(A) \oplus u_{A^c} G_N \cdot (A^c)$. Herein, $G_N(A)$ is a submatrix that is obtained from those rows corresponding to the indices in the set A and that is in $G_N$. $G_N(A^C)$ is a submatrix that is obtained from those rows corresponding to the indices in the set $A^c$ and that is in $G_N$. $u_A$ is the information bit set in $u_1^N$ and includes K bits. Generally, various categories of check bits including but not limited to cyclic redundancy check (CRC) bits and parity check (PC) bits may all be included in the information bit set. $u_{A^c}$ is the frozen bit set in $u_1^N$ and includes (N-K) bits, which are known bits. These frozen bits are usually set to 0, but the frozen bits may be arbitrarily set, provided that the receive end and the transmit end agree in advance. Therefore, an encoding output of the polar code may be simplified as $x_1^N = u_A G_N(A)$. Herein, $u_A$ is the information bit set in $u_1^N$, and $u_A$ is a row vector with a length of K, that is, |A|=K. |•| represents a quantity of elements in the set, and K is an information block size. $G_N(A)$ is the submatrix that is obtained from those rows corresponding to the indices in the set A and that is in the matrix $G_N$. $G_N(A)$ is a K×N matrix.

After the mother code length N is determined, a construction process of the polar code is a selection process of the set A and determines performance of the polar code. The construction process of the polar code is usually as follows: determining, based on the mother code length N, that there are N polarized sub-channels in total, which respectively correspond to N rows in the encoding matrix; and when rate matching is not considered, using indices of first K polarized sub-channels with high reliability as elements of the set A, and using indices corresponding to remaining N-K polarized sub-channels as elements of the frozen bit index set $A^c$. The set A determines positions of the information bits, and the set $A^c$ determines positions of the frozen bits. Sequence numbers of polarized sub-channels are position indices of information bits or frozen bits and are also position indices in $u_1^N$.

When rate matching is considered, mainly when puncturing or shortening is considered, N-M polarized sub-channels that need to be punctured or shortened (that is, deleted) are usually determined first, where M is a target code length, that is, a length of a rate matched bit sequence. The N-M polarized sub-channels selected herein are used for placing frozen bits. In a 5G NR standard, for puncturing, some polarized sub-channels that are referred to as pre-frozen polarized sub-channels are additionally determined, and are also used for placing frozen bits. Herein, a quantity of the pre-frozen polarized sub-channels may be defined as P, where P is greater than or equal to 0 (for shortening, P is obviously 0 and may not need to be considered in this case). Then, based on reliability, K polarized sub-channels with high reliability are selected from remaining M-P polarized sub-channels for placing K information bits. Certainly, M-P-K sub-channels with low reliability may be alternatively selected first for placing the frozen bits, and the remaining K sub-channels are used for placing the information bits. Reliability of any one of the K polarized sub-channels used for placing the K information bits is higher than reliability of any one of the M-P-K sub-channels used for placing the frozen bits. In this application, a value of P is not limited. Even for puncturing, P may be 0, and even for shortening, P may be greater than 0. This does not affect implementation of technical solutions in this application. Regardless of an encoding end or a decoding end, principles of determining K sub-channels used for placing K information bits are consistent, and methods for determining K sub-channels used for placing K information bits are also consistent. In addition, in the 5G NR standard, the N-M polarized sub-channels are selected as follows: placing a subblock interleaved (divided into 32 subblocks) sequence into a circular buffer (which is equivalent to a rate matching sequence); and for puncturing, starting reading from an $(N-M)^{th}$ position in the circular buffer and discarding bits that are in a $0^{th}$ position to an $(N-M-1)^{th}$ position, or for shortening, starting reading from a $0^{th}$ position until an $(M-1)^{th}$ position in the circular buffer and discarding bits that are in a $M^{th}$ position to an $(N-1)^{th}$ position. In this manner, a relationship between rate matching sequences corresponding to different mother code lengths is not considered.

It should be noted that the relative relation of reliability described herein is based on a given manner for calculating reliability. Different manners for calculating reliability may result in a change in relative relations of reliability of polarized sub-channels, but methods for selecting polarized sub-channels used for placing information bits are the same. When the 5G NR standard is not applied, it may be alternatively considered that information bits are placed on last punctured or shortened polarized sub-channels. In this application, polarized sub-channels used for placing information bits are not limited to being selected according to the 5G NR standard.

In current satellite communication, for example, in a BeiDou satellite communication system, there is a short message communication mode. A short packet may be considered as a "short message" commonly used nowadays, but is different from the "short message", in that in addition to display of such published information itself, not only a publisher of the short packet can be located, but also a location of the publisher can be displayed. However, a current BeiDou second-generation short message system uses turbo codes. Therefore, polar codes may be used to improve performance and reduce complexity. Before transmitting information bits to a terrestrial central station, the BeiDou short message system segments the information. After the segmentation, an information bit length of each segment is 89 to 994 (including CRC bits), and a used encoding rate is ½. If a consumer terminal wants to access the short message system subsequently, a lower encoding rate needs to be used, for example, ⅛.

In embodiments of this application, a manner of providing a rate matching sequence in advance is used, and rate matching sequences corresponding to different mother code lengths also meet a nesting relationship. In this way, an operation procedure can be simplified, and processing efficiency can be improved. The nesting characteristic is similar to reliability ranking sequences corresponding to different mother code lengths in the 5G NR standard. To be specific, when a mother code length na is less than or equal to a mother code length nb, relative relations of reliability of polarized sub-channels (polarized sub-channels 0, . . . , and Na−1) in a reliability sequence corresponding to na are consistent with relative relations of reliability of these polarized sub-channels (the polarized sub-channels 0, . . . , and Na−1) in a reliability sequence corresponding to nb. In other words, from the reliability sequence corresponding to nb, the reliability sequence corresponding to na can be obtained by retaining only polarized sub-channel sequence numbers less than na and not changing relative relations between positions of the Na polarized sub-channel sequence numbers. Therefore, in specific implementation, reliability sequences corresponding to different mother code lengths may all be stored in advance; or only a reliability sequence corresponding to a maximum mother code length $N_{max}$ may be stored in advance, and then a reliability sequence corresponding to another mother code length na is obtained from the reliability sequence corresponding to the maximum mother code length by retaining only polarized sub-channel sequence numbers less than $N_{max}$. In this way, on the one hand, some storage overheads can be saved, and on the other hand, it is also easy to implement, with no need to consider operations such as subblock interleaving. Particularly, a maximum na may alternatively be equal to $N_{max}$.

Similarly, when a mother code length na is less than or equal to a mother code length nb, relative relations of rate matching (puncturing or shortening) sequences of polarized sub-channels (polarized sub-channels 0, . . . , and Na−1) in a rate matching sequence corresponding to na are consistent with relative relations of rate matching sequences of these polarized sub-channels (the polarized sub-channels 0, . . . , and Na−1) in a rate matching sequence corresponding to nb. In other words, from the rate matching sequence corresponding to Nb, the rate matching sequence corresponding to Na can be obtained by retaining only polarized sub-channel sequence numbers less than Na and not changing relative relations between positions of the Na polarized sub-channel sequence numbers. Therefore, in specific implementation, rate matching sequences corresponding to different mother code lengths may all be stored in advance; or only a rate matching sequence corresponding to a maximum mother code length $N_{max}$ may be stored in advance, and then a rate matching sequence corresponding to another mother code length Na is obtained from the rate matching sequence corresponding to the maximum mother code length by retaining only polarized sub-channel sequence numbers less than $N_{max}$. Particularly, a maximum Na may alternatively be equal to $N_{max}$.

FIG. 1 is a schematic diagram of a structure of a wireless communication network according to an embodiment of the present invention. FIG. 1 is merely an example. Other wireless networks that can use the rate matching method or apparatus in embodiments of the present invention also all fall within the protection scope of the present invention.

As shown in FIG. 1, the wireless communication network 100 includes a network device 110 and terminals 112. When the wireless communication network 100 includes a core network 102, the network device 110 may be further connected to the core network 102. The network device 110 may further communicate with an IP network 104, for example, an internet, a private IP network, or another data network. A network device provides service for a terminal within its coverage area. For example, as shown in FIG. 1, the network device 110 provides wireless access for one or more terminals 112 within a coverage area of the network device 110. Besides, coverage areas of network devices may overlap, for example, the network device 110 and a network device 120. Network devices may further communicate with each other. For example, the network device 110 may communicate with the network device 120.

The network device may be a device configured to communicate with a terminal device. For example, the network device may be an evolved NodeB (eNB, or eNodeB) in an LTE system, a gNB in a 5G network, a satellite in satellite communication, a network side device in a future communication system, or the like. Alternatively, the network device may be a relay station, an access point, a vehicle-mounted device, or the like. In a device to device (D2D) communication system, a machine to machine (M2M) communication system, and an internet of vehicles system, the network device may alternatively be a terminal functioning as a base station.

The terminal may be user equipment (UE), an access terminal, a subscriber unit, a mobile station, a remote station, a remote terminal, a mobile device, a user terminal, a wireless communication device, a user agent, or a user apparatus. The access terminal may be a cellular phone, a cordless phone, a session initiation protocol (SIP) phone, a wireless local loop (WLL) station, a personal digital assistant (PDA), a handheld device or computing device with a wireless communication function, another processing device, vehicle-mounted device, or wearable device connected to a wireless modem, a terminal device in a future communication network, or the like.

Based on an architecture of the communication system shown in FIG. 1, in this embodiment of this application, a polar code rate matching method may be performed by the foregoing network device or terminal. When transmitting data or information as a transmit end, either the network device or the terminal can use the polar code rate matching method. Correspondingly, when receiving data or information as a receive end, the network device or terminal also needs to first determine a rate matching sequence according to the method described in the present invention. The following describes in detail the polar code rate matching method provided in this embodiment of this application.

Figure 2:
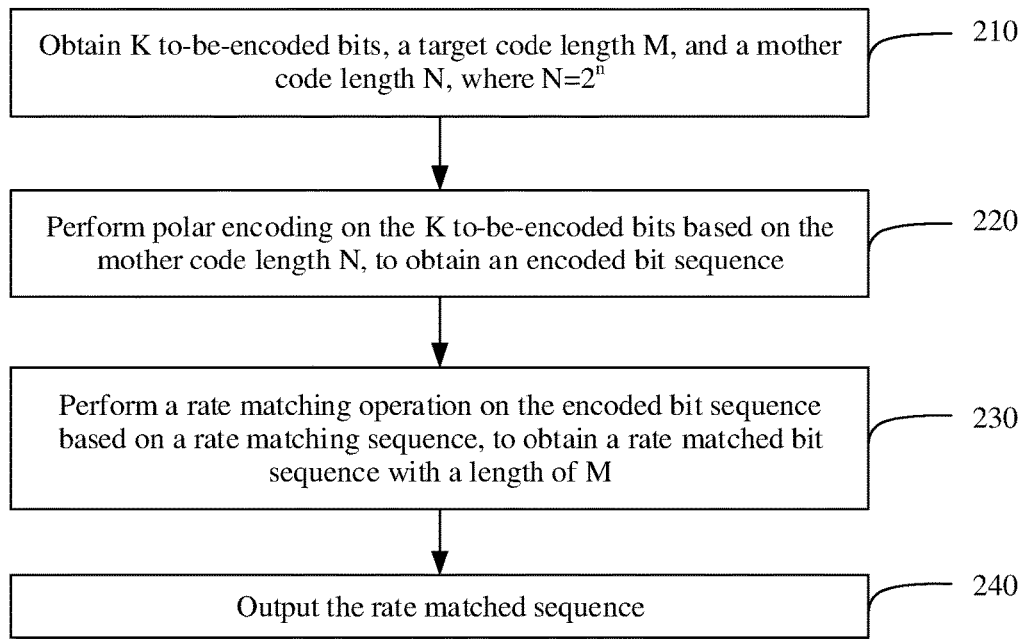
FIG. 2 is a schematic flowchart of a polar code rate matching method according to an embodiment of this application.

Based on the architecture of the communication system shown in FIG. 1, as shown in FIG. 2, a specific process of the polar code rate matching method provided in this embodiment of this application is described as follows.

Operation 210: Obtain K to-be-encoded bits, a target code length M, and a mother code length N, where $N=2^n$ and M, K, n, and N are positive integers.

In addition to payload bits, the K to-be-encoded bits herein may further include but are not limited to one or more categories of other various types of non-frozen bits such as CRC bits and PC bits.

For simplicity of the system, the rate matching manner is not repeated in the present invention. Therefore, the mother code length N may be obtained based on the target code length: $N=2^{\text{ceil}(\log_2(M))}$, that is, $n=\text{ceil}(\log_2(M))$. The ceil operation herein is a round-up operation. It can be learned that N is a number that is not less than M and is a minimum integer power of 2.

In addition, if a fixed encoding rate is used, the target code length M can be obtained through conversion when the K to-be-encoded bits are obtained, or a quantity of to-be-encoded bits that should be obtained can be learned of after the target code length M is obtained. For example, if a fixed encoding rate ⅛ is used, M=8K, or K=M/8. The fixed encoding rate may alternatively be a common encoding rate such as ½, ⅓, or ¼. In this manner, complexity of implementation can be further reduced. If a variable encoding rate is used, a receive end and a transmit end need to be notified in a manner such as using signaling, to ensure consistency. An advantage of this manner is that resources can be used more flexibly. In specific application, it may be specified in advance by using a standard protocol or a dedicated protocol.

Operation 220: Perform polar code encoding on the K to-be-encoded bits based on the mother code length N, to obtain an encoded bit sequence.

For a specific encoding operation, refer to the foregoing description. If an operation similar to that in the 5G NR standard is followed, that is, polarized subchannels to be punctured or shortened are first determined, a rate matching sequence needs to be used in this step of operation to determine polarized sub-channels to be punctured or shortened (that is, deleted) and possible P pre-frozen polarized sub-channels (P is greater than or equal to 0), and then K polarized sub-channels with high reliability for placing the K information bits are selected from remaining M-P polarized sub-channels based on reliability. Positions of the K information bits are also determined in a same manner on a decoding side. To avoid repetition, the rate matching sequence is described in an operation 230. It should be noted that in a 5G NR system, whether a rate matching manner of puncturing or a rate matching manner of shortening is used needs to be determined at each rate matching. In this application, for simple implementation, puncturing or shortening may be fixed as the rate matching manner.

Optionally, the encoded bit sequence is further interleaved. This interleaving operation is slightly different from subblock interleaving in 5G NR. The encoded bit sequence does not need to be divided into 32 subblocks (or another quantity of subblocks). Instead, the encoded bit sequence is mapped to a circular buffer based on the rate matching sequence for a subsequent puncturing operation (certainly, a shortening operation is also similar).

Operation 230: Perform a rate matching operation on the encoded bit sequence based on the rate matching sequence, to obtain a rate matched bit sequence with a length of M.

For the puncturing operation, an example first sequence is provided in Appendix I. The first sequence is a sequence 1, a sequence 2, or a sequence 3. The sequence 1 includes $N_2$ polarized sub-channel sequence numbers. The sequence 2 includes $N_2/2$ polarized sub-channel sequence numbers. A minimum value of the polarized sub-channel sequence number is 0, and a maximum value of the polarized sub-channel sequence number is $N_2-1$. $N_2=8192$. $N_2$ is greater than or equal to N. Certainly, it may alternatively be that the minimum value of the polarized sub-channel sequence number is 1, and the maximum value of the polarized sub-channel sequence number is $N_2$. In this case, related polarized sub-channel sequence numbers all increase by 1 accordingly. The first sequence may alternatively be the sequence 3. The sequence 3 includes $N_2$ different values. A sequence number of a position at which each value is located is a polarized sub-channel sequence number. A value is a rate matching priority of a polarized sub-channel at which the value is located.

It should be noted that the sequences 1, 2, and 3 are substantially equivalent. For the puncturing operation, the sequence 2 is substantially a subsequence of the sequence 1, with a first half of the sequence 1 being directly taken; and a value of each element in the sequence 3 represents a puncturing priority of a position (that is, a polarized sub-channel) at which the element is located, with a smaller value indicating a higher puncturing priority. Based on the sequence 1 or the sequence 2, if the target code length is M, bits that need to be punctured (or deleted) are bits carried by polarized sub-channels corresponding to first N-M polarized sub-channel sequence numbers in the sequence 1 or the sequence 2. For the sequence 3, bits that need to be punctured are bits carried by polarized sub-channels at which N-M smallest values in the sequence 3 are located, or bits carried by polarized sub-channels at which M largest values are located are retained.

In a communication system, a maximum mother code length $N_{max}$ is usually defined. It is assumed that $N_{max}=8$, and the sequence 1 is [0, 4, 6, 2, 3, 1, 7, 5]. Accordingly, the sequence 2 is [0, 4, 6, 2], that is, a first half of the sequence 1, and the sequence 3 is [0, 5, 3, 4, 1, 7, 2, 6]. '5' in the sequence 1 represents a polarized sub-channel 5. The polarized sub-channel 5 has a puncturing priority of 7 and is a last one to be punctured, that is, corresponding to '7' in the sequence 3. To be specific, the puncturing priority of the polarized sub-channel 5 (a fifth element, counted from a $0^{th}$ element) in the sequence 3 is '7'. Assuming that M=6, in the sequence 1 or the sequence 2, bits to be punctured are bits carried by first two (N-M=2) polarized sub-channels (polarized sub-channels 0 and 4) in the sequence. That is, polarized sub-channels to be punctured are polarized sub-channels (the polarized sub-channels 0 and 4) at which values less than or equal to 2 (N-M=2) (that is, 0 and 1) are located. Based on a nesting characteristic, when N=4, a sequence corresponding to the sequence 1 is [0, 2, 3, 1], and a sequence corresponding to the sequence 2 is [0, 2]. Note that in the sequence 3, a value in the sequence 3 represents only a priority. Therefore, a value is not necessarily limited to a maximum polarized sub-channel sequence number. When different value taking methods are used, it is only necessary to confirm that ordinal relationships of priorities corresponding to different polarized sub-channels are consistent. Therefore, when N=4, for the sequence 3, a first half of the sequence that is for $N_{max}=8$ may be simply taken. To be specific, in this case, a sequence corresponding to the sequence 3 is [0, 5, 3, 4]. Although 5 in the sequence is already greater than N, the sequence obtained by using this value taking method is equivalent to a sequence 3 (that is, [0, 3, 1, 2]) derived from the sequence 1 (that is, [0, 2, 3, 1]) that is for N=4. That is, when the rate matching manner is puncturing, the two manners both indicate that a puncturing priority of a $0^{th}$ polarized sub-channel is 0 (that is, highest), a puncturing priority of a first polarized sub-channel is 3 (that is, lowest), a puncturing priority of a second polarized sub-channel is 1, and a puncturing priority of a third polarized sub-channel is 2. Similarly, when the rate matching manner is shortening, the two manners both indicate that a shortening priority of a $0^{th}$ polarized sub-channel is 0 (that is, highest), a shortening priority of a first polarized sub-channel is 3 (that is, lowest), a shortening priority of a second polarized sub-channel is 1, and a shortening priority of a third polarized sub-channel is 2. Therefore, on the one hand, a nesting manner of the sequence 3 may be similar to a nesting manner of the sequence 1. That is, values less than or equal to N are selected from a sequence that is for a mother code length greater than N. On the other hand, alternatively and more simply, values in first N positions in the sequence that is for a length greater than N may be taken. Actually, because the sequence 1, the sequence 2, and the sequence 3 all need to meet the nesting characteristic, the sequence 2 is the first half of the sequence 1, and the sequence 3 is a manner of expressing the sequence 1 by using puncturing priorities, not all sequences can meet such requirement. $N_{max}=8$ is still used as an example. If the sequence 1 is [0, 2, 4, 3, 6, 1, 7, 5], nesting of the sequence 2 when N=4 cannot be met. Therefore, when $N_2$ is large, design of nested rate matching sequences is quite difficult.

When the rate matching manner is shortening, for a sequence 1, a sequence same as the sequence 1 that is for the puncturing operation may be taken; for a sequence 3, a sequence same as the sequence 3 that is for the puncturing operation may be taken (therefore, the sequence 1 and the sequence 3 in Appendix I may be directly used); and for a sequence 2, a second half of the sequence 1 may be taken. They also all meet the nesting characteristic. A value of each element in the sequence 3 represents a shortening priority of a position (that is, a polarized sub-channel) at which the element is located, with a larger value indicating a higher shortening priority. Based on the sequence 1 or the sequence 2, if the target code length is M, bits that need to be shortened are bits carried by polarized sub-channels corresponding to last N-M polarized sub-channel sequence numbers in the sequence 1 or the sequence 2. For the sequence 3, bits that need to be shortened are bits carried by polarized sub-channels at which all values greater than or equal to M in the sequence 3 are located. If the foregoing sequence [0, 4, 6, 2, 3, 1, 7, 5] is still used as the sequence 1, a corresponding sequence 2 is [3, 1, 7, 5]. When a shortening operation is performed, bits that need to be shortened are bits carried by polarized sub-channels corresponding to last N-M polarized sub-channel sequence numbers in the sequence 1 or the sequence 2. For the sequence 3, bits that need to be shortened are bits carried by polarized sub-channels at which N-M largest values in the sequence 3 are located, or bits carried by polarized sub-channels at which M smallest values in the sequence 3 are located are retained. To avoid confusion, puncturing is used as an example in all other parts of this application, but an overall principle also applies to the shortening operation. Therefore, details are not described again.

In actual application, a rate matching sequence may be a subsequence of the first sequence. Note that in this application, a subsequence of a sequence may also include the sequence itself. In addition, that a sequence A is a subsequence of a sequence B means that all elements in the sequence A are taken from the sequence B, and a relative order of these elements is exactly consistent with their relative order in the sequence B. When N=8192, the rate matching sequence is 1a, 2a, or 3a. The sequence 1a is the same as the sequence 1, the sequence 2a is the same as the sequence 2, and the sequence 3a is the same as the sequence 3. Therefore, the sequences 1a, 2a, and 3a are no longer provided repeatedly. In Appendix I, the following rate matching sequences are further provided: rate matching sequences 1b, 2b, and 3b that are for a mother code length N of 4096 (a length of the sequence 2b is 2048); rate matching sequences 1c, 2c, and 3c that are for a mother code length N of 2048 (a length of the sequence 2c is 1024); rate matching sequences 1d, 2d, and 3d that are for a mother code length of 1024 (a length of the sequence 2d is 512); and rate matching sequences 1e, 2e, and 3e that are for a mother code length of 512 (a length of the sequence 2e is 256). The sequence 1a, the sequence 1b, the sequence 1c, the sequence 1d, and the sequence 1e are subsequences of the sequence 1, and all meet the nesting characteristic described above. The sequence 2a, the sequence 2b, the sequence 2c, the sequence 2d, and the sequence 2e are subsequences of the sequence 2, and also all meet the nesting characteristic described above. The sequence 3a, the sequence 3b, the sequence 3c, the sequence 3d, and the sequence 3e are subsequences of the sequence 3. The sequence 3b is a first half of the sequence 3a. The sequence 3c is a first half of the sequence 3b (that is, a first ¼ of the sequence 3a). The sequence 3d is a first half of the sequence 3c (that is, a first ⅛ of the sequence 3a). The sequence 3e is a first half of the sequence 3d (that is, a first 1/16 of the sequence 3a). Likewise, the sequence 3a, the sequence 3b, the sequence 3c, the sequence 3d, and the sequence 3e also all meet the nesting characteristic described above.

Generally, in a communication system, a maximum mother code length $N_{max}$ is defined. $N_{max}$ is usually less than or equal to $N_2$, that is, meeting $N<=N_{max}<=N_2$. A transmit end and a receive end may store only puncturing sequences (that is, rate matching sequences) corresponding to $N_{max}$, or may store puncturing sequences corresponding to different mother code lengths less than or equal to $N_{max}$, or may store puncturing sequences corresponding to $N_{max}$ and several commonly used different mother code lengths.

In addition to the example in Appendix I, another example of the first sequence is provided in Appendix II. Accordingly, there are two sets of possible rate matching sequences available. In actual application, one of the two sets may be used. Unless otherwise specified, Appendix I is used as an example in this application.

Operation 240: Output the rate matched sequence.

Note that if a modulation operation is considered, the sequence output herein should be a sequence obtained after the rate matched bit sequence is modulated. The sequence is a symbol sequence. In this case, a length of the sequence is not necessarily still M. If modulation is not considered, the rate matched sequence is the rate matched bit sequence. Because modulation itself is not a technology indispensable for implementing the solutions in embodiments of this application, the two terms "rate matched sequence" and "rate matched bit sequence" are not strictly distinguished in this application when understanding is not affected.

The embodiment shown in FIG. 2 above is operations performed at a transmit end. Operations performed at a receive end are also similar. After receiving a to-be-decoded information sequence, a receiver (or a receive apparatus) also needs to perform a similar method: obtaining a to-be-decoded information sequence including K to-be-decoded bits, a target code length M, and a mother code length N; determining a rate matching sequence; performing a rate dematching operation and a decoding and demodulation operation on the to-be-decoded information sequence; and obtaining and outputting a decoding result. Rate dematching is restoring punctured positions or shortened positions. For the punctured positions, a log-likelihood ratio (log-likelihood ratio, LLR) may be considered as 0 during decoding. For the shortened positions, the LLR may be considered infinite during decoding. A detailed decoding algorithm is not limited herein.

It should be noted that the first sequences in Appendix I and Appendix II are two examples. Application of the first sequences to a polar code encoding process helps improve encoding and decoding performance of polar codes. In the sequences in any example, adjustments or equivalent replacements including but not limited to the following aspects may be made, on a premise of not affecting an overall effect of the sequences:

1. Positions of a small quantity of elements in a sequence are interchanged. For example, a position of a sequence number may be adjusted within a specified amplitude. For example, if the specified amplitude is 5, a position of an element with a sequence number of 10 may be adjusted within five positions on the left and right.
2. Some elements in a sequence are adjusted, but sets of channels selected based on the sequence for transmitting T bits of information are consistent or similar.
3. A sequence includes N elements whose sequence numbers start from 0 and end at N−1. The N elements whose sequence numbers start from 0 and end at N−1 represent sequence numbers of N polarized sub-channels. Actually, the sequence numbers of the N polarized sub-channels may alternatively start from 1 and end at N. Sequence numbers in the foregoing sequences all increase by 1. This is also a sequence number form in the foregoing calculation manners. Certainly, sequence numbers or identifiers of the foregoing polarized sub-channels may be alternatively expressed in another manner. The specific expression manner does not affect specific positions of polarized sub-channels expressed in the sequence. Especially for the sequences 3b, 3c, 3d, and 3e, as described above, elements in the sequences may not all be in a range of 0 to N−1, but this does not affect a priority order of the polarized sub-channels.
4. The sequence numbers of the N polarized sub-channels in the foregoing sequences are arranged in ascending order of rate matching priorities of the N polarized sub-channels. Actually, the sequence numbers of the N polarized sub-channels may be alternatively arranged in descending order of the rate matching priorities of the N polarized sub-channels, that is, just arranging the elements in the foregoing sequences in reverse order.

Figure 3:
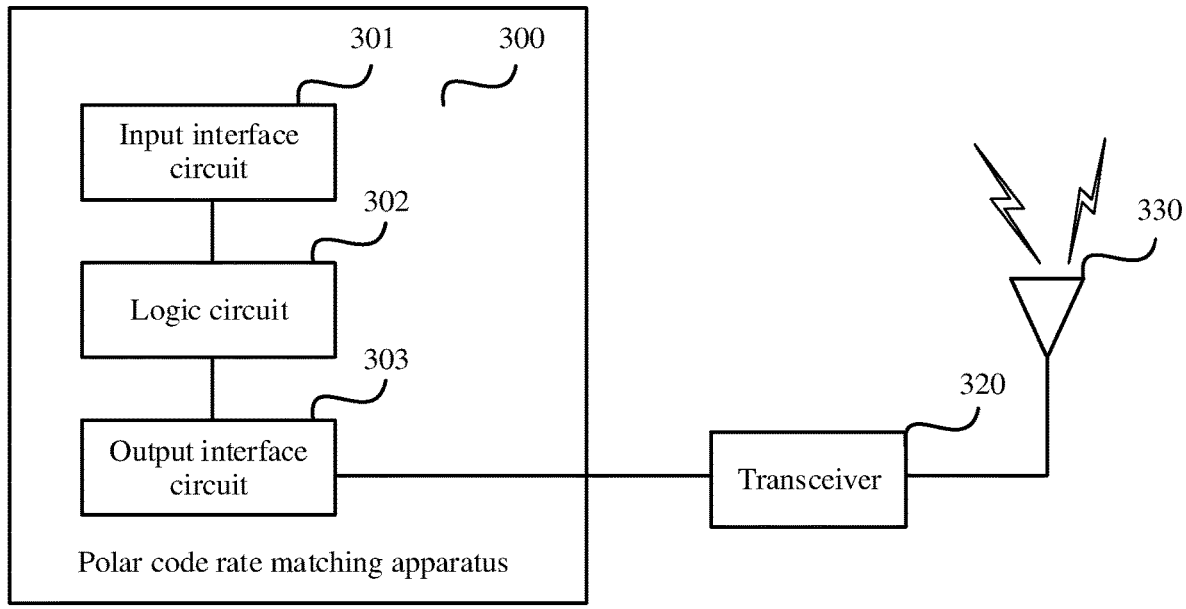
FIG. 3 is a first schematic diagram of a structure of a polar code rate matching apparatus according to an embodiment of this application.

As shown in FIG. 3, an embodiment of this application further provides a polar code rate matching apparatus 300. Some or all of the polar code rate matching method shown in FIG. 2 may be implemented by hardware or software.

For the polar code rate matching apparatus 300, based on an inventive concept same as that of the polar code rate matching method shown in FIG. 2, the polar code rate matching apparatus 300 is configured to perform the polar code rate matching method shown in FIG. 2. When some or all of the polar code rate matching method in the foregoing embodiment is implemented by hardware, the polar code rate matching apparatus 300 includes: an input interface circuit 301, configured to obtain to-be-encoded bits; a logic circuit 302, configured to perform the polar code rate matching method shown in FIG. 2 above, where for details, refer to a description in the foregoing method embodiment, and details are not described herein again; and an output interface circuit 303, configured to output a rate matched sequence. Further, the rate matched sequence may alternatively be a modulated sequence. The sequence is a sequence of modulated symbols, which are output to a transceiver 320. The transceiver 320 performs corresponding processing (including but not limited to processing such as digital-to-analog conversion and/or frequency conversion) on the modulated sequence and then sends out the sequence by using an antenna 330. Optionally, the polar code rate matching apparatus 300 may be a chip or an integrated circuit in specific implementation.

Figure 4:
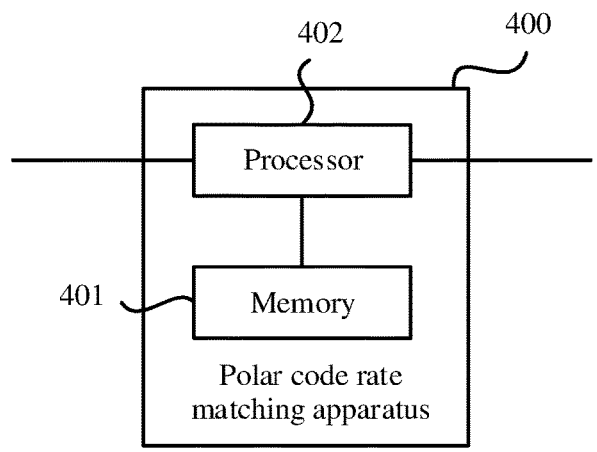
FIG. 4 is a second schematic diagram of a structure of a polar code rate matching apparatus according to an embodiment of this application.

Optionally, when some or all of the polar code rate matching method in the foregoing embodiment is implemented by software, as shown in FIG. 4, a polar code rate matching apparatus 400 includes: a memory 401, configured to store a program; and a processor 402, configured to execute the program stored in the memory 401. When the program is executed, the polar code rate matching apparatus 400 is enabled to implement the polar code rate matching method provided in the foregoing embodiment.

Figure 5:
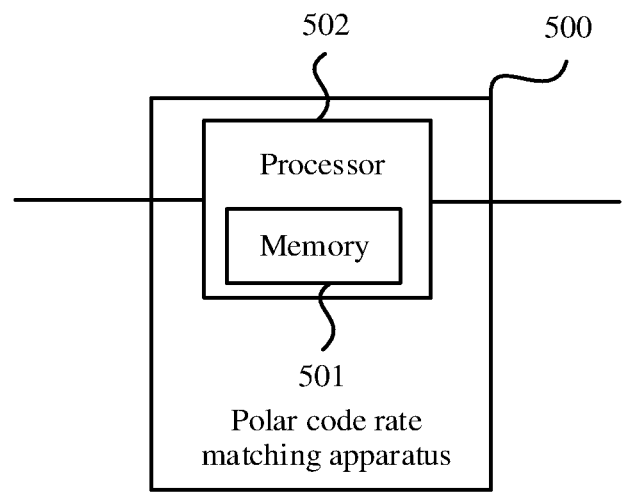
FIG. 5 is a third schematic diagram of a structure of a polar code rate matching apparatus according to an embodiment of this application.

Optionally, the memory 401 may be a physically independent unit. Alternatively, as shown in FIG. 5, a memory 501 may be integrated with a processor 502.

Optionally, when some or all of the rate matching method in the foregoing embodiment is implemented by software, the polar code rate matching apparatus 400 may alternatively include only a processor 402. A memory 401 configured to store a program is located outside the polar code rate matching apparatus 400. The processor 402 is connected to the memory 401 by a circuit/an electric wire, and configured to read and execute the program stored in the memory 401.

Figure 6:
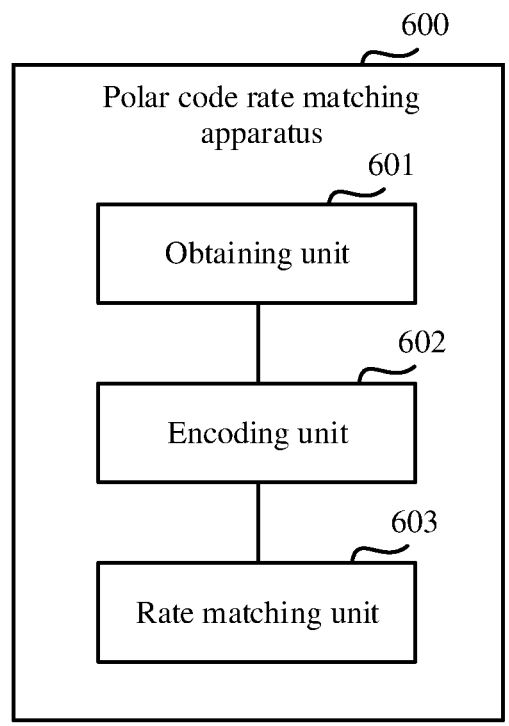
FIG. 6 is a fourth schematic diagram of a structure of a polar code rate matching apparatus according to an embodiment of this application.
Figure 7:
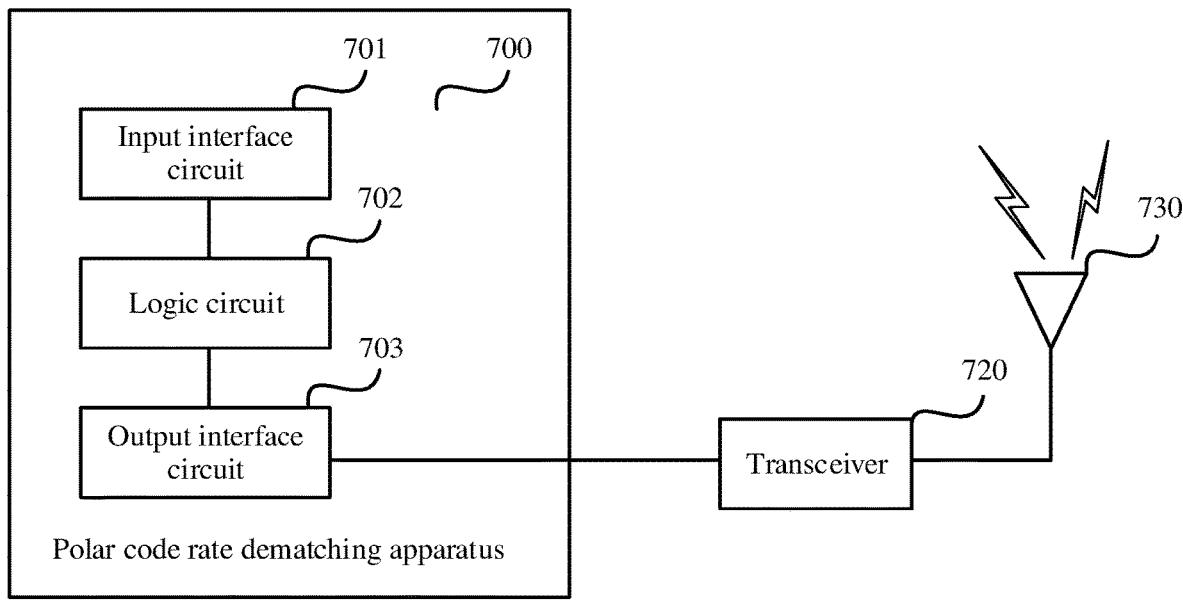
FIG. 7 is a first schematic diagram of a structure of a polar code rate dematching apparatus according to an embodiment of this application.

Based on the polar code rate matching method shown in FIG. 2, as shown in FIG. 6, an embodiment of this application further provides a polar code rate matching apparatus 600. The polar code rate matching apparatus 600 is configured to perform the polar code rate matching method shown in FIG. 2. The polar code rate matching apparatus 600 includes:

an obtaining unit 601, configured to obtain K to-be-encoded bits and a target code length M;
an encoding unit 602, configured to: determine a mother code length N, and perform polar code encoding on the K to-be-encoded bits based on the mother code length N, to obtain an encoded bit sequence, where for a specific encoding process, refer to the operation 220 in the foregoing embodiment; and
a rate matching unit 603, configured to perform a rate matching operation on the encoded bit sequence based on a rate matching sequence, to obtain a rate matched bit sequence with a length of M (or a sequence obtained after the bit sequence is further modulated, also referred to as a rate matched sequence), where for a specific rate matching method, refer to the operation 230 in the foregoing embodiment.

Corresponding to a transmit end, an apparatus at a receive end may also be similarly designed.

A polar code rate dematching apparatus 700 includes: an input interface circuit 701, configured to obtain a to-be-decoded information sequence; a logic circuit 702, configured to perform the foregoing polar code rate dematching method, to obtain decoded information bits; and an output interface circuit 703, configured to output the decoded information bits. The polar code rate dematching apparatus 700 may further include a transceiver 720 and obtains the to-be-decoded information sequence by using an antenna

730. In specific implementation, the polar code rate dematching apparatus 700 may be a chip or an integrated circuit.

Figure 8:
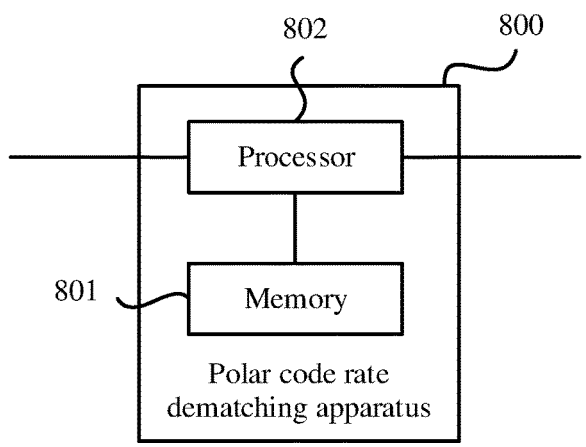
FIG. 8 is a second schematic diagram of a structure of a polar code rate dematching apparatus according to an embodiment of this application.

Optionally, when some or all of the polar code rate dematching method in the foregoing embodiment is implemented by software, as shown in FIG. 8, a polar code rate dematching apparatus 800 includes: a memory 801, configured to store a program; and a processor 802, configured to execute the program stored in the memory 801. When the program is executed, the polar code rate dematching apparatus 800 is enabled to implement the polar code rate dematching method provided in the foregoing embodiment.

Figure 9:
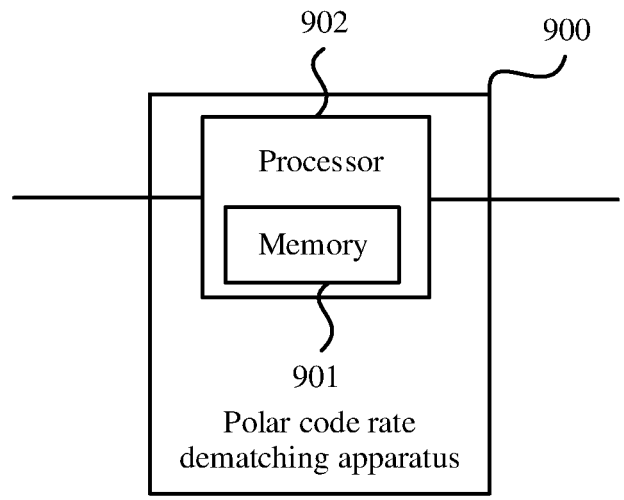
FIG. 9 is a third schematic diagram of a structure of a polar code rate dematching apparatus according to an embodiment of this application.

Optionally, the memory 801 may be a physically independent unit. Alternatively, as shown in FIG. 9, a memory 901 may be integrated with a processor 902.

Optionally, when some or all of the rate dematching method in the foregoing embodiment is implemented by software, the polar code rate dematching apparatus 800 may alternatively include only a processor 802. A memory 801 configured to store a program is located outside the polar code rate dematching apparatus 800. The processor 802 is connected to the memory 801 by a circuit/an electric wire, and configured to read and execute the program stored in the memory 801.

The processor 402 and/or the processor 802 may be a central processing unit (CPU), a network processor (NP), or a combination of a CPU and an NP.

The processor 402 and/or the processor 802 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), a generic array logic (GAL), or any combination thereof.

The memory in the foregoing embodiments may include a volatile memory, for example, a random-access memory (RAM). The memory may alternatively include a non-volatile memory, for example, a flash memory, a hard disk drive (HDD), or a solid-state drive (SSD). The memory may alternatively include a combination of the foregoing types of memories.

Figure 10:
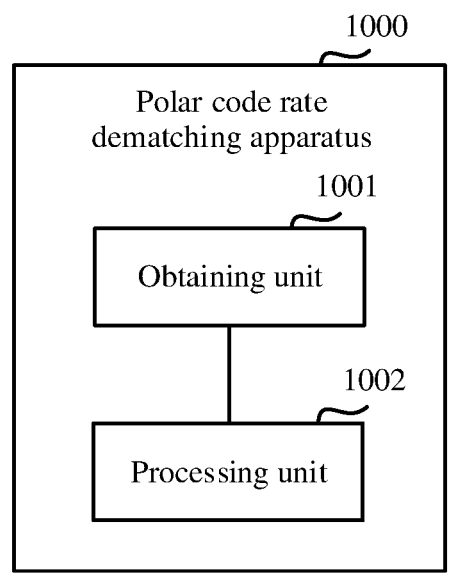
FIG. 10 is a fourth schematic diagram of a structure of a polar code rate dematching apparatus according to an embodiment of this application.

Based on the foregoing polar code rate dematching method, as shown in FIG. 10, an embodiment of this application further provides a polar code rate dematching apparatus 1000. The polar code rate dematching apparatus 1000 is configured to perform the foregoing polar code rate dematching method. The polar code rate dematching apparatus 1000 includes:

an obtaining unit 1001, configured to obtain a to-be-decoded information sequence; and a processing unit 1002, configured to: determine a mother code length N, perform a rate dematching operation and a decoding and demodulation operation on the to-be-decoded information sequence based on the mother code length N and a rate matching sequence, and obtain and output a decoding result.

An embodiment of this application further provides a computer storage medium. The computer storage medium stores computer program instructions. When the computer program instructions are executed by a computer, the foregoing polar code rate matching method or the foregoing polar code rate dematching method is enabled to be executed.

An embodiment of this application further provides a computer program product including instructions. When the computer program product is run on a computer, the foregoing polar code rate matching method or the foregoing polar code rate dematching method is enabled to be executed.

A person skilled in the art should understand that embodiments of this application may be provided as a method, a system, or a computer program product. Therefore, this application may use a form of a hardware-only embodiment, a software-only embodiment, or an embodiment with a combination of software and hardware. In addition, this application may use a form of a computer program product that is implemented on one or more computer-usable storage media (including but not limited to a disk memory, a CD-ROM, an optical memory, and the like) that include computer-usable program code.

This application is described with reference to the flowcharts and/or block diagrams of the method, the device (system), and the computer program product according to embodiments of this application. It should be understood that computer program instructions may be used to implement each process and/or each block in the flowcharts and/or the block diagrams and a combination of a process and/or a block in the flowcharts and/or the block diagrams. The computer program instructions may be provided for a general-purpose computer, a dedicated computer, an embedded processor, or a processor of another programmable data processing device to generate a machine, so that the instructions executed by the computer or the processor of the another programmable data processing device generate an apparatus for implementing a specific function in one or more procedures in the flowcharts and/or in one or more blocks in the block diagrams.

The computer program instructions may alternatively be stored in a computer-readable memory that can indicate a computer or another programmable data processing device to work in a specific manner, so that the instructions stored in the computer-readable memory generate an artifact that includes an instruction apparatus. The instruction apparatus implements a specific function in one or more procedures in the flowcharts and/or in one or more blocks in the block diagrams.

The computer program instructions may alternatively be loaded onto a computer or another programmable data processing device, so that a series of operations and steps are performed on the computer or the another programmable device, so that computer-implemented processing is generated. Therefore, the instructions executed on the computer or the another programmable device provide steps for implementing a specific function in one or more procedures in the flowcharts and/or in one or more blocks in the block diagrams.

Although some embodiments of this application have been described, persons skilled in the art can make changes and modifications to these embodiments once they learn the basic inventive concept. Therefore, the following claims are intended to be construed as to cover the embodiments and all changes and modifications falling within the scope of this application.

Clearly, persons skilled in the art can make various modifications and variations to embodiments of this application without departing from the scope of embodiments of this application. In this case, this application is intended to cover these modifications and variations provided that they fall within the scope of protection defined by the following claims and their equivalent technologies.

APPENDIX I: AN EXAMPLE OF A FIRST
SEQUENCE

Sequence 1:
Punc_Q=[0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 512, 513, 514, 515, 516, 517, 518, 519, 520, 521, 522, 523, 524, 525, 526, 527, 528, 529, 530, 531, 532, 533, 534, 535, 536, 537, 538, 539, 540, 541, 542, 543, 544, 545, 546, 547, 548, 549, 550, 551, 552, 553, 554, 555, 556, 557, 558, 559, 560, 561, 562, 563, 564, 565, 566, 567, 568, 569, 570, 571, 572, 573, 574, 575, 576, 577, 578, 579, 580, 581, 582, 583, 584, 585, 586, 587, 588, 589, 590, 591, 592, 593, 594, 595, 596, 597, 598, 599, 600, 601, 602, 603, 604, 605, 606, 607, 608, 609, 610, 611, 612, 613, 614, 615, 616, 617, 618, 619, 620, 621, 622, 623, 624, 625, 626, 627, 628, 629, 630, 631, 632, 633, 634, 635, 636, 637, 638, 639, 1024, 1025, 1026, 1027, 1028, 1029, 1030, 1031, 1032, 1033, 1034, 1035, 1036, 1037, 1038, 1039, 1040, 1041, 1042, 1043, 1044, 1045, 1046, 1047, 1048, 1049, 1050, 1051, 1052, 1053, 1054, 1055, 1056, 1057, 1058, 1059, 1060, 1061, 1062, 1063, 1064, 1065, 1066, 1067, 1068, 1069, 1070, 1071, 1072, 1073, 1074, 1075, 1076, 1077, 1078, 1079, 1080, 1081, 1082, 1083, 1084, 1085, 1086, 1087, 1088, 1089, 1090, 1091, 1092, 1093, 1094, 1095, 1096, 1097, 1098, 1099, 1100, 1101, 1102, 1103, 1104, 1105, 1106, 1107, 1108, 1109, 1110, 1111, 1112, 1113, 1114, 1115, 1116, 1117, 1118, 1119, 1120, 1121, 1122, 1123, 1124, 1125, 1126, 1127, 1128, 1129, 1130, 1131, 1132, 1133, 1134, 1135, 1136, 1137, 1138, 1139, 1140, 1141, 1142, 1143, 1144, 1145, 1146, 1147, 1148, 1149, 1150, 1151, 2048, 2049, 2050, 2051, 2052, 2053, 2054, 2055, 2056, 2057, 2058, 2059, 2060, 2061, 2062, 2063, 2064, 2065, 2066, 2067, 2068, 2069, 2070, 2071, 2072, 2073, 2074, 2075, 2076, 2077, 2078, 2079, 2080, 2081, 2082, 2083, 2084, 2085, 2086, 2087, 2088, 2089, 2090, 2091, 2092, 2093, 2094, 2095, 2096, 2097, 2098, 2099, 2100, 2101, 2102, 2103, 2104, 2105, 2106, 2107, 2108, 2109, 2110, 2111, 2112, 2113, 2114, 2115, 2116, 2117, 2118, 2119, 2120, 2121, 2122, 2123, 2124, 2125, 2126, 2127, 2128, 2129, 2130, 2131, 2132, 2133, 2134, 2135, 2136, 2137, 2138, 2139, 2140, 2141, 2142, 2143, 2144, 2145, 2146, 2147, 2148, 2149, 2150, 2151, 2152, 2153, 2154, 2155, 2156, 2157, 2158, 2159, 2160, 2161, 2162, 2163, 2164, 2165, 2166, 2167, 2168, 2169, 2170, 2171, 2172, 2173, 2174, 2175, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 501, 502, 503, 504, 505, 506, 507, 508, 509, 510, 511, 4096, 4097, 4098, 4099, 4100, 4101, 4102, 4103, 4104, 4105, 4106, 4107, 4108, 4109, 4110, 4111, 4112, 4113, 4114, 4115, 4116, 4117, 4118, 4119, 4120, 4121, 4122, 4123, 4124, 4125, 4126, 4127, 4128, 4129, 4130, 4131, 4132, 4133, 4134, 4135, 4136, 4137, 4138, 4139, 4140, 4141, 4142, 4143, 4144, 4145, 4146, 4147, 4148, 4149, 4150, 4151, 4152, 4153, 4154, 4155, 4156, 4157, 4158, 4159, 4160, 4161, 4162, 4163, 4164, 4165, 4166, 4167, 4168, 4169, 4170, 4171, 4172, 4173, 4174, 4175, 4176, 4177, 4178, 4179, 4180, 4181, 4182, 4183, 4184, 4185, 4186, 4187, 4188, 4189, 4190, 4191, 4192, 4193, 4194, 4195, 4196, 4197, 4198, 4199, 4200, 4201, 4202, 4203, 4204, 4205, 4206, 4207, 4208, 4209, 4210, 4211, 4212, 4213, 4214, 4215, 4216, 4217, 4218, 4219, 4220, 4221, 4222, 4223, 640, 641, 642, 643, 644, 645, 646, 647, 648, 649, 650, 651, 652, 653, 654, 655, 656, 657, 658, 659, 660, 661, 662, 663, 664, 665, 666, 667, 668, 669, 670, 671, 672, 673, 674, 675, 676, 677, 678, 679, 680, 681, 682, 683, 684, 685, 686, 687, 688, 689, 690, 691, 692, 693, 694, 695, 696, 697, 698, 699, 700, 701, 702, 703, 704, 705, 706, 707, 708, 709, 710, 711, 712, 713, 714, 715, 716, 717, 718, 719, 720, 721, 722, 723, 724, 725, 726, 727, 728, 729, 730, 731, 732, 733, 734, 735, 736, 737, 738, 739, 740, 741, 72, 743, 744, 745, 746, 747, 748, 749, 750, 751, 752, 753, 754, 755, 756, 757, 758, 759, 760, 761, 762, 763, 764, 765, 766, 767, 768, 769, 770, 771, 772, 773, 774, 775, 776, 777, 778, 779, 780, 781, 782, 783, 784, 785, 786, 787, 788, 789, 790, 791, 792, 793, 794, 795, 796, 797, 798, 799, 800, 801, 802, 803, 804, 805, 806, 807, 808, 809, 810, 811, 812, 813, 814, 815, 816, 817, 818, 819, 820, 821, 822, 823, 824, 825, 826, 827, 828, 829, 830, 831, 832, 83, 834, 835, 836, 837, 838, 839, 840, 841, 842, 843, 844, 845, 846, 847, 848, 849, 850, 851, 852, 853, 854, 855, 856, 857, 858, 859, 860, 861, 862, 863, 864, 865, 866, 867, 868, 869, 870, 871, 872, 873, 874, 875, 876, 877, 878, 879, 880, 881, 882, 883, 884, 885, 886, 887, 888, 889, 890, 891, 892, 893, 894, 895, 1152, 1153, 1154, 1155, 1156, 1157, 1158, 1159, 1160, 1161, 1162, 1163, 1164, 1165, 1166, 1167, 1168, 1169, 1170, 1171, 1172, 1173, 1174, 1175, 1176, 1177, 1178, 1179, 1180, 1181, 1182, 1183, 1184, 1185, 1186, 1187, 1188, 1189, 1190, 1191, 1192, 1193, 1194, 1195, 1196, 1197, 1198, 1199, 1200, 1201, 1202, 1203, 1204, 1205, 1206, 1207, 1208, 1209, 1210, 1211, 1212, 1213, 1214, 1215, 1216, 1217, 1218, 1219, 1220, 1221, 1222, 1223, 1224, 1225, 1226, 1227, 1228, 1229, 1230, 1231, 1232, 1233, 1234, 1235, 1236, 1237, 1238, 1239, 1240, 1241, 1242, 1243, 1244, 1245, 1246, 1247, 1248, 1249, 1250, 1251, 1252, 1253, 1254, 1255, 1256, 1257, 1258, 1259, 1260, 1261, 1262, 1263, 1264, 1265, 1266, 1267, 1268, 1269, 1270, 1271, 1272, 1273, 1274, 1275, 1276, 1277, 1278, 1279, 1280, 1281, 1282, 1283, 1284, 1285, 1286, 1287, 1288, 1289, 1290, 1291, 1292, 1293, 1294, 1295, 1296, 1297, 1298, 1299, 1300, 1301, 1302, 1303, 1304, 1305, 1306, 1307, 1308, 1309, 1310, 1311, 1312, 1313, 1314, 1315, 1316, 1317, 1318, 1319, 1320, 1321, 1322, 1323, 1324, 1325, 1326, 1327, 1328, 1329, 1330, 1331, 1332, 1333, 1334, 1335, 1336, 1337, 1338, 1339, 1340, 1341, 1342, 1343, 1344, 1345, 1346, 1347, 1348, 1349, 1350, 1351, 1352, 1353, 1354, 1355, 1356, 1357, 1358, 1359, 1360, 1361, 1362, 1363, 1364, 1365, 1366, 1367, 1368, 1369, 1370, 1371, 1372, 1373, 1374, 1375, 1376, 1377, 1378, 1379, 1380, 1381, 1382, 1383, 1384, 1385, 1386, 1387, 1388, 1389, 1390, 1391, 1392, 1393, 1394, 1395, 1396, 1397, 1398, 1399, 1400, 1401, 1402, 1403, 1404, 1405, 1406, 1407, 2176, 2177, 2178, 2179, 2180, 2181, 2182, 2183, 2184, 2185, 2186, 2187, 2188, 2189, 2190, 2191, 2192, 2193, 2194, 2195, 2196, 2197, 2198, 2199, 2200, 2201, 2202, 2203, 2204, 2205, 2206, 2207, 2208, 2209, 2210, 2211, 2212, 2213, 2214, 2215, 2216, 2217, 2218, 2219, 2220, 2221, 2222, 2223, 2224, 2225, 2226, 2227, 2228, 2229, 2230, 2231, 2232, 2233, 2234, 2235, 2236, 2237, 2238, 2239, 2240, 2241, 2242, 2243, 2244, 2245, 2246, 2247, 2248, 2249, 2250, 2251, 2252, 2253, 2254, 2255, 2256, 2257, 2258, 2259, 2260, 2261, 2262, 2263, 2264, 2265, 2266, 2267, 2268, 2269, 2270, 2271, 2272, 2273, 2274, 2275, 2276, 2277, 2278, 2279, 2280, 2281, 2282, 2283, 2284, 2285, 2286, 2287, 2288, 2289, 2290, 2291, 2292, 2293, 2294, 2295, 2296, 2297, 2298, 2299, 2300, 2301, 2302, 2303, 1536, 1537, 1538, 1539, 1540, 1541, 1542, 1543, 1544, 1545, 1546, 1547, 1548, 1549, 1550, 1551, 1552, 1553, 1554, 1555, 1556, 1557, 1558, 1559, 1560, 1561, 1562, 1563, 1564, 1565, 1566, 1567, 1568, 1569, 1570, 1571, 1572, 1573, 1574, 1575, 1576, 1577, 1578, 1579, 1580, 1581, 1582, 1583, 1584, 1585, 1586, 1587, 1588, 1589, 1590, 1591, 1592, 1593, 1594, 1595, 1596, 1597, 1598, 1599, 1600, 1601, 1602, 1603, 1604, 1605, 1606, 1607, 1608, 1609, 1610, 1611, 1612, 1613, 1614, 1615, 1616, 1617, 1618, 1619, 1620, 1621, 1622, 1623, 1624, 1625, 1626, 1627, 1628, 1629, 1630, 1631, 1632, 1633, 1634, 1635, 1636, 1637, 1638, 1639, 1640, 1641, 1642, 1643, 1644, 1645, 1646, 1647, 1648, 1649, 1650, 1651, 1652, 1653, 1654, 1655, 1656, 1657, 1658, 1659, 1660, 1661, 1662, 1663, 2304, 2305, 2306, 2307, 2308, 2309, 2310, 2311, 2312, 2313, 2314, 2315, 2316, 2317, 2318, 2319, 2320, 2321, 2322, 2323, 2324, 2325, 2326, 2327, 2328, 2329, 2330, 2331, 2332, 2333, 2334, 2335, 2336, 2337, 2338, 2339, 2340, 2341, 2342, 2343, 2344, 2345, 2346, 2347, 2348, 2349, 2350, 2351, 2352, 2353, 2354, 2355, 2356, 2357, 2358, 2359, 2360, 2361, 2362, 2363, 2364, 2365, 2366, 2367, 2368, 2369, 2370, 2371, 2372, 2373, 2374, 2375, 2376, 2377, 2378, 2379, 2380, 2381, 2382, 2383, 2384, 2385, 2386, 2387, 2388, 2389, 2390, 2391, 2392, 2393, 2394, 2395, 2396, 2397, 2398, 2399, 2400, 2401, 2402, 2403, 2404, 2405, 2406, 2407, 2408, 2409, 2410, 2411, 2412, 2413, 2414, 2415, 2416, 2417, 2418, 2419, 2420, 2421, 2422, 2423, 2424, 2425, 2426, 2427, 2428, 2429, 2430, 2431, 4224, 4225, 4226, 4227, 4228, 4229, 4230, 4231, 4232, 4233, 4234, 4235, 4236, 4237, 4238, 4239, 4240, 4241, 4242, 4243, 4244, 4245, 4246, 4247, 4248, 4249, 4250, 4251, 4252, 4253, 4254, 4255, 4256, 4257, 4258, 4259, 4260, 4261, 4262, 4263, 4264, 4265, 4266, 4267, 4268, 4269, 4270, 4271, 4272, 4273, 4274, 4275, 4276, 4277, 4278, 4279, 4280, 4281, 4282, 4283, 4284, 4285, 4286, 4287, 4288, 4289, 4290, 4291, 4292, 4293, 4294, 4295, 4296, 4297, 4298, 4299, 4300, 4301, 4302, 4303, 4304, 4305, 4306, 4307, 4308, 4309, 4310, 4311, 4312, 4313, 4314, 4315, 4316, 4317, 4318, 4319, 4320, 4321, 4322, 4323, 4324, 4325, 4326, 4327, 4328, 4329, 4330, 4331, 4332, 4333, 4334, 4335, 4336, 4337, 4338, 4339, 4340, 4341, 4342, 4343, 4344, 4345, 4346, 4347, 4348, 4349, 4350, 4351, 2560, 2561, 2562, 2563, 2564, 2565, 2566, 2567, 2568, 2569, 2570, 2571, 2572, 2573, 2574, 2575, 2576, 2577, 2578, 2579, 2580, 2581, 2582, 2583, 2584, 2585, 2586, 2587, 2588, 2589, 2590, 2591, 2592, 2593, 2594, 2595, 2596, 2597, 2598, 2599, 2600, 2601, 2602, 2603, 2604, 2605, 2606, 2607, 2608, 2609, 2610, 2611, 2612, 2613, 2614, 2615, 2616, 2617, 2618, 2619, 2620, 2621, 2622, 2623, 2624, 2625, 2626, 2627, 2628, 2629, 2630, 2631, 2632, 2633, 2634, 2635, 2636, 2637, 2638, 2639, 2640, 2641, 2642, 2643, 2644, 2645, 2646, 2647, 2648, 2649, 2650, 2651, 2652, 2653, 2654, 2655, 2656, 2657, 2658, 2659, 2660, 2661, 2662, 2663, 2664, 2665, 2666, 2667, 2668, 2669, 2670, 2671, 2672, 2673, 2674, 2675, 2676, 2677, 2678, 2679, 2680, 2681, 2682, 2683, 2684, 2685, 2686, 2687, 4352, 4353, 4354, 4355, 4356, 4357, 4358, 4359, 4360, 4361, 4362, 4363, 4364, 4365, 4366, 4367, 4368, 4369, 4370, 4371, 4372, 4373, 4374, 4375, 4376, 4377, 4378, 4379, 4380, 4381, 4382, 4383, 4384, 4385, 4386, 4387, 4388, 4389, 4390, 4391, 4392, 4393, 4394, 4395, 4396, 4397, 4398, 4399, 4400, 4401, 4402, 4403, 4404, 4405, 4406, 4407, 4408, 4409, 4410, 4411, 4412, 4413, 4414, 4415, 4416, 4417, 4418, 4419, 4420, 4421, 4422, 4423, 4424, 4425, 4426, 4427, 4428, 4429, 4430, 4431, 4432, 4433, 4434, 4435, 4436, 4437, 4438, 4439, 4440, 4441, 4442, 4443, 4444, 4445, 4446, 4447, 4448, 4449, 4450, 4451, 4452, 4453, 4454, 4455, 4456, 4457, 4458, 4459, 4460, 4461, 4462, 4463, 4464, 4465, 4466, 4467, 4468, 4469, 4470, 4471, 4472, 4473, 4474, 4475, 4476, 4477, 4478, 4479, 896, 897, 898, 899, 900, 901, 902, 903, 904, 905, 906, 907, 908, 909, 910, 911, 912, 913, 914, 915, 916, 917, 918, 919, 920, 921, 922, 923, 924, 925, 926, 927, 928, 929, 930, 931, 932, 933, 934, 935, 936, 937, 938, 939, 940, 941, 942, 943, 944, 945, 946, 947, 948, 949, 950, 951, 952, 953, 954, 955, 956, 957, 958, 959, 960, 961, 962, 963, 964, 965, 966, 967, 968, 969, 970, 971, 972, 973, 974, 975, 976, 977, 978, 979, 980, 981, 982, 983, 984, 985, 986, 987, 988, 989, 990, 991, 992, 993, 994, 995, 996, 997, 998, 999, 1000, 1001, 1002, 1003, 1004, 1005, 1006, 1007, 1008, 1009, 1010, 1011, 1012, 1013, 1014, 1015, 1016, 1017, 1018, 1019, 1020, 1021, 1022, 1023, 3072, 3073, 3074, 3075, 3076, 3077, 3078, 3079, 3080, 3081, 3082, 3083, 3084, 3085, 3086, 3087, 3088, 3089, 3090, 3091, 3092, 3093, 3094, 3095, 3096, 3097, 3098, 3099, 3100, 3101, 3102, 3103, 3104, 3105, 3106, 3107, 3108, 3109, 3110, 3111, 3112, 3113, 3114, 3115, 3116, 3117, 3118, 3119, 3120, 3121, 3122, 3123, 3124, 3125, 3126, 3127, 3128, 3129, 3130, 3131, 3132, 3133, 3134, 3135, 3136, 3137, 3138, 3139, 3140, 3141, 3142, 3143, 3144, 3145, 3146, 3147, 3148, 3149, 3150, 3151, 3152, 3153, 3154, 3155, 3156, 3157, 3158, 3159, 3160, 3161, 3162, 3163, 3164, 3165, 3166, 3167, 3168, 3169, 3170, 3171, 3172, 3173, 3174, 3175, 3176, 3177, 3178, 3179, 3180, 3181, 3182, 3183, 3184, 3185, 3186, 3187, 3188, 3189, 3190, 3191, 3192, 3193, 3194, 3195, 3196, 3197, 3198, 3199, 4608, 4609, 4610, 4611, 4612, 4613, 4614, 4615, 4616, 4617, 4618, 4619, 4620, 4621, 4622, 4623, 4624, 4625, 4626, 4627, 4628, 4629, 4630, 4631, 4632, 4633, 4634, 4635, 4636, 4637, 4638, 4639, 4640, 4641, 4642, 4643, 4644, 4645, 4646, 4647, 4648, 4649, 4650, 4651, 4652, 4653, 4654, 4655, 4656, 4657, 4658, 4659, 4660, 4661, 4662, 4663, 4664, 4665, 4666, 4667, 4668, 4669, 4670, 4671, 4672, 4673, 4674, 4675, 4676, 4677, 4678, 4679, 4680, 4681, 4682, 4683, 4684, 4685, 4686, 4687, 4688, 4689, 4690, 4691, 4692, 4693, 4694, 4695, 4696, 4697, 4698, 4699, 4700, 4701, 4702, 4703, 4704, 4705, 4706, 4707, 4708, 4709, 4710, 4711, 4712, 4713, 4714, 4715, 4716, 4717, 4718, 4719, 4720, 4721, 4722, 4723, 4724, 4725, 4726, 4727, 4728, 4729, 4730, 4731, 4732, 4733, 4734, 4735, 1408, 1409, 1410, 1411, 1412, 1413, 1414, 1415, 1416, 1417, 1418, 1419, 1420, 1421, 1422, 1423, 1424, 1425, 1426, 1427, 1428, 1429, 1430, 1431, 1432, 1433, 1434, 1435, 1436, 1437, 1438, 1439, 1440, 1441, 1442, 1443, 1444, 1445, 1446, 1447, 1448, 1449, 1450, 1451, 1452, 1453, 1454, 1455, 1456, 1457, 1458, 1459, 1460, 1461, 1462, 1463, 1464, 1465, 1466, 1467, 1468, 1469, 1470, 1471, 1472, 1473, 1474, 1475, 1476, 1477, 1478, 1479, 1480, 1481, 1482, 1483, 1484, 1485, 1486, 1487, 1488, 1489, 1490, 1491, 1492, 1493, 1494, 1495, 1496, 1497, 1498, 1499, 1500, 1501, 1502, 1503, 1504, 1505, 1506, 1507, 1508, 1509, 1510, 1511, 1512, 1513, 1514, 1515, 1516, 1517, 1518, 1519, 1520, 1521, 1522, 1523, 1524, 1525, 1526, 1527, 1528, 1529, 1530, 1531, 1532, 1533, 1534, 1535, 5120, 5121, 5122, 5123, 5124, 5125, 5126, 5127, 5128, 5129, 5130, 5131, 5132, 5133, 5134, 5135, 5136, 5137, 5138, 5139, 5140, 5141, 5142, 5143, 5144, 5145, 5146, 5147, 5148, 5149, 5150, 5151, 5152, 5153, 5154, 5155, 5156, 5157, 5158, 5159, 5160, 5161, 5162, 5163, 5164, 5165, 5166, 5167, 5168, 5169, 5170, 5171, 5172, 5173, 5174, 5175, 5176, 5177, 5178, 5179, 5180, 5181, 5182, 5183, 5184, 5185, 5186, 5187, 5188, 5189, 5190, 5191, 5192, 5193, 5194, 5195, 5196, 5197, 5198, 5199, 5200, 5201, 5202, 5203, 5204, 5205, 5206, 5207, 5208, 5209, 5210, 5211, 5212, 5213, 5214, 5215, 5216, 5217, 5218, 5219, 5220, 5221, 5222, 5223, 5224, 5225, 5226, 5227, 5228, 5229, 5230, 5231, 5232, 5233, 5234, 5235, 5236, 5237, 5238, 5239, 5240, 5241, 5242, 5243, 5244, 5245, 5246, 5247, 1664, 1665, 1666, 1667, 1668, 1669, 1670, 1671, 1672, 1673, 1674, 1675, 1676, 1677, 1678, 1679, 1680, 1681, 1682, 1683, 1684, 1685, 1686, 1687, 1688, 1689, 1690, 1691, 1692, 1693, 1694, 1695, 1696, 1697, 1698, 1699, 1700, 1701, 1702, 1703, 1704, 1705, 1706, 1707, 1708, 1709, 1710, 1711, 1712, 1713, 1714, 1715, 1716, 1717, 1718, 1719, 1720, 1721, 1722, 1723, 1724, 1725, 1726, 1727, 1728, 1729, 1730, 1731, 1732, 1733, 1734, 1735, 1736, 1737, 1738, 1739, 1740, 1741, 1742, 1743, 1744, 1745, 1746, 1747, 1748, 1749, 1750, 1751, 1752, 1753, 1754, 1755, 1756, 1757, 1758, 1759, 1760, 1761, 1762, 1763, 1764, 1765, 1766, 1767, 1768, 1769, 1770, 1771, 1772, 1773, 1774, 1775, 1776, 1777, 1778, 1779, 1780, 1781, 1782, 1783, 1784, 1785, 1786, 1787, 1788, 1789, 1790, 1791, 2432, 2433, 2434, 2435, 2436, 2437, 2438, 2439, 2440, 2441, 2442, 2443, 2444, 2445, 2446, 2447, 2448, 2449, 2450, 2451, 2452, 2453, 2454, 2455, 2456, 2457, 2458, 2459, 2460, 2461, 2462, 2463, 2464, 2465, 2466, 2467, 2468, 2469, 2470, 2471, 2472, 2473, 2474, 2475, 2476, 2477, 2478, 2479, 2480, 2481, 2482, 2483, 2484, 2485, 2486, 2487, 2488, 2489, 2490, 2491, 2492, 2493, 2494, 2495, 2496, 2497, 2498, 2499, 2500, 2501, 2502, 2503, 2504, 2505, 2506, 2507, 2508, 2509, 2510, 2511, 2512, 2513, 2514, 2515, 2516, 2517, 2518, 2519, 2520, 2521, 2522, 2523, 2524, 2525, 2526, 2527, 2528, 2529, 2530, 2531, 2532, 2533, 2534, 2535, 2536, 2537, 2538, 2539, 2540, 2541, 2542, 2543, 2544, 2545, 2546, 2547, 2548, 2549, 2550, 2551, 2552, 2553, 2554, 2555, 2556, 2557, 2558, 2559, 1792, 1793, 1794, 1795, 1796, 1797, 1798, 1799, 1800, 1801, 1802, 1803, 1804, 1805, 1806, 1807, 1808, 1809, 1810, 1811, 1812, 1813, 1814, 1815, 1816, 1817, 1818, 1819, 1820, 1821, 1822, 1823, 1824, 1825, 1826, 1827, 1828, 1829, 1830, 1831, 1832, 1833, 1834, 1835, 1836, 1837, 1838, 1839, 1840, 1841, 1842, 1843, 1844, 1845, 1846, 1847, 1848, 1849, 1850, 1851, 1852, 1853, 1854, 1855, 1856, 1857, 1858, 1859, 1860, 1861, 1862, 1863, 1864, 1865, 1866, 1867, 1868, 1869, 1870, 1871, 1872, 1873, 1874, 1875, 1876, 1877, 1878, 1879, 1880, 1881, 1882, 1883, 1884, 1885, 1886, 1887, 1888, 1889, 1890, 1891, 1892, 1893, 1894, 1895, 1896, 1897, 1898, 1899, 1900, 1901, 1902, 1903, 1904, 1905, 1906, 1907, 1908, 1909, 1910, 1911, 1912, 1913, 1914, 1915, 1916, 1917, 1918, 1919, 6144, 6145, 6146, 6147, 6148, 6149, 6150, 6151, 6152, 6153, 6154, 6155, 6156, 6157, 6158, 6159, 6160, 6161, 6162, 6163, 6164, 6165, 6166, 6167, 6168, 6169, 6170, 6171, 6172, 6173, 6174, 6175, 6176, 6177, 6178, 6179, 6180, 6181, 6182, 6183, 6184, 6185, 6186, 6187, 6188, 6189, 6190, 6191, 6192, 6193, 6194, 6195, 6196, 6197, 6198, 6199, 6200, 6201, 6202, 6203, 6204, 6205, 6206, 6207, 6208, 6209, 6210, 6211, 6212, 6213, 6214, 6215, 6216, 6217, 6218, 6219, 6220, 6221, 6222, 6223, 6224, 6225, 6226, 6227, 6228, 6229, 6230, 6231, 6232, 6233, 6234, 6235, 6236, 6237, 6238, 6239, 6240, 6241, 6242, 6243, 6244, 6245, 6246, 6247, 6248, 6249, 6250, 6251, 6252, 6253, 6254, 6255, 6256, 6257, 6258, 6259, 6260, 6261, 6262, 6263, 6264, 6265, 6266, 6267, 6268, 6269, 6270, 6271, 2688, 2689, 2690, 2691, 2692, 2693, 2694, 2695, 2696, 2697, 2698, 2699, 2700, 2701, 2702, 2703, 2704, 2705, 2706, 2707, 2708, 2709, 2710, 2711, 2712, 2713, 2714, 2715, 2716, 2717, 2718, 2719, 2720, 2721, 2722, 2723, 2724, 2725, 2726, 2727, 2728, 2729, 2730, 2731, 2732, 2733, 2734, 2735, 2736, 2737, 2738, 2739, 2740, 2741, 2742, 2743, 2744, 2745, 2746, 2747, 2748, 2749, 2750, 2751, 2752, 2753, 2754, 2755, 2756, 2757, 2758, 2759, 2760, 2761, 2762, 2763, 2764, 2765, 2766, 2767, 2768, 2769, 2770, 2771, 2772, 2773, 2774, 2775, 2776, 2777, 2778, 2779, 2780, 2781, 2782, 2783, 2784, 2785, 2786, 2787, 2788, 2789, 2790, 2791, 2792, 2793, 2794, 2795, 2796, 2797, 2798, 2799, 2800, 2801, 2802, 2803, 2804, 2805, 2806, 2807, 2808, 2809, 2810, 2811, 2812, 2813, 2814, 2815, 4480, 4481, 4482, 4483, 4484, 4485, 4486, 4487, 4488, 4489, 4490, 4491, 4492, 4493, 4494, 4495, 4496, 4497, 4498, 4499, 4500, 4501, 4502, 4503, 4504, 4505, 4506, 4507, 4508, 4509, 4510, 4511, 4512, 4513, 4514, 4515, 4516, 4517, 4518, 4519, 4520, 4521, 4522, 4523, 4524, 4525, 4526, 4527, 4528, 4529, 4530, 4531, 4532, 4533, 4534, 4535, 4536, 4537, 4538, 4539, 4540, 4541, 4542, 4543, 4544, 4545, 4546, 4547, 4548, 4549, 4550, 4551, 4552, 4553, 4554, 4555, 4556, 4557, 4558, 4559, 4560, 4561, 4562, 4563, 4564, 4565, 4566, 4567, 4568, 4569, 4570, 4571, 4572, 4573, 4574, 4575, 4576, 4577, 4578, 4579, 4580, 4581, 4582, 4583, 4584, 4585, 4586, 4587, 4588, 4589, 4590, 4591, 4592, 4593, 4594, 4595, 4596, 4597, 4598, 4599, 4600, 4601, 4602, 4603, 4604, 4605, 4606, 4607, 2816, 2817, 2818, 2819, 2820, 2821, 2822, 2823, 2824, 2825, 2826, 2827, 2828, 2829, 2830, 2831, 2832, 2833, 2834, 2835, 2836, 2837, 2838, 2839, 2840, 2841, 2842, 2843, 2844, 2845, 2846, 2847, 2848, 2849, 2850, 2851, 2852, 2853, 2854, 2855, 2856, 2857, 2858, 2859, 2860, 2861, 2862, 2863, 2864, 2865, 2866, 2867, 2868, 2869, 2870, 2871, 2872, 2873, 2874, 2875, 2876, 2877, 2878, 2879, 2880, 2881, 2882, 2883, 2884, 2885, 2886, 2887, 2888, 2889, 2890, 2891, 2892, 2893, 2894, 2895, 2896, 2897, 2898, 2899, 2900, 2901, 2902, 2903, 2904, 2905, 2906, 2907, 2908, 2909, 2910, 2911, 2912, 2913, 2914, 2915, 2916, 2917, 2918, 2919, 2920, 2921, 2922, 2923, 2924, 2925, 2926, 2927, 2928, 2929, 2930, 2931, 2932, 2933, 2934, 2935, 2936, 2937, 2938, 2939, 2940, 2941, 2942, 2943, 3200, 3201, 3202, 3203, 3204, 3205, 3206, 3207, 3208, 3209, 3210, 3211, 3212, 3213, 3214, 3215, 3216, 3217, 3218, 3219, 3220, 3221, 3222, 3223, 3224, 3225, 3226, 3227, 3228, 3229, 3230, 3231, 3232, 3233, 3234, 3235, 3236, 3237, 3238, 3239, 3240, 3241, 3242, 3243, 3244, 3245, 3246, 3247, 3248, 3249, 3250, 3251, 3252, 3253, 3254, 3255, 3256, 3257, 3258, 3259, 3260, 3261, 3262, 3263, 3264, 3265, 3266, 3267, 3268, 3269, 3270, 3271, 3272, 3273, 3274, 3275, 3276, 3277, 3278, 3279, 3280, 3281, 3282, 3283, 3284, 3285, 3286, 3287, 3288, 3289, 3290, 3291, 3292, 3293, 3294, 3295, 3296, 3297, 3298, 3299, 3300, 3301, 3302, 3303, 3304, 3305, 3306, 3307, 3308, 3309, 3310, 3311, 3312, 3313, 3314, 3315, 3316, 3317, 3318, 3319, 3320, 3321, 3322, 3323, 3324, 3325, 3326, 3327, 4736, 4737, 4738, 4739, 4740, 4741, 4742, 4743, 4744, 4745, 4746, 4747, 4748, 4749, 4750, 4751, 4752, 4753, 4754, 4755, 4756, 4757, 4758, 4759, 4760, 4761, 4762, 4763, 4764, 4765, 4766, 4767, 4768, 4769, 4770, 4771, 4772, 4773, 4774, 4775, 4776, 4777, 4778, 4779, 4780, 4781, 4782, 4783, 4784, 4785, 4786, 4787, 4788, 4789, 4790, 4791, 4792, 4793, 4794, 4795, 4796, 4797, 4798, 4799, 4800, 4801, 4802, 4803, 4804, 4805, 4806, 4807, 4808, 4809, 4810, 4811, 4812, 4813, 4814, 4815, 4816, 4817, 4818, 4819, 4820, 4821, 4822, 4823, 4824, 4825, 4826, 4827, 4828, 4829, 4830, 4831, 4832, 4833, 4834, 4835, 4836, 4837, 4838, 4839, 4840, 4841, 4842, 4843, 4844, 4845, 4846, 4847, 4848, 4849, 4850, 4851, 4852, 4853, 4854, 4855, 4856, 4857, 4858, 4859, 4860, 4861, 4862, 4863, 3328, 3329, 3330, 3331, 3332, 3333, 3334, 3335, 3336, 3337, 3338, 3339, 3340, 3341, 3342, 3343, 3344, 3345, 3346, 3347, 3348, 3349, 3350, 3351, 3352, 3353, 3354, 3355, 3356, 3357, 3358, 3359, 3360, 3361, 3362, 3363, 3364, 3365, 3366, 3367, 3368, 3369, 3370, 3371, 3372, 3373, 3374, 3375, 3376, 3377, 3378, 3379, 3380, 3381, 3382, 3383, 3384, 3385, 3386, 3387, 3388, 3389, 3390, 3391, 3392, 3393, 3394, 3395, 3396, 3397, 3398, 3399, 3400, 3401, 3402, 3403, 3404, 3405, 3406, 3407, 3408, 3409, 3410, 3411, 3412, 3413, 3414, 3415, 3416, 3417, 3418, 3419, 3420, 3421, 3422, 3423, 3424, 3425, 3426, 3427, 3428, 3429, 3430, 3431, 3432, 3433, 3434, 3435, 3436, 3437, 3438, 3439, 3440, 3441, 3442, 3443, 3444, 3445, 3446, 3447, 3448, 3449, 3450, 3451, 3452, 3453, 3454, 3455, 4864, 4865, 4866, 4867, 4868, 4869, 4870, 4871, 4872, 4873, 4874, 4875, 4876, 4877, 4878, 4879, 4880, 4881, 4882, 4883, 4884, 4885, 4886, 4887, 4888, 4889, 4890, 4891, 4892, 4893, 4894, 4895, 4896, 4897, 4898, 4899, 4900, 4901, 4902, 4903, 4904, 4905, 4906, 4907, 4908, 4909, 4910, 4911, 4912, 4913, 4914, 4915, 4916, 4917, 4918, 4919, 4920, 4921, 4922, 4923, 4924, 4925, 4926, 4927, 4928, 4929, 4930, 4931, 4932, 4933, 4934, 4935, 4936, 4937, 4938, 4939, 4940, 4941, 4942, 4943, 4944, 4945, 4946, 4947, 4948, 4949, 4950, 4951, 4952, 4953, 4954, 4955, 4956, 4957, 4958, 4959, 4960, 4961, 4962, 4963, 4964, 4965, 4966, 4967, 4968, 4969, 4970, 4971, 4972, 4973, 4974, 4975, 4976, 4977, 4978, 4979, 4980, 4981, 4982, 4983, 4984, 4985, 4986, 4987, 4988, 4989, 4990, 4991, 5248, 5249, 5250, 5251, 5252, 5253, 5254, 5255, 5256, 5257, 5258, 5259, 5260, 5261, 5262, 5263, 5264, 5265, 5266, 5267, 5268, 5269, 5270, 5271, 5272, 5273, 5274, 5275, 5276, 5277, 5278, 5279, 5280, 5281, 5282, 5283, 5284, 5285, 5286, 5287, 5288, 5289, 5290, 5291, 5292, 5293, 5294, 5295, 5296, 5297, 5298, 5299, 5300, 5301, 5302, 5303, 5304, 5305, 5306, 5307, 5308, 5309, 5310, 5311, 5312, 5313, 5314, 5315, 5316, 5317, 5318, 5319, 5320, 5321, 5322, 5323, 5324, 5325, 5326, 5327, 5328, 5329, 5330, 5331, 5332, 5333, 5334, 5335, 5336, 5337, 5338, 5339, 5340, 5341, 5342, 5343, 5344, 5345, 5346, 5347, 5348, 5349, 5350, 5351, 5352, 5353, 5354, 5355, 5356, 5357, 5358, 5359, 5360, 5361, 5362, 5363, 5364, 5365, 5366, 5367, 5368, 5369, 5370, 5371, 5372, 5373, 5374, 5375, 3584, 3585, 3586, 3587, 3588, 3589, 3590, 3591, 3592, 3593, 3594, 3595, 3596, 3597, 3598, 3599, 3600, 3601, 3602, 3603, 3604, 3605, 3606, 3607, 3608, 3609, 3610, 3611, 3612, 3613, 3614, 3615, 3616, 3617, 3618, 3619, 3620, 3621, 3622, 3623, 3624, 3625, 3626, 3627, 3628, 3629, 3630, 3631, 3632, 3633, 3634, 3635, 3636, 3637, 3638, 3639, 3640, 3641, 3642, 3643, 3644, 3645, 3646, 3647, 3648, 3649, 3650, 3651, 3652, 3653, 3654, 3655, 3656, 3657, 3658, 3659, 3660, 3661, 3662, 3663, 3664, 3665, 3666, 3667, 3668, 3669, 3670, 3671, 3672, 3673, 3674, 3675, 3676, 3677, 3678, 3679, 3680, 3681, 3682, 3683, 3684, 3685, 3686, 3687, 3688, 3689, 3690, 3691, 3692, 3693, 3694, 3695, 3696, 3697, 3698, 3699, 3700, 3701, 3702, 3703, 3704, 3705, 3706, 3707, 3708, 3709, 3710, 3711, 5376, 5377, 5378, 5379, 5380, 5381, 5382, 5383, 5384, 5385, 5386, 5387, 5388, 5389, 5390, 5391, 5392, 5393, 5394, 5395, 5396, 5397, 5398, 5399, 5400, 5401, 5402, 5403, 5404, 5405, 5406, 5407, 5408, 5409, 5410, 5411, 5412, 5413, 5414, 5415, 5416, 5417, 5418, 5419, 5420, 5421, 5422, 5423, 5424, 5425, 5426, 5427, 5428, 5429, 5430, 5431, 5432, 5433, 5434, 5435, 5436, 5437, 5438, 5439, 5440, 5441, 5442, 5443, 5444, 5445, 5446, 5447, 5448, 5449, 5450, 5451, 5452, 5453, 5454, 5455, 5456, 5457, 5458, 5459, 5460, 5461, 5462, 5463, 5464, 5465, 5466, 5467, 5468, 5469, 5470, 5471, 5472, 5473, 5474, 5475, 5476, 5477, 5478, 5479, 5480, 5481, 5482, 5483, 5484, 5485, 5486, 5487, 5488, 5489, 5490, 5491, 5492, 5493, 5494, 5495, 5496, 5497, 5498, 5499, 5500, 5501, 5502, 5503, 1920, 1921, 1922, 1923, 1924, 1925, 1926, 1927, 1928, 1929, 1930, 1931, 1932, 1933, 1934, 1935, 1936, 1937, 1938, 1939, 1940, 1941, 1942, 1943, 1944, 1945, 1946, 1947, 1948, 1949, 1950, 1951, 1952, 1953, 1954, 1955, 1956, 1957, 1958, 1959, 1960, 1961, 1962, 1963, 1964, 1965, 1966, 1967, 1968, 1969, 1970, 1971, 1972, 1973, 1974, 1975, 1976, 1977, 1978, 1979, 1980, 1981, 1982, 1983, 1984, 1985, 1986, 1987, 1988, 1989, 1990, 1991, 1992, 1993, 1994, 1995, 1996, 1997, 1998, 1999, 2000, 2001, 2002, 2003, 2004, 2005, 2006, 2007, 2008, 2009, 2010, 2011, 2012, 2013, 2014, 2015, 2016, 2017, 2018, 2019, 2020, 2021, 2022, 2023, 2024, 2025, 2026, 2027, 2028, 2029, 2030, 2031, 2032, 2033, 2034, 2035, 2036, 2037, 2038, 2039, 2040, 2041, 2042, 2043, 2044, 2045, 2046, 2047, 6272, 6273, 6274, 6275, 6276, 6277, 6278, 6279, 6280, 6281, 6282, 6283, 6284, 6285, 6286, 6287, 6288, 6289, 6290, 6291, 6292, 6293, 6294, 6295, 6296, 6297, 6298, 6299, 6300, 6301, 6302, 6303, 6304, 6305, 6306, 6307, 6308, 6309, 6310, 6311, 6312, 6313, 6314, 6315, 6316, 6317, 6318, 6319, 6320, 6321, 6322, 6323, 6324, 6325, 6326, 6327, 6328, 6329, 6330, 6331, 6332, 6333, 6334, 6335, 6336, 6337, 6338, 6339, 6340, 6341, 6342, 6343, 6344, 6345, 6346, 6347, 6348, 6349, 6350, 6351, 6352, 6353, 6354, 6355, 6356, 6357, 6358, 6359, 6360, 6361, 6362, 6363, 6364, 6365, 6366, 6367, 6368, 6369, 6370, 6371, 6372, 6373, 6374, 6375, 6376, 6377, 6378, 6379, 6380, 6381, 6382, 6383, 6384, 6385, 6386, 6387, 6388, 6389, 6390, 6391, 6392, 6393, 6394, 6395, 6396, 6397, 6398, 6399, 5632, 5633, 5634, 5635, 5636, 5637, 5638, 5639, 5640, 5641, 5642, 5643, 5644, 5645, 5646, 5647, 5648, 5649, 5650, 5651, 5652, 5653, 5654, 5655, 5656, 5657, 5658, 5659, 5660, 5661, 5662, 5663, 5664, 5665, 5666, 5667, 5668, 5669, 5670, 5671, 5672, 5673, 5674, 5675, 5676, 5677, 5678, 5679, 5680, 5681, 5682, 5683, 5684, 5685, 5686, 5687, 5688, 5689, 5690, 5691, 5692, 5693, 5694, 5695, 5696, 5697, 5698, 5699, 5700, 5701, 5702, 5703, 5704, 5705, 5706, 5707, 5708, 5709, 5710, 5711, 5712, 5713, 5714, 5715, 5716, 5717, 5718, 5719, 5720, 5721, 5722, 5723, 5724, 5725, 5726, 5727, 5728, 5729, 5730, 5731, 5732, 5733, 5734, 5735, 5736, 5737, 5738, 5739, 5740, 5741, 5742, 5743, 5744, 5745, 5746, 5747, 5748, 5749, 5750, 5751, 5752, 5753, 5754, 5755, 5756, 5757, 5758, 5759, 6400, 6401, 6402, 6403, 6404, 6405, 6406, 6407, 6408, 6409, 6410, 6411, 6412, 6413, 6414, 6415, 6416, 6417, 6418, 6419, 6420, 6421, 6422, 6423, 6424, 6425, 6426, 6427, 6428, 6429, 6430, 6431, 6432, 6433, 6434, 6435, 6436, 6437, 6438, 6439, 6440, 6441, 6442, 6443, 6444, 6445, 6446, 6447, 6448, 6449, 6450, 6451, 6452, 6453, 6454, 6455, 6456, 6457, 6458, 6459, 6460, 6461, 6462, 6463, 6464, 6465, 6466, 6467, 6468, 6469, 6470, 6471, 6472, 6473, 6474, 6475, 6476, 6477, 6478, 6479, 6480, 6481, 6482, 6483, 6484, 6485, 6486, 6487, 6488, 6489, 6490, 6491, 6492, 6493, 6494, 6495, 6496, 6497, 6498, 6499, 6500, 6501, 6502, 6503, 6504, 6505, 6506, 6507, 6508, 6509, 6510, 6511, 6512, 6513, 6514, 6515, 6516, 6517, 6518, 6519, 6520, 6521, 6522, 6523, 6524, 6525, 6526, 6527, 2944, 2945, 2946, 2947, 2948, 2949, 2950, 2951, 2952, 2953, 2954, 2955, 2956, 2957, 2958, 2959, 2960, 2961, 2962, 2963, 2964, 2965, 2966, 2967, 2968, 2969, 2970, 2971, 2972, 2973, 2974, 2975, 2976, 2977, 2978, 2979, 2980, 2981, 2982, 2983, 2984, 2985, 2986, 2987, 2988, 2989, 2990, 2991, 2992, 2993, 2994, 2995, 2996, 2997, 2998, 2999, 3000, 3001, 3002, 3003, 3004, 3005, 3006, 3007, 3008, 3009, 3010, 3011, 3012, 3013, 3014, 3015, 3016, 3017, 3018, 3019, 3020, 3021, 3022, 3023, 3024, 3025, 3026, 3027, 3028, 3029, 3030, 3031, 3032, 3033, 3034, 3035, 3036, 3037, 3038, 3039, 3040, 3041, 3042, 3043, 3044, 3045, 3046, 3047, 3048, 3049, 3050, 3051, 3052, 3053, 3054, 3055, 3056, 3057, 3058, 3059, 3060, 3061, 3062, 3063, 3064, 3065, 3066, 3067, 3068, 3069, 3070, 3071, 6656, 6657, 6658, 6659, 6660, 6661, 6662, 6663, 6664, 6665, 6666, 6667, 6668, 6669, 6670, 6671, 6672, 6673, 6674, 6675, 6676, 6677, 6678, 6679, 6680, 6681, 6682, 6683, 6684, 6685, 6686, 6687, 6688, 6689, 6690, 6691, 6692, 6693, 6694, 6695, 6696, 6697, 6698, 6699, 6700, 6701, 6702, 6703, 6704, 6705, 6706, 6707, 6708, 6709, 6710, 6711, 6712, 6713, 6714, 6715, 6716, 6717, 6718, 6719, 6720, 6721, 6722, 6723, 6724, 6725, 6726, 6727, 6728, 6729, 6730, 6731, 6732, 6733, 6734, 6735, 6736, 6737, 6738, 6739, 6740, 6741, 6742, 6743, 6744, 6745, 6746, 6747, 6748, 6749, 6750, 6751, 6752, 6753, 6754, 6755, 6756, 6757, 6758, 6759, 6760, 6761, 6762, 6763, 6764, 6765, 6766, 6767, 6768, 6769, 6770, 6771, 6772, 6773, 6774, 6775, 6776, 6777, 6778, 6779, 6780, 6781, 6782, 6783, 3456, 3457, 3458, 3459, 3460, 3461, 3462, 3463, 3464, 3465, 3466, 3467, 3468, 3469, 3470, 3471, 3472, 3473, 3474, 3475, 3476, 3477, 3478, 3479, 3480, 3481, 3482, 3483, 3484, 3485, 3486, 3487, 3488, 3489, 3490, 3491, 3492, 3493, 3494, 3495, 3496, 3497, 3498, 3499, 3500, 3501, 3502, 3503, 3504, 3505, 3506, 3507, 3508, 3509, 3510, 3511, 3512, 3513, 3514, 3515, 3516, 3517, 3518, 3519, 3520, 3521, 3522, 3523, 3524, 3525, 3526, 3527, 3528, 3529, 3530, 3531, 3532, 3533, 3534, 3535, 3536, 3537, 3538, 3539, 3540, 3541, 3542, 3543, 3544, 3545, 3546, 3547, 3548, 3549, 3550, 3551, 3552, 3553, 3554, 3555, 3556, 3557, 3558, 3559, 3560, 3561, 3562, 3563, 3564, 3565, 3566, 3567, 3568, 3569, 3570, 3571, 3572, 3573, 3574, 3575, 3576, 3577, 3578, 3579, 3580, 3581, 3582, 3583, 4992, 4993, 4994, 4995, 4996, 4997, 4998, 4999, 5000, 5001, 5002, 5003, 5004, 5005, 5006, 5007, 5008, 5009, 5010, 5011, 5012, 5013, 5014, 5015, 5016, 5017, 5018, 5019, 5020, 5021, 5022, 5023, 5024, 5025, 5026, 5027, 5028, 5029, 5030, 5031, 5032, 5033, 5034, 5035, 5036, 5037, 5038, 5039, 5040, 5041, 5042, 5043, 5044, 5045, 5046, 5047, 5048, 5049, 5050, 5051, 5052, 5053, 5054, 5055, 5056, 5057, 5058, 5059, 5060, 5061, 5062, 5063, 5064, 5065, 5066, 5067, 5068, 5069, 5070, 5071, 5072, 5073, 5074, 5075, 5076, 5077, 5078, 5079, 5080, 5081, 5082, 5083, 5084, 5085, 5086, 5087, 5088, 5089, 5090, 5091, 5092, 5093, 5094, 5095, 5096, 5097, 5098, 5099, 5100, 5101, 5102, 5103, 5104, 5105, 5106, 5107, 5108, 5109, 5110, 5111, 5112, 5113, 5114, 5115, 5116, 5117, 5118, 5119, 7168, 7169, 7170, 7171, 7172, 7173, 7174, 7175, 7176, 7177, 7178, 7179, 7180, 7181, 7182, 7183, 7184, 7185, 7186, 7187, 7188, 7189, 7190, 7191, 7192, 7193, 7194, 7195, 7196, 7197, 7198, 7199, 7200, 7201, 7202, 7203, 7204, 7205, 7206, 7207, 7208, 7209, 7210, 7211, 7212, 7213, 7214, 7215, 7216, 7217, 7218, 7219, 7220, 7221, 7222, 7223, 7224, 7225, 7226, 7227, 7228, 7229, 7230, 7231, 7232, 7233, 7234, 7235, 7236, 7237, 7238, 7239, 7240, 7241, 7242, 7243, 7244, 7245, 7246, 7247, 7248, 7249, 7250, 7251, 7252, 7253, 7254, 7255, 7256, 7257, 7258, 7259, 7260, 7261, 7262, 7263, 7264, 7265, 7266, 7267, 7268, 7269, 7270, 7271, 7272, 7273, 7274, 7275, 7276, 7277, 7278, 7279, 7280, 7281, 7282, 7283, 7284, 7285, 7286, 7287, 7288, 7289, 7290, 7291, 7292, 7293, 7294, 7295, 3712, 3713, 3714, 3715, 3716, 3717, 3718, 3719, 3720, 3721, 3722, 3723, 3724, 3725, 3726, 3727, 3728, 3729, 3730, 3731, 3732, 3733, 3734, 3735, 3736, 3737, 3738, 3739, 3740, 3741, 3742, 3743, 3744, 3745, 3746, 3747, 3748, 3749, 3750, 3751, 3752, 3753, 3754, 3755, 3756, 3757, 3758, 3759, 3760, 3761, 3762, 3763, 3764, 3765, 3766, 3767, 3768, 3769, 3770, 3771, 3772, 3773, 3774, 3775, 3776, 3777, 3778, 3779, 3780, 3781, 3782, 3783, 3784, 3785, 3786, 3787, 3788, 3789, 3790, 3791, 3792, 3793, 3794, 3795, 3796, 3797, 3798, 3799, 3800, 3801, 3802, 3803, 3804, 3805, 3806, 3807, 3808, 3809, 3810, 3811, 3812, 3813, 3814, 3815, 3816, 3817, 3818, 3819, 3820, 3821, 3822, 3823, 3824, 3825, 3826, 3827, 3828, 3829, 3830, 3831, 3832, 3833, 3834, 3835, 3836, 3837, 3838, 3839, 5504, 5505, 5506, 5507, 5508, 5509, 5510, 5511, 5512, 5513, 5514, 5515, 5516, 5517, 5518, 5519, 5520, 5521, 5522, 5523, 5524, 5525, 5526, 5527, 5528, 5529, 5530, 5531, 5532, 5533, 5534, 5535, 5536, 5537, 5538, 5539, 5540, 5541, 5542, 5543, 5544, 5545, 5546, 5547, 5548, 5549, 5550, 5551, 5552, 5553, 5554, 5555, 5556, 5557, 5558, 5559, 5560, 5561, 5562, 5563, 5564, 5565, 5566, 5567, 5568, 5569, 5570, 5571, 5572, 5573, 5574, 5575, 5576, 5577, 5578, 5579, 5580, 5581, 5582, 5583, 5584, 5585, 5586, 5587, 5588, 5589, 5590, 5591, 5592, 5593, 5594, 5595, 5596, 5597, 5598, 5599, 5600, 5601, 5602, 5603, 5604, 5605, 5606, 5607, 5608, 5609, 5610, 5611, 5612, 5613, 5614, 5615, 5616, 5617, 5618, 5619, 5620, 5621, 5622, 5623, 5624, 5625, 5626, 5627, 5628, 5629, 5630, 5631, 3840, 3841, 3842, 3843, 3844, 3845, 3846, 3847, 3848, 3849, 3850, 3851, 3852, 3853, 3854, 3855, 3856, 3857, 3858, 3859, 3860, 3861, 3862, 3863, 3864, 3865, 3866, 3867, 3868, 3869, 3870, 3871, 3872, 3873, 3874, 3875, 3876, 3877, 3878, 3879, 3880, 3881, 3882, 3883, 3884, 3885, 3886, 3887, 3888, 3889, 3890, 3891, 3892, 3893, 3894, 3895, 3896, 3897, 3898, 3899, 3900, 3901, 3902, 3903, 3904, 3905, 3906, 3907, 3908, 3909, 3910, 3911, 3912, 3913, 3914, 3915, 3916, 3917, 3918, 3919, 3920, 3921, 3922, 3923, 3924, 3925, 3926, 3927, 3928, 3929, 3930, 3931, 3932, 3933, 3934, 3935, 3936, 3937, 3938, 3939, 3940, 3941, 3942, 3943, 3944, 3945, 3946, 3947, 3948, 3949, 3950, 3951, 3952, 3953, 3954, 3955, 3956, 3957, 3958, 3959, 3960, 3961, 3962, 3963, 3964, 3965, 3966, 3967, 5760, 5761, 5762, 5763, 5764, 5765, 5766, 5767, 5768, 5769, 5770, 5771, 5772, 5773, 5774, 5775, 5776, 5777, 5778, 5779, 5780, 5781, 5782, 5783, 5784, 5785, 5786, 5787, 5788, 5789, 5790, 5791, 5792, 5793, 5794, 5795, 5796, 5797, 5798, 5799, 5800, 5801, 5802, 5803, 5804, 5805, 5806, 5807, 5808, 5809, 5810, 5811, 5812, 5813, 5814, 5815, 5816, 5817, 5818, 5819, 5820, 5821, 5822, 5823, 5824, 5825, 5826, 5827, 5828, 5829, 5830, 5831, 5832, 5833, 5834, 5835, 5836, 5837, 5838, 5839, 5840, 5841, 5842, 5843, 5844, 5845, 5846, 5847, 5848, 5849, 5850, 5851, 5852, 5853, 5854, 5855, 5856, 5857, 5858, 5859, 5860, 5861, 5862, 5863, 5864, 5865, 5866, 5867, 5868, 5869, 5870, 5871, 5872, 5873, 5874, 5875, 5876, 5877, 5878, 5879, 5880, 5881, 5882, 5883, 5884, 5885, 5886, 5887, 6528, 6529, 6530, 6531, 6532, 6533, 6534, 6535, 6536, 6537, 6538, 6539, 6540, 6541, 6542, 6543, 6544, 6545, 6546, 6547, 6548, 6549, 6550, 6551, 6552, 6553, 6554, 6555, 6556, 6557, 6558, 6559, 6560, 6561, 6562, 6563, 6564, 6565, 6566, 6567, 6568, 6569, 6570, 6571, 6572, 6573, 6574, 6575, 6576, 6577, 6578, 6579, 6580, 6581, 6582, 6583, 6584, 6585, 6586, 6587, 6588, 6589, 6590, 6591, 6592, 6593, 6594, 6595, 6596, 6597, 6598, 6599, 6600, 6601, 6602, 6603, 6604, 6605, 6606, 6607, 6608, 6609, 6610, 6611, 6612, 6613, 6614, 6615, 6616, 6617, 6618, 6619, 6620, 6621, 6622, 6623, 6624, 6625, 6626, 6627, 6628, 6629, 6630, 6631, 6632, 6633, 6634, 6635, 6636, 6637, 6638, 6639, 6640, 6641, 6642, 6643, 6644, 6645, 6646, 6647, 6648, 6649, 6650, 6651, 6652, 6653, 6654, 6655, 5888, 5889, 5890, 5891, 5892, 5893, 5894, 5895, 5896, 5897, 5898, 5899, 5900, 5901, 5902, 5903, 5904, 5905, 5906, 5907, 5908, 5909, 5910, 5911, 5912, 5913, 5914, 5915, 5916, 5917, 5918, 5919, 5920, 5921, 5922, 5923, 5924, 5925, 5926, 5927, 5928, 5929, 5930, 5931, 5932, 5933, 5934, 5935, 5936, 5937, 5938, 5939, 5940, 5941, 5942, 5943, 5944, 5945, 5946, 5947, 5948, 5949, 5950, 5951, 5952, 5953, 5954, 5955, 5956, 5957, 5958, 5959, 5960, 5961, 5962, 5963, 5964, 5965, 5966, 5967, 5968, 5969, 5970, 5971, 5972, 5973, 5974, 5975, 5976, 5977, 5978, 5979, 5980, 5981, 5982, 5983, 5984, 5985, 5986, 5987, 5988, 5989, 5990, 5991, 5992, 5993, 5994, 5995, 5996, 5997, 5998, 5999, 6000, 6001, 6002, 6003, 6004, 6005, 6006, 6007, 6008, 6009, 6010, 6011, 6012, 6013, 6014, 6015, 6784, 6785, 6786, 6787, 6788, 6789, 6790, 6791, 6792, 6793, 6794, 6795, 6796, 6797, 6798, 6799, 6800, 6801, 6802, 6803, 6804, 6805, 6806, 6807, 6808, 6809, 6810, 6811, 6812, 6813, 6814, 6815, 6816, 6817, 6818, 6819, 6820, 6821, 6822, 6823, 6824, 6825, 6826, 6827, 6828, 6829, 6830, 6831, 6832, 6833, 6834, 6835, 6836, 6837, 6838, 6839, 6840, 6841, 6842, 6843, 6844, 6845, 6846, 6847, 6848, 6849, 6850, 6851, 6852, 6853, 6854, 6855, 6856, 6857, 6858, 6859, 6860, 6861, 6862, 6863, 6864, 6865, 6866, 6867, 6868, 6869, 6870, 6871, 6872, 6873, 6874, 6875, 6876, 6877, 6878, 6879, 6880, 6881, 6882, 6883, 6884, 6885, 6886, 6887, 6888, 6889, 6890, 6891, 6892, 6893, 6894, 6895, 6896, 6897, 6898, 6899, 6900, 6901, 6902, 6903, 6904, 6905, 6906, 6907, 6908, 6909, 6910, 6911, 6912, 6913, 6914, 6915, 6916, 6917, 6918, 6919, 6920, 6921, 6922, 6923, 6924, 6925, 6926, 6927, 6928, 6929, 6930, 6931, 6932, 6933, 6934, 6935, 6936, 6937, 6938, 6939, 6940, 6941, 6942, 6943, 6944, 6945, 6946, 6947, 6948, 6949, 6950, 6951, 6952, 6953, 6954, 6955, 6956, 6957, 6958, 6959, 6960, 6961, 6962, 6963, 6964, 6965, 6966, 6967, 6968, 6969, 6970, 6971, 6972, 6973, 6974, 6975, 6976, 6977, 6978, 6979, 6980, 6981, 6982, 6983, 6984, 6985, 6986, 6987, 6988, 6989, 6990, 6991, 6992, 6993, 6994, 6995, 6996, 6997, 6998, 6999, 7000, 7001, 7002, 7003, 7004, 7005, 7006, 7007, 7008, 7009, 7010, 7011, 7012, 7013, 7014, 7015, 7016, 7017, 7018, 7019, 7020, 7021, 7022, 7023, 7024, 7025, 7026, 7027, 7028, 7029, 7030, 7031, 7032, 7033, 7034, 7035, 7036, 7037, 7038, 7039, 7296, 7297, 7298, 7299, 7300, 7301, 7302, 7303, 7304, 7305, 7306, 7307, 7308, 7309, 7310, 7311, 7312, 7313, 7314, 7315, 7316, 7317, 7318, 7319, 7320, 7321, 7322, 7323, 7324, 7325, 7326, 7327, 7328, 7329, 7330, 7331, 7332, 7333, 7334, 7335, 7336, 7337, 7338, 7339, 7340, 7341, 7342, 7343, 7344, 7345, 7346, 7347, 7348, 7349, 7350, 7351, 7352, 7353, 7354, 7355, 7356, 7357, 7358, 7359, 7360, 7361, 7362, 7363, 7364, 7365, 7366, 7367, 7368, 7369, 7370, 7371, 7372, 7373, 7374, 7375, 7376, 7377, 7378, 7379, 7380, 7381, 7382, 7383, 7384, 7385, 7386, 7387, 7388, 7389, 7390, 7391, 7392, 7393, 7394, 7395, 7396, 7397, 7398, 7399, 7400, 7401, 7402, 7403, 7404, 7405, 7406, 7407, 7408, 7409, 7410, 7411, 7412, 7413, 7414, 7415, 7416, 7417, 7418, 7419, 7420, 7421, 7422, 7423, 7424, 7425, 7426, 7427, 7428, 7429, 7430, 7431, 7432, 7433, 7434, 7435, 7436, 7437, 7438, 7439, 7440, 7441, 7442, 7443, 7444, 7445, 7446, 7447, 7448, 7449, 7450, 7451, 7452, 7453, 7454, 7455, 7456, 7457, 7458, 7459, 7460, 7461, 7462, 7463, 7464, 7465, 7466, 7467, 7468, 7469, 7470, 7471, 7472, 7473, 7474, 7475, 7476, 7477, 7478, 7479, 7480, 7481, 7482, 7483, 7484, 7485, 7486, 7487, 7488, 7489, 7490, 7491, 7492, 7493, 7494, 7495, 7496, 7497, 7498, 7499, 7500, 7501, 7502, 7503, 7504, 7505, 7506, 7507, 7508, 7509, 7510, 7511, 7512, 7513, 7514, 7515, 7516, 7517, 7518, 7519, 7520, 7521, 7522, 7523, 7524, 7525, 7526, 7527, 7528, 7529, 7530, 7531, 7532, 7533, 7534, 7535, 7536, 7537, 7538, 7539, 7540, 7541, 7542, 7543, 7544, 7545, 7546, 7547, 7548, 7549, 7550, 7551, 3968, 3969, 3970, 3971, 3972, 3973, 3974, 3975, 3976, 3977, 3978, 3979, 3980, 3981, 3982, 3983, 3984, 3985, 3986, 3987, 3988, 3989, 3990, 3991, 3992, 3993, 3994, 3995, 3996, 3997, 3998, 3999, 4000, 4001, 4002, 4003, 4004, 4005, 4006, 4007, 4008, 4009, 4010, 4011, 4012, 4013, 4014, 4015, 4016, 4017, 4018, 4019, 4020, 4021, 4022, 4023, 4024, 4025, 4026, 4027, 4028, 4029, 4030, 4031, 4032, 4033, 4034, 4035, 4036, 4037, 4038, 4039, 4040, 4041, 4042, 4043, 4044, 4045, 4046, 4047, 4048, 4049, 4050, 4051, 4052, 4053, 4054, 4055, 4056, 4057, 4058, 4059, 4060, 4061, 4062, 4063, 4064, 4065, 4066, 4067, 4068, 4069, 4070, 4071, 4072, 4073, 4074, 4075, 4076, 4077, 4078, 4079, 4080, 4081, 4082, 4083, 4084, 4085, 4086, 4087, 4088, 4089, 4090, 4091, 4092, 4093, 4094, 4095, 7680, 7681, 7682, 7683, 7684, 7685, 7686, 7687, 7688, 7689, 7690, 7691, 7692, 7693, 7694, 7695, 7696, 7697, 7698, 7699, 7700, 7701, 7702, 7703, 7704, 7705, 7706, 7707, 7708, 7709, 7710, 7711, 7712, 7713, 7714, 7715, 7716, 7717, 7718, 7719, 7720, 7721, 7722, 7723, 7724, 7725, 7726, 7727, 7728, 7729, 7730, 7731, 7732, 7733, 7734, 7735, 7736, 7737, 7738, 7739, 7740, 7741, 7742, 7743, 7744, 7745, 7746, 7747, 7748, 7749, 7750, 7751, 7752, 7753, 7754, 7755, 7756, 7757, 7758, 7759, 7760, 7761, 7762, 7763, 7764, 7765, 7766, 7767, 7768, 7769, 7770, 7771, 7772, 7773, 7774, 7775, 7776, 7777, 7778, 7779, 7780, 7781, 7782, 7783, 7784, 7785, 7786, 7787, 7788, 7789, 7790, 7791, 7792, 7793, 7794, 7795, 7796, 7797, 7798, 7799, 7800, 7801, 7802, 7803, 7804, 7805, 7806, 7807, 6016, 6017, 6018, 6019, 6020, 6021, 6022, 6023, 6024, 6025, 6026, 6027, 6028, 6029, 6030, 6031, 6032, 6033, 6034, 6035, 6036, 6037, 6038, 6039, 6040, 6041, 6042, 6043, 6044, 6045, 6046, 6047, 6048, 6049, 6050, 6051, 6052, 6053, 6054, 6055, 6056, 6057, 6058, 6059, 6060, 6061, 6062, 6063, 6064, 6065, 6066, 6067, 6068, 6069, 6070, 6071, 6072, 6073, 6074, 6075, 6076, 6077, 6078, 6079, 6080, 6081, 6082, 6083, 6084, 6085, 6086, 6087, 6088, 6089, 6090, 6091, 6092, 6093, 6094, 6095, 6096, 6097, 6098, 6099, 6100, 6101, 6102, 6103, 6104, 6105, 6106, 6107, 6108, 6109, 6110, 6111, 6112, 6113, 6114, 6115, 6116, 6117, 6118, 6119, 6120, 6121, 6122, 6123, 6124, 6125, 6126, 6127, 6128, 6129, 6130, 6131, 6132, 6133, 6134, 6135, 6136, 6137, 6138, 6139, 6140, 6141, 6142, 6143, 7040, 7041, 7042, 7043, 7044, 7045, 7046, 7047, 7048, 7049, 7050, 7051, 7052, 7053, 7054, 7055, 7056, 7057, 7058, 7059, 7060, 7061, 7062, 7063, 7064, 7065, 7066, 7067, 7068, 7069, 7070, 7071, 7072, 7073, 7074, 7075, 7076, 7077, 7078, 7079, 7080, 7081, 7082, 7083, 7084, 7085, 7086, 7087, 7088, 7089, 7090, 7091, 7092, 7093, 7094, 7095, 7096, 7097, 7098, 7099, 7100, 7101, 7102, 7103, 7104, 7105, 7106, 7107, 7108, 7109, 7110, 7111, 7112, 7113, 7114, 7115, 7116, 7117, 7118, 7119, 7120, 7121, 7122, 7123, 7124, 7125, 7126, 7127, 7128, 7129, 7130, 7131, 7132, 7133, 7134, 7135, 7136, 7137, 7138, 7139, 7140, 7141, 7142, 7143, 7144, 7145, 7146, 7147, 7148, 7149, 7150, 7151, 7152, 7153, 7154, 7155, 7156, 7157, 7158, 7159, 7160, 7161, 7162, 7163, 7164, 7165, 7166, 7167, 7552, 7553, 7554, 7555, 7556, 7557, 7558, 7559, 7560, 7561, 7562, 7563, 7564, 7565, 7566, 7567, 7568, 7569, 7570, 7571, 7572, 7573, 7574, 7575, 7576, 7577, 7578, 7579, 7580, 7581, 7582, 7583, 7584, 7585, 7586, 7587, 7588, 7589, 7590, 7591, 7592, 7593, 7594, 7595, 7596, 7597, 7598, 7599, 7600, 7601, 7602, 7603, 7604, 7605, 7606, 7607, 7608, 7609, 7610, 7611, 7612, 7613, 7614, 7615, 7616, 7617, 7618, 7619, 7620, 7621, 7622, 7623, 7624, 7625, 7626, 7627, 7628, 7629, 7630, 7631, 7632, 7633, 7634, 7635, 7636, 7637, 7638, 7639, 7640, 7641, 7642, 7643, 7644, 7645, 7646, 7647, 7648, 7649, 7650, 7651, 7652, 7653, 7654, 7655, 7656, 7657, 7658, 7659, 7660, 7661, 7662, 7663, 7664, 7665, 7666, 7667, 7668, 7669, 7670, 7671, 7672, 7673, 7674, 7675, 7676, 7677, 7678, 7679, 7808, 7809, 7810, 7811, 7812, 7813, 7814, 7815, 7816, 7817, 7818, 7819, 7820, 7821, 7822, 7823, 7824, 7825, 7826, 7827, 7828, 7829, 7830, 7831, 7832, 7833, 7834, 7835, 7836, 7837, 7838, 7839, 7840, 7841, 7842, 7843, 7844, 7845, 7846, 7847, 7848, 7849, 7850, 7851, 7852, 7853, 7854, 7855, 7856, 7857, 7858, 7859, 7860, 7861, 7862, 7863, 7864, 7865, 7866, 7867, 7868, 7869, 7870, 7871, 7872, 7873, 7874, 7875, 7876, 7877, 7878, 7879, 7880, 7881, 7882, 7883, 7884, 7885, 7886, 7887, 7888, 7889, 7890, 7891, 7892, 7893, 7894, 7895, 7896, 7897, 7898, 7899, 7900, 7901, 7902, 7903, 7904, 7905, 7906, 7907, 7908, 7909, 7910, 7911, 7912, 7913, 7914, 7915, 7916, 7917, 7918, 7919, 7920, 7921, 7922, 7923, 7924, 7925, 7926, 7927, 7928, 7929, 7930, 7931, 7932, 7933, 7934, 7935, 7936, 7937, 7938, 7939, 7940, 7941, 7942, 7943, 7944, 7945, 7946, 7947, 7948, 7949, 7950, 7951, 7952, 7953, 7954, 7955, 7956, 7957, 7958, 7959, 7960, 7961, 7962, 7963, 7964, 7965, 7966, 7967, 7968, 7969, 7970, 7971, 7972, 7973, 7974, 7975, 7976, 7977, 7978, 7979, 7980, 7981, 7982, 7983, 7984, 7985, 7986, 7987, 7988, 7989, 7990, 7991, 7992, 7993, 7994, 7995, 7996, 7997, 7998, 7999, 8000, 8001, 8002, 8003, 8004, 8005, 8006, 8007, 8008, 8009, 8010, 8011, 8012, 8013, 8014, 8015, 8016, 8017, 8018, 8019, 8020, 8021, 8022, 8023, 8024, 8025, 8026, 8027, 8028, 8029, 8030, 8031, 8032, 8033, 8034, 8035, 8036, 8037, 8038, 8039, 8040, 8041, 8042, 8043, 8044, 8045, 8046, 8047, 8048, 8049, 8050, 8051, 8052, 8053, 8054, 8055, 8056, 8057, 8058, 8059, 8060, 8061, 8062, 8063, 8064, 8065, 8066, 8067, 8068, 8069, 8070, 8071, 8072, 8073, 8074, 8075, 8076, 8077, 8078, 8079, 8080, 8081, 8082, 8083, 8084, 8085, 8086, 8087, 8088, 8089, 8090, 8091, 8092, 8093, 8094, 8095, 8096, 8097, 8098, 8099, 8100, 8101, 8102, 8103, 8104, 8105, 8106, 8107, 8108, 8109, 8110, 8111, 8112, 8113, 8114, 8115, 8116, 8117, 8118, 8119, 8120, 8121, 8122, 8123, 8124, 8125, 8126, 8127, 8128, 8129, 8130, 8131, 8132, 8133, 8134, 8135, 8136, 8137, 8138, 8139, 8140, 8141, 8142, 8143, 8144, 8145, 8146, 8147, 8148, 8149, 8150, 8151, 8152, 8153, 8154, 8155, 8156, 8157, 8158, 8159, 8160, 8161, 8162, 8163, 8164, 8165, 8166, 8167, 8168, 8169, 8170, 8171, 8172, 8173, 8174, 8175, 8176, 8177, 8178, 8179, 8180, 8181, 8182, 8183, 8184, 8185, 8186, 8187, 8188, 8189, 8190, 8191].

Sequence 2:

Punc_Q_half=[0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 512, 513, 514, 515, 516, 517, 518, 519, 520, 521, 522, 523, 524, 525, 526, 527, 528, 529, 530, 531, 532, 533, 534, 535, 536, 537, 538, 539, 540, 541, 542, 543, 544, 545, 546, 547, 548, 549, 550, 551, 552, 553, 554, 555, 556, 557, 558, 559, 560, 561, 562, 563, 564, 565, 566, 567, 568, 569, 570, 571, 572, 573, 574, 575, 576, 577, 578, 579, 580, 581, 582, 583, 584, 585, 586, 587, 588, 589, 590, 591, 592, 593, 594, 595, 596, 597, 598, 599, 600, 601, 602, 603, 604, 605, 606, 607, 608, 609, 610, 611, 612, 613, 614, 615, 616, 617, 618, 619, 620, 621, 622, 623, 624, 625, 626, 627, 628, 629, 630, 631, 632, 633, 634, 635, 636, 637, 638, 639, 1024, 1025, 1026, 1027, 1028, 1029, 1030, 1031, 1032, 1033, 1034, 1035, 1036, 1037, 1038, 1039, 1040, 1041, 1042, 1043, 1044, 1045, 1046, 1047, 1048, 1049, 1050, 1051, 1052, 1053, 1054, 1055, 1056, 1057, 1058, 1059, 1060, 1061, 1062, 1063, 1064, 1065, 1066, 1067, 1068, 1069, 1070, 1071, 1072, 1073, 1074, 1075, 1076, 1077, 1078, 1079, 1080, 1081, 1082, 1083, 1084, 1085, 1086, 1087, 1088, 1089, 1090, 1091, 1092, 1093, 1094, 1095, 1096, 1097, 1098, 1099, 1100, 1101, 1102, 1103, 1104, 1105, 1106, 1107, 1108, 1109, 1110, 1111, 1112, 1113, 1114, 1115, 1116, 1117, 1118, 1119, 1120, 1121, 1122, 1123, 1124, 1125, 1126, 1127, 1128, 1129, 1130, 1131, 1132, 1133, 1134, 1135, 1136, 1137, 1138, 1139, 1140, 1141, 1142, 1143, 1144, 1145, 1146, 1147, 1148, 1149, 1150, 1151, 2048, 2049, 2050, 2051, 2052, 2053, 2054, 2055, 2056, 2057, 2058, 2059, 2060, 2061, 2062, 2063, 2064, 2065, 2066, 2067, 2068, 2069, 2070, 2071, 2072, 2073, 2074, 2075, 2076, 2077, 2078, 2079, 2080, 2081, 2082, 2083, 2084, 2085, 2086, 2087, 2088, 2089, 2090, 2091, 2092, 2093, 2094, 2095, 2096, 2097, 2098, 2099, 2100, 2101, 2102, 2103, 2104, 2105, 2106, 2107, 2108, 2109, 2110, 2111, 2112, 2113, 2114, 2115, 2116, 2117, 2118, 2119, 2120, 2121, 2122, 2123, 2124, 2125, 2126, 2127, 2128, 2129, 2130, 2131, 2132, 2133, 2134, 2135, 2136, 2137, 2138, 2139, 2140, 2141, 2142, 2143, 2144, 2145, 2146, 2147, 2148, 2149, 2150, 2151, 2152, 2153, 2154, 2155, 2156, 2157, 2158, 2159, 2160, 2161, 2162, 2163, 2164, 2165, 2166, 2167, 2168, 2169, 2170, 2171, 2172, 2173, 2174, 2175, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 501, 502, 503, 504, 505, 506, 507, 508, 509, 510, 511, 4096, 4097, 4098, 4099, 4100, 4101, 4102, 4103, 4104, 4105, 4106, 4107, 4108, 4109, 4110, 4111, 4112, 4113, 4114, 4115, 4116, 4117, 4118, 4119, 4120, 4121, 4122, 4123, 4124, 4125, 4126, 4127, 4128, 4129, 4130, 4131, 4132, 4133, 4134, 4135, 4136, 4137, 4138, 4139, 4140, 4141, 4142, 4143, 4144, 4145, 4146, 4147, 4148, 4149, 4150, 4151, 4152, 4153, 4154, 4155, 4156, 4157, 4158, 4159, 4160, 4161, 4162, 4163, 4164, 4165, 4166, 4167, 4168, 4169, 4170, 4171, 4172, 4173, 4174, 4175, 4176, 4177, 4178, 4179, 4180, 4181, 4182, 4183, 4184, 4185, 4186, 4187, 4188, 4189, 4190, 4191, 4192, 4193, 4194, 4195, 4196, 4197, 4198, 4199, 4200, 4201, 4202, 4203, 4204, 4205, 4206, 4207, 4208, 4209, 4210, 4211, 4212, 4213, 4214, 4215, 4216, 4217, 4218, 4219, 4220, 4221, 4222, 4223, 640, 641, 642, 643, 644, 645, 646, 647, 648, 649, 650, 651, 652, 653, 654, 655, 656, 657, 658, 659, 660, 661, 662, 663, 664, 665, 666, 667, 668, 669, 670, 671, 672, 673, 674, 675, 676, 677, 678, 679, 680, 681, 682, 683, 684, 685, 686, 687, 688, 689, 690, 691, 692, 693, 694, 695, 696, 697, 698, 699, 700, 701, 702, 703, 704, 705, 706, 707, 708, 709, 710, 711, 712, 713, 714, 715, 716, 717, 718, 719, 720, 721, 722, 723, 724, 725, 726, 727, 728, 729, 730, 731, 732, 733, 734, 735, 736, 737, 738, 739, 740, 741, 742, 743, 744, 745, 746, 747, 748, 749, 750, 751, 752, 753, 754, 755, 756, 757, 758, 759, 760, 761, 762, 763, 764, 765, 766, 767, 768, 769, 770, 771, 772, 773, 774, 775, 776, 777, 778, 779, 780, 781, 782, 783, 784, 785, 786, 787, 788, 789, 790, 791, 792, 793, 794, 795, 796, 797, 798, 799, 800, 801, 802, 803, 804, 805, 806, 807, 808, 809, 810, 811, 812, 813, 814, 815, 816, 817, 818, 819, 820, 821, 822, 823, 824, 825, 826, 827, 828, 829, 830, 831, 832, 833, 834, 835, 836, 837, 838, 839, 840, 841, 842, 843, 844, 845, 846, 847, 848, 849, 850, 851, 852, 853, 854, 855, 856, 857, 858, 859, 860, 861, 862, 863, 864, 865, 866, 867, 868, 869, 870, 871, 872, 873, 874, 875, 876, 877, 878, 879, 880, 881, 882, 883, 884, 885, 886, 887, 888, 889, 890, 891, 892, 893, 894, 895, 1152, 1153, 1154, 1155, 1156, 1157, 1158, 1159, 1160, 1161, 1162, 1163, 1164, 1165, 1166, 1167, 1168, 1169, 1170, 1171, 1172, 1173, 1174, 1175, 1176, 1177, 1178, 1179, 1180, 1181, 1182, 1183, 1184, 1185, 1186, 1187, 1188, 1189, 1190, 1191, 1192, 1193, 1194, 1195, 1196, 1197, 1198, 1199, 1200, 1201, 1202, 1203, 1204, 1205, 1206, 1207, 1208, 1209, 1210, 1211, 1212, 1213, 1214, 1215, 1216, 1217, 1218, 1219, 1220, 1221, 1222, 1223, 1224, 1225, 1226, 1227, 1228, 1229, 1230, 1231, 1232, 1233, 1234, 1235, 1236, 1237, 1238, 1239, 1240, 1241, 1242, 1243, 1244, 1245, 1246, 1247, 1248, 1249, 1250, 1251, 1252, 1253, 1254, 1255, 1256, 1257, 1258, 1259, 1260, 1261, 1262, 1263, 1264, 1265, 1266, 1267, 1268, 1269, 1270, 1271, 1272, 1273, 1274, 1275, 1276, 1277, 1278, 1279, 1280, 1281, 1282, 1283, 1284, 1285, 1286, 1287, 1288, 1289, 1290, 1291, 1292, 1293, 1294, 1295, 1296, 1297, 1298, 1299, 1300, 1301, 1302, 1303, 1304, 1305, 1306, 1307, 1308, 1309, 1310, 1311, 1312, 1313, 1314, 1315, 1316, 1317, 1318, 1319, 1320, 1321, 1322, 1323, 1324, 1325, 1326, 1327, 1328, 1329, 1330, 1331, 1332, 1333, 1334, 1335, 1336, 1337, 1338, 1339, 1340, 1341, 1342, 1343, 1344, 1345, 1346, 1347, 1348, 1349, 1350, 1351, 1352, 1353, 1354, 1355, 1356, 1357, 1358, 1359, 1360, 1361, 1362, 1363, 1364, 1365, 1366, 1367, 1368, 1369, 1370, 1371, 1372, 1373, 1374, 1375, 1376, 1377, 1378, 1379, 1380, 1381, 1382, 1383, 1384, 1385, 1386, 1387, 1388, 1389, 1390, 1391, 1392, 1393, 1394, 1395, 1396, 1397, 1398, 1399, 1400, 1401, 1402, 1403, 1404, 1405, 1406, 1407, 2176, 2177, 2178, 2179, 2180, 2181, 2182, 2183, 2184, 2185, 2186, 2187, 2188, 2189, 2190, 2191, 2192, 2193, 2194, 2195, 2196, 2197, 2198, 2199, 2200, 2201, 2202, 2203, 2204, 2205, 2206, 2207, 2208, 2209, 2210, 2211, 2212, 2213, 2214, 2215, 2216, 2217, 2218, 2219, 2220, 2221, 2222, 2223, 2224, 2225, 2226, 2227, 2228, 2229, 2230, 2231, 2232, 2233, 2234, 2235, 2236, 2237, 2238, 2239, 2240, 2241, 2242, 2243, 2244, 2245, 2246, 2247, 2248, 2249, 2250, 2251, 2252, 2253, 2254, 2255, 2256, 2257, 2258, 2259, 2260, 2261, 2262, 2263, 2264, 2265, 2266, 2267, 2268, 2269, 2270, 2271, 2272, 2273, 2274, 2275, 2276, 2277, 2278, 2279, 2280, 2281, 2282, 2283, 2284, 2285, 2286, 2287, 2288, 2289, 2290, 2291, 2292, 2293, 2294, 2295, 2296, 2297, 2298, 2299, 2300, 2301, 2302, 2303, 1536, 1537, 1538, 1539, 1540, 1541, 1542, 1543, 1544, 1545, 1546, 1547, 1548, 1549, 1550, 1551, 1552, 1553, 1554, 1555, 1556, 1557, 1558, 1559, 1560, 1561, 1562, 1563, 1564, 1565, 1566, 1567, 1568, 1569, 1570, 1571, 1572, 1573, 1574, 1575, 1576, 1577, 1578, 1579, 1580, 1581, 1582, 1583, 1584, 1585, 1586, 1587, 1588, 1589, 1590, 1591, 1592, 1593, 1594, 1595, 1596, 1597, 1598, 1599, 1600, 1601, 1602, 1603, 1604, 1605, 1606, 1607, 1608, 1609, 1610, 1611, 1612, 1613, 1614, 1615, 1616, 1617, 1618, 1619, 1620, 1621, 1622, 1623, 1624, 1625, 1626, 1627, 1628, 1629, 1630, 1631, 1632, 1633, 1634, 1635, 1636, 1637, 1638, 1639, 1640, 1641, 1642, 1643, 1644, 1645, 1646, 1647, 1648, 1649, 1650, 1651, 1652, 1653, 1654, 1655, 1656, 1657, 1658, 1659, 1660, 1661, 1662, 1663, 2304, 2305, 2306, 2307, 2308, 2309, 2310, 2311, 2312, 2313, 2314, 2315, 2316, 2317, 2318, 2319, 2320, 2321, 2322, 2323, 2324, 2325, 2326, 2327, 2328, 2329, 2330, 2331, 2332, 2333, 2334, 2335, 2336, 2337, 2338, 2339, 2340, 2341, 2342, 2343, 2344, 2345, 2346, 2347, 2348, 2349, 2350, 2351, 2352, 2353, 2354, 2355, 2356, 2357, 2358, 2359, 2360, 2361, 2362, 2363, 2364, 2365, 2366, 2367, 2368, 2369, 2370, 2371, 2372, 2373, 2374, 2375, 2376, 2377, 2378, 2379, 2380, 2381, 2382, 2383, 2384, 2385, 2386, 2387, 2388, 2389, 2390, 2391, 2392, 2393, 2394, 2395, 2396, 2397, 2398, 2399, 2400, 2401, 2402, 2403, 2404, 2405, 2406, 2407, 2408, 2409, 2410, 2411, 2412, 2413, 2414, 2415, 2416, 2417, 2418, 2419, 2420, 2421, 2422, 2423, 2424, 2425, 2426, 2427, 2428, 2429, 2430, 2431, 4224, 4225, 4226, 4227, 4228, 4229, 4230, 4231, 4232, 4233, 4234, 4235, 4236, 4237, 4238, 4239, 4240, 4241, 4242, 4243, 4244, 4245, 4246, 4247, 4248, 4249, 4250, 4251, 4252, 4253, 4254, 4255, 4256, 4257, 4258, 4259, 4260, 4261, 4262, 4263, 4264, 4265, 4266, 4267, 4268, 4269, 4270, 4271, 4272, 4273, 4274, 4275, 4276, 4277, 4278, 4279, 4280, 4281, 4282, 4283, 4284, 4285, 4286, 4287, 4288, 4289, 4290, 4291, 4292, 4293, 4294, 4295, 4296, 4297, 4298, 4299, 4300, 4301, 4302, 4303, 4304, 4305, 4306, 4307, 4308, 4309, 4310, 4311, 4312, 4313, 4314, 4315, 4316, 4317, 4318, 4319, 4320, 4321, 4322, 4323, 4324, 4325, 4326, 4327, 4328, 4329, 4330, 4331, 4332, 4333, 4334, 4335, 4336, 4337, 4338, 4339, 4340, 4341, 4342, 4343, 4344, 4345, 4346, 4347, 4348, 4349, 4350, 4351, 2560, 2561, 2562, 2563, 2564, 2565, 2566, 2567, 2568, 2569, 2570, 2571, 2572, 2573, 2574, 2575, 2576, 2577, 2578, 2579, 2580, 2581, 2582, 2583, 2584, 2585, 2586, 2587, 2588, 2589, 2590, 2591, 2592, 2593, 2594, 2595, 2596, 2597, 2598, 2599, 2600, 2601, 2602, 2603, 2604, 2605, 2606, 2607, 2608, 2609, 2610, 2611, 2612, 2613, 2614, 2615, 2616, 2617, 2618, 2619, 2620, 2621, 2622, 2623, 2624, 2625, 2626, 2627, 2628, 2629, 2630, 2631, 2632, 2633, 2634, 2635, 2636, 2637, 2638, 2639, 2640, 2641, 2642, 2643, 2644, 2645, 2646, 2647, 2648, 2649, 2650, 2651, 2652, 2653, 2654, 2655, 2656, 2657, 2658, 2659, 2660, 2661, 2662, 2663, 2664, 2665, 2666, 2667, 2668, 2669, 2670, 2671, 2672, 2673, 2674, 2675, 2676, 2677, 2678, 2679, 2680, 2681, 2682, 2683, 2684, 2685, 2686, 2687, 4352, 4353, 4354, 4355, 4356, 4357, 4358, 4359, 4360, 4361, 4362, 4363, 4364, 4365, 4366, 4367, 4368, 4369, 4370, 4371, 4372, 4373, 4374, 4375, 4376, 4377, 4378, 4379, 4380, 4381, 4382, 4383, 4384, 4385, 4386, 4387, 4388, 4389, 4390, 4391, 4392, 4393, 4394, 4395, 4396, 4397, 4398, 4399, 4400, 4401, 4402, 4403, 4404, 4405, 4406, 4407, 4408, 4409, 4410, 4411, 4412, 4413, 4414, 4415, 4416, 4417, 4418, 4419, 4420, 4421, 4422, 4423, 4424, 4425, 4426, 4427, 4428, 4429, 4430, 4431, 4432, 4433, 4434, 4435, 4436, 4437, 4438, 4439, 4440, 4441, 4442, 4443, 4444, 4445, 4446, 4447, 4448, 4449, 4450, 4451, 4452, 4453, 4454, 4455, 4456, 4457, 4458, 4459, 4460, 4461, 4462, 4463, 4464, 4465, 4466, 4467, 4468, 4469, 4470, 4471, 4472, 4473, 4474, 4475, 4476, 4477, 4478, 4479, 896, 897, 898, 899, 900, 901, 902, 903, 904, 905, 906, 907, 908, 909, 910, 911, 912, 913, 914, 915, 916, 917, 918, 919, 920, 921, 922, 923, 924, 925, 926, 927, 928, 929, 930, 931, 932, 933, 934, 935, 936, 937, 938, 939, 940, 941, 942, 943, 944, 945, 946, 947, 948, 949, 950, 951, 952, 953, 954, 955, 956, 957, 958, 959, 960, 961, 962, 963, 964, 965, 966, 967, 968, 969, 970, 971, 972, 973, 974, 975, 976, 977, 978, 979, 980, 981, 982, 983, 984, 985, 986, 987, 988, 989, 990, 991, 992, 993, 994, 995, 996, 997, 998, 999, 1000, 1001, 1002, 1003, 1004, 1005, 1006, 1007, 1008, 1009, 1010, 1011, 1012, 1013, 1014, 1015, 1016, 1017, 1018, 1019, 1020, 1021, 1022, 1023, 3072, 3073, 3074, 3075, 3076, 3077, 3078, 3079, 3080, 3081, 3082, 3083, 3084, 3085, 3086, 3087, 3088, 3089, 3090, 3091, 3092, 3093, 3094, 3095, 3096, 3097, 3098, 3099, 3100, 3101, 3102, 3103, 3104, 3105, 3106, 3107, 3108, 3109, 3110, 3111, 3112, 3113, 3114, 3115, 3116, 3117, 3118, 3119, 3120, 3121, 3122, 3123, 3124, 3125, 3126, 3127, 3128, 3129, 3130, 3131, 3132, 3133, 3134, 3135, 3136, 3137, 3138, 3139, 3140, 3141, 3142, 3143, 3144, 3145, 3146, 3147, 3148, 3149, 3150, 3151, 3152, 3153, 3154, 3155, 3156, 3157, 3158, 3159, 3160, 3161, 3162, 3163, 3164, 3165, 3166, 3167, 3168, 3169, 3170, 3171, 3172, 3173, 3174, 3175, 3176, 3177, 3178, 3179, 3180, 3181, 3182, 3183, 3184, 3185, 3186, 3187, 3188, 3189, 3190, 3191, 3192, 3193, 3194, 3195, 3196, 3197, 3198, 3199, 4608, 4609, 4610, 4611, 4612, 4613, 4614, 4615, 4616, 4617, 4618, 4619, 4620, 4621, 4622, 4623, 4624, 4625, 4626, 4627, 4628, 4629, 4630, 4631, 4632, 4633, 4634, 4635, 4636, 4637, 4638, 4639, 4640, 4641, 4642, 4643, 4644, 4645, 4646, 4647, 4648, 4649, 4650, 4651, 4652, 4653, 4654, 4655, 4656, 4657, 4658, 4659, 4660, 4661, 4662, 4663, 4664, 4665, 4666, 4667, 4668, 4669, 4670, 4671, 4672, 4673, 4674, 4675, 4676, 4677, 4678, 4679, 4680, 4681, 4682, 4683, 4684, 4685, 4686, 4687, 4688, 4689, 4690, 4691, 4692, 4693, 4694, 4695, 4696, 4697, 4698, 4699, 4700, 4701, 4702, 4703, 4704, 4705, 4706, 4707, 4708, 4709, 4710, 4711, 4712, 4713, 4714, 4715, 4716, 4717, 4718, 4719, 4720, 4721, 4722, 4723, 4724, 4725, 4726, 4727, 4728, 4729, 4730, 4731, 4732, 4733, 4734, 4735, 1408, 1409, 1410, 1411, 1412, 1413, 1414, 1415, 1416, 1417, 1418, 1419, 1420, 1421, 1422, 1423, 1424, 1425, 1426, 1427, 1428, 1429, 1430, 1431, 1432, 1433, 1434, 1435, 1436, 1437, 1438, 1439, 1440, 1441, 1442, 1443, 1444, 1445, 1446, 1447, 1448, 1449, 1450, 1451, 1452, 1453, 1454, 1455, 1456, 1457, 1458, 1459, 1460, 1461, 1462, 1463, 1464, 1465, 1466, 1467, 1468, 1469, 1470, 1471, 1472, 1473, 1474, 1475, 1476, 1477, 1478, 1479, 1480, 1481, 1482, 1483, 1484, 1485, 1486, 1487, 1488, 1489, 1490, 1491, 1492, 1493, 1494, 1495, 1496, 1497, 1498, 1499, 1500, 1501, 1502, 1503, 1504, 1505, 1506, 1507, 1508, 1509, 1510, 1511, 1512, 1513, 1514, 1515, 1516, 1517, 1518, 1519, 1520, 1521, 1522, 1523, 1524, 1525, 1526, 1527, 1528, 1529, 1530, 1531, 1532, 1533, 1534, 1535, 5120, 5121, 5122, 5123, 5124, 5125, 5126, 5127, 5128, 5129, 5130, 5131, 5132, 5133, 5134, 5135, 5136, 5137, 5138, 5139, 5140, 5141, 5142, 5143, 5144, 5145, 5146, 5147, 5148, 5149, 5150, 5151, 5152, 5153, 5154, 5155, 5156, 5157, 5158, 5159, 5160, 5161, 5162, 5163, 5164, 5165, 5166, 5167, 5168, 5169, 5170, 5171, 5172, 5173, 5174, 5175, 5176, 5177, 5178, 5179, 5180, 5181, 5182, 5183, 5184, 5185, 5186, 5187, 5188, 5189, 5190, 5191, 5192, 5193, 5194, 5195, 5196, 5197, 5198, 5199, 5200, 5201, 5202, 5203, 5204, 5205, 5206, 5207, 5208, 5209, 5210, 5211, 5212, 5213, 5214, 5215, 5216, 5217, 5218, 5219, 5220, 5221, 5222, 5223, 5224, 5225, 5226, 5227, 5228, 5229, 5230, 5231, 5232, 5233, 5234, 5235, 5236, 5237, 5238, 5239, 5240, 5241, 5242, 5243, 5244, 5245, 5246, 5247, 1664, 1665, 1666, 1667, 1668, 1669, 1670, 1671, 1672, 1673, 1674, 1675, 1676, 1677, 1678, 1679, 1680, 1681, 1682, 1683, 1684, 1685, 1686, 1687, 1688, 1689, 1690, 1691, 1692, 1693, 1694, 1695, 1696, 1697, 1698, 1699, 1700, 1701, 1702, 1703, 1704, 1705, 1706, 1707, 1708, 1709, 1710, 1711, 1712, 1713, 1714, 1715, 1716, 1717, 1718, 1719, 1720, 1721, 1722, 1723, 1724, 1725, 1726, 1727, 1728, 1729, 1730, 1731, 1732, 1733, 1734, 1735, 1736, 1737, 1738, 1739, 1740, 1741, 1742, 1743, 1744, 1745, 1746, 1747, 1748, 1749, 1750, 1751, 1752, 1753, 1754, 1755, 1756, 1757, 1758, 1759, 1760, 1761, 1762, 1763, 1764, 1765, 1766, 1767, 1768, 1769, 1770, 1771, 1772, 1773, 1774, 1775, 1776, 1777, 1778, 1779, 1780, 1781, 1782, 1783, 1784, 1785, 1786, 1787, 1788, 1789, 1790, 1791, 2432, 2433, 2434, 2435, 2436, 2437, 2438, 2439, 2440, 2441, 2442, 2443, 2444, 2445, 2446, 2447, 2448, 2449, 2450, 2451, 2452, 2453, 2454, 2455, 2456, 2457, 2458, 2459, 2460, 2461, 2462, 2463, 2464, 2465, 2466, 2467, 2468, 2469, 2470, 2471, 2472, 2473, 2474, 2475, 2476, 2477, 2478, 2479, 2480, 2481, 2482, 2483, 2484, 2485, 2486, 2487, 2488, 2489, 2490, 2491, 2492, 2493, 2494, 2495, 2496, 2497, 2498, 2499, 2500, 2501, 2502, 2503, 2504, 2505, 2506, 2507, 2508, 2509, 2510, 2511, 2512, 2513, 2514, 2515, 2516, 2517, 2518, 2519, 2520, 2521, 2522, 2523, 2524, 2525, 2526, 2527, 2528, 2529, 2530, 2531, 2532, 2533, 2534, 2535, 2536, 2537, 2538, 2539, 2540, 2541, 2542, 2543, 2544, 2545, 2546, 2547, 2548, 2549, 2550, 2551, 2552, 2553, 2554, 2555, 2556, 2557, 2558, 2559, 1792, 1793, 1794, 1795, 1796, 1797, 1798, 1799, 1800, 1801, 1802, 1803, 1804, 1805, 1806, 1807, 1808, 1809, 1810, 1811, 1812, 1813, 1814, 1815, 1816, 1817, 1818, 1819, 1820, 1821, 1822, 1823, 1824, 1825, 1826, 1827, 1828, 1829, 1830, 1831, 1832, 1833, 1834, 1835, 1836, 1837, 1838, 1839, 1840, 1841, 1842, 1843, 1844, 1845, 1846, 1847, 1848, 1849, 1850, 1851, 1852, 1853, 1854, 1855, 1856, 1857, 1858, 1859, 1860, 1861, 1862, 1863, 1864, 1865, 1866, 1867, 1868, 1869, 1870, 1871, 1872, 1873, 1874, 1875, 1876, 1877, 1878, 1879, 1880, 1881, 1882, 1883, 1884, 1885, 1886, 1887, 1888, 1889, 1890, 1891, 1892, 1893, 1894, 1895, 1896, 1897, 1898, 1899, 1900, 1901, 1902, 1903, 1904, 1905, 1906, 1907, 1908, 1909, 1910, 1911, 1912, 1913, 1914, 1915, 1916, 1917, 1918, 1919, 6144, 6145, 6146, 6147, 6148, 6149, 6150, 6151, 6152, 6153, 6154, 6155, 6156, 6157, 6158, 6159, 6160, 6161, 6162, 6163, 6164, 6165, 6166, 6167, 6168, 6169, 6170, 6171, 6172, 6173, 6174, 6175, 6176, 6177, 6178, 6179, 6180, 6181, 6182, 6183, 6184, 6185, 6186, 6187, 6188, 6189, 6190, 6191, 6192, 6193, 6194, 6195, 6196, 6197, 6198, 6199, 6200, 6201, 6202, 6203, 6204, 6205, 6206, 6207, 6208, 6209, 6210, 6211, 6212, 6213, 6214, 6215, 6216, 6217, 6218, 6219, 6220, 6221, 6222, 6223, 6224, 6225, 6226, 6227, 6228, 6229, 6230, 6231, 6232, 6233, 6234, 6235, 6236, 6237, 6238, 6239, 6240, 6241, 6242, 6243, 6244, 6245, 6246, 6247, 6248, 6249, 6250, 6251, 6252, 6253, 6254, 6255, 6256, 6257, 6258, 6259, 6260, 6261, 6262, 6263, 6264, 6265, 6266, 6267, 6268, 6269, 6270, 6271, 2688, 2689, 2690, 2691, 2692, 2693, 2694, 2695, 2696, 2697, 2698, 2699, 2700, 2701, 2702, 2703, 2704, 2705, 2706, 2707, 2708, 2709, 2710, 2711, 2712, 2713, 2714, 2715, 2716, 2717, 2718, 2719, 2720, 2721, 2722, 2723, 2724, 2725, 2726, 2727, 2728, 2729, 2730, 2731, 2732, 2733, 2734, 2735, 2736, 2737, 2738, 2739, 2740, 2741, 2742, 2743, 2744, 2745, 2746, 2747, 2748, 2749, 2750, 2751, 2752, 2753, 2754, 2755, 2756, 2757, 2758, 2759, 2760, 2761, 2762, 2763, 2764, 2765, 2766, 2767, 2768, 2769, 2770, 2771, 2772, 2773, 2774, 2775, 2776, 2777, 2778, 2779, 2780, 2781, 2782, 2783, 2784, 2785, 2786, 2787, 2788, 2789, 2790, 2791, 2792, 2793, 2794, 2795, 2796, 2797, 2798, 2799, 2800, 2801, 2802, 2803, 2804, 2805, 2806, 2807, 2808, 2809, 2810, 2811, 2812, 2813, 2814, 2815, 4480, 4481, 4482, 4483, 4484, 4485, 4486, 4487, 4488, 4489, 4490, 4491, 4492, 4493, 4494, 4495, 4496, 4497, 4498, 4499, 4500, 4501, 4502, 4503, 4504, 4505, 4506, 4507, 4508, 4509, 4510, 4511, 4512, 4513, 4514, 4515, 4516, 4517, 4518, 4519, 4520, 4521, 4522, 4523, 4524, 4525, 4526, 4527, 4528, 4529, 4530, 4531, 4532, 4533, 4534, 4535, 4536, 4537, 4538, 4539, 4540, 4541, 4542, 4543, 4544, 4545, 4546, 4547, 4548, 4549, 4550, 4551, 4552, 4553, 4554, 4555, 4556, 4557, 4558, 4559, 4560, 4561, 4562, 4563, 4564, 4565, 4566, 4567, 4568, 4569, 4570, 4571, 4572, 4573, 4574, 4575, 4576, 4577, 4578, 4579, 4580, 4581, 4582, 4583, 4584, 4585, 4586, 4587, 4588, 4589, 4590, 4591, 4592, 4593, 4594, 4595, 4596, 4597, 4598, 4599, 4600, 4601, 4602, 4603, 4604, 4605, 4606, 4607, 2816, 2817, 2818, 2819, 2820, 2821, 2822, 2823, 2824, 2825, 2826, 2827, 2828, 2829, 2830, 2831, 2832, 2833, 2834, 2835, 2836, 2837, 2838, 2839, 2840, 2841, 2842, 2843, 2844, 2845, 2846, 2847, 2848, 2849, 2850, 2851, 2852, 2853, 2854, 2855, 2856, 2857, 2858, 2859, 2860, 2861, 2862, 2863, 2864, 2865, 2866, 2867, 2868, 2869, 2870, 2871, 2872, 2873, 2874, 2875, 2876, 2877, 2878, 2879, 2880, 2881, 2882, 2883, 2884, 2885, 2886, 2887, 2888, 2889, 2890, 2891, 2892, 2893, 2894, 2895, 2896, 2897, 2898, 2899, 2900, 2901, 2902, 2903, 2904, 2905, 2906, 2907, 2908, 2909, 2910, 2911, 2912, 2913, 2914, 2915, 2916, 2917, 2918, 2919, 2920, 2921, 2922, 2923, 2924, 2925, 2926, 2927, 2928, 2929, 2930, 2931, 2932, 2933, 2934, 2935, 2936, 2937, 2938, 2939, 2940, 2941, 2942, 2943, 3200, 3201, 3202, 3203, 3204, 3205, 3206, 3207, 3208, 3209, 3210, 3211, 3212, 3213, 3214, 3215, 3216, 3217, 3218, 3219, 3220, 3221, 3222, 3223, 3224, 3225, 3226, 3227, 3228, 3229, 3230, 3231, 3232, 3233, 3234, 3235, 3236, 3237, 3238, 3239, 3240, 3241, 3242, 3243, 3244, 3245, 3246, 3247, 3248, 3249, 3250, 3251, 3252, 3253, 3254, 3255, 3256, 3257, 3258, 3259, 3260, 3261, 3262, 3263, 3264, 3265, 3266, 3267, 3268, 3269, 3270, 3271, 3272, 3273, 3274, 3275, 3276, 3277, 3278, 3279, 3280, 3281, 3282, 3283, 3284, 3285, 3286, 3287, 3288, 3289, 3290, 3291, 3292, 3293, 3294, 3295, 3296, 3297, 3298, 3299, 3300, 3301, 3302, 3303, 3304, 3305, 3306, 3307, 3308, 3309, 3310, 3311, 3312, 3313, 3314, 3315, 3316, 3317, 3318, 3319, 3320, 3321, 3322, 3323, 3324, 3325, 3326, 3327, 4736, 4737, 4738, 4739, 4740, 4741, 4742, 4743, 4744, 4745, 4746, 4747, 4748, 4749, 4750, 4751, 4752, 4753, 4754, 4755, 4756, 4757, 4758, 4759, 4760, 4761, 4762, 4763, 4764, 4765, 4766, 4767, 4768, 4769, 4770, 4771, 4772, 4773, 4774, 4775, 4776, 4777, 4778, 4779, 4780, 4781, 4782, 4783, 4784, 4785, 4786, 4787, 4788, 4789, 4790, 4791, 4792, 4793, 4794, 4795, 4796, 4797, 4798, 4799, 4800, 4801, 4802, 4803, 4804, 4805, 4806, 4807, 4808, 4809, 4810, 4811, 4812, 4813, 4814, 4815, 4816, 4817, 4818, 4819, 4820, 4821, 4822, 4823, 4824, 4825, 4826, 4827, 4828, 4829, 4830, 4831, 4832, 4833, 4834, 4835, 4836, 4837, 4838, 4839, 4840, 4841, 4842, 4843, 4844, 4845, 4846, 4847, 4848, 4849, 4850, 4851, 4852, 4853, 4854, 4855, 4856, 4857, 4858, 4859, 4860, 4861, 4862, 4863].

Sequence 3:

Punc_Z=[0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 768, 769, 770, 771, 772, 773, 774, 775, 776, 777, 778, 779, 780, 781, 782, 783, 784, 785, 786, 787, 788, 789, 790, 791, 792, 793, 794, 795, 796, 797, 798, 799, 800, 801, 802, 803, 804, 805, 806, 807, 808, 809, 810, 811, 812, 813, 814, 815, 816, 817, 818, 819, 820, 821, 822, 823, 824, 825, 826, 827, 828, 829, 830, 831, 832, 833, 834, 835, 836, 837, 838, 839, 840, 841, 842, 843, 844, 845, 846, 847, 848, 849, 850, 851, 852, 853, 854, 855, 856, 857, 858, 859, 860, 861, 862, 863, 864, 865, 866, 867, 868, 869, 870, 871, 872, 873, 874, 875, 876, 877, 878, 879, 880, 881, 882, 883, 884, 885, 886, 887, 888, 889, 890, 891, 892, 893, 894, 895, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 501, 502, 503, 504, 505, 506, 507, 508, 509, 510, 511, 1024, 1025, 1026, 1027, 1028, 1029, 1030, 1031, 1032, 1033, 1034, 1035, 1036, 1037, 1038, 1039, 1040, 1041, 1042, 1043, 1044, 1045, 1046, 1047, 1048, 1049, 1050, 1051, 1052, 1053, 1054, 1055, 1056, 1057, 1058, 1059, 1060, 1061, 1062, 1063, 1064, 1065, 1066, 1067, 1068, 1069, 1070, 1071, 1072, 1073, 1074, 1075, 1076, 1077, 1078, 1079, 1080, 1081, 1082, 1083, 1084, 1085, 1086, 1087, 1088, 1089, 1090, 1091, 1092, 1093, 1094, 1095, 1096, 1097, 1098, 1099, 1100, 1101, 1102, 1103, 1104, 1105, 1106, 1107, 1108, 1109, 1110, 1111, 1112, 1113, 1114, 1115, 1116, 1117, 1118, 1119, 1120, 1121, 1122, 1123, 1124, 1125, 1126, 1127, 1128, 1129, 1130, 1131, 1132, 1133, 1134, 1135, 1136, 1137, 1138, 1139, 1140, 1141, 1142, 1143, 1144, 1145, 1146, 1147, 1148, 1149, 1150, 1151, 1152, 1153, 1154, 1155, 1156, 1157, 1158, 1159, 1160, 1161, 1162, 1163, 1164, 1165, 1166, 1167, 1168, 1169, 1170, 1171, 1172, 1173, 1174, 1175, 1176, 1177, 1178, 1179, 1180, 1181, 1182, 1183, 1184, 1185, 1186, 1187, 1188, 1189, 1190, 1191, 1192, 1193, 1194, 1195, 1196, 1197, 1198, 1199, 1200, 1201, 1202, 1203, 1204, 1205, 1206, 1207, 1208, 1209, 1210, 1211, 1212, 1213, 1214, 1215, 1216, 1217, 1218, 1219, 1220, 1221, 1222, 1223, 1224, 1225, 1226, 1227, 1228, 1229, 1230, 1231, 1232, 1233, 1234, 1235, 1236, 1237, 1238, 1239, 1240, 1241, 1242, 1243, 1244, 1245, 1246, 1247, 1248, 1249, 1250, 1251, 1252, 1253, 1254, 1255, 1256, 1257, 1258, 1259, 1260, 1261, 1262, 1263, 1264, 1265, 1266, 1267, 1268, 1269, 1270, 1271, 1272, 1273, 1274, 1275, 1276, 1277, 1278, 1279, 2304, 2305, 2306, 2307, 2308, 2309, 2310, 2311, 2312, 2313, 2314, 2315, 2316, 2317, 2318, 2319, 2320, 2321, 2322, 2323, 2324, 2325, 2326, 2327, 2328, 2329, 2330, 2331, 2332, 2333, 2334, 2335, 2336, 2337, 2338, 2339, 2340, 2341, 2342, 2343, 2344, 2345, 2346, 2347, 2348, 2349, 2350, 2351, 2352, 2353, 2354, 2355, 2356, 2357, 2358, 2359, 2360, 2361, 2362, 2363, 2364, 2365, 2366, 2367, 2368, 2369, 2370, 2371, 2372, 2373, 2374, 2375, 2376, 2377, 2378, 2379, 2380, 2381, 2382, 2383, 2384, 2385, 2386, 2387, 2388, 2389, 2390, 2391, 2392, 2393, 2394, 2395, 2396, 2397, 2398, 2399, 2400, 2401, 2402, 2403, 2404, 2405, 2406, 2407, 2408, 2409, 2410, 2411, 2412, 2413, 2414, 2415, 2416, 2417, 2418, 2419, 2420, 2421, 2422, 2423, 2424, 2425, 2426, 2427, 2428, 2429, 2430, 2431, 512, 513, 514, 515, 516, 517, 518, 519, 520, 521, 522, 523, 524, 525, 526, 527, 528, 529, 530, 531, 532, 533, 534, 535, 536, 537, 538, 539, 540, 541, 542, 543, 544, 545, 546, 547, 548, 549, 550, 551, 552, 553, 554, 555, 556, 557, 558, 559, 560, 561, 562, 563, 564, 565, 566, 567, 568, 569, 570, 571, 572, 573, 574, 575, 576, 577, 578, 579, 580, 581, 582, 583, 584, 585, 586, 587, 588, 589, 590, 591, 592, 593, 594, 595, 596, 597, 598, 599, 600, 601, 602, 603, 604, 605, 606, 607, 608, 609, 610, 611, 612, 613, 614, 615, 616, 617, 618, 619, 620, 621, 622, 623, 624, 625, 626, 627, 628, 629, 630, 631, 632, 633, 634, 635, 636, 637, 638, 639, 1280, 1281, 1282, 1283, 1284, 1285, 1286, 1287, 1288, 1289, 1290, 1291, 1292, 1293, 1294, 1295, 1296, 1297, 1298, 1299, 1300, 1301, 1302, 1303, 1304, 1305, 1306, 1307, 1308, 1309, 1310, 1311, 1312, 1313, 1314, 1315, 1316, 1317, 1318, 1319, 1320, 1321, 1322, 1323, 1324, 1325, 1326, 1327, 1328, 1329, 1330, 1331, 1332, 1333, 1334, 1335, 1336, 1337, 1338, 1339, 1340, 1341, 1342, 1343, 1344, 1345, 1346, 1347, 1348, 1349, 1350, 1351, 1352, 1353, 1354, 1355, 1356, 1357, 1358, 1359, 1360, 1361, 1362, 1363, 1364, 1365, 1366, 1367, 1368, 1369, 1370, 1371, 1372, 1373, 1374, 1375, 1376, 1377, 1378, 1379, 1380, 1381, 1382, 1383, 1384, 1385, 1386, 1387, 1388, 1389, 1390, 1391, 1392, 1393, 1394, 1395, 1396, 1397, 1398, 1399, 1400, 1401, 1402, 1403, 1404, 1405, 1406, 1407, 1408, 1409, 1410, 1411, 1412, 1413, 1414, 1415, 1416, 1417, 1418, 1419, 1420, 1421, 1422, 1423, 1424, 1425, 1426, 1427, 1428, 1429, 1430, 1431, 1432, 1433, 1434, 1435, 1436, 1437, 1438, 1439, 1440, 1441, 1442, 1443, 1444, 1445, 1446, 1447, 1448, 1449, 1450, 1451, 1452, 1453, 1454, 1455, 1456, 1457, 1458, 1459, 1460, 1461, 1462, 1463, 1464, 1465, 1466, 1467, 1468, 1469, 1470, 1471, 1472, 1473, 1474, 1475, 1476, 1477, 1478, 1479, 1480, 1481, 1482, 1483, 1484, 1485, 1486, 1487, 1488, 1489, 1490, 1491, 1492, 1493, 1494, 1495, 1496, 1497, 1498, 1499, 1500, 1501, 1502, 1503, 1504, 1505, 1506, 1507, 1508, 1509, 1510, 1511, 1512, 1513, 1514, 1515, 1516, 1517, 1518, 1519, 1520, 1521, 1522, 1523, 1524, 1525, 1526, 1527, 1528, 1529, 1530, 1531, 1532, 1533, 1534, 1535, 2688, 2689, 2690, 2691, 2692, 2693, 2694, 2695, 2696, 2697, 2698, 2699, 2700, 2701, 2702, 2703, 2704, 2705, 2706, 2707, 2708, 2709, 2710, 2711, 2712, 2713, 2714, 2715, 2716, 2717, 2718, 2719, 2720, 2721, 2722, 2723, 2724, 2725, 2726, 2727, 2728, 2729, 2730, 2731, 2732, 2733, 2734, 2735, 2736, 2737, 2738, 2739, 2740, 2741, 2742, 2743, 2744, 2745, 2746, 2747, 2748, 2749, 2750, 2751, 2752, 2753, 2754, 2755, 2756, 2757, 2758, 2759, 2760, 2761, 2762, 2763, 2764, 2765, 2766, 2767, 2768, 2769, 2770, 2771, 2772, 2773, 2774, 2775, 2776, 2777, 2778, 2779, 2780, 2781, 2782, 2783, 2784, 2785, 2786, 2787, 2788, 2789, 2790, 2791, 2792, 2793, 2794, 2795, 2796, 2797, 2798, 2799, 2800, 2801, 2802, 2803, 2804, 2805, 2806, 2807, 2808, 2809, 2810, 2811, 2812, 2813, 2814, 2815, 1664, 1665, 1666, 1667, 1668, 1669, 1670, 1671, 1672, 1673, 1674, 1675, 1676, 1677, 1678, 1679, 1680, 1681, 1682, 1683, 1684, 1685, 1686, 1687, 1688, 1689, 1690, 1691, 1692, 1693, 1694, 1695, 1696, 1697, 1698, 1699, 1700, 1701, 1702, 1703, 1704, 1705, 1706, 1707, 1708, 1709, 1710, 1711, 1712, 1713, 1714, 1715, 1716, 1717, 1718, 1719, 1720, 1721, 1722, 1723, 1724, 1725, 1726, 1727, 1728, 1729, 1730, 1731, 1732, 1733, 1734, 1735, 1736, 1737, 1738, 1739, 1740, 1741, 1742, 1743, 1744, 1745, 1746, 1747, 1748, 1749, 1750, 1751, 1752, 1753, 1754, 1755, 1756, 1757, 1758, 1759, 1760, 1761, 1762, 1763, 1764, 1765, 1766, 1767, 1768, 1769, 1770, 1771, 1772, 1773, 1774, 1775, 1776, 1777, 1778, 1779, 1780, 1781, 1782, 1783, 1784, 1785, 1786, 1787, 1788, 1789, 1790, 1791, 2944, 2945, 2946, 2947, 2948, 2949, 2950, 2951, 2952, 2953, 2954, 2955, 2956, 2957, 2958, 2959, 2960, 2961, 2962, 2963, 2964, 2965, 2966, 2967, 2968, 2969, 2970, 2971, 2972, 2973, 2974, 2975, 2976, 2977, 2978, 2979, 2980, 2981, 2982, 2983, 2984, 2985, 2986, 2987, 2988, 2989, 2990, 2991, 2992, 2993, 2994, 2995, 2996, 2997, 2998, 2999, 3000, 3001, 3002, 3003, 3004, 3005, 3006, 3007, 3008, 3009, 3010, 3011, 3012, 3013, 3014, 3015, 3016, 3017, 3018, 3019, 3020, 3021, 3022, 3023, 3024, 3025, 3026, 3027, 3028, 3029, 3030, 3031, 3032, 3033, 3034, 3035, 3036, 3037, 3038, 3039, 3040, 3041, 3042, 3043, 3044, 3045, 3046, 3047, 3048, 3049, 3050, 3051, 3052, 3053, 3054, 3055, 3056, 3057, 3058, 3059, 3060, 3061, 3062, 3063, 3064, 3065, 3066, 3067, 3068, 3069, 3070, 3071, 3200, 3201, 3202, 3203, 3204, 3205, 3206, 3207, 3208, 3209, 3210, 3211, 3212, 3213, 3214, 3215, 3216, 3217, 3218, 3219, 3220, 3221, 3222, 3223, 3224, 3225, 3226, 3227, 3228, 3229, 3230, 3231, 3232, 3233, 3234, 3235, 3236, 3237, 3238, 3239, 3240, 3241, 3242, 3243, 3244, 3245, 3246, 3247, 3248, 3249, 3250, 3251, 3252, 3253, 3254, 3255, 3256, 3257, 3258, 3259, 3260, 3261, 3262, 3263, 3264, 3265, 3266, 3267, 3268, 3269, 3270, 3271, 3272, 3273, 3274, 3275, 3276, 3277, 3278, 3279, 3280, 3281, 3282, 3283, 3284, 3285, 3286, 3287, 3288, 3289, 3290, 3291, 3292, 3293, 3294, 3295, 3296, 3297, 3298, 3299, 3300, 3301, 3302, 3303, 3304, 3305, 3306, 3307, 3308, 3309, 3310, 3311, 3312, 3313, 3314, 3315, 3316, 3317, 3318, 3319, 3320, 3321, 3322, 3323, 3324, 3325, 3326, 3327, 4736, 4737, 4738, 4739, 4740, 4741, 4742, 4743, 4744, 4745, 4746, 4747, 4748, 4749, 4750, 4751, 4752, 4753, 4754, 4755, 4756, 4757, 4758, 4759, 4760, 4761, 4762, 4763, 4764, 4765, 4766, 4767, 4768, 4769, 4770, 4771, 4772, 4773, 4774, 4775, 4776, 4777, 4778, 4779, 4780, 4781, 4782, 4783, 4784, 4785, 4786, 4787, 4788, 4789, 4790, 4791, 4792, 4793, 4794, 4795, 4796, 4797, 4798, 4799, 4800, 4801, 4802, 4803, 4804, 4805, 4806, 4807, 4808, 4809, 4810, 4811, 4812, 4813, 4814, 4815, 4816, 4817, 4818, 4819, 4820, 4821, 4822, 4823, 4824, 4825, 4826, 4827, 4828, 4829, 4830, 4831, 4832, 4833, 4834, 4835, 4836, 4837, 4838, 4839, 4840, 4841, 4842, 4843, 4844, 4845, 4846, 4847, 4848, 4849, 4850, 4851, 4852, 4853, 4854, 4855, 4856, 4857, 4858, 4859, 4860, 4861, 4862, 4863, 640, 641, 642, 643, 644, 645, 646, 647, 648, 649, 650, 651, 652, 653, 654, 655, 656, 657, 658, 659, 660, 661, 662, 663, 664, 665, 666, 667, 668, 669, 670, 671, 672, 673, 674, 675, 676, 677, 678, 679, 680, 681, 682, 683, 684, 685, 686, 687, 688, 689, 690, 691, 692, 693, 694, 695, 696, 697, 698, 699, 700, 701, 702, 703, 704, 705, 706, 707, 708, 709, 710, 711, 712, 713, 714, 715, 716, 717, 718, 719, 720, 721, 722, 723, 724, 725, 726, 727, 728, 729, 730, 731, 732, 733, 734, 735, 736, 737, 738, 739, 740, 741, 742, 743, 744, 745, 746, 747, 748, 749, 750, 751, 752, 753, 754, 755, 756, 757, 758, 759, 760, 761, 762, 763, 764, 765, 766, 767, 1536, 1537, 1538, 1539, 1540, 1541, 1542, 1543, 1544, 1545, 1546, 1547, 1548, 1549, 1550, 1551, 1552, 1553, 1554, 1555, 1556, 1557, 1558, 1559, 1560, 1561, 1562, 1563, 1564, 1565, 1566, 1567, 1568, 1569, 1570, 1571, 1572, 1573, 1574, 1575, 1576, 1577, 1578, 1579, 1580, 1581, 1582, 1583, 1584, 1585, 1586, 1587, 1588, 1589, 1590, 1591, 1592, 1593, 1594, 1595, 1596, 1597, 1598, 1599, 1600, 1601, 1602, 1603, 1604, 1605, 1606, 1607, 1608, 1609, 1610, 1611, 1612, 1613, 1614, 1615, 1616, 1617, 1618, 1619, 1620, 1621, 1622, 1623, 1624, 1625, 1626, 1627, 1628, 1629, 1630, 1631, 1632, 1633, 1634, 1635, 1636, 1637, 1638, 1639, 1640, 1641, 1642, 1643, 1644, 1645, 1646, 1647, 1648, 1649, 1650, 1651, 1652, 1653, 1654, 1655, 1656, 1657, 1658, 1659, 1660, 1661, 1662, 1663, 1792, 1793, 1794, 1795, 1796, 1797, 1798, 1799, 1800, 1801, 1802, 1803, 1804, 1805, 1806, 1807, 1808, 1809, 1810, 1811, 1812, 1813, 1814, 1815, 1816, 1817, 1818, 1819, 1820, 1821, 1822, 1823, 1824, 1825, 1826, 1827, 1828, 1829, 1830, 1831, 1832, 1833, 1834, 1835, 1836, 1837, 1838, 1839, 1840, 1841, 1842, 1843, 1844, 1845, 1846, 1847, 1848, 1849, 1850, 1851, 1852, 1853, 1854, 1855, 1856, 1857, 1858, 1859, 1860, 1861, 1862, 1863, 1864, 1865, 1866, 1867, 1868, 1869, 1870, 1871, 1872, 1873, 1874, 1875, 1876, 1877, 1878, 1879, 1880, 1881, 1882, 1883, 1884, 1885, 1886, 1887, 1888, 1889, 1890, 1891, 1892, 1893, 1894, 1895, 1896, 1897, 1898, 1899, 1900, 1901, 1902, 1903, 1904, 1905, 1906, 1907, 1908, 1909, 1910, 1911, 1912, 1913, 1914, 1915, 1916, 1917, 1918, 1919, 3072, 3073, 3074, 3075, 3076, 3077, 3078, 3079, 3080, 3081, 3082, 3083, 3084, 3085, 3086, 3087, 3088, 3089, 3090, 3091, 3092, 3093, 3094, 3095, 3096, 3097, 3098, 3099, 3100, 3101, 3102, 3103, 3104, 3105, 3106, 3107, 3108, 3109, 3110, 3111, 3112, 3113, 3114, 3115, 3116, 3117, 3118, 3119, 3120, 3121, 3122, 3123, 3124, 3125, 3126, 3127, 3128, 3129, 3130, 3131, 3132, 3133, 3134, 3135, 3136, 3137, 3138, 3139, 3140, 3141, 3142, 3143, 3144, 3145, 3146, 3147, 3148, 3149, 3150, 3151, 3152, 3153, 3154, 3155, 3156, 3157, 3158, 3159, 3160, 3161, 3162, 3163, 3164, 3165, 3166, 3167, 3168, 3169, 3170, 3171, 3172, 3173, 3174, 3175, 3176, 3177, 3178, 3179, 3180, 3181, 3182, 3183, 3184, 3185, 3186, 3187, 3188, 3189, 3190, 3191, 3192, 3193, 3194, 3195, 3196, 3197, 3198, 3199, 2048, 2049, 2050, 2051, 2052, 2053, 2054, 2055, 2056, 2057, 2058, 2059, 2060, 2061, 2062, 2063, 2064, 2065, 2066, 2067, 2068, 2069, 2070, 2071, 2072, 2073, 2074, 2075, 2076, 2077, 2078, 2079, 2080, 2081, 2082, 2083, 2084, 2085, 2086, 2087, 2088, 2089, 2090, 2091, 2092, 2093, 2094, 2095, 2096, 2097, 2098, 2099, 2100, 2101, 2102, 2103, 2104, 2105, 2106, 2107, 2108, 2109, 2110, 2111, 2112, 2113, 2114, 2115, 2116, 2117, 2118, 2119, 2120, 2121, 2122, 2123, 2124, 2125, 2126, 2127, 2128, 2129, 2130, 2131, 2132, 2133, 2134, 2135, 2136, 2137, 2138, 2139, 2140, 2141, 2142, 2143, 2144, 2145, 2146, 2147, 2148, 2149, 2150, 2151, 2152, 2153, 2154, 2155, 2156, 2157, 2158, 2159, 2160, 2161, 2162, 2163, 2164, 2165, 2166, 2167, 2168, 2169, 2170, 2171, 2172, 2173, 2174, 2175, 3456, 3457, 3458, 3459, 3460, 3461, 3462, 3463, 3464, 3465, 3466, 3467, 3468, 3469, 3470, 3471, 3472, 3473, 3474, 3475, 3476, 3477, 3478, 3479, 3480, 3481, 3482, 3483, 3484, 3485, 3486, 3487, 3488, 3489, 3490, 3491, 3492, 3493, 3494, 3495, 3496, 3497, 3498, 3499, 3500, 3501, 3502, 3503, 3504, 3505, 3506, 3507, 3508, 3509, 3510, 3511, 3512, 3513, 3514, 3515, 3516, 3517, 3518, 3519, 3520, 3521, 3522, 3523, 3524, 3525, 3526, 3527, 3528, 3529, 3530, 3531, 3532, 3533, 3534, 3535, 3536, 3537, 3538, 3539, 3540, 3541, 3542, 3543, 3544, 3545, 3546, 3547, 3548, 3549, 3550, 3551, 3552, 3553, 3554, 3555, 3556, 3557, 3558, 3559, 3560, 3561, 3562, 3563, 3564, 3565, 3566, 3567, 3568, 3569, 3570, 3571, 3572, 3573, 3574, 3575, 3576, 3577, 3578, 3579, 3580, 3581, 3582, 3583, 3712, 3713, 3714, 3715, 3716, 3717, 3718, 3719, 3720, 3721, 3722, 3723, 3724, 3725, 3726, 3727, 3728, 3729, 3730, 3731, 3732, 3733, 3734, 3735, 3736, 3737, 3738, 3739, 3740, 3741, 3742, 3743, 3744, 3745, 3746, 3747, 3748, 3749, 3750, 3751, 3752, 3753, 3754, 3755, 3756, 3757, 3758, 3759, 3760, 3761, 3762, 3763, 3764, 3765, 3766, 3767, 3768, 3769, 3770, 3771, 3772, 3773, 3774, 3775, 3776, 3777, 3778, 3779, 3780, 3781, 3782, 3783, 3784, 3785, 3786, 3787, 3788, 3789, 3790, 3791, 3792, 3793, 3794, 3795, 3796, 3797, 3798, 3799, 3800, 3801, 3802, 3803, 3804, 3805, 3806, 3807, 3808, 3809, 3810, 3811, 3812, 3813, 3814, 3815, 3816, 3817, 3818, 3819, 3820, 3821, 3822, 3823, 3824, 3825, 3826, 3827, 3828, 3829, 3830, 3831, 3832, 3833, 3834, 3835, 3836, 3837, 3838, 3839, 5248, 5249, 5250, 5251, 5252, 5253, 5254, 5255, 5256, 5257, 5258, 5259, 5260, 5261, 5262, 5263, 5264, 5265, 5266, 5267, 5268, 5269, 5270, 5271, 5272, 5273, 5274, 5275, 5276, 5277, 5278, 5279, 5280, 5281, 5282, 5283, 5284, 5285, 5286, 5287, 5288, 5289, 5290, 5291, 5292, 5293, 5294, 5295, 5296, 5297, 5298, 5299, 5300, 5301, 5302, 5303, 5304, 5305, 5306, 5307, 5308, 5309, 5310, 5311, 5312, 5313, 5314, 5315, 5316, 5317, 5318, 5319, 5320, 5321, 5322, 5323, 5324, 5325, 5326, 5327, 5328, 5329, 5330, 5331, 5332, 5333, 5334, 5335, 5336, 5337, 5338, 5339, 5340, 5341, 5342, 5343, 5344, 5345, 5346, 5347, 5348, 5349, 5350, 5351, 5352, 5353, 5354, 5355, 5356, 5357, 5358, 5359, 5360, 5361, 5362, 5363, 5364, 5365, 5366, 5367, 5368, 5369, 5370, 5371, 5372, 5373, 5374, 5375, 2432, 2433, 2434, 2435, 2436, 2437, 2438, 2439, 2440, 2441, 2442, 2443, 2444, 2445, 2446, 2447, 2448, 2449, 2450, 2451, 2452, 2453, 2454, 2455, 2456, 2457, 2458, 2459, 2460, 2461, 2462, 2463, 2464, 2465, 2466, 2467, 2468, 2469, 2470, 2471, 2472, 2473, 2474, 2475, 2476, 2477, 2478, 2479, 2480, 2481, 2482, 2483, 2484, 2485, 2486, 2487, 2488, 2489, 2490, 2491, 2492, 2493, 2494, 2495, 2496, 2497, 2498, 2499, 2500, 2501, 2502, 2503, 2504, 2505, 2506, 2507, 2508, 2509, 2510, 2511, 2512, 2513, 2514, 2515, 2516, 2517, 2518, 2519, 2520, 2521, 2522, 2523, 2524, 2525, 2526, 2527, 2528, 2529, 2530, 2531, 2532, 2533, 2534, 2535, 2536, 2537, 2538, 2539, 2540, 2541, 2542, 2543, 2544, 2545, 2546, 2547, 2548, 2549, 2550, 2551, 2552, 2553, 2554, 2555, 2556, 2557, 2558, 2559, 3840, 3841, 3842, 3843, 3844, 3845, 3846, 3847, 3848, 3849, 3850, 3851, 3852, 3853, 3854, 3855, 3856, 3857, 3858, 3859, 3860, 3861, 3862, 3863, 3864, 3865, 3866, 3867, 3868, 3869, 3870, 3871, 3872, 3873, 3874, 3875, 3876, 3877, 3878, 3879, 3880, 3881, 3882, 3883, 3884, 3885, 3886, 3887, 3888, 3889, 3890, 3891, 3892, 3893, 3894, 3895, 3896, 3897, 3898, 3899, 3900, 3901, 3902, 3903, 3904, 3905, 3906, 3907, 3908, 3909, 3910, 3911, 3912, 3913, 3914, 3915, 3916, 3917, 3918, 3919, 3920, 3921, 3922, 3923, 3924, 3925, 3926, 3927, 3928, 3929, 3930, 3931, 3932, 3933, 3934, 3935, 3936, 3937, 3938, 3939, 3940, 3941, 3942, 3943, 3944, 3945, 3946, 3947, 3948, 3949, 3950, 3951, 3952, 3953, 3954, 3955, 3956, 3957, 3958, 3959, 3960, 3961, 3962, 3963, 3964, 3965, 3966, 3967, 4096, 4097, 4098, 4099, 4100, 4101, 4102, 4103, 4104, 4105, 4106, 4107, 4108, 4109, 4110, 4111, 4112, 4113, 4114, 4115, 4116, 4117, 4118, 4119, 4120, 4121, 4122, 4123, 4124, 4125, 4126, 4127, 4128, 4129, 4130, 4131, 4132, 4133, 4134, 4135, 4136, 4137, 4138, 4139, 4140, 4141, 4142, 4143, 4144, 4145, 4146, 4147, 4148, 4149, 4150, 4151, 4152, 4153, 4154, 4155, 4156, 4157, 4158, 4159, 4160, 4161, 4162, 4163, 4164, 4165, 4166, 4167, 4168, 4169, 4170, 4171, 4172, 4173, 4174, 4175, 4176, 4177, 4178, 4179, 4180, 4181, 4182, 4183, 4184, 4185, 4186, 4187, 4188, 4189, 4190, 4191, 4192, 4193, 4194, 4195, 4196, 4197, 4198, 4199, 4200, 4201, 4202, 4203, 4204, 4205, 4206, 4207, 4208, 4209, 4210, 4211, 4212, 4213, 4214, 4215, 4216, 4217, 4218, 4219, 4220, 4221, 4222, 4223, 5504, 5505, 5506, 5507, 5508, 5509, 5510, 5511, 5512, 5513, 5514, 5515, 5516, 5517, 5518, 5519, 5520, 5521, 5522, 5523, 5524, 5525, 5526, 5527, 5528, 5529, 5530, 5531, 5532, 5533, 5534, 5535, 5536, 5537, 5538, 5539, 5540, 5541, 5542, 5543, 5544, 5545, 5546, 5547, 5548, 5549, 5550, 5551, 5552, 5553, 5554, 5555, 5556, 5557, 5558, 5559, 5560, 5561, 5562, 5563, 5564, 5565, 5566, 5567, 5568, 5569, 5570, 5571, 5572, 5573, 5574, 5575, 5576, 5577, 5578, 5579, 5580, 5581, 5582, 5583, 5584, 5585, 5586, 5587, 5588, 5589, 5590, 5591, 5592, 5593, 5594, 5595, 5596, 5597, 5598, 5599, 5600, 5601, 5602, 5603, 5604, 5605, 5606, 5607, 5608, 5609, 5610, 5611, 5612, 5613, 5614, 5615, 5616, 5617, 5618, 5619, 5620, 5621, 5622, 5623, 5624, 5625, 5626, 5627, 5628, 5629, 5630, 5631, 4480, 4481, 4482, 4483, 4484, 4485, 4486, 4487, 4488, 4489, 4490, 4491, 4492, 4493, 4494, 4495, 4496, 4497, 4498, 4499, 4500, 4501, 4502, 4503, 4504, 4505, 4506, 4507, 4508, 4509, 4510, 4511, 4512, 4513, 4514, 4515, 4516, 4517, 4518, 4519, 4520, 4521, 4522, 4523, 4524, 4525, 4526, 4527, 4528, 4529, 4530, 4531, 4532, 4533, 4534, 4535, 4536, 4537, 4538, 4539, 4540, 4541, 4542, 4543, 4544, 4545, 4546, 4547, 4548, 4549, 4550, 4551, 4552, 4553, 4554, 4555, 4556, 4557, 4558, 4559, 4560, 4561, 4562, 4563, 4564, 4565, 4566, 4567, 4568, 4569, 4570, 4571, 4572, 4573, 4574, 4575, 4576, 4577, 4578, 4579, 4580, 4581, 4582, 4583, 4584, 4585, 4586, 4587, 4588, 4589, 4590, 4591, 4592, 4593, 4594, 4595, 4596, 4597, 4598, 4599, 4600, 4601, 4602, 4603, 4604, 4605, 4606, 4607, 5888, 5889, 5890, 5891, 5892, 5893, 5894, 5895, 5896, 5897, 5898, 5899, 5900, 5901, 5902, 5903, 5904, 5905, 5906, 5907, 5908, 5909, 5910, 5911, 5912, 5913, 5914, 5915, 5916, 5917, 5918, 5919, 5920, 5921, 5922, 5923, 5924, 5925, 5926, 5927, 5928, 5929, 5930, 5931, 5932, 5933, 5934, 5935, 5936, 5937, 5938, 5939, 5940, 5941, 5942, 5943, 5944, 5945, 5946, 5947, 5948, 5949, 5950, 5951, 5952, 5953, 5954, 5955, 5956, 5957, 5958, 5959, 5960, 5961, 5962, 5963, 5964, 5965, 5966, 5967, 5968, 5969, 5970, 5971, 5972, 5973, 5974, 5975, 5976, 5977, 5978, 5979, 5980, 5981, 5982, 5983, 5984, 5985, 5986, 5987, 5988, 5989, 5990, 5991, 5992, 5993, 5994, 5995, 5996, 5997, 5998, 5999, 6000, 6001, 6002, 6003, 6004, 6005, 6006, 6007, 6008, 6009, 6010, 6011, 6012, 6013, 6014, 6015, 6144, 6145, 6146, 6147, 6148, 6149, 6150, 6151, 6152, 6153, 6154, 6155, 6156, 6157, 6158, 6159, 6160, 6161, 6162, 6163, 6164, 6165, 6166, 6167, 6168, 6169, 6170, 6171, 6172, 6173, 6174, 6175, 6176, 6177, 6178, 6179, 6180, 6181, 6182, 6183, 6184, 6185, 6186, 6187, 6188, 6189, 6190, 6191, 6192, 6193, 6194, 6195, 6196, 6197, 6198, 6199, 6200, 6201, 6202, 6203, 6204, 6205, 6206, 6207, 6208, 6209, 6210, 6211, 6212, 6213, 6214, 6215, 6216, 6217, 6218, 6219, 6220, 6221, 6222, 6223, 6224, 6225, 6226, 6227, 6228, 6229, 6230, 6231, 6232, 6233, 6234, 6235, 6236, 6237, 6238, 6239, 6240, 6241, 6242, 6243, 6244, 6245, 6246, 6247, 6248, 6249, 6250, 6251, 6252, 6253, 6254, 6255, 6256, 6257, 6258, 6259, 6260, 6261, 6262, 6263, 6264, 6265, 6266, 6267, 6268, 6269, 6270, 6271, 7168, 7169, 7170, 7171, 7172, 7173, 7174, 7175, 7176, 7177, 7178, 7179, 7180, 7181, 7182, 7183, 7184, 7185, 7186, 7187, 7188, 7189, 7190, 7191, 7192, 7193, 7194, 7195, 7196, 7197, 7198, 7199, 7200, 7201, 7202, 7203, 7204, 7205, 7206, 7207, 7208, 7209, 7210, 7211, 7212, 7213, 7214, 7215, 7216, 7217, 7218, 7219, 7220, 7221, 7222, 7223, 7224, 7225, 7226, 7227, 7228, 7229, 7230, 7231, 7232, 7233, 7234, 7235, 7236, 7237, 7238, 7239, 7240, 7241, 7242, 7243, 7244, 7245, 7246, 7247, 7248, 7249, 7250, 7251, 7252, 7253, 7254, 7255, 7256, 7257, 7258, 7259, 7260, 7261, 7262, 7263, 7264, 7265, 7266, 7267, 7268, 7269, 7270, 7271, 7272, 7273, 7274, 7275, 7276, 7277, 7278, 7279, 7280, 7281, 7282, 7283, 7284, 7285, 7286, 7287, 7288, 7289, 7290, 7291, 7292, 7293, 7294, 7295, 896, 897, 898, 899, 900, 901, 902, 903, 904, 905, 906, 907, 908, 909, 910, 911, 912, 913, 914, 915, 916, 917, 918, 919, 920, 921, 922, 923, 924, 925, 926, 927, 928, 929, 930, 931, 932, 933, 934, 935, 936, 937, 938, 939, 940, 941, 942, 943, 944, 945, 946, 947, 948, 949, 950, 951, 952, 953, 954, 955, 956, 957, 958, 959, 960, 961, 962, 963, 964, 965, 966, 967, 968, 969, 970, 971, 972, 973, 974, 975, 976, 977, 978, 979, 980, 981, 982, 983, 984, 985, 986, 987, 988, 989, 990, 991, 992, 993, 994, 995, 996, 997, 998, 999, 1000, 1001, 1002, 1003, 1004, 1005, 1006, 1007, 1008, 1009, 1010, 1011, 1012, 1013, 1014, 1015, 1016, 1017, 1018, 1019, 1020, 1021, 1022, 1023, 1920, 1921, 1922, 1923, 1924, 1925, 1926, 1927, 1928, 1929, 1930, 1931, 1932, 1933, 1934, 1935, 1936, 1937, 1938, 1939, 1940, 1941, 1942, 1943, 1944, 1945, 1946, 1947, 1948, 1949, 1950, 1951, 1952, 1953, 1954, 1955, 1956, 1957, 1958, 1959, 1960, 1961, 1962, 1963, 1964, 1965, 1966, 1967, 1968, 1969, 1970, 1971, 1972, 1973, 1974, 1975, 1976, 1977, 1978, 1979, 1980, 1981, 1982, 1983, 1984, 1985, 1986, 1987, 1988, 1989, 1990, 1991, 1992, 1993, 1994, 1995, 1996, 1997, 1998, 1999, 2000, 2001, 2002, 2003, 2004, 2005, 2006, 2007, 2008, 2009, 2010, 2011, 2012, 2013, 2014, 2015, 2016, 2017, 2018, 2019, 2020, 2021, 2022, 2023, 2024, 2025, 2026, 2027, 2028, 2029, 2030, 2031, 2032, 2033, 2034, 2035, 2036, 2037, 2038, 2039, 2040, 2041, 2042, 2043, 2044, 2045, 2046, 2047, 2176, 2177, 2178, 2179, 2180, 2181, 2182, 2183, 2184, 2185, 2186, 2187, 2188, 2189, 2190, 2191, 2192, 2193, 2194, 2195, 2196, 2197, 2198, 2199, 2200, 2201, 2202, 2203, 2204, 2205, 2206, 2207, 2208, 2209, 2210, 2211, 2212, 2213, 2214, 2215, 2216, 2217, 2218, 2219, 2220, 2221, 2222, 2223, 2224, 2225, 2226, 2227, 2228, 2229, 2230, 2231, 2232, 2233, 2234, 2235, 2236, 2237, 2238, 2239, 2240, 2241, 2242, 2243, 2244, 2245, 2246, 2247, 2248, 2249, 2250, 2251, 2252, 2253, 2254, 2255, 2256, 2257, 2258, 2259, 2260, 2261, 2262, 2263, 2264, 2265, 2266, 2267, 2268, 2269, 2270, 2271, 2272, 2273, 2274, 2275, 2276, 2277, 2278, 2279, 2280, 2281, 2282, 2283, 2284, 2285, 2286, 2287, 2288, 2289, 2290, 2291, 2292, 2293, 2294, 2295, 2296, 2297, 2298, 2299, 2300, 2301, 2302, 2303, 3584, 3585, 3586, 3587, 3588, 3589, 3590, 3591, 3592, 3593, 3594, 3595, 3596, 3597, 3598, 3599, 3600, 3601, 3602, 3603, 3604, 3605, 3606, 3607, 3608, 3609, 3610, 3611, 3612, 3613, 3614, 3615, 3616, 3617, 3618, 3619, 3620, 3621, 3622, 3623, 3624, 3625, 3626, 3627, 3628, 3629, 3630, 3631, 3632, 3633, 3634, 3635, 3636, 3637, 3638, 3639, 3640, 3641, 3642, 3643, 3644, 3645, 3646, 3647, 3648, 3649, 3650, 3651, 3652, 3653, 3654, 3655, 3656, 3657, 3658, 3659, 3660, 3661, 3662, 3663, 3664, 3665, 3666, 3667, 3668, 3669, 3670, 3671, 3672, 3673, 3674, 3675, 3676, 3677, 3678, 3679, 3680, 3681, 3682, 3683, 3684, 3685, 3686, 3687, 3688, 3689, 3690, 3691, 3692, 3693, 3694, 3695, 3696, 3697, 3698, 3699, 3700, 3701, 3702, 3703, 3704, 3705, 3706, 3707, 3708, 3709, 3710, 3711, 2560, 2561, 2562, 2563, 2564, 2565, 2566, 2567, 2568, 2569, 2570, 2571, 2572, 2573, 2574, 2575, 2576, 2577, 2578, 2579, 2580, 2581, 2582, 2583, 2584, 2585, 2586, 2587, 2588, 2589, 2590, 2591, 2592, 2593, 2594, 2595, 2596, 2597, 2598, 2599, 2600, 2601, 2602, 2603, 2604, 2605, 2606, 2607, 2608, 2609, 2610, 2611, 2612, 2613, 2614, 2615, 2616, 2617, 2618, 2619, 2620, 2621, 2622, 2623, 2624, 2625, 2626, 2627, 2628, 2629, 2630, 2631, 2632, 2633, 2634, 2635, 2636, 2637, 2638, 2639, 2640, 2641, 2642, 2643, 2644, 2645, 2646, 2647, 2648, 2649, 2650, 2651, 2652, 2653, 2654, 2655, 2656, 2657, 2658, 2659, 2660, 2661, 2662, 2663, 2664, 2665, 2666, 2667, 2668, 2669, 2670, 2671, 2672, 2673, 2674, 2675, 2676, 2677, 2678, 2679, 2680, 2681, 2682, 2683, 2684, 2685, 2686, 2687, 3968, 3969, 3970, 3971, 3972, 3973, 3974, 3975, 3976, 3977, 3978, 3979, 3980, 3981, 3982, 3983, 3984, 3985, 3986, 3987, 3988, 3989, 3990, 3991, 3992, 3993, 3994, 3995, 3996, 3997, 3998, 3999, 4000, 4001, 4002, 4003, 4004, 4005, 4006, 4007, 4008, 4009, 4010, 4011, 4012, 4013, 4014, 4015, 4016, 4017, 4018, 4019, 4020, 4021, 4022, 4023, 4024, 4025, 4026, 4027, 4028, 4029, 4030, 4031, 4032, 4033, 4034, 4035, 403.6, 4037, 4038, 4039, 4040, 4041, 4042, 4043, 4044, 4045, 4046, 4047, 4048, 4049, 4050, 4051, 4052, 4053, 4054, 4055, 4056, 4057, 4058, 4059, 4060, 4061, 4062, 4063, 4064, 4065, 4066, 4067, 4068, 4069, 4070, 4071, 4072, 4073, 4074, 4075, 4076, 4077, 4078, 4079, 4080, 4081, 4082, 4083, 4084, 4085, 4086, 4087, 4088, 4089, 4090, 4091, 4092, 4093, 4094, 4095, 4224, 4225, 4226, 4227, 4228, 4229, 4230, 4231, 4232, 4233, 4234, 4235, 4236, 4237, 4238, 4239, 4240, 4241, 4242, 4243, 4244, 4245, 4246, 4247, 4248, 4249, 4250, 4251, 4252, 4253, 4254, 4255, 4256, 4257, 4258, 4259, 4260, 4261, 4262, 4263, 4264, 4265, 4266, 4267, 4268, 4269, 4270, 4271, 4272, 4273, 4274, 4275, 4276, 4277, 4278, 4279, 4280, 4281, 4282, 4283, 4284, 4285, 4286, 4287, 4288, 4289, 4290, 4291, 4292, 4293, 4294, 4295, 4296, 4297, 4298, 4299, 4300, 4301, 4302, 4303, 4304, 4305, 4306, 4307, 4308, 4309, 4310, 4311, 4312, 4313, 4314, 4315, 4316, 4317, 4318, 4319, 4320, 4321, 4322, 4323, 4324, 4325, 4326, 4327, 4328, 4329, 4330, 4331, 4332, 4333, 4334, 4335, 4336, 4337, 4338, 4339, 4340, 4341, 4342, 4343, 4344, 4345, 4346, 4347, 4348, 4349, 4350, 4351, 5632, 5633, 5634, 5635, 5636, 5637, 5638, 5639, 5640, 5641, 5642, 5643, 5644, 5645, 5646, 5647, 5648, 5649, 5650, 5651, 5652, 5653, 5654, 5655, 5656, 5657, 5658, 5659, 5660, 5661, 5662, 5663, 5664, 5665, 5666, 5667, 5668, 5669, 5670, 5671, 5672, 5673, 5674, 5675, 5676, 5677, 5678, 5679, 5680, 5681, 5682, 5683, 5684, 5685, 5686, 5687, 5688, 5689, 5690, 5691, 5692, 5693, 5694, 5695, 5696, 5697, 5698, 5699, 5700, 5701, 5702, 5703, 5704, 5705, 5706, 5707, 5708, 5709, 5710, 5711, 5712, 5713, 5714, 5715, 5716, 5717, 5718, 5719, 5720, 5721, 5722, 5723, 5724, 5725, 5726, 5727, 5728, 5729, 5730, 5731, 5732, 5733, 5734, 5735, 5736, 5737, 5738, 5739, 5740, 5741, 5742, 5743, 5744, 5745, 5746, 5747, 5748, 5749, 5750, 5751, 5752, 5753, 5754, 5755, 5756, 5757, 5758, 5759, 2816, 2817, 2818, 2819, 2820, 2821, 2822, 2823, 2824, 2825, 2826, 2827, 2828, 2829, 2830, 2831, 2832, 2833, 2834, 2835, 2836, 2837, 2838, 2839, 2840, 2841, 2842, 2843, 2844, 2845, 2846, 2847, 2848, 2849, 2850, 2851, 2852, 2853, 2854, 2855, 2856, 2857, 2858, 2859, 2860, 2861, 2862, 2863, 2864, 2865, 2866, 2867, 2868, 2869, 2870, 2871, 2872, 2873, 2874, 2875, 2876, 2877, 2878, 2879, 2880, 2881, 2882, 2883, 2884, 2885, 2886, 2887, 2888, 2889, 2890, 2891, 2892, 2893, 2894, 2895, 2896, 2897, 2898, 2899, 2900, 2901, 2902, 2903, 2904, 2905, 2906, 2907, 2908, 2909, 2910, 2911, 2912, 2913, 2914, 2915, 2916, 2917, 2918, 2919, 2920, 2921, 2922, 2923, 2924, 2925, 2926, 2927, 2928, 2929, 2930, 2931, 2932, 2933, 2934, 2935, 2936, 2937, 2938, 2939, 2940, 2941, 2942, 2943, 4352, 4353, 4354, 4355, 4356, 4357, 4358, 4359, 4360, 4361, 4362, 4363, 4364, 4365, 4366, 4367, 4368, 4369, 4370, 4371, 4372, 4373, 4374, 4375, 4376, 4377, 4378, 4379, 4380, 4381, 4382, 4383, 4384, 4385, 4386, 4387, 4388, 4389, 4390, 4391, 4392, 4393, 4394, 4395, 4396, 4397, 4398, 4399, 4400, 4401, 4402, 4403, 4404, 4405, 4406, 4407, 4408, 4409, 4410, 4411, 4412, 4413, 4414, 4415, 4416, 4417, 4418, 4419, 4420, 4421, 4422, 4423, 4424, 4425, 4426, 4427, 4428, 4429, 4430, 4431, 4432, 4433, 4434, 4435, 4436, 4437, 4438, 4439, 4440, 4441, 4442, 4443, 4444, 4445, 4446, 4447, 4448, 4449, 4450, 4451, 4452, 4453, 4454, 4455, 4456, 4457, 4458, 4459, 4460, 4461, 4462, 4463, 4464, 4465, 4466, 4467, 4468, 4469, 4470, 4471, 4472, 4473, 4474, 4475, 4476, 4477, 4478, 4479, 4608, 4609, 4610, 4611, 4612, 4613, 4614, 4615, 4616, 4617, 4618, 4619, 4620, 4621, 4622, 4623, 4624, 4625, 4626, 4627, 4628, 4629, 4630, 4631, 4632, 4633, 4634, 4635, 4636, 4637, 4638, 4639, 4640, 4641, 4642, 4643, 4644, 4645, 4646, 4647, 4648, 4649, 4650, 4651, 4652, 4653, 4654, 4655, 4656, 4657, 4658, 4659, 4660, 4661, 4662, 4663, 4664, 4665, 4666, 4667, 4668, 4669, 4670, 4671, 4672, 4673, 4674, 4675, 4676, 4677, 4678, 4679, 4680, 4681, 4682, 4683, 4684, 4685, 4686, 4687, 4688, 4689, 4690, 4691, 4692, 4693, 4694, 4695, 4696, 4697, 4698, 4699, 4700, 4701, 4702, 4703, 4704, 4705, 4706, 4707, 4708, 4709, 4710, 4711, 4712, 4713, 4714, 4715, 4716, 4717, 4718, 4719, 4720, 4721, 4722, 4723, 4724, 4725, 4726, 4727, 4728, 4729, 4730, 4731, 4732, 4733, 4734, 4735, 6016, 6017, 6018, 6019, 6020, 6021, 6022, 6023, 6024, 6025, 6026, 6027, 6028, 6029, 6030, 6031, 6032, 6033, 6034, 6035, 6036, 6037, 6038, 6039, 6040, 6041, 6042, 6043, 6044, 6045, 6046, 6047, 6048, 6049, 6050, 6051, 6052, 6053, 6054, 6055, 6056, 6057, 6058, 6059, 6060, 6061, 6062, 6063, 6064, 6065, 6066, 6067, 6068, 6069, 6070, 6071, 6072, 6073, 6074, 6075, 6076, 6077, 6078, 6079, 6080, 6081, 6082, 6083, 6084, 6085, 6086, 6087, 6088, 6089, 6090, 6091, 6092, 6093, 6094, 6095, 6096, 6097, 6098, 6099, 6100, 6101, 6102, 6103, 6104, 6105, 6106, 6107, 6108, 6109, 6110, 6111, 6112, 6113, 6114, 6115, 6116, 6117, 6118, 6119, 6120, 6121, 6122, 6123, 6124, 6125, 6126, 6127, 6128, 6129, 6130, 6131, 6132, 6133, 6134, 6135, 6136, 6137, 6138, 6139, 6140, 6141, 6142, 6143, 4992, 4993, 4994, 4995, 4996, 4997, 4998, 4999, 5000, 5001, 5002, 5003, 5004, 5005, 5006, 5007, 5008, 5009, 5010, 5011, 5012, 5013, 5014, 5015, 5016, 5017, 5018, 5019, 5020, 5021, 5022, 5023, 5024, 5025, 5026, 5027, 5028, 5029, 5030, 5031, 5032, 5033, 5034, 5035, 5036, 5037, 5038, 5039, 5040, 5041, 5042, 5043, 5044, 5045, 5046, 5047, 5048, 5049, 5050, 5051, 5052, 5053, 5054, 5055, 5056, 5057, 5058, 5059, 5060, 5061, 5062, 5063, 5064, 5065, 5066, 5067, 5068, 5069, 5070, 5071, 5072, 5073, 5074, 5075, 5076, 5077, 5078, 5079, 5080, 5081, 5082, 5083, 5084, 5085, 5086, 5087, 5088, 5089, 5090, 5091, 5092, 5093, 5094, 5095, 5096, 5097, 5098, 5099, 5100, 5101, 5102, 5103, 5104, 5105, 5106, 5107, 5108, 5109, 5110, 5111, 5112, 5113, 5114, 5115, 5116, 5117, 5118, 5119, 6272, 6273, 6274, 6275, 6276, 6277, 6278, 6279, 6280, 6281, 6282, 6283, 6284, 6285, 6286, 6287, 6288, 6289, 6290, 6291, 6292, 6293, 6294, 6295, 6296, 6297, 6298, 6299, 6300, 6301, 6302, 6303, 6304, 6305, 6306, 6307, 6308, 6309, 6310, 6311, 6312, 6313, 6314, 6315, 6316, 6317, 6318, 6319, 6320, 6321, 6322, 6323, 6324, 6325, 6326, 6327, 6328, 6329, 6330, 6331, 6332, 6333, 6334, 6335, 6336, 6337, 6338, 6339, 6340, 6341, 6342, 6343, 6344, 6345, 6346, 6347, 6348, 6349, 6350, 6351, 6352, 6353, 6354, 6355, 6356, 6357, 6358, 6359, 6360, 6361, 6362, 6363, 6364, 6365, 6366, 6367, 6368, 6369, 6370, 6371, 6372, 6373, 6374, 6375, 6376, 6377, 6378, 6379, 6380, 6381, 6382, 6383, 6384, 6385, 6386, 6387, 6388, 6389, 6390, 6391, 6392, 6393, 6394, 6395, 6396, 6397, 6398, 6399, 6528, 6529, 6530, 6531, 6532, 6533, 6534, 6535, 6536, 6537, 6538, 6539, 6540, 6541, 6542, 6543, 6544, 6545, 6546, 6547, 6548, 6549, 6550, 6551, 6552, 6553, 6554, 6555, 6556, 6557, 6558, 6559, 6560, 6561, 6562, 6563, 6564, 6565, 6566, 6567, 6568, 6569, 6570, 6571, 6572, 6573, 6574, 6575, 6576, 6577, 6578, 6579, 6580, 6581, 6582, 6583, 6584, 6585, 6586, 6587, 6588, 6589, 6590, 6591, 6592, 6593, 6594, 6595, 6596, 6597, 6598, 6599, 6600, 6601, 6602, 6603, 6604, 6605, 6606, 6607, 6608, 6609, 6610, 6611, 6612, 6613, 6614, 6615, 6616, 6617, 6618, 6619, 6620, 6621, 6622, 6623, 6624, 6625, 6626, 6627, 6628, 6629, 6630, 6631, 6632, 6633, 6634, 6635, 6636, 6637, 6638, 6639, 6640, 6641, 6642, 6643, 6644, 6645, 6646, 6647, 6648, 6649, 6650, 6651, 6652, 6653, 6654, 6655, 7424, 7425, 7426, 7427, 7428, 7429, 7430, 7431, 7432, 7433, 7434, 7435, 7436, 7437, 7438, 7439, 7440, 7441, 7442, 7443, 7444, 7445, 7446, 7447, 7448, 7449, 7450, 7451, 7452, 7453, 7454, 7455, 7456, 7457, 7458, 7459, 7460, 7461, 7462, 7463, 7464, 7465, 7466, 7467, 7468, 7469, 7470, 7471, 7472, 7473, 7474, 7475, 7476, 7477, 7478, 7479, 7480, 7481, 7482, 7483, 7484, 7485, 7486, 7487, 7488, 7489, 7490, 7491, 7492, 7493, 7494, 7495, 7496, 7497, 7498, 7499, 7500, 7501, 7502, 7503, 7504, 7505, 7506, 7507, 7508, 7509, 7510, 7511, 7512, 7513, 7514, 7515, 7516, 7517, 7518, 7519, 7520, 7521, 7522, 7523, 7524, 7525, 7526, 7527, 7528, 7529, 7530, 7531, 7532, 7533, 7534, 7535, 7536, 7537, 7538, 7539, 7540, 7541, 7542, 7543, 7544, 7545, 7546, 7547, 7548, 7549, 7550, 7551, 3328, 3329, 3330, 3331, 3332, 3333, 3334, 3335, 3336, 3337, 3338, 3339, 3340, 3341, 3342, 3343, 3344, 3345, 3346, 3347, 3348, 3349, 3350, 3351, 3352, 3353, 3354, 3355, 3356, 3357, 3358, 3359, 3360, 3361, 3362, 3363, 3364, 3365, 3366, 3367, 3368, 3369, 3370, 3371, 3372, 3373, 3374, 3375, 3376, 3377, 3378, 3379, 3380, 3381, 3382, 3383, 3384, 3385, 3386, 3387, 3388, 3389, 3390, 3391, 3392, 3393, 3394, 3395, 3396, 3397, 3398, 3399, 3400, 3401, 3402, 3403, 3404, 3405, 3406, 3407, 3408, 3409, 3410, 3411, 3412, 3413, 3414, 3415, 3416, 3417, 3418, 3419, 3420, 3421, 3422, 3423, 3424, 3425, 3426, 3427, 3428, 3429, 3430, 3431, 3432, 3433, 3434, 3435, 3436, 3437, 3438, 3439, 3440, 3441, 3442, 3443, 3444, 3445, 3446, 3447, 3448, 3449, 3450, 3451, 3452, 3453, 3454, 3455, 4864, 4865, 4866, 4867, 4868, 4869, 4870, 4871, 4872, 4873, 4874, 4875, 4876, 4877, 4878, 4879, 4880, 4881, 4882, 4883, 4884, 4885, 4886, 4887, 4888, 4889, 4890, 4891, 4892, 4893, 4894, 4895, 4896, 4897, 4898, 4899, 4900, 4901, 4902, 4903, 4904, 4905, 4906, 4907, 4908, 4909, 4910, 4911, 4912, 4913, 4914, 4915, 4916, 4917, 4918, 4919, 4920, 4921, 4922, 4923, 4924, 4925, 4926, 4927, 4928, 4929, 4930, 4931, 4932, 4933, 4934, 4935, 4936, 4937, 4938, 4939, 4940, 4941, 4942, 4943, 4944, 4945, 4946, 4947, 4948, 4949, 4950, 4951, 4952, 4953, 4954, 4955, 4956, 4957, 4958, 4959, 4960, 4961, 4962, 4963, 4964, 4965, 4966, 4967, 4968, 4969, 4970, 4971, 4972, 4973, 4974, 4975, 4976, 4977, 4978, 4979, 4980, 4981, 4982, 4983, 4984, 4985, 4986, 4987, 4988, 4989, 4990, 4991, 5120, 5121, 5122, 5123, 5124, 5125, 5126, 5127, 5128, 5129, 5130, 5131, 5132, 5133, 5134, 5135, 5136, 5137, 5138, 5139, 5140, 5141, 5142, 5143, 5144, 5145, 5146, 5147, 5148, 5149, 5150, 5151, 5152, 5153, 5154, 5155, 5156, 5157, 5158, 5159, 5160, 5161, 5162, 5163, 5164, 5165, 5166, 5167, 5168, 5169, 5170, 5171, 5172, 5173, 5174, 5175, 5176, 5177, 5178, 5179, 5180, 5181, 5182, 5183, 5184, 5185, 5186, 5187, 5188, 5189, 5190, 5191, 5192, 5193, 5194, 5195, 5196, 5197, 5198, 5199, 5200, 5201, 5202, 5203, 5204, 5205, 5206, 5207, 5208, 5209, 5210, 5211, 5212, 5213, 5214, 5215, 5216, 5217, 5218, 5219, 5220, 5221, 5222, 5223, 5224, 5225, 5226, 5227, 5228, 5229, 5230, 5231, 5232, 5233, 5234, 5235, 5236, 5237, 5238, 5239, 5240, 5241, 5242, 5243, 5244, 5245, 5246, 5247, 6400, 6401, 6402, 6403, 6404, 6405, 6406, 6407, 6408, 6409, 6410, 6411, 6412, 6413, 6414, 6415, 6416, 6417, 6418, 6419, 6420, 6421, 6422, 6423, 6424, 6425, 6426, 6427, 6428, 6429, 6430, 6431, 6432, 6433, 6434, 6435, 6436, 6437, 6438, 6439, 6440, 6441, 6442, 6443, 6444, 6445, 6446, 6447, 6448, 6449, 6450, 6451, 6452, 6453, 6454, 6455, 6456, 6457, 6458, 6459, 6460, 6461, 6462, 6463, 6464, 6465, 6466, 6467, 6468, 6469, 6470, 6471, 6472, 6473, 6474, 6475, 6476, 6477, 6478, 6479, 6480, 6481, 6482, 6483, 6484, 6485, 6486, 6487, 6488, 6489, 6490, 6491, 6492, 6493, 6494, 6495, 6496, 6497, 6498, 6499, 6500, 6501, 6502, 6503, 6504, 6505, 6506, 6507, 6508, 6509, 6510, 6511, 6512, 6513, 6514, 6515, 6516, 6517, 6518, 6519, 6520, 6521, 6522, 6523, 6524, 6525, 6526, 6527, 5376, 5377, 5378, 5379, 5380, 5381, 5382, 5383, 5384, 5385, 5386, 5387, 5388, 5389, 5390, 5391, 5392, 5393, 5394, 5395, 5396, 5397, 5398, 5399, 5400, 5401, 5402, 5403, 5404, 5405, 5406, 5407, 5408, 5409, 5410, 5411, 5412, 5413, 5414, 5415, 5416, 5417, 5418, 5419, 5420, 5421, 5422, 5423, 5424, 5425, 5426, 5427, 5428, 5429, 5430, 5431, 5432, 5433, 5434, 5435, 5436, 5437, 5438, 5439, 5440, 5441, 5442, 5443, 5444, 5445, 5446, 5447, 5448, 5449, 5450, 5451, 5452, 5453, 5454, 5455, 5456, 5457, 5458, 5459, 5460, 5461, 5462, 5463, 5464, 5465, 5466, 5467, 5468, 5469, 5470, 5471, 5472, 5473, 5474, 5475, 5476, 5477, 5478, 5479, 5480, 5481, 5482, 5483, 5484, 5485, 5486, 5487, 5488, 5489, 5490, 5491, 5492, 5493, 5494, 5495, 5496, 5497, 5498, 5499, 5500, 5501, 5502, 5503, 6656, 6657, 6658, 6659, 6660, 6661, 6662, 6663, 6664, 6665, 6666, 6667, 6668, 6669, 6670, 6671, 6672, 6673, 6674, 6675, 6676, 6677, 6678, 6679, 6680, 6681, 6682, 6683, 6684, 6685, 6686, 6687, 6688, 6689, 6690, 6691, 6692, 6693, 6694, 6695, 6696, 6697, 6698, 6699, 6700, 6701, 6702, 6703, 6704, 6705, 6706, 6707, 6708, 6709, 6710, 6711, 6712, 6713, 6714, 6715, 6716, 6717, 6718, 6719, 6720, 6721, 6722, 6723, 6724, 6725, 6726, 6727, 6728, 6729, 6730, 6731, 6732, 6733, 6734, 6735, 6736, 6737, 6738, 6739, 6740, 6741, 6742, 6743, 6744, 6745, 6746, 6747, 6748, 6749, 6750, 6751, 6752, 6753, 6754, 6755, 6756, 6757, 6758, 6759, 6760, 6761, 6762, 6763, 6764, 6765, 6766, 6767, 6768, 6769, 6770, 6771, 6772, 6773, 6774, 6775, 6776, 6777, 6778, 6779, 6780, 6781, 6782, 6783, 6784, 6785, 6786, 6787, 6788, 6789, 6790, 6791, 6792, 6793, 6794, 6795, 6796, 6797, 6798, 6799, 6800, 6801, 6802, 6803, 6804, 6805, 6806, 6807, 6808, 6809, 6810, 6811, 6812, 6813, 6814, 6815, 6816, 6817, 6818, 6819, 6820, 6821, 6822, 6823, 6824, 6825, 6826, 6827, 6828, 6829, 6830, 6831, 6832, 6833, 6834, 6835, 6836, 6837, 6838, 6839, 6840, 6841, 6842, 6843, 6844, 6845, 6846, 6847, 6848, 6849, 6850, 6851, 6852, 6853, 6854, 6855, 6856, 6857, 6858, 6859, 6860, 6861, 6862, 6863, 6864, 6865, 6866, 6867, 6868, 6869, 6870, 6871, 6872, 6873, 6874, 6875, 6876, 6877, 6878, 6879, 6880, 6881, 6882, 6883, 6884, 6885, 6886, 6887, 6888, 6889, 6890, 6891, 6892, 6893, 6894, 6895, 6896, 6897, 6898, 6899, 6900, 6901, 6902, 6903, 6904, 6905, 6906, 6907, 6908, 6909, 6910, 6911, 7552, 7553, 7554, 7555, 7556, 7557, 7558, 7559, 7560, 7561, 7562, 7563, 7564, 7565, 7566, 7567, 7568, 7569, 7570, 7571, 7572, 7573, 7574, 7575, 7576, 7577, 7578, 7579, 7580, 7581, 7582, 7583, 7584, 7585, 7586, 7587, 7588, 7589, 7590, 7591, 7592, 7593, 7594, 7595, 7596, 7597, 7598, 7599, 7600, 7601, 7602, 7603, 7604, 7605, 7606, 7607, 7608, 7609, 7610, 7611, 7612, 7613, 7614, 7615, 7616, 7617, 7618, 7619, 7620, 7621, 7622, 7623, 7624, 7625, 7626, 7627, 7628, 7629, 7630, 7631, 7632, 7633, 7634, 7635, 7636, 7637, 7638, 7639, 7640, 7641, 7642, 7643, 7644, 7645, 7646, 7647, 7648, 7649, 7650, 7651, 7652, 7653, 7654, 7655, 7656, 7657, 7658, 7659, 7660, 7661, 7662, 7663, 7664, 7665, 7666, 7667, 7668, 7669, 7670, 7671, 7672, 7673, 7674, 7675, 7676, 7677, 7678, 7679, 5760, 5761, 5762, 5763, 5764, 5765, 5766, 5767, 5768, 5769, 5770, 5771, 5772, 5773, 5774, 5775, 5776, 5777, 5778, 5779, 5780, 5781, 5782, 5783, 5784, 5785, 5786, 5787, 5788, 5789, 5790, 5791, 5792, 5793, 5794, 5795, 5796, 5797, 5798, 5799, 5800, 5801, 5802, 5803, 5804, 5805, 5806, 5807, 5808, 5809, 5810, 5811, 5812, 5813, 5814, 5815, 5816, 5817, 5818, 5819, 5820, 5821, 5822, 5823, 5824, 5825, 5826, 5827, 5828, 5829, 5830, 5831, 5832, 5833, 5834, 5835, 5836, 5837, 5838, 5839, 5840, 5841, 5842, 5843, 5844, 5845, 5846, 5847, 5848, 5849, 5850, 5851, 5852, 5853, 5854, 5855, 5856, 5857, 5858, 5859, 5860, 5861, 5862, 5863, 5864, 5865, 5866, 5867, 5868, 5869, 5870, 5871, 5872, 5873, 5874, 5875, 5876, 5877, 5878, 5879, 5880, 5881, 5882, 5883, 5884, 5885, 5886, 5887, 6912, 6913, 6914, 6915, 6916, 6917, 6918, 6919, 6920, 6921, 6922, 6923, 6924, 6925, 6926, 6927, 6928, 6929, 6930, 6931, 6932, 6933, 6934, 6935, 6936, 6937, 6938, 6939, 6940, 6941, 6942, 6943, 6944, 6945, 6946, 6947, 6948, 6949, 6950, 6951, 6952, 6953, 6954, 6955, 6956, 6957, 6958, 6959, 6960, 6961, 6962, 6963, 6964, 6965, 6966, 6967, 6968, 6969, 6970, 6971, 6972, 6973, 6974, 6975, 6976, 6977, 6978, 6979, 6980, 6981, 6982, 6983, 6984, 6985, 6986, 6987, 6988, 6989, 6990, 6991, 6992, 6993, 6994, 6995, 6996, 6997, 6998, 6999, 7000, 7001, 7002, 7003, 7004, 7005, 7006, 7007, 7008, 7009, 7010, 7011, 7012, 7013, 7014, 7015, 7016, 7017, 7018, 7019, 7020, 7021, 7022, 7023, 7024, 7025, 7026, 7027, 7028, 7029, 7030, 7031, 7032, 7033, 7034, 7035, 7036, 7037, 7038, 7039, 7040, 7041, 7042, 7043, 7044, 7045, 7046, 7047, 7048, 7049, 7050, 7051, 7052, 7053, 7054, 7055, 7056, 7057, 7058, 7059, 7060, 7061, 7062, 7063, 7064, 7065, 7066, 7067, 7068, 7069, 7070, 7071, 7072, 7073, 7074, 7075, 7076, 7077, 7078, 7079, 7080, 7081, 7082, 7083, 7084, 7085, 7086, 7087, 7088, 7089, 7090, 7091, 7092, 7093, 7094, 7095, 7096, 7097, 7098, 7099, 7100, 7101, 7102, 7103, 7104, 7105, 7106, 7107, 7108, 7109, 7110, 7111, 7112, 7113, 7114, 7115, 7116, 7117, 7118, 7119, 7120, 7121, 7122, 7123, 7124, 7125, 7126, 7127, 7128, 7129, 7130, 7131, 7132, 7133, 7134, 7135, 7136, 7137, 7138, 7139, 7140, 7141, 7142, 7143, 7144, 7145, 7146, 7147, 7148, 7149, 7150, 7151, 7152, 7153, 7154, 7155, 7156, 7157, 7158, 7159, 7160, 7161, 7162, 7163, 7164, 7165, 7166, 7167, 7680, 7681, 7682, 7683, 7684, 7685, 7686, 7687, 7688, 7689, 7690, 7691, 7692, 7693, 7694, 7695, 7696, 7697, 7698, 7699, 7700, 7701, 7702, 7703, 7704, 7705, 7706, 7707, 7708, 7709, 7710, 7711, 7712, 7713, 7714, 7715, 7716, 7717, 7718, 7719, 7720, 7721, 7722, 7723, 7724, 7725, 7726, 7727, 7728, 7729, 7730, 7731, 7732, 7733, 7734, 7735, 7736, 7737, 7738, 7739, 7740, 7741, 7742, 7743, 7744, 7745, 7746, 7747, 7748, 7749, 7750, 7751, 7752, 7753, 7754, 7755, 7756, 7757, 7758, 7759, 7760, 7761, 7762, 7763, 7764, 7765, 7766, 7767, 7768, 7769, 7770, 7771, 7772, 7773, 7774, 7775, 7776, 7777, 7778, 7779, 7780, 7781, 7782, 7783, 7784, 7785, 7786, 7787, 7788, 7789, 7790, 7791, 7792, 7793, 7794, 7795, 7796, 7797, 7798, 7799, 7800, 7801, 7802, 7803, 7804, 7805, 7806, 7807, 7296, 7297, 7298, 7299, 7300, 7301, 7302, 7303, 7304, 7305, 7306, 7307, 7308, 7309, 7310, 7311, 7312, 7313, 7314, 7315, 7316, 7317, 7318, 7319, 7320, 7321, 7322, 7323, 7324, 7325, 7326, 7327, 7328, 7329, 7330, 7331, 7332, 7333, 7334, 7335, 7336, 7337, 7338, 7339, 7340, 7341, 7342, 7343, 7344, 7345, 7346, 7347, 7348, 7349, 7350, 7351, 7352, 7353, 7354, 7355, 7356, 7357, 7358, 7359, 7360, 7361, 7362, 7363, 7364, 7365, 7366, 7367, 7368, 7369, 7370, 7371, 7372, 7373, 7374, 7375, 7376, 7377, 7378, 7379, 7380, 7381, 7382, 7383, 7384, 7385, 7386, 7387, 7388, 7389, 7390, 7391, 7392, 7393, 7394, 7395, 7396, 7397, 7398, 7399, 7400, 7401, 7402, 7403, 7404, 7405, 7406, 7407, 7408, 7409, 7410, 7411, 7412, 7413, 7414, 7415, 7416, 7417, 7418, 7419, 7420, 7421, 7422, 7423, 7808, 7809, 7810, 7811, 7812, 7813, 7814, 7815, 7816, 7817, 7818, 7819, 7820, 7821, 7822, 7823, 7824, 7825, 7826, 7827, 7828, 7829, 7830, 7831, 7832, 7833, 7834, 7835, 7836, 7837, 7838, 7839, 7840, 7841, 7842, 7843, 7844, 7845, 7846, 7847, 7848, 7849, 7850, 7851, 7852, 7853, 7854, 7855, 7856, 7857, 7858, 7859, 7860, 7861, 7862, 7863, 7864, 7865, 7866, 7867, 7868, 7869, 7870, 7871, 7872, 7873, 7874, 7875, 7876, 7877, 7878, 7879, 7880, 7881, 7882, 7883, 7884, 7885, 7886, 7887, 7888, 7889, 7890, 7891, 7892, 7893, 7894, 7895, 7896, 7897, 7898, 7899, 7900, 7901, 7902, 7903, 7904, 7905, 7906, 7907, 7908, 7909, 7910, 7911, 7912, 7913, 7914, 7915, 7916, 7917, 7918, 7919, 7920, 7921, 7922, 7923, 7924, 7925, 7926, 7927, 7928, 7929, 7930, 7931, 7932, 7933, 7934, 7935, 7936, 7937, 7938, 7939, 7940, 7941, 7942, 7943, 7944, 7945, 7946, 7947, 7948, 7949, 7950, 7951, 7952, 7953, 7954, 7955, 7956, 7957, 7958, 7959, 7960, 7961, 7962, 7963, 7964, 7965, 7966, 7967, 7968, 7969, 7970, 7971, 7972, 7973, 7974, 7975, 7976, 7977, 7978, 7979, 7980, 7981, 7982, 7983, 7984, 7985, 7986, 7987, 7988, 7989, 7990, 7991, 7992, 7993, 7994, 7995, 7996, 7997, 7998, 7999, 8000, 8001, 8002, 8003, 8004, 8005, 8006, 8007, 8008, 8009, 8010, 8011, 8012, 8013, 8014, 8015, 8016, 8017, 8018, 8019, 8020, 8021, 8022, 8023, 8024, 8025, 8026, 8027, 8028, 8029, 8030, 8031, 8032, 8033, 8034, 8035, 8036, 8037, 8038, 8039, 8040, 8041, 8042, 8043, 8044, 8045, 8046, 8047, 8048, 8049, 8050, 8051, 8052, 8053, 8054, 8055, 8056, 8057, 8058, 8059, 8060, 8061, 8062, 8063, 8064, 8065, 8066, 8067, 8068, 8069, 8070, 8071, 8072, 8073, 8074, 8075, 8076, 8077, 8078, 8079, 8080, 8081, 8082, 8083, 8084, 8085, 8086, 8087, 8088, 8089, 8090, 8091, 8092, 8093, 8094, 8095, 8096, 8097, 8098, 8099, 8100, 8101, 8102, 8103, 8104, 8105, 8106, 8107, 8108, 8109, 8110, 8111, 8112, 8113, 8114, 8115, 8116, 8117, 8118, 8119, 8120, 8121, 8122, 8123, 8124, 8125, 8126, 8127, 8128, 8129, 8130, 8131, 8132, 8133, 8134, 8135, 8136, 8137, 8138, 8139, 8140, 8141, 8142, 8143, 8144, 8145, 8146, 8147, 8148, 8149, 8150, 8151, 8152, 8153, 8154, 8155, 8156, 8157, 8158, 8159, 8160, 8161, 8162, 8163, 8164, 8165, 8166, 8167, 8168, 8169, 8170, 8171, 8172, 8173, 8174, 8175, 8176, 8177, 8178, 8179, 8180, 8181, 8182, 8183, 8184, 8185, 8186, 8187, 8188, 8189, 8190, 8191].

When N=8192, a sequence 1a is the sequence 1, a sequence 2a is the sequence 2, and a sequence 3a is the sequence 3.

When N=4096:

A sequence 1b is as follows:

Punc_Q=[0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 512, 513, 514, 515, 516, 517, 518, 519, 520, 521, 522, 523, 524, 525, 526, 527, 528, 529, 530, 531, 532, 533, 534, 535, 536, 537, 538, 539, 540, 541, 542, 543, 544, 545, 546, 547, 548, 549, 550, 551, 552, 553, 554, 555, 556, 557, 558, 559, 560, 561, 562, 563, 564, 565, 566, 567, 568, 569, 570, 571, 572, 573, 574, 575, 576, 577, 578, 579, 580, 581, 582, 583, 584, 585, 586, 587, 588, 589, 590, 591, 592, 593, 594, 595, 596, 597, 598, 599, 600, 601, 602, 603, 604, 605, 606, 607, 608, 609, 610, 611, 612, 613, 614, 615, 616, 617, 618, 619, 620, 621, 622, 623, 624, 625, 626, 627, 628, 629, 630, 631, 632, 633, 634, 635, 636, 637, 638, 639, 1024, 1025, 1026, 1027, 1028, 1029, 1030, 1031, 1032, 1033, 1034, 1035, 1036, 1037, 1038, 1039, 1040, 1041, 1042, 1043, 1044, 1045, 1046, 1047, 1048, 1049, 1050, 1051, 1052, 1053, 1054, 1055, 1056, 1057, 1058, 1059, 1060, 1061, 1062, 1063, 1064, 1065, 1066, 1067, 1068, 1069, 1070, 1071, 1072, 1073, 1074, 1075, 1076, 1077, 1078, 1079, 1080, 1081, 1082, 1083, 1084, 1085, 1086, 1087, 1088, 1089, 1090, 1091, 1092, 1093, 1094, 1095, 1096, 1097, 1098, 1099, 1100, 1101, 1102, 1103, 1104, 1105, 1106, 1107, 1108, 1109, 1110, 1111, 1112, 1113, 1114, 1115, 1116, 1117, 1118, 1119, 1120, 1121, 1122, 1123, 1124, 1125, 1126, 1127, 1128, 1129, 1130, 1131, 1132, 1133, 1134, 1135, 1136, 1137, 1138, 1139, 1140, 1141, 1142, 1143, 1144, 1145, 1146, 1147, 1148, 1149, 1150, 1151, 2048, 2049, 2050, 2051, 2052, 2053, 2054, 2055, 2056, 2057, 2058, 2059, 2060, 2061, 2062, 2063, 2064, 2065, 2066, 2067, 2068, 2069, 2070, 2071, 2072, 2073, 2074, 2075, 2076, 2077, 2078, 2079, 2080, 2081, 2082, 2083, 2084, 2085, 2086, 2087, 2088, 2089, 2090, 2091, 2092, 2093, 2094, 2095, 2096, 2097, 2098, 2099, 2100, 2101, 2102, 2103, 2104, 2105, 2106, 2107, 2108, 2109, 2110, 2111, 2112, 2113, 2114, 2115, 2116, 2117, 2118, 2119, 2120, 2121, 2122, 2123, 2124, 2125, 2126, 2127, 2128, 2129, 2130, 2131, 2132, 2133, 2134, 2135, 2136, 2137, 2138, 2139, 2140, 2141, 2142, 2143, 2144, 2145, 2146, 2147, 2148, 2149, 2150, 2151, 2152, 2153, 2154, 2155, 2156, 2157, 2158, 2159, 2160, 2161, 2162, 2163, 2164, 2165, 2166, 2167, 2168, 2169, 2170, 2171, 2172, 2173, 2174, 2175, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 501, 502, 503, 504, 505, 506, 507, 508, 509, 510, 511, 640, 641, 642, 643, 644, 645, 646, 647, 648, 649, 650, 651, 652, 653, 654, 655, 656, 657, 658, 659, 660, 661, 662, 663, 664, 665, 666, 667, 668, 669, 670, 671, 672, 673, 674, 675, 676, 677, 678, 679, 680, 681, 682, 683, 684, 685, 686, 687, 688, 689, 690, 691, 692, 693, 694, 695, 696, 697, 698, 699, 700, 701, 702, 703, 704, 705, 706, 707, 708, 709, 710, 711, 712, 713, 714, 715, 716, 717, 718, 719, 720, 721, 722, 723, 724, 725, 726, 727, 728, 729, 730, 731, 732, 733, 734, 735, 736, 737, 738, 739, 740, 741, 742, 743, 744, 745, 746, 747, 748, 749, 750, 751, 752, 753, 754, 755, 756, 757, 758, 759, 760, 761, 762, 763, 764, 765, 766, 767, 768, 769, 770, 771, 772, 773, 774, 775, 776, 777, 778, 779, 780, 781, 782, 783, 784, 785, 786, 787, 788, 789, 790, 791, 792, 793, 794, 795, 796, 797, 798, 799, 800, 801, 802, 803, 804, 805, 806, 807, 808, 809, 810, 811, 812, 813, 814, 815, 816, 817, 818, 819, 820, 821, 822, 823, 824, 825, 826, 827, 828, 829, 830, 831, 832, 833, 834, 835, 836, 837, 838, 839, 840, 841, 842, 843, 844, 845, 846, 847, 848, 849, 850, 851, 852, 853, 854, 855, 856, 857, 858, 859, 860, 861, 862, 863, 864, 865, 866, 867, 868, 869, 870, 871, 872, 873, 874, 875, 876, 877, 878, 879, 880, 881, 882, 883, 884, 885, 886, 887, 888, 889, 890, 891, 892, 893, 894, 895, 1152, 1153, 1154, 1155, 1156, 1157, 1158, 1159, 1160, 1161, 1162, 1163, 1164, 1165, 1166, 1167, 1168, 1169, 1170, 1171, 1172, 1173, 1174, 1175, 1176, 1177, 1178, 1179, 1180, 1181, 1182, 1183, 1184, 1185, 1186, 1187, 1188, 1189, 1190, 1191, 1192, 1193, 1194, 1195, 1196, 1197, 1198, 1199, 1200, 1201, 1202, 1203, 1204, 1205, 1206, 1207, 1208, 1209, 1210, 1211, 1212, 1213, 1214, 1215, 1216, 1217, 1218, 1219, 1220, 1221, 1222, 1223, 1224, 1225, 1226, 1227, 1228, 1229, 1230, 1231, 1232, 1233, 1234, 1235, 1236, 1237, 1238, 1239, 1240, 1241, 1242, 1243, 1244, 1245, 1246, 1247, 1248, 1249, 1250, 1251, 1252, 1253, 1254, 1255, 1256, 1257, 1258, 1259, 1260, 1261, 1262, 1263, 1264, 1265, 1266, 1267, 1268, 1269, 1270, 1271, 1272, 1273, 1274, 1275, 1276, 1277, 1278, 1279, 1280, 1281, 1282, 1283, 1284, 1285, 1286, 1287, 1288, 1289, 1290, 1291, 1292, 1293, 1294, 1295, 1296, 1297, 1298, 1299, 1300, 1301, 1302, 1303, 1304, 1305, 1306, 1307, 1308, 1309, 1310, 1311, 1312, 1313, 1314, 1315, 1316, 1317, 1318, 1319, 1320, 1321, 1322, 1323, 1324, 1325, 1326, 1327, 1328, 1329, 1330, 1331, 1332, 1333, 1334, 1335, 1336, 1337, 1338, 1339, 1340, 1341, 1342, 1343, 1344, 1345, 1346, 1347, 1348, 1349, 1350, 1351, 1352, 1353, 1354, 1355, 1356, 1357, 1358, 1359, 1360, 1361, 1362, 1363, 1364, 1365, 1366, 1367, 1368, 1369, 1370, 1371, 1372, 1373, 1374, 1375, 1376, 1377, 1378, 1379, 1380, 1381, 1382, 1383, 1384, 1385, 1386, 1387, 1388, 1389, 1390, 1391, 1392, 1393, 1394, 1395, 1396, 1397, 1398, 1399, 1400, 1401, 1402, 1403, 1404, 1405, 1406, 1407, 2176, 2177, 2178, 2179, 2180, 2181, 2182, 2183, 2184, 2185, 2186, 2187, 2188, 2189, 2190, 2191, 2192, 2193, 2194, 2195, 2196, 2197, 2198, 2199, 2200, 2201, 2202, 2203, 2204, 2205, 2206, 2207, 2208, 2209, 2210, 2211, 2212, 2213, 2214, 2215, 2216, 2217, 2218, 2219, 2220, 2221, 2222, 2223, 2224, 2225, 2226, 2227, 2228, 2229, 2230, 2231, 2232, 2233, 2234, 2235, 2236, 2237, 2238, 2239, 2240, 2241, 2242, 2243, 2244, 2245, 2246, 2247, 2248, 2249, 2250, 2251, 2252, 2253, 2254, 2255, 2256, 2257, 2258, 2259, 2260, 2261, 2262, 2263, 2264, 2265, 2266, 2267, 2268, 2269, 2270, 2271, 2272, 2273, 2274, 2275, 2276, 2277, 2278, 2279, 2280, 2281, 2282, 2283, 2284, 2285, 2286, 2287, 2288, 2289, 2290, 2291, 2292, 2293, 2294, 2295, 2296, 2297, 2298, 2299, 2300, 2301, 2302, 2303, 1536, 1537, 1538, 1539, 1540, 1541, 1542, 1543, 1544, 1545, 1546, 1547, 1548, 1549, 1550, 1551, 1552, 1553, 1554, 1555, 1556, 1557, 1558, 1559, 1560, 1561, 1562, 1563, 1564, 1565, 1566, 1567, 1568, 1569, 1570, 1571, 1572, 1573, 1574, 1575, 1576, 1577, 1578, 1579, 1580, 1581, 1582, 1583, 1584, 1585, 1586, 1587, 1588, 1589, 1590, 1591, 1592, 1593, 1594, 1595, 1596, 1597, 1598, 1599, 1600, 1601, 1602, 1603, 1604, 1605, 1606, 1607, 1608, 1609, 1610, 1611, 1612, 1613, 1614, 1615, 1616, 1617, 1618, 1619, 1620, 1621, 1622, 1623, 1624, 1625, 1626, 1627, 1628, 1629, 1630, 1631, 1632, 1633, 1634, 1635, 1636, 1637, 1638, 1639, 1640, 1641, 1642, 1643, 1644, 1645, 1646, 1647, 1648, 1649, 1650, 1651, 1652, 1653, 1654, 1655, 1656, 1657, 1658, 1659, 1660, 1661, 1662, 1663, 2304, 2305, 2306, 2307, 2308, 2309, 2310, 2311, 2312, 2313, 2314, 2315, 2316, 2317, 2318, 2319, 2320, 2321, 2322, 2323, 2324, 2325, 2326, 2327, 2328, 2329, 2330, 2331, 2332, 2333, 2334, 2335, 2336, 2337, 2338, 2339, 2340, 2341, 2342, 2343, 2344, 2345, 2346, 2347, 2348, 2349, 2350, 2351, 2352, 2353, 2354, 2355, 2356, 2357, 2358, 2359, 2360, 2361, 2362, 2363, 2364, 2365, 2366, 2367, 2368, 2369, 2370, 2371, 2372, 2373, 2374, 2375, 2376, 2377, 2378, 2379, 2380, 2381, 2382, 2383, 2384, 2385, 2386, 2387, 2388, 2389, 2390, 2391, 2392, 2393, 2394, 2395, 2396, 2397, 2398, 2399, 2400, 2401, 2402, 2403, 2404, 2405, 2406, 2407, 2408, 2409, 2410, 2411, 2412, 2413, 2414, 2415, 2416, 2417, 2418, 2419, 2420, 2421, 2422, 2423, 2424, 2425, 2426, 2427, 2428, 2429, 2430, 2431, 2560, 2561, 2562, 2563, 2564, 2565, 2566, 2567, 2568, 2569, 2570, 2571, 2572, 2573, 2574, 2575, 2576, 2577, 2578, 2579, 2580, 2581, 2582, 2583, 2584, 2585, 2586, 2587, 2588, 2589, 2590, 2591, 2592, 2593, 2594, 2595, 2596, 2597, 2598, 2599, 2600, 2601, 2602, 2603, 2604, 2605, 2606, 2607, 2608, 2609, 2610, 2611, 2612, 2613, 2614, 2615, 2616, 2617, 2618, 2619, 2620, 2621, 2622, 2623, 2624, 2625, 2626, 2627, 2628, 2629, 2630, 2631, 2632, 2633, 2634, 2635, 2636, 2637, 2638, 2639, 2640, 2641, 2642, 2643, 2644, 2645, 2646, 2647, 2648, 2649, 2650, 2651, 2652, 2653, 2654, 2655, 2656, 2657, 2658, 2659, 2660, 2661, 2662, 2663, 2664, 2665, 2666, 2667, 2668, 2669, 2670, 2671, 2672, 2673, 2674, 2675, 2676, 2677, 2678, 2679, 2680, 2681, 2682, 2683, 2684, 2685, 2686, 2687, 896, 897, 898, 899, 900, 901, 902, 903, 904, 905, 906, 907, 908, 909, 910, 911, 912, 913, 914, 915, 916, 917, 918, 919, 920, 921, 922, 923, 924, 925, 926, 927, 928, 929, 930, 931, 932, 933, 934, 935, 936, 937, 938, 939, 940, 941, 942, 943, 944, 945, 946, 947, 948, 949, 950, 951, 952, 953, 954, 955, 956, 957, 958, 959, 960, 961, 962, 963, 964, 965, 966, 967, 968, 969, 970, 971, 972, 973, 974, 975, 976, 977, 978, 979, 980, 981, 982, 983, 984, 985, 986, 987, 988, 989, 990, 991, 992, 993, 994, 995, 996, 997, 998, 999, 1000, 1001, 1002, 1003, 1004, 1005, 1006, 1007, 1008, 1009, 1010, 1011, 1012, 1013, 1014, 1015, 1016, 1017, 1018, 1019, 1020, 1021, 1022, 1023, 3072, 3073, 3074, 3075, 3076, 3077, 3078, 3079, 3080, 3081, 3082, 3083, 3084, 3085, 3086, 3087, 3088, 3089, 3090, 3091, 3092, 3093, 3094, 3095, 3096, 3097, 3098, 3099, 3100, 3101, 3102, 3103, 3104, 3105, 3106, 3107, 3108, 3109, 3110, 3111, 3112, 3113, 3114, 3115, 3116, 3117, 3118, 3119, 3120, 3121, 3122, 3123, 3124, 3125, 3126, 3127, 3128, 3129, 3130, 3131, 3132, 3133, 3134, 3135, 3136, 3137, 3138, 3139, 3140, 3141, 3142, 3143, 3144, 3145, 3146, 3147, 3148, 3149, 3150, 3151, 3152, 3153, 3154, 3155, 3156, 3157, 3158, 3159, 3160, 3161, 3162, 3163, 3164, 3165, 3166, 3167, 3168, 3169, 3170, 3171, 3172, 3173, 3174, 3175, 3176, 3177, 3178, 3179, 3180, 3181, 3182, 3183, 3184, 3185, 3186, 3187, 3188, 3189, 3190, 3191, 3192, 3193, 3194, 3195, 3196, 3197, 3198, 3199, 1408, 1409, 1410, 1411, 1412, 1413, 1414, 1415, 1416, 1417, 1418, 1419, 1420, 1421, 1422, 1423, 1424, 1425, 1426, 1427, 1428, 1429, 1430, 1431, 1432, 1433, 1434, 1435, 1436, 1437, 1438, 1439, 1440, 1441, 1442, 1443, 1444, 1445, 1446, 1447, 1448, 1449, 1450, 1451, 1452, 1453, 1454, 1455, 1456, 1457, 1458, 1459, 1460, 1461, 1462, 1463, 1464, 1465, 1466, 1467, 1468, 1469, 1470, 1471, 1472, 1473, 1474, 1475, 1476, 1477, 1478, 1479, 1480, 1481, 1482, 1483, 1484, 1485, 1486, 1487, 1488, 1489, 1490, 1491, 1492, 1493, 1494, 1495, 1496, 1497, 1498, 1499, 1500, 1501, 1502, 1503, 1504, 1505, 1506, 1507, 1508, 1509, 1510, 1511, 1512, 1513, 1514, 1515, 1516, 1517, 1518, 1519, 1520, 1521, 1522, 1523, 1524, 1525, 1526, 1527, 1528, 1529, 1530, 1531, 1532, 1533, 1534, 1535, 1664, 1665, 1666, 1667, 1668, 1669, 1670, 1671, 1672, 1673, 1674, 1675, 1676, 1677, 1678, 1679, 1680, 1681, 1682, 1683, 1684, 1685, 1686, 1687, 1688, 1689, 1690, 1691, 1692, 1693, 1694, 1695, 1696, 1697, 1698, 1699, 1700, 1701, 1702, 1703, 1704, 1705, 1706, 1707, 1708, 1709, 1710, 1711, 1712, 1713, 1714, 1715, 1716, 1717, 1718, 1719, 1720, 1721, 1722, 1723, 1724, 1725, 1726, 1727, 1728, 1729, 1730, 1731, 1732, 1733, 1734, 1735, 1736, 1737, 1738, 1739, 1740, 1741, 1742, 1743, 1744, 1745, 1746, 1747, 1748, 1749, 1750, 1751, 1752, 1753, 1754, 1755, 1756, 1757, 1758, 1759, 1760, 1761, 1762, 1763, 1764, 1765, 1766, 1767, 1768, 1769, 1770, 1771, 1772, 1773, 1774, 1775, 1776, 1777, 1778, 1779, 1780, 1781, 1782, 1783, 1784, 1785, 1786, 1787, 1788, 1789, 1790, 1791, 2432, 2433, 2434, 2435, 2436, 2437, 2438, 2439, 2440, 2441, 2442, 2443, 2444, 2445, 2446, 2447, 2448, 2449, 2450, 2451, 2452, 2453, 2454, 2455, 2456, 2457, 2458, 2459, 2460, 2461, 2462, 2463, 2464, 2465, 2466, 2467, 2468, 2469, 2470, 2471, 2472, 2473, 2474, 2475, 2476, 2477, 2478, 2479, 2480, 2481, 2482, 2483, 2484, 2485, 2486, 2487, 2488, 2489, 2490, 2491, 2492, 2493, 2494, 2495, 2496, 2497, 2498, 2499, 2500, 2501, 2502, 2503, 2504, 2505, 2506, 2507, 2508, 2509, 2510, 2511, 2512, 2513, 2514, 2515, 2516, 2517, 2518, 2519, 2520, 2521, 2522, 2523, 2524, 2525, 2526, 2527, 2528, 2529, 2530, 2531, 2532, 2533, 2534, 2535, 2536, 2537, 2538, 2539, 2540, 2541, 2542, 2543, 2544, 2545, 2546, 2547, 2548, 2549, 2550, 2551, 2552, 2553, 2554, 2555, 2556, 2557, 2558, 2559, 1792, 1793, 1794, 1795, 1796, 1797, 1798, 1799, 1800, 1801, 1802, 1803, 1804, 1805, 1806, 1807, 1808, 1809, 1810, 1811, 1812, 1813, 1814, 1815, 1816, 1817, 1818, 1819, 1820, 1821, 1822, 1823, 1824, 1825, 1826, 1827, 1828, 1829, 1830, 1831, 1832, 1833, 1834, 1835, 1836, 1837, 1838, 1839, 1840, 1841, 1842, 1843, 1844, 1845, 1846, 1847, 1848, 1849, 1850, 1851, 1852, 1853, 1854, 1855, 1856, 1857, 1858, 1859, 1860, 1861, 1862, 1863, 1864, 1865, 1866, 1867, 1868, 1869, 1870, 1871, 1872, 1873, 1874, 1875, 1876, 1877, 1878, 1879, 1880, 1881, 1882, 1883, 1884, 1885, 1886, 1887, 1888, 1889, 1890, 1891, 1892, 1893, 1894, 1895, 1896, 1897, 1898, 1899, 1900, 1901, 1902, 1903, 1904, 1905, 1906, 1907, 1908, 1909, 1910, 1911, 1912, 1913, 1914, 1915, 1916, 1917, 1918, 1919, 2688, 2689, 2690, 2691, 2692, 2693, 2694, 2695, 2696, 2697, 2698, 2699, 2700, 2701, 2702, 2703, 2704, 2705, 2706, 2707, 2708, 2709, 2710, 2711, 2712, 2713, 2714, 2715, 2716, 2717, 2718, 2719, 2720, 2721, 2722, 2723, 2724, 2725, 2726, 2727, 2728, 2729, 2730, 2731, 2732, 2733, 2734, 2735, 2736, 2737, 2738, 2739, 2740, 2741, 2742, 2743, 2744, 2745, 2746, 2747, 2748, 2749, 2750, 2751, 2752, 2753, 2754, 2755, 2756, 2757, 2758, 2759, 2760, 2761, 2762, 2763, 2764, 2765, 2766, 2767, 2768, 2769, 2770, 2771, 2772, 2773, 2774, 2775, 2776, 2777, 2778, 2779, 2780, 2781, 2782, 2783, 2784, 2785, 2786, 2787, 2788, 2789, 2790, 2791, 2792, 2793, 2794, 2795, 2796, 2797, 2798, 2799, 2800, 2801, 2802, 2803, 2804, 2805, 2806, 2807, 2808, 2809, 2810, 2811, 2812, 2813, 2814, 2815, 2816, 2817, 2818, 2819, 2820, 2821, 2822, 2823, 2824, 2825, 2826, 2827, 2828, 2829, 2830, 2831, 2832, 2833, 2834, 2835, 2836, 2837, 2838, 2839, 2840, 2841, 2842, 2843, 2844, 2845, 2846, 2847, 2848, 2849, 2850, 2851, 2852, 2853, 2854, 2855, 2856, 2857, 2858, 2859, 2860, 2861, 2862, 2863, 2864, 2865, 2866, 2867, 2868, 2869, 2870, 2871, 2872, 2873, 2874, 2875, 2876, 2877, 2878, 2879, 2880, 2881, 2882, 2883, 2884, 2885, 2886, 2887, 2888, 2889, 2890, 2891, 2892, 2893, 2894, 2895, 2896, 2897, 2898, 2899, 2900, 2901, 2902, 2903, 2904, 2905, 2906, 2907, 2908, 2909, 2910, 2911, 2912, 2913, 2914, 2915, 2916, 2917, 2918, 2919, 2920, 2921, 2922, 2923, 2924, 2925, 2926, 2927, 2928, 2929, 2930, 2931, 2932, 2933, 2934, 2935, 2936, 2937, 2938, 2939, 2940, 2941, 2942, 2943, 3200, 3201, 3202, 3203, 3204, 3205, 3206, 3207, 3208, 3209, 3210, 3211, 3212, 3213, 3214, 3215, 3216, 3217, 3218, 3219, 3220, 3221, 3222, 3223, 3224, 3225, 3226, 3227, 3228, 3229, 3230, 3231, 3232, 3233, 3234, 3235, 3236, 3237, 3238, 3239, 3240, 3241, 3242, 3243, 3244, 3245, 3246, 3247, 3248, 3249, 3250, 3251, 3252, 3253, 3254, 3255, 3256, 3257, 3258, 3259, 3260, 3261, 3262, 3263, 3264, 3265, 3266, 3267, 3268, 3269, 3270, 3271, 3272, 3273, 3274, 3275, 3276, 3277, 3278, 3279, 3280, 3281, 3282, 3283, 3284, 3285, 3286, 3287, 3288, 3289, 3290, 3291, 3292, 3293, 3294, 3295, 3296, 3297, 3298, 3299, 3300, 3301, 3302, 3303, 3304, 3305, 3306, 3307, 3308, 3309, 3310, 3311, 3312, 3313, 3314, 3315, 3316, 3317, 3318, 3319, 3320, 3321, 3322, 3323, 3324, 3325, 3326, 3327, 3328, 3329, 3330, 3331, 3332, 3333, 3334, 3335, 3336, 3337, 3338, 3339, 3340, 3341, 3342, 3343, 3344, 3345, 3346, 3347, 3348, 3349, 3350, 3351, 3352, 3353, 3354, 3355, 3356, 3357, 3358, 3359, 3360, 3361, 3362, 3363, 3364, 3365, 3366, 3367, 3368, 3369, 3370, 3371, 3372, 3373, 3374, 3375, 3376, 3377, 3378, 3379, 3380, 3381, 3382, 3383, 3384, 3385, 3386, 3387, 3388, 3389, 3390, 3391, 3392, 3393, 3394, 3395, 3396, 3397, 3398, 3399, 3400, 3401, 3402, 3403, 3404, 3405, 3406, 3407, 3408, 3409, 3410, 3411, 3412, 3413, 3414, 3415, 3416, 3417, 3418, 3419, 3420, 3421, 3422, 3423, 3424, 3425, 3426, 3427, 3428, 3429, 3430, 3431, 3432, 3433, 3434, 3435, 3436, 3437, 3438, 3439, 3440, 3441, 3442, 3443, 3444, 3445, 3446, 3447, 3448, 3449, 3450, 3451, 3452, 3453, 3454, 3455, 3584, 3585, 3586, 3587, 3588, 3589, 3590, 3591, 3592, 3593, 3594, 3595, 3596, 3597, 3598, 3599, 3600, 3601, 3602, 3603, 3604, 3605, 3606, 3607, 3608, 3609, 3610, 3611, 3612, 3613, 3614, 3615, 3616, 3617, 3618, 3619, 3620, 3621, 3622, 3623, 3624, 3625, 3626, 3627, 3628, 3629, 3630, 3631, 3632, 3633, 3634, 3635, 3636, 3637, 3638, 3639, 3640, 3641, 3642, 3643, 3644, 3645, 3646, 3647, 3648, 3649, 3650, 3651, 3652, 3653, 3654, 3655, 3656, 3657, 3658, 3659, 3660, 3661, 3662, 3663, 3664, 3665, 3666, 3667, 3668, 3669, 3670, 3671, 3672, 3673, 3674, 3675, 3676, 3677, 3678, 3679, 3680, 3681, 3682, 3683, 3684, 3685, 3686, 3687, 3688, 3689, 3690, 3691, 3692, 3693, 3694, 3695, 3696, 3697, 3698, 3699, 3700, 3701, 3702, 3703, 3704, 3705, 3706, 3707, 3708, 3709, 3710, 3711, 1920, 1921, 1922, 1923, 1924, 1925, 1926, 1927, 1928, 1929, 1930, 1931, 1932, 1933, 1934, 1935, 1936, 1937, 1938, 1939, 1940, 1941, 1942, 1943, 1944, 1945, 1946, 1947, 1948, 1949, 1950, 1951, 1952, 1953, 1954, 1955, 1956, 1957, 1958, 1959, 1960, 1961, 1962, 1963, 1964, 1965, 1966, 1967, 1968, 1969, 1970, 1971, 1972, 1973, 1974, 1975, 1976, 1977, 1978, 1979, 1980, 1981, 1982, 1983, 1984, 1985, 1986, 1987, 1988, 1989, 1990, 1991, 1992, 1993, 1994, 1995, 1996, 1997, 1998, 1999, 2000, 2001, 2002, 2003, 2004, 2005, 2006, 2007, 2008, 2009, 2010, 2011, 2012, 2013, 2014, 2015, 2016, 2017, 2018, 2019, 2020, 2021, 2022, 2023, 2024, 2025, 2026, 2027, 2028, 2029, 2030, 2031, 2032, 2033, 2034, 2035, 2036, 2037, 2038, 2039, 2040, 2041, 2042, 2043, 2044, 2045, 2046, 2047, 2944, 2945, 2946, 2947, 2948, 2949, 2950, 2951, 2952, 2953, 2954, 2955, 2956, 2957, 2958, 2959, 2960, 2961, 2962, 2963, 2964, 2965, 2966, 2967, 2968, 2969, 2970, 2971, 2972, 2973, 2974, 2975, 2976, 2977, 2978, 2979, 2980, 2981, 2982, 2983, 2984, 2985, 2986, 2987, 2988, 2989, 2990, 2991, 2992, 2993, 2994, 2995, 2996, 2997, 2998, 2999, 3000, 3001, 3002, 3003, 3004, 3005, 3006, 3007, 3008, 3009, 3010, 3011, 3012, 3013, 3014, 3015, 3016, 3017, 3018, 3019, 3020, 3021, 3022, 3023, 3024, 3025, 3026, 3027, 3028, 3029, 3030, 3031, 3032, 3033, 3034, 3035, 3036, 3037, 3038, 3039, 3040, 3041, 3042, 3043, 3044, 3045, 3046, 3047, 3048, 3049, 3050, 3051, 3052, 3053, 3054, 3055, 3056, 3057, 3058, 3059, 3060, 3061, 3062, 3063, 3064, 3065, 3066, 3067, 3068, 3069, 3070, 3071, 3456, 3457, 3458, 3459, 3460, 3461, 3462, 3463, 3464, 3465, 3466, 3467, 3468, 3469, 3470, 3471, 3472, 3473, 3474, 3475, 3476, 3477, 3478, 3479, 3480, 3481, 3482, 3483, 3484, 3485, 3486, 3487, 3488, 3489, 3490, 3491, 3492, 3493, 3494, 3495, 3496, 3497, 3498, 3499, 3500, 3501, 3502, 3503, 3504, 3505, 3506, 3507, 3508, 3509, 3510, 3511, 3512, 3513, 3514, 3515, 3516, 3517, 3518, 3519, 3520, 3521, 3522, 3523, 3524, 3525, 3526, 3527, 3528, 3529, 3530, 3531, 3532, 3533, 3534, 3535, 3536, 3537, 3538, 3539, 3540, 3541, 3542, 3543, 3544, 3545, 3546, 3547, 3548, 3549, 3550, 3551, 3552, 3553, 3554, 3555, 3556, 3557, 3558, 3559, 3560, 3561, 3562, 3563, 3564, 3565, 3566, 3567, 3568, 3569, 3570, 3571, 3572, 3573, 3574, 3575, 3576, 3577, 3578, 3579, 3580, 3581, 3582, 3583, 3712, 3713, 3714, 3715, 3716, 3717, 3718, 3719, 3720, 3721, 3722, 3723, 3724, 3725, 3726, 3727, 3728, 3729, 3730, 3731, 3732, 3733, 3734, 3735, 3736, 3737, 3738, 3739, 3740, 3741, 3742, 3743, 3744, 3745, 3746, 3747, 3748, 3749, 3750, 3751, 3752, 3753, 3754, 3755, 3756, 3757, 3758, 3759, 3760, 3761, 3762, 3763, 3764, 3765, 3766, 3767, 3768, 3769, 3770, 3771, 3772, 3773, 3774, 3775, 3776, 3777, 3778, 3779, 3780, 3781, 3782, 3783, 3784, 3785, 3786, 3787, 3788, 3789, 3790, 3791, 3792, 3793, 3794, 3795, 3796, 3797, 3798, 3799, 3800, 3801, 3802, 3803, 3804, 3805, 3806, 3807, 3808, 3809, 3810, 3811, 3812, 3813, 3814, 3815, 3816, 3817, 3818, 3819, 3820, 3821, 3822, 3823, 3824, 3825, 3826, 3827, 3828, 3829, 3830, 3831, 3832, 3833, 3834, 3835, 3836, 3837, 3838, 3839, 3840, 3841, 3842, 3843, 3844, 3845, 3846, 3847, 3848, 3849, 3850, 3851, 3852, 3853, 3854, 3855, 3856, 3857, 3858, 3859, 3860, 3861, 3862, 3863, 3864, 3865, 3866, 3867, 3868, 3869, 3870, 3871, 3872, 3873, 3874, 3875, 3876, 3877, 3878, 3879, 3880, 3881, 3882, 3883, 3884, 3885, 3886, 3887, 3888, 3889, 3890, 3891, 3892, 3893, 3894, 3895, 3896, 3897, 3898, 3899, 3900, 3901, 3902, 3903, 3904, 3905, 3906, 3907, 3908, 3909, 3910, 3911, 3912, 3913, 3914, 3915, 3916, 3917, 3918, 3919, 3920, 3921, 3922, 3923, 3924, 3925, 3926, 3927, 3928, 3929, 3930, 3931, 3932, 3933, 3934, 3935, 3936, 3937, 3938, 3939, 3940, 3941, 3942, 3943, 3944, 3945, 3946, 3947, 3948, 3949, 3950, 3951, 3952, 3953, 3954, 3955, 3956, 3957, 3958, 3959, 3960, 3961, 3962, 3963, 3964, 3965, 3966, 3967, 3968, 3969, 3970, 3971, 3972, 3973, 3974, 3975, 3976, 3977, 3978, 3979, 3980, 3981, 3982, 3983, 3984, 3985, 3986, 3987, 3988, 3989, 3990, 3991, 3992, 3993, 3994, 3995, 3996, 3997, 3998, 3999, 4000, 4001, 4002, 4003, 4004, 4005, 4006, 4007, 4008, 4009, 4010, 4011, 4012, 4013, 4014, 4015, 4016, 4017, 4018, 4019, 4020, 4021, 4022, 4023, 4024, 4025, 4026, 4027, 4028, 4029, 4030, 4031, 4032, 4033, 4034, 4035, 4036, 4037, 4038, 4039, 4040, 4041, 4042, 4043, 4044, 4045, 4046, 4047, 4048, 4049, 4050, 4051, 4052, 4053, 4054, 4055, 4056, 4057, 4058, 4059, 4060, 4061, 4062, 4063, 4064, 4065, 4066, 4067, 4068, 4069, 4070, 4071, 4072, 4073, 4074, 4075, 4076, 4077, 4078, 4079, 4080, 4081, 4082, 4083, 4084, 4085, 4086, 4087, 4088, 4089, 4090, 4091, 4092, 4093, 4094, 4095].

A sequence 2b is as follows:

Punc_Q_half=[0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 512, 513, 514, 515, 516, 517, 518, 519, 520, 521, 522, 523, 524, 525, 526, 527, 528, 529, 530, 531, 532, 533, 534, 535, 536, 537, 538, 539, 540, 541, 542, 543, 544, 545, 546, 547, 548, 549, 550, 551, 552, 553, 554, 555, 556, 557, 558, 559, 560, 561, 562, 563, 564, 565, 566, 567, 568, 569, 570, 571, 572, 573, 574, 575, 576, 577, 578, 579, 580, 581, 582, 583, 584, 585, 586, 587, 588, 589, 590, 591, 592, 593, 594, 595, 596, 597, 598, 599, 600, 601, 602, 603, 604, 605, 606, 607, 608, 609, 610, 611, 612, 613, 614, 615, 616, 617, 618, 619, 620, 621, 622, 623, 624, 625, 626, 627, 628, 629, 630, 631, 632, 633, 634, 635, 636, 637, 638, 639, 1024, 1025, 1026, 1027, 1028, 1029, 1030, 1031, 1032, 1033, 1034, 1035, 1036, 1037, 1038, 1039, 1040, 1041, 1042, 1043, 1044, 1045, 1046, 1047, 1048, 1049, 1050, 1051, 1052, 1053, 1054, 1055, 1056, 1057, 1058, 1059, 1060, 1061, 1062, 1063, 1064, 1065, 1066, 1067, 1068, 1069, 1070, 1071, 1072, 1073, 1074, 1075, 1076, 1077, 1078, 1079, 1080, 1081, 1082, 1083, 1084, 1085, 1086, 1087, 1088, 1089, 1090, 1091, 1092, 1093, 1094, 1095, 1096, 1097, 1098, 1099, 1100, 1101, 1102, 1103, 1104, 1105, 1106, 1107, 1108, 1109, 1110, 1111, 1112, 1113, 1114, 1115, 1116, 1117, 1118, 1119, 1120, 1121, 1122, 1123, 1124, 1125, 1126, 1127, 1128, 1129, 1130, 1131, 1132, 1133, 1134, 1135, 1136, 1137, 1138, 1139, 1140, 1141, 1142, 1143, 1144, 1145, 1146, 1147, 1148, 1149, 1150, 1151, 2048, 2049, 2050, 2051, 2052, 2053, 2054, 2055, 2056, 2057, 2058, 2059, 2060, 2061, 2062, 2063, 2064, 2065, 2066, 2067, 2068, 2069, 2070, 2071, 2072, 2073, 2074, 2075, 2076, 2077, 2078, 2079, 2080, 2081, 2082, 2083, 2084, 2085, 2086, 2087, 2088, 2089, 2090, 2091, 2092, 2093, 2094, 2095, 2096, 2097, 2098, 2099, 2100, 2101, 2102, 2103, 2104, 2105, 2106, 2107, 2108, 2109, 2110, 2111, 2112, 2113, 2114, 2115, 2116, 2117, 2118, 2119, 2120, 2121, 2122, 2123, 2124, 2125, 2126, 2127, 2128, 2129, 2130, 2131, 2132, 2133, 2134, 2135, 2136, 2137, 2138, 2139, 2140, 2141, 2142, 2143, 2144, 2145, 2146, 2147, 2148, 2149, 2150, 2151, 2152, 2153, 2154, 2155, 2156, 2157, 2158, 2159, 2160, 2161, 2162, 2163, 2164, 2165, 2166, 2167, 2168, 2169, 2170, 2171, 2172, 2173, 2174, 2175, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 501, 502, 503, 504, 505, 506, 507, 508, 509, 510, 511, 640, 641, 642, 643, 644, 645, 646, 647, 648, 649, 650, 651, 652, 653, 654, 655, 656, 657, 658, 659, 660, 661, 662, 663, 664, 665, 666, 667, 668, 669, 670, 671, 672, 673, 674, 675, 676, 677, 678, 679, 680, 681, 682, 683, 684, 685, 686, 687, 688, 689, 690, 691, 692, 693, 694, 695, 696, 697, 698, 699, 700, 701, 702, 703, 704, 705, 706, 707, 708, 709, 710, 711, 712, 713, 714, 715, 716, 717, 718, 719, 720, 721, 722, 723, 724, 725, 726, 727, 728, 729, 730, 731, 732, 733, 734, 735, 736, 737, 738, 739, 740, 741, 742, 743, 744, 745, 746, 747, 748, 749, 750, 751, 752, 753, 754, 755, 756, 757, 758, 759, 760, 761, 762, 763, 764, 765, 766, 767, 768, 769, 770, 771, 772, 773, 774, 775, 776, 777, 778, 779, 780, 781, 782, 783, 784, 785, 786, 787, 788, 789, 790, 791, 792, 793, 794, 795, 796, 797, 798, 799, 800, 801, 802, 803, 804, 805, 806, 807, 808, 809, 810, 811, 812, 813, 814, 815, 816, 817, 818, 819, 820, 821, 822, 823, 824, 825, 826, 827, 828, 829, 830, 831, 832, 833, 834, 835, 836, 837, 838, 839, 840, 841, 842, 843, 844, 845, 846, 847, 848, 849, 850, 851, 852, 853, 854, 855, 856, 857, 858, 859, 860, 861, 862, 863, 864, 865, 866, 867, 868, 869, 870, 871, 872, 873, 874, 875, 876, 877, 878, 879, 880, 881, 882, 883, 884, 885, 886, 887, 888, 889, 890, 891, 892, 893, 894, 895, 1152, 1153, 1154, 1155, 1156, 1157, 1158, 1159, 1160, 1161, 1162, 1163, 1164, 1165, 1166, 1167, 1168, 1169, 1170, 1171, 1172, 1173, 1174, 1175, 1176, 1177, 1178, 1179, 1180, 1181, 1182, 1183, 1184, 1185, 1186, 1187, 1188, 1189, 1190, 1191, 1192, 1193, 1194, 1195, 1196, 1197, 1198, 1199, 1200, 1201, 1202, 1203, 1204, 1205, 1206, 1207, 1208, 1209, 1210, 1211, 1212, 1213, 1214, 1215, 1216, 1217, 1218, 1219, 1220, 1221, 1222, 1223, 1224, 1225, 1226, 1227, 1228, 1229, 1230, 1231, 1232, 1233, 1234, 1235, 1236, 1237, 1238, 1239, 1240, 1241, 1242, 1243, 1244, 1245, 1246, 1247, 1248, 1249, 1250, 1251, 1252, 1253, 1254, 1255, 1256, 1257, 1258, 1259, 1260, 1261, 1262, 1263, 1264, 1265, 1266, 1267, 1268, 1269, 1270, 1271, 1272, 1273, 1274, 1275, 1276, 1277, 1278, 1279, 1280, 1281, 1282, 1283, 1284, 1285, 1286, 1287, 1288, 1289, 1290, 1291, 1292, 1293, 1294, 1295, 1296, 1297, 1298, 1299, 1300, 1301, 1302, 1303, 1304, 1305, 1306, 1307, 1308, 1309, 1310, 1311, 1312, 1313, 1314, 1315, 1316, 1317, 1318, 1319, 1320, 1321, 1322, 1323, 1324, 1325, 1326, 1327, 1328, 1329, 1330, 1331, 1332, 1333, 1334, 1335, 1336, 1337, 1338, 1339, 1340, 1341, 1342, 1343, 1344, 1345, 1346, 1347, 1348, 1349, 1350, 1351, 1352, 1353, 1354, 1355, 1356, 1357, 1358, 1359, 1360, 1361, 1362, 1363, 1364, 1365, 1366, 1367, 1368, 1369, 1370, 1371, 1372, 1373, 1374, 1375, 1376, 1377, 1378, 1379, 1380, 1381, 1382, 1383, 1384, 1385, 1386, 1387, 1388, 1389, 1390, 1391, 1392, 1393, 1394, 1395, 1396, 1397, 1398, 1399, 1400, 1401, 1402, 1403, 1404, 1405, 1406, 1407, 2176, 2177, 2178, 2179, 2180, 2181, 2182, 2183, 2184, 2185, 2186, 2187, 2188, 2189, 2190, 2191, 2192, 2193, 2194, 2195, 2196, 2197, 2198, 2199, 2200, 2201, 2202, 2203, 2204, 2205, 2206, 2207, 2208, 2209, 2210, 2211, 2212, 2213, 2214, 2215, 2216, 2217, 2218, 2219, 2220, 2221, 2222, 2223, 2224, 2225, 2226, 2227, 2228, 2229, 2230, 2231, 2232, 2233, 2234, 2235, 2236, 2237, 2238, 2239, 2240, 2241, 2242, 2243, 2244, 2245, 2246, 2247, 2248, 2249, 2250, 2251, 2252, 2253, 2254, 2255, 2256, 2257, 2258, 2259, 2260, 2261, 2262, 2263, 2264, 2265, 2266, 2267, 2268, 2269, 2270, 2271, 2272, 2273, 2274, 2275, 2276, 2277, 2278, 2279, 2280, 2281, 2282, 2283, 2284, 2285, 2286, 2287, 2288, 2289, 2290, 2291, 2292, 2293, 2294, 2295, 2296, 2297, 2298, 2299, 2300, 2301, 2302, 2303, 1536, 1537, 1538, 1539, 1540, 1541, 1542, 1543, 1544, 1545, 1546, 1547, 1548, 1549, 1550, 1551, 1552, 1553, 1554, 1555, 1556, 1557, 1558, 1559, 1560, 1561, 1562, 1563, 1564, 1565, 1566, 1567, 1568, 1569, 1570, 1571, 1572, 1573, 1574, 1575, 1576, 1577, 1578, 1579, 1580, 1581, 1582, 1583, 1584, 1585, 1586, 1587, 1588, 1589, 1590, 1591, 1592, 1593, 1594, 1595, 1596, 1597, 1598, 1599, 1600, 1601, 1602, 1603, 1604, 1605, 1606, 1607, 1608, 1609, 1610, 1611, 1612, 1613, 1614, 1615, 1616, 1617, 1618, 1619, 1620, 1621, 1622, 1623, 1624, 1625, 1626, 1627, 1628, 1629, 1630, 1631, 1632, 1633, 1634, 1635, 1636, 1637, 1638, 1639, 1640, 1641, 1642, 1643, 1644, 1645, 1646, 1647, 1648, 1649, 1650, 1651, 1652, 1653, 1654, 1655, 1656, 1657, 1658, 1659, 1660, 1661, 1662, 1663, 2304, 2305, 2306, 2307, 2308, 2309, 2310, 2311, 2312, 2313, 2314, 2315, 2316, 2317, 2318, 2319, 2320, 2321, 2322, 2323, 2324, 2325, 2326, 2327, 2328, 2329, 2330, 2331, 2332, 2333, 2334, 2335, 2336, 2337, 2338, 2339, 2340, 2341, 2342, 2343, 2344, 2345, 2346, 2347, 2348, 2349, 2350, 2351, 2352, 2353, 2354, 2355, 2356, 2357, 2358, 2359, 2360, 2361, 2362, 2363, 2364, 2365, 2366, 2367, 2368, 2369, 2370, 2371, 2372, 2373, 2374, 2375, 2376, 2377, 2378, 2379, 2380, 2381, 2382, 2383, 2384, 2385, 2386, 2387, 2388, 2389, 2390, 2391, 2392, 2393, 2394, 2395, 2396, 2397, 2398, 2399, 2400, 2401, 2402, 2403, 2404, 2405, 2406, 2407, 2408, 2409, 2410, 2411, 2412, 2413, 2414, 2415, 2416, 2417, 2418, 2419, 2420, 2421, 2422, 2423, 2424, 2425, 2426, 2427, 2428, 2429, 2430, 2431, 2560, 2561, 2562, 2563, 2564, 2565, 2566, 2567, 2568, 2569, 2570, 2571, 2572, 2573, 2574, 2575, 2576, 2577, 2578, 2579, 2580, 2581, 2582, 2583, 2584, 2585, 2586, 2587, 2588, 2589, 2590, 2591, 2592, 2593, 2594, 2595, 2596, 2597, 2598, 2599, 2600, 2601, 2602, 2603, 2604, 2605, 2606, 2607, 2608, 2609, 2610, 2611, 2612, 2613, 2614, 2615, 2616, 2617, 2618, 2619, 2620, 2621, 2622, 2623, 2624, 2625, 2626, 2627, 2628, 2629, 2630, 2631, 2632, 2633, 2634, 2635, 2636, 2637, 2638, 2639, 2640, 2641, 2642, 2643, 2644, 2645, 2646, 2647, 2648, 2649, 2650, 2651, 2652, 2653, 2654, 2655, 2656, 2657, 2658, 2659, 2660, 2661, 2662, 2663, 2664, 2665, 2666, 2667, 2668, 2669, 2670, 2671, 2672, 2673, 2674, 2675, 2676, 2677, 2678, 2679, 2680, 2681, 2682, 2683, 2684, 2685, 2686, 2687, 896, 897, 898, 899, 900, 901, 902, 903, 904, 905, 906, 907, 908, 909, 910, 911, 912, 913, 914, 915, 916, 917, 918, 919, 920, 921, 922, 923, 924, 925, 926, 927, 928, 929, 930, 931, 932, 933, 934, 935, 936, 937, 938, 939, 940, 941, 942, 943, 944, 945, 946, 947, 948, 949, 950, 951, 952, 953, 954, 955, 956, 957, 958, 959, 960, 961, 962, 963, 964, 965, 966, 967, 968, 969, 970, 971, 972, 973, 974, 975, 976, 977, 978, 979, 980, 981, 982, 983, 984, 985, 986, 987, 988, 989, 990, 991, 992, 993, 994, 995, 996, 997, 998, 999, 1000, 1001, 1002, 1003, 1004, 1005, 1006, 1007, 1008, 1009, 1010, 1011, 1012, 1013, 1014, 1015, 1016, 1017, 1018, 1019, 1020, 1021, 1022, 1023].

A sequence 3b is as follows:

Punc_Z=[0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 768, 769, 770, 771, 772, 773, 774, 775, 776, 777, 778, 779, 780, 781, 782, 783, 784, 785, 786, 787, 788, 789, 790, 791, 792, 793, 794, 795, 796, 797, 798, 799, 800, 801, 802, 803, 804, 805, 806, 807, 808, 809, 810, 811, 812, 813, 814, 815, 816, 817, 818, 819, 820, 821, 822, 823, 824, 825, 826, 827, 828, 829, 830, 831, 832, 833, 834, 835, 836, 837, 838, 839, 840, 841, 842, 843, 844, 845, 846, 847, 848, 849, 850, 851, 852, 853, 854, 855, 856, 857, 858, 859, 860, 861, 862, 863, 864, 865, 866, 867, 868, 869, 870, 871, 872, 873, 874, 875, 876, 877, 878, 879, 880, 881, 882, 883, 884, 885, 886, 887, 888, 889, 890, 891, 892, 893, 894, 895, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 501, 502, 503, 504, 505, 506, 507, 508, 509, 510, 511, 1024, 1025, 1026, 1027, 1028, 1029, 1030, 1031, 1032, 1033, 1034, 1035, 1036, 1037, 1038, 1039, 1040, 1041, 1042, 1043, 1044, 1045, 1046, 1047, 1048, 1049, 1050, 1051, 1052, 1053, 1054, 1055, 1056, 1057, 1058, 1059, 1060, 1061, 1062, 1063, 1064, 1065, 1066, 1067, 1068, 1069, 1070, 1071, 1072, 1073, 1074, 1075, 1076, 1077, 1078, 1079, 1080, 1081, 1082, 1083, 1084, 1085, 1086, 1087, 1088, 1089, 1090, 1091, 1092, 1093, 1094, 1095, 1096, 1097, 1098, 1099, 1100, 1101, 1102, 1103, 1104, 1105, 1106, 1107, 1108, 1109, 1110, 1111, 1112, 1113, 1114, 1115, 1116, 1117, 1118, 1119, 1120, 1121, 1122, 1123, 1124, 1125, 1126, 1127, 1128, 1129, 1130, 1131, 1132, 1133, 1134, 1135, 1136, 1137, 1138, 1139, 1140, 1141, 1142, 1143, 1144, 1145, 1146, 1147, 1148, 1149, 1150, 1151, 1152, 1153, 1154, 1155, 1156, 1157, 1158, 1159, 1160, 1161, 1162, 1163, 1164, 1165, 1166, 1167, 1168, 1169, 1170, 1171, 1172, 1173, 1174, 1175, 1176, 1177, 1178, 1179, 1180, 1181, 1182, 1183, 1184, 1185, 1186, 1187, 1188, 1189, 1190, 1191, 1192, 1193, 1194, 1195, 1196, 1197, 1198, 1199, 1200, 1201, 1202, 1203, 1204, 1205, 1206, 1207, 1208, 1209, 1210, 1211, 1212, 1213, 1214, 1215, 1216, 1217, 1218, 1219, 1220, 1221, 1222, 1223, 1224, 1225, 1226, 1227, 1228, 1229, 1230, 1231, 1232, 1233, 1234, 1235, 1236, 1237, 1238, 1239, 1240, 1241, 1242, 1243, 1244, 1245, 1246, 1247, 1248, 1249, 1250, 1251, 1252, 1253, 1254, 1255, 1256, 1257, 1258, 1259, 1260, 1261, 1262, 1263, 1264, 1265, 1266, 1267, 1268, 1269, 1270, 1271, 1272, 1273, 1274, 1275, 1276, 1277, 1278, 1279, 2304, 2305, 2306, 2307, 2308, 2309, 2310, 2311, 2312, 2313, 2314, 2315, 2316, 2317, 2318, 2319, 2320, 2321, 2322, 2323, 2324, 2325, 2326, 2327, 2328, 2329, 2330, 2331, 2332, 2333, 2334, 2335, 2336, 2337, 2338, 2339, 2340, 2341, 2342, 2343, 2344, 2345, 2346, 2347, 2348, 2349, 2350, 2351, 2352, 2353, 2354, 2355, 2356, 2357, 2358, 2359, 2360, 2361, 2362, 2363, 2364, 2365, 2366, 2367, 2368, 2369, 2370, 2371, 2372, 2373, 2374, 2375, 2376, 2377, 2378, 2379, 2380, 2381, 2382, 2383, 2384, 2385, 2386, 2387, 2388, 2389, 2390, 2391, 2392, 2393, 2394, 2395, 2396, 2397, 2398, 2399, 2400, 2401, 2402, 2403, 2404, 2405, 2406, 2407, 2408, 2409, 2410, 2411, 2412, 2413, 2414, 2415, 2416, 2417, 2418, 2419, 2420, 2421, 2422, 2423, 2424, 2425, 2426, 2427, 2428, 2429, 2430, 2431, 512, 513, 514, 515, 516, 517, 518, 519, 520, 521, 522, 523, 524, 525, 526, 527, 528, 529, 530, 531, 532, 533, 534, 535, 536, 537, 538, 539, 540, 541, 542, 543, 544, 545, 546, 547, 548, 549, 550, 551, 552, 553, 554, 555, 556, 557, 558, 559, 560, 561, 562, 563, 564, 565, 566, 567, 568, 569, 570, 571, 572, 573, 574, 575, 576, 577, 578, 579, 580, 581, 582, 583, 584, 585, 586, 587, 588, 589, 590, 591, 592, 593, 594, 595, 596, 597, 598, 599, 600, 601, 602, 603, 604, 605, 606, 607, 608, 609, 610, 611, 612, 613, 614, 615, 616, 617, 618, 619, 620, 621, 622, 623, 624, 625, 626, 627, 628, 629, 630, 631, 632, 633, 634, 635, 636, 637, 638, 639, 1280, 1281, 1282, 1283, 1284, 1285, 1286, 1287, 1288, 1289, 1290, 1291, 1292, 1293, 1294, 1295, 1296, 1297, 1298, 1299, 1300, 1301, 1302, 1303, 1304, 1305, 1306, 1307, 1308, 1309, 1310, 1311, 1312, 1313, 1314, 1315, 1316, 1317, 1318, 1319, 1320, 1321, 1322, 1323, 1324, 1325, 1326, 1327, 1328, 1329, 1330, 1331, 1332, 1333, 1334, 1335, 1336, 1337, 1338, 1339, 1340, 1341, 1342, 1343, 1344, 1345, 1346, 1347, 1348, 1349, 1350, 1351, 1352, 1353, 1354, 1355, 1356, 1357, 1358, 1359, 1360, 1361, 1362, 1363, 1364, 1365, 1366, 1367, 1368, 1369, 1370, 1371, 1372, 1373, 1374, 1375, 1376, 1377, 1378, 1379, 1380, 1381, 1382, 1383, 1384, 1385, 1386, 1387, 1388, 1389, 1390, 1391, 1392, 1393, 1394, 1395, 1396, 1397, 1398, 1399, 1400, 1401, 1402, 1403, 1404, 1405, 1406, 1407, 1408, 1409, 1410, 1411, 1412, 1413, 1414, 1415, 1416, 1417, 1418, 1419, 1420, 1421, 1422, 1423, 1424, 1425, 1426, 1427, 1428, 1429, 1430, 1431, 1432, 1433, 1434, 1435, 1436, 1437, 1438, 1439, 1440, 1441, 1442, 1443, 1444, 1445, 1446, 1447, 1448, 1449, 1450, 1451, 1452, 1453, 1454, 1455, 1456, 1457, 1458, 1459, 1460, 1461, 1462, 1463, 1464, 1465, 1466, 1467, 1468, 1469, 1470, 1471, 1472, 1473, 1474, 1475, 1476, 1477, 1478, 1479, 1480, 1481, 1482, 1483, 1484, 1485, 1486, 1487, 1488, 1489, 1490, 1491, 1492, 1493, 1494, 1495, 1496, 1497, 1498, 1499, 1500, 1501, 1502, 1503, 1504, 1505, 1506, 1507, 1508, 1509, 1510, 1511, 1512, 1513, 1514, 1515, 1516, 1517, 1518, 1519, 1520, 1521, 1522, 1523, 1524, 1525, 1526, 1527, 1528, 1529, 1530, 1531, 1532, 1533, 1534, 1535, 2688, 2689, 2690, 2691, 2692, 2693, 2694, 2695, 2696, 2697, 2698, 2699, 2700, 2701, 2702, 2703, 2704, 2705, 2706, 2707, 2708, 2709, 2710, 2711, 2712, 2713, 2714, 2715, 2716, 2717, 2718, 2719, 2720, 2721, 2722, 2723, 2724, 2725, 2726, 2727, 2728, 2729, 2730, 2731, 2732, 2733, 2734, 2735, 2736, 2737, 2738, 2739, 2740, 2741, 2742, 2743, 2744, 2745, 2746, 2747, 2748, 2749, 2750, 2751, 2752, 2753, 2754, 2755, 2756, 2757, 2758, 2759, 2760, 2761, 2762, 2763, 2764, 2765, 2766, 2767, 2768, 2769, 2770, 2771, 2772, 2773, 2774, 2775, 2776, 2777, 2778, 2779, 2780, 2781, 2782, 2783, 2784, 2785, 2786, 2787, 2788, 2789, 2790, 2791, 2792, 2793, 2794, 2795, 2796, 2797, 2798, 2799, 2800, 2801, 2802, 2803, 2804, 2805, 2806, 2807, 2808, 2809, 2810, 2811, 2812, 2813, 2814, 2815, 1664, 1665, 1666, 1667, 1668, 1669, 1670, 1671, 1672, 1673, 1674, 1675, 1676, 1677, 1678, 1679, 1680, 1681, 1682, 1683, 1684, 1685, 1686, 1687, 1688, 1689, 1690, 1691, 1692, 1693, 1694, 1695, 1696, 1697, 1698, 1699, 1700, 1701, 1702, 1703, 1704, 1705, 1706, 1707, 1708, 1709, 1710, 1711, 1712, 1713, 1714, 1715, 1716, 1717, 1718, 1719, 1720, 1721, 1722, 1723, 1724, 1725, 1726, 1727, 1728, 1729, 1730, 1731, 1732, 1733, 1734, 1735, 1736, 1737, 1738, 1739, 1740, 1741, 1742, 1743, 1744, 1745, 1746, 1747, 1748, 1749, 1750, 1751, 1752, 1753, 1754, 1755, 1756, 1757, 1758, 1759, 1760, 1761, 1762, 1763, 1764, 1765, 1766, 1767, 1768, 1769, 1770, 1771, 1772, 1773, 1774, 1775, 1776, 1777, 1778, 1779, 1780, 1781, 1782, 1783, 1784, 1785, 1786, 1787, 1788, 1789, 1790, 1791, 2944, 2945, 2946, 2947, 2948, 2949, 2950, 2951, 2952, 2953, 2954, 2955, 2956, 2957, 2958, 2959, 2960, 2961, 2962, 2963, 2964, 2965, 2966, 2967, 2968, 2969, 2970, 2971, 2972, 2973, 2974, 2975, 2976, 2977, 2978, 2979, 2980, 2981, 2982, 2983, 2984, 2985, 2986, 2987, 2988, 2989, 2990, 2991, 2992, 2993, 2994, 2995, 2996, 2997, 2998, 2999, 3000, 3001, 3002, 3003, 3004, 3005, 3006, 3007, 3008, 3009, 3010, 3011, 3012, 3013, 3014, 3015, 3016, 3017, 3018, 3019, 3020, 3021, 3022, 3023, 3024, 3025, 3026, 3027, 3028, 3029, 3030, 3031, 3032, 3033, 3034, 3035, 3036, 3037, 3038, 3039, 3040, 3041, 3042, 3043, 3044, 3045, 3046, 3047, 3048, 3049, 3050, 3051, 3052, 3053, 3054, 3055, 3056, 3057, 3058, 3059, 3060, 3061, 3062, 3063, 3064, 3065, 3066, 3067, 3068, 3069, 3070, 3071, 3200, 3201, 3202, 3203, 3204, 3205, 3206, 3207, 3208, 3209, 3210, 3211, 3212, 3213, 3214, 3215, 3216, 3217, 3218, 3219, 3220, 3221, 3222, 3223, 3224, 3225, 3226, 3227, 3228, 3229, 3230, 3231, 3232, 3233, 3234, 3235, 3236, 3237, 3238, 3239, 3240, 3241, 3242, 3243, 3244, 3245, 3246, 3247, 3248, 3249, 3250, 3251, 3252, 3253, 3254, 3255, 3256, 3257, 3258, 3259, 3260, 3261, 3262, 3263, 3264, 3265, 3266, 3267, 3268, 3269, 3270, 3271, 3272, 3273, 3274, 3275, 3276, 3277, 3278, 3279, 3280, 3281, 3282, 3283, 3284, 3285, 3286, 3287, 3288, 3289, 3290, 3291, 3292, 3293, 3294, 3295, 3296, 3297, 3298, 3299, 3300, 3301, 3302, 3303, 3304, 3305, 3306, 3307, 3308, 3309, 3310, 3311, 3312, 3313, 3314, 3315, 3316, 3317, 3318, 3319, 3320, 3321, 3322, 3323, 3324, 3325, 3326, 3327, 4736, 4737, 4738, 4739, 4740, 4741, 4742, 4743, 4744, 4745, 4746, 4747, 4748, 4749, 4750, 4751, 4752, 4753, 4754, 4755, 4756, 4757, 4758, 4759, 4760, 4761, 4762, 4763, 4764, 4765, 4766, 4767, 4768, 4769, 4770, 4771, 4772, 4773, 4774, 4775, 4776, 4777, 4778, 4779, 4780, 4781, 4782, 4783, 4784, 4785, 4786, 4787, 4788, 4789, 4790, 4791, 4792, 4793, 4794, 4795, 4796, 4797, 4798, 4799, 4800, 4801, 4802, 4803, 4804, 4805, 4806, 4807, 4808, 4809, 4810, 4811, 4812, 4813, 4814, 4815, 4816, 4817, 4818, 4819, 4820, 4821, 4822, 4823, 4824, 4825, 4826, 4827, 4828, 4829, 4830, 4831, 4832, 4833, 4834, 4835, 4836, 4837, 4838, 4839, 4840, 4841, 4842, 4843, 4844, 4845, 4846, 4847, 4848, 4849, 4850, 4851, 4852, 4853, 4854, 4855, 4856, 4857, 4858, 4859, 4860, 4861, 4862, 4863, 640, 641, 642, 643, 644, 645, 646, 647, 648, 649, 650, 651, 652, 653, 654, 655, 656, 657, 658, 659, 660, 661, 662, 663, 664, 665, 666, 667, 668, 669, 670, 671, 672, 673, 674, 675, 676, 677, 678, 679, 680, 681, 682, 683, 684, 685, 686, 687, 688, 689, 690, 691, 692, 693, 694, 695, 696, 697, 698, 699, 700, 701, 702, 703, 704, 705, 706, 707, 708, 709, 710, 711, 712, 713, 714, 715, 716, 717, 718, 719, 720, 721, 722, 723, 724, 725, 726, 727, 728, 729, 730, 731, 732, 733, 734, 735, 736, 737, 738, 739, 740, 741, 742, 743, 744, 745, 746, 747, 748, 749, 750, 751, 752, 753, 754, 755, 756, 757, 758, 759, 760, 761, 762, 763, 764, 765, 766, 767, 1536, 1537, 1538, 1539, 1540, 1541, 1542, 1543, 1544, 1545, 1546, 1547, 1548, 1549, 1550, 1551, 1552, 1553, 1554, 1555, 1556, 1557, 1558, 1559, 1560, 1561, 1562, 1563, 1564, 1565, 1566, 1567, 1568, 1569, 1570, 1571, 1572, 1573, 1574, 1575, 1576, 1577, 1578, 1579, 1580, 1581, 1582, 1583, 1584, 1585, 1586, 1587, 1588, 1589, 1590, 1591, 1592, 1593, 1594, 1595, 1596, 1597, 1598, 1599, 1600, 1601, 1602, 1603, 1604, 1605, 1606, 1607, 1608, 1609, 1610, 1611, 1612, 1613, 1614, 1615, 1616, 1617, 1618, 1619, 1620, 1621, 1622, 1623, 1624, 1625, 1626, 1627, 1628, 1629, 1630, 1631, 1632, 1633, 1634, 1635, 1636, 1637, 1638, 1639, 1640, 1641, 1642, 1643, 1644, 1645, 1646, 1647, 1648, 1649, 1650, 1651, 1652, 1653, 1654, 1655, 1656, 1657, 1658, 1659, 1660, 1661, 1662, 1663, 1792, 1793, 1794, 1795, 1796, 1797, 1798, 1799, 1800, 1801, 1802, 1803, 1804, 1805, 1806, 1807, 1808, 1809, 1810, 1811, 1812, 1813, 1814, 1815, 1816, 1817, 1818, 1819, 1820, 1821, 1822, 1823, 1824, 1825, 1826, 1827, 1828, 1829, 1830, 1831, 1832, 1833, 1834, 1835, 1836, 1837, 1838, 1839, 1840, 1841, 1842, 1843, 1844, 1845, 1846, 1847, 1848, 1849, 1850, 1851, 1852, 1853, 1854, 1855, 1856, 1857, 1858, 1859, 1860, 1861, 1862, 1863, 1864, 1865, 1866, 1867, 1868, 1869, 1870, 1871, 1872, 1873, 1874, 1875, 1876, 1877, 1878, 1879, 1880, 1881, 1882, 1883, 1884, 1885, 1886, 1887, 1888, 1889, 1890, 1891, 1892, 1893, 1894, 1895, 1896, 1897, 1898, 1899, 1900, 1901, 1902, 1903, 1904, 1905, 1906, 1907, 1908, 1909, 1910, 1911, 1912, 1913, 1914, 1915, 1916, 1917, 1918, 1919, 3072, 3073, 3074, 3075, 3076, 3077, 3078, 3079, 3080, 3081, 3082, 3083, 3084, 3085, 3086, 3087, 3088, 3089, 3090, 3091, 3092, 3093, 3094, 3095, 3096, 3097, 3098, 3099, 3100, 3101, 3102, 3103, 3104, 3105, 3106, 3107, 3108, 3109, 3110, 3111, 3112, 3113, 3114, 3115, 3116, 3117, 3118, 3119, 3120, 3121, 3122, 3123, 3124, 3125, 3126, 3127, 3128, 3129, 3130, 3131, 3132, 3133, 3134, 3135, 3136, 3137, 3138, 3139, 3140, 3141, 3142, 3143, 3144, 3145, 3146, 3147, 3148, 3149, 3150, 3151, 3152, 3153, 3154, 3155, 3156, 3157, 3158, 3159, 3160, 3161, 3162, 3163, 3164, 3165, 3166, 3167, 3168, 3169, 3170, 3171, 3172, 3173, 3174, 3175, 3176, 3177, 3178, 3179, 3180, 3181, 3182, 3183, 3184, 3185, 3186, 3187, 3188, 3189, 3190, 3191, 3192, 3193, 3194, 3195, 3196, 3197, 3198, 3199, 2048, 2049, 2050, 2051, 2052, 2053, 2054, 2055, 2056, 2057, 2058, 2059, 2060, 2061, 2062, 2063, 2064, 2065, 2066, 2067, 2068, 2069, 2070, 2071, 2072, 2073, 2074, 2075, 2076, 2077, 2078, 2079, 2080, 2081, 2082, 2083, 2084, 2085, 2086, 2087, 2088, 2089, 2090, 2091, 2092, 2093, 2094, 2095, 2096, 2097, 2098, 2099, 2100, 2101, 2102, 2103, 2104, 2105, 2106, 2107, 2108, 2109, 2110, 2111, 2112, 2113, 2114, 2115, 2116, 2117, 2118, 2119, 2120, 2121, 2122, 2123, 2124, 2125, 2126, 2127, 2128, 2129, 2130, 2131, 2132, 2133, 2134, 2135, 2136, 2137, 2138, 2139, 2140, 2141, 2142, 2143, 2144, 2145, 2146, 2147, 2148, 2149, 2150, 2151, 2152, 2153, 2154, 2155, 2156, 2157, 2158, 2159, 2160, 2161, 2162, 2163, 2164, 2165, 2166, 2167, 2168, 2169, 2170, 2171, 2172, 2173, 2174, 2175, 3456, 3457, 3458, 3459, 3460, 3461, 3462, 3463, 3464, 3465, 3466, 3467, 3468, 3469, 3470, 3471, 3472, 3473, 3474, 3475, 3476, 3477, 3478, 3479, 3480, 3481, 3482, 3483, 3484, 3485, 3486, 3487, 3488, 3489, 3490, 3491, 3492, 3493, 3494, 3495, 3496, 3497, 3498, 3499, 3500, 3501, 3502, 3503, 3504, 3505, 3506, 3507, 3508, 3509, 3510, 3511, 3512, 3513, 3514, 3515, 3516, 3517, 3518, 3519, 3520, 3521, 3522, 3523, 3524, 3525, 3526, 3527, 3528, 3529, 3530, 3531, 3532, 3533, 3534, 3535, 3536, 3537, 3538, 3539, 3540, 3541, 3542, 3543, 3544, 3545, 3546, 3547, 3548, 3549, 3550, 3551, 3552, 3553, 3554, 3555, 3556, 3557, 3558, 3559, 3560, 3561, 3562, 3563, 3564, 3565, 3566, 3567, 3568, 3569, 3570, 3571, 3572, 3573, 3574, 3575, 3576, 3577, 3578, 3579, 3580, 3581, 3582, 3583, 3712, 3713, 3714, 3715, 3716, 3717, 3718, 3719, 3720, 3721, 3722, 3723, 3724, 3725, 3726, 3727, 3728, 3729, 3730, 3731, 3732, 3733, 3734, 3735, 3736, 3737, 3738, 3739, 3740, 3741, 3742, 3743, 3744, 3745, 3746, 3747, 3748, 3749, 3750, 3751, 3752, 3753, 3754, 3755, 3756, 3757, 3758, 3759, 3760, 3761, 3762, 3763, 3764, 3765, 3766, 3767, 3768, 3769, 3770, 3771, 3772, 3773, 3774, 3775, 3776, 3777, 3778, 3779, 3780, 3781, 3782, 3783, 3784, 3785, 3786, 3787, 3788, 3789, 3790, 3791, 3792, 3793, 3794, 3795, 3796, 3797, 3798, 3799, 3800, 3801, 3802, 3803, 3804, 3805, 3806, 3807, 3808, 3809, 3810, 3811, 3812, 3813, 3814, 3815, 3816, 3817, 3818, 3819, 3820, 3821, 3822, 3823, 3824, 3825, 3826, 3827, 3828, 3829, 3830, 3831, 3832, 3833, 3834, 3835, 3836, 3837, 3838, 3839, 5248, 5249, 5250, 5251, 5252, 5253, 5254, 5255, 5256, 5257, 5258, 5259, 5260, 5261, 5262, 5263, 5264, 5265, 5266, 5267, 5268, 5269, 5270, 5271, 5272, 5273, 5274, 5275, 5276, 5277, 5278, 5279, 5280, 5281, 5282, 5283, 5284, 5285, 5286, 5287, 5288, 5289, 5290, 5291, 5292, 5293, 5294, 5295, 5296, 5297, 5298, 5299, 5300, 5301, 5302, 5303, 5304, 5305, 5306, 5307, 5308, 5309, 5310, 5311, 5312, 5313, 5314, 5315, 5316, 5317, 5318, 5319, 5320, 5321, 5322, 5323, 5324, 5325, 5326, 5327, 5328, 5329, 5330, 5331, 5332, 5333, 5334, 5335, 5336, 5337, 5338, 5339, 5340, 5341, 5342, 5343, 5344, 5345, 5346, 5347, 5348, 5349, 5350, 5351, 5352, 5353, 5354, 5355, 5356, 5357, 5358, 5359, 5360, 5361, 5362, 5363, 5364, 5365, 5366, 5367, 5368, 5369, 5370, 5371, 5372, 5373, 5374, 5375, 2432, 2433, 2434, 2435, 2436, 2437, 2438, 2439, 2440, 2441, 2442, 2443, 2444, 2445, 2446, 2447, 2448, 2449, 2450, 2451, 2452, 2453, 2454, 2455, 2456, 2457, 2458, 2459, 2460, 2461, 2462, 2463, 2464, 2465, 2466, 2467, 2468, 2469, 2470, 2471, 2472, 2473, 2474, 2475, 2476, 2477, 2478, 2479, 2480, 2481, 2482, 2483, 2484, 2485, 2486, 2487, 2488, 2489, 2490, 2491, 2492, 2493, 2494, 2495, 2496, 2497, 2498, 2499, 2500, 2501, 2502, 2503, 2504, 2505, 2506, 2507, 2508, 2509, 2510, 2511, 2512, 2513, 2514, 2515, 2516, 2517, 2518, 2519, 2520, 2521, 2522, 2523, 2524, 2525, 2526, 2527, 2528, 2529, 2530, 2531, 2532, 2533, 2534, 2535, 2536, 2537, 2538, 2539, 2540, 2541, 2542, 2543, 2544, 2545, 2546, 2547, 2548, 2549, 2550, 2551, 2552, 2553, 2554, 2555, 2556, 2557, 2558, 2559, 3840, 3841, 3842, 3843, 3844, 3845, 3846, 3847, 3848, 3849, 3850, 3851, 3852, 3853, 3854, 3855, 3856, 3857, 3858, 3859, 3860, 3861, 3862, 3863, 3864, 3865, 3866, 3867, 3868, 3869, 3870, 3871, 3872, 3873, 3874, 3875, 3876, 3877, 3878, 3879, 3880, 3881, 3882, 3883, 3884, 3885, 3886, 3887, 3888, 3889, 3890, 3891, 3892, 3893, 3894, 3895, 3896, 3897, 3898, 3899, 3900, 3901, 3902, 3903, 3904, 3905, 3906, 3907, 3908, 3909, 3910, 3911, 3912, 3913, 3914, 3915, 3916, 3917, 3918, 3919, 3920, 3921, 3922, 3923, 3924, 3925, 3926, 3927, 3928, 3929, 3930, 3931, 3932, 3933, 3934, 3935, 3936, 3937, 3938, 3939, 3940, 3941, 3942, 3943, 3944, 3945, 3946, 3947, 3948, 3949, 3950, 3951, 3952, 3953, 3954, 3955, 3956, 3957, 3958, 3959, 3960, 3961, 3962, 3963, 3964, 3965, 3966, 3967, 4096, 4097, 4098, 4099, 4100, 4101, 4102, 4103, 4104, 4105, 4106, 4107, 4108, 4109, 4110, 4111, 4112, 4113, 4114, 4115, 4116, 4117, 4118, 4119, 4120, 4121, 4122, 4123, 4124, 4125, 4126, 4127, 4128, 4129, 4130, 4131, 4132, 4133, 4134, 4135, 4136, 4137, 4138, 4139, 4140, 4141, 4142, 4143, 4144, 4145, 4146, 4147, 4148, 4149, 4150, 4151, 4152, 4153, 4154, 4155, 4156, 4157, 4158, 4159, 4160, 4161, 4162, 4163, 4164, 4165, 4166, 4167, 4168, 4169, 4170, 4171, 4172, 4173, 4174, 4175, 4176, 4177, 4178, 4179, 4180, 4181, 4182, 4183, 4184, 4185, 4186, 4187, 4188, 4189, 4190, 4191, 4192, 4193, 4194, 4195, 4196, 4197, 4198, 4199, 4200, 4201, 4202, 4203, 4204, 4205, 4206, 4207, 4208, 4209, 4210, 4211, 4212, 4213, 4214, 4215, 4216, 4217, 4218, 4219, 4220, 4221, 4222, 4223, 5504, 5505, 5506, 5507, 5508, 5509, 5510, 5511, 5512, 5513, 5514, 5515, 5516, 5517, 5518, 5519, 5520, 5521, 5522, 5523, 5524, 5525, 5526, 5527, 5528, 5529, 5530, 5531, 5532, 5533, 5534, 5535, 5536, 5537, 5538, 5539, 5540, 5541, 5542, 5543, 5544, 5545, 5546, 5547, 5548, 5549, 5550, 5551, 5552, 5553, 5554, 5555, 5556, 5557, 5558, 5559, 5560, 5561, 5562, 5563, 5564, 5565, 5566, 5567, 5568, 5569, 5570, 5571, 5572, 5573, 5574, 5575, 5576, 5577, 5578, 5579, 5580, 5581, 5582, 5583, 5584, 5585, 5586, 5587, 5588, 5589, 5590, 5591, 5592, 5593, 5594, 5595, 5596, 5597, 5598, 5599, 5600, 5601, 5602, 5603, 5604, 5605, 5606, 5607, 5608, 5609, 5610, 5611, 5612, 5613, 5614, 5615, 5616, 5617, 5618, 5619, 5620, 5621, 5622, 5623, 5624, 5625, 5626, 5627, 5628, 5629, 5630, 5631, 4480, 4481, 4482, 4483, 4484, 4485, 4486, 4487, 4488, 4489, 4490, 4491, 4492, 4493, 4494, 4495, 4496, 4497, 4498, 4499, 4500, 4501, 4502, 4503, 4504, 4505, 4506, 4507, 4508, 4509, 4510, 4511, 4512, 4513, 4514, 4515, 4516, 4517, 4518, 4519, 4520, 4521, 4522, 4523, 4524, 4525, 4526, 4527, 4528, 4529, 4530, 4531, 4532, 4533, 4534, 4535, 4536, 4537, 4538, 4539, 4540, 4541, 4542, 4543, 4544, 4545, 4546, 4547, 4548, 4549, 4550, 4551, 4552, 4553, 4554, 4555, 4556, 4557, 4558, 4559, 4560, 4561, 4562, 4563, 4564, 4565, 4566, 4567, 4568, 4569, 4570, 4571, 4572, 4573, 4574, 4575, 4576, 4577, 4578, 4579, 4580, 4581, 4582, 4583, 4584, 4585, 4586, 4587, 4588, 4589, 4590, 4591, 4592, 4593, 4594, 4595, 4596, 4597, 4598, 4599, 4600, 4601, 4602, 4603, 4604, 4605, 4606, 4607, 5888, 5889, 5890, 5891, 5892, 5893, 5894, 5895, 5896, 5897, 5898, 5899, 5900, 5901, 5902, 5903, 5904, 5905, 5906, 5907, 5908, 5909, 5910, 5911, 5912, 5913, 5914, 5915, 5916, 5917, 5918, 5919, 5920, 5921, 5922, 5923, 5924, 5925, 5926, 5927, 5928, 5929, 5930, 5931, 5932, 5933, 5934, 5935, 5936, 5937, 5938, 5939, 5940, 5941, 5942, 5943, 5944, 5945, 5946, 5947, 5948, 5949, 5950, 5951, 5952, 5953, 5954, 5955, 5956, 5957, 5958, 5959, 5960, 5961, 5962, 5963, 5964, 5965, 5966, 5967, 5968, 5969, 5970, 5971, 5972, 5973, 5974, 5975, 5976, 5977, 5978, 5979, 5980, 5981, 5982, 5983, 5984, 5985, 5986, 5987, 5988, 5989, 5990, 5991, 5992, 5993, 5994, 5995, 5996, 5997, 5998, 5999, 6000, 6001, 6002, 6003, 6004, 6005, 6006, 6007, 6008, 6009, 6010, 6011, 6012, 6013, 6014, 6015, 6144, 6145, 6146, 6147, 6148, 6149, 6150, 6151, 6152, 6153, 6154, 6155, 6156, 6157, 6158, 6159, 6160, 6161, 6162, 6163, 6164, 6165, 6166, 6167, 6168, 6169, 6170, 6171, 6172, 6173, 6174, 6175, 6176, 6177, 6178, 6179, 6180, 6181, 6182, 6183, 6184, 6185, 6186, 6187, 6188, 6189, 6190, 6191, 6192, 6193, 6194, 6195, 6196, 6197, 6198, 6199, 6200, 6201, 6202, 6203, 6204, 6205, 6206, 6207, 6208, 6209, 6210, 6211, 6212, 6213, 6214, 6215, 6216, 6217, 6218, 6219, 6220, 6221, 6222, 6223, 6224, 6225, 6226, 6227, 6228, 6229, 6230, 6231, 6232, 6233, 6234, 6235, 6236, 6237, 6238, 6239, 6240, 6241, 6242, 6243, 6244, 6245, 6246, 6247, 6248, 6249, 6250, 6251, 6252, 6253, 6254, 6255, 6256, 6257, 6258, 6259, 6260, 6261, 6262, 6263, 6264, 6265, 6266, 6267, 6268, 6269, 6270, 6271, 7168, 7169, 7170, 7171, 7172, 7173, 7174, 7175, 7176, 7177, 7178, 7179, 7180, 7181, 7182, 7183, 7184, 7185, 7186, 7187, 7188, 7189, 7190, 7191, 7192, 7193, 7194, 7195, 7196, 7197, 7198, 7199, 7200, 7201, 7202, 7203, 7204, 7205, 7206, 7207, 7208, 7209, 7210, 7211, 7212, 7213, 7214, 7215, 7216, 7217, 7218, 7219, 7220, 7221, 7222, 7223, 7224, 7225, 7226, 7227, 7228, 7229, 7230, 7231, 7232, 7233, 7234, 7235, 7236, 7237, 7238, 7239, 7240, 7241, 7242, 7243, 7244, 7245, 7246, 7247, 7248, 7249, 7250, 7251, 7252, 7253, 7254, 7255, 7256, 7257, 7258, 7259, 7260, 7261, 7262, 7263, 7264, 7265, 7266, 7267, 7268, 7269, 7270, 7271, 7272, 7273, 7274, 7275, 7276, 7277, 7278, 7279, 7280, 7281, 7282, 7283, 7284, 7285, 7286, 7287, 7288, 7289, 7290, 7291, 7292, 7293, 7294, 7295].

When N=2048:

A sequence 1c is as follows:

Punc_Q=[0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 512, 513, 514, 515, 516, 517, 518, 519, 520, 521, 522, 523, 524, 525, 526, 527, 528, 529, 530, 531, 532, 533, 534, 535, 536, 537, 538, 539, 540, 541, 542, 543, 544, 545, 546, 547, 548, 549, 550, 551, 552, 553, 554, 555, 556, 557, 558, 559, 560, 561, 562, 563, 564, 565, 566, 567, 568, 569, 570, 571, 572, 573, 574, 575, 576, 577, 578, 579, 580, 581, 582, 583, 584, 585, 586, 587, 588, 589, 590, 591, 592, 593, 594, 595, 596, 597, 598, 599, 600, 601, 602, 603, 604, 605, 606, 607, 608, 609, 610, 611, 612, 613, 614, 615, 616, 617, 618, 619, 620, 621, 622, 623, 624, 625, 626, 627, 628, 629, 630, 631, 632, 633, 634, 635, 636, 637, 638, 639, 1024, 1025, 1026, 1027, 1028, 1029, 1030, 1031, 1032, 1033, 1034, 1035, 1036, 1037, 1038, 1039, 1040, 1041, 1042, 1043, 1044, 1045, 1046, 1047, 1048, 1049, 1050, 1051, 1052, 1053, 1054, 1055, 1056, 1057, 1058, 1059, 1060, 1061, 1062, 1063, 1064, 1065, 1066, 1067, 1068, 1069, 1070, 1071, 1072, 1073, 1074, 1075, 1076, 1077, 1078, 1079, 1080, 1081, 1082, 1083, 1084, 1085, 1086, 1087, 1088, 1089, 1090, 1091, 1092, 1093, 1094, 1095, 1096, 1097, 1098, 1099, 1100, 1101, 1102, 1103, 1104, 1105, 1106, 1107, 1108, 1109, 1110, 1111, 1112, 1113, 1114, 1115, 1116, 1117, 1118, 1119, 1120, 1121, 1122, 1123, 1124, 1125, 1126, 1127, 1128, 1129, 1130, 1131, 1132, 1133, 1134, 1135, 1136, 1137, 1138, 1139, 1140, 1141, 1142, 1143, 1144, 1145, 1146, 1147, 1148, 1149, 1150, 1151, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 501, 502, 503, 504, 505, 506, 507, 508, 509, 510, 511, 640, 641, 642, 643, 644, 645, 646, 647, 648, 649, 650, 651, 652, 653, 654, 655, 656, 657, 658, 659, 660, 661, 662, 663, 664, 665, 666, 667, 668, 669, 670, 671, 672, 673, 674, 675, 676, 677, 678, 679, 680, 681, 682, 683, 684, 685, 686, 687, 688, 689, 690, 691, 692, 693, 694, 695, 696, 697, 698, 699, 700, 701, 702, 703, 704, 705, 706, 707, 708, 709, 710, 711, 712, 713, 714, 715, 716, 717, 718, 719, 720, 721, 722, 723, 724, 725, 726, 727, 728, 729, 730, 731, 732, 733, 734, 735, 736, 737, 738, 739, 740, 741, 742, 743, 744, 745, 746, 747, 748, 749, 750, 751, 752, 753, 754, 755, 756, 757, 758, 759, 760, 761, 762, 763, 764, 765, 766, 767, 768, 769, 770, 771, 772, 773, 774, 775, 776, 777, 778, 779, 780, 781, 782, 783, 784, 785, 786, 787, 788, 789, 790, 791, 792, 793, 794, 795, 796, 797, 798, 799, 800, 801, 802, 803, 804, 805, 806, 807, 808, 809, 810, 811, 812, 813, 814, 815, 816, 817, 818, 819, 820, 821, 822, 823, 824, 825, 826, 827, 828, 829, 830, 831, 832, 833, 834, 835, 836, 837, 838, 839, 840, 841, 842, 843, 844, 845, 846, 847, 848, 849, 850, 851, 852, 853, 854, 855, 856, 857, 858, 859, 860, 861, 862, 863, 864, 865, 866, 867, 868, 869, 870, 871, 872, 873, 874, 875, 876, 877, 878, 879, 880, 881, 882, 883, 884, 885, 886, 887, 888, 889, 890, 891, 892, 893, 894, 895, 1152, 1153, 1154, 1155, 1156, 1157, 1158, 1159, 1160, 1161, 1162, 1163, 1164, 1165, 1166, 1167, 1168, 1169, 1170, 1171, 1172, 1173, 1174, 1175, 1176, 1177, 1178, 1179, 1180, 1181, 1182, 1183, 1184, 1185, 1186, 1187, 1188, 1189, 1190, 1191, 1192, 1193, 1194, 1195, 1196, 1197, 1198, 1199, 1200, 1201, 1202, 1203, 1204, 1205, 1206, 1207, 1208, 1209, 1210, 1211, 1212, 1213, 1214, 1215, 1216, 1217, 1218, 1219, 1220, 1221, 1222, 1223, 1224, 1225, 1226, 1227, 1228, 1229, 1230, 1231, 1232, 1233, 1234, 1235, 1236, 1237, 1238, 1239, 1240, 1241, 1242, 1243, 1244, 1245, 1246, 1247, 1248, 1249, 1250, 1251, 1252, 1253, 1254, 1255, 1256, 1257, 1258, 1259, 1260, 1261, 1262, 1263, 1264, 1265, 1266, 1267, 1268, 1269, 1270, 1271, 1272, 1273, 1274, 1275, 1276, 1277, 1278, 1279, 1280, 1281, 1282, 1283, 1284, 1285, 1286, 1287, 1288, 1289, 1290, 1291, 1292, 1293, 1294, 1295, 1296, 1297, 1298, 1299, 1300, 1301, 1302, 1303, 1304, 1305, 1306, 1307, 1308, 1309, 1310, 1311, 1312, 1313, 1314, 1315, 1316, 1317, 1318, 1319, 1320, 1321, 1322, 1323, 1324, 1325, 1326, 1327, 1328, 1329, 1330, 1331, 1332, 1333, 1334, 1335, 1336, 1337, 1338, 1339, 1340, 1341, 1342, 1343, 1344, 1345, 1346, 1347, 1348, 1349, 1350, 1351, 1352, 1353, 1354, 1355, 1356, 1357, 1358, 1359, 1360, 1361, 1362, 1363, 1364, 1365, 1366, 1367, 1368, 1369, 1370, 1371, 1372, 1373, 1374, 1375, 1376, 1377, 1378, 1379, 1380, 1381, 1382, 1383, 1384, 1385, 1386, 1387, 1388, 1389, 1390, 1391, 1392, 1393, 1394, 1395, 1396, 1397, 1398, 1399, 1400, 1401, 1402, 1403, 1404, 1405, 1406, 1407, 1536, 1537, 1538, 1539, 1540, 1541, 1542, 1543, 1544, 1545, 1546, 1547, 1548, 1549, 1550, 1551, 1552, 1553, 1554, 1555, 1556, 1557, 1558, 1559, 1560, 1561, 1562, 1563, 1564, 1565, 1566, 1567, 1568, 1569, 1570, 1571, 1572, 1573, 1574, 1575, 1576, 1577, 1578, 1579, 1580, 1581, 1582, 1583, 1584, 1585, 1586, 1587, 1588, 1589, 1590, 1591, 1592, 1593, 1594, 1595, 1596, 1597, 1598, 1599, 1600, 1601, 1602, 1603, 1604, 1605, 1606, 1607, 1608, 1609, 1610, 1611, 1612, 1613, 1614, 1615, 1616, 1617, 1618, 1619, 1620, 1621, 1622, 1623, 1624, 1625, 1626, 1627, 1628, 1629, 1630, 1631, 1632, 1633, 1634, 1635, 1636, 1637, 1638, 1639, 1640, 1641, 1642, 1643, 1644, 1645, 1646, 1647, 1648, 1649, 1650, 1651, 1652, 1653, 1654, 1655, 1656, 1657, 1658, 1659, 1660, 1661, 1662, 1663, 896, 897, 898, 899, 900, 901, 902, 903, 904, 905, 906, 907, 908, 909, 910, 911, 912, 913, 914, 915, 916, 917, 918, 919, 920, 921, 922, 923, 924, 925, 926, 927, 928, 929, 930, 931, 932, 933, 934, 935, 936, 937, 938, 939, 940, 941, 942, 943, 944, 945, 946, 947, 948, 949, 950, 951, 952, 953, 954, 955, 956, 957, 958, 959, 960, 961, 962, 963, 964, 965, 966, 967, 968, 969, 970, 971, 972, 973, 974, 975, 976, 977, 978, 979, 980, 981, 982, 983, 984, 985, 986, 987, 988, 989, 990, 991, 992, 993, 994, 995, 996, 997, 998, 999, 1000, 1001, 1002, 1003, 1004, 1005, 1006, 1007, 1008, 1009, 1010, 1011, 1012, 1013, 1014, 1015, 1016, 1017, 1018, 1019, 1020, 1021, 1022, 1023, 1408, 1409, 1410, 1411, 1412, 1413, 1414, 1415, 1416, 1417, 1418, 1419, 1420, 1421, 1422, 1423, 1424, 1425, 1426, 1427, 1428, 1429, 1430, 1431, 1432, 1433, 1434, 1435, 1436, 1437, 1438, 1439, 1440, 1441, 1442, 1443, 1444, 1445, 1446, 1447, 1448, 1449, 1450, 1451, 1452, 1453, 1454, 1455, 1456, 1457, 1458, 1459, 1460, 1461, 1462, 1463, 1464, 1465, 1466, 1467, 1468, 1469, 1470, 1471, 1472, 1473, 1474, 1475, 1476, 1477, 1478, 1479, 1480, 1481, 1482, 1483, 1484, 1485, 1486, 1487, 1488, 1489, 1490, 1491, 1492, 1493, 1494, 1495, 1496, 1497, 1498, 1499, 1500, 1501, 1502, 1503, 1504, 1505, 1506, 1507, 1508, 1509, 1510, 1511, 1512, 1513, 1514, 1515, 1516, 1517, 1518, 1519, 1520, 1521, 1522, 1523, 1524, 1525, 1526, 1527, 1528, 1529, 1530, 1531, 1532, 1533, 1534, 1535, 1664, 1665, 1666, 1667, 1668, 1669, 1670, 1671, 1672, 1673, 1674, 1675, 1676, 1677, 1678, 1679, 1680, 1681, 1682, 1683, 1684, 1685, 1686, 1687, 1688, 1689, 1690, 1691, 1692, 1693, 1694, 1695, 1696, 1697, 1698, 1699, 1700, 1701, 1702, 1703, 1704, 1705, 1706, 1707, 1708, 1709, 1710, 1711, 1712, 1713, 1714, 1715, 1716, 1717, 1718, 1719, 1720, 1721, 1722, 1723, 1724, 1725, 1726, 1727, 1728, 1729, 1730, 1731, 1732, 1733, 1734, 1735, 1736, 1737, 1738, 1739, 1740, 1741, 1742, 1743, 1744, 1745, 1746, 1747, 1748, 1749, 1750, 1751, 1752, 1753, 1754, 1755, 1756, 1757, 1758, 1759, 1760, 1761, 1762, 1763, 1764, 1765, 1766, 1767, 1768, 1769, 1770, 1771, 1772, 1773, 1774, 1775, 1776, 1777, 1778, 1779, 1780, 1781, 1782, 1783, 1784, 1785, 1786, 1787, 1788, 1789, 1790, 1791, 1792, 1793, 1794, 1795, 1796, 1797, 1798, 1799, 1800, 1801, 1802, 1803, 1804, 1805, 1806, 1807, 1808, 1809, 1810, 1811, 1812, 1813, 1814, 1815, 1816, 1817, 1818, 1819, 1820, 1821, 1822, 1823, 1824, 1825, 1826, 1827, 1828, 1829, 1830, 1831, 1832, 1833, 1834, 1835, 1836, 1837, 1838, 1839, 1840, 1841, 1842, 1843, 1844, 1845, 1846, 1847, 1848, 1849, 1850, 1851, 1852, 1853, 1854, 1855, 1856, 1857, 1858, 1859, 1860, 1861, 1862, 1863, 1864, 1865, 1866, 1867, 1868, 1869, 1870, 1871, 1872, 1873, 1874, 1875, 1876, 1877, 1878, 1879, 1880, 1881, 1882, 1883, 1884, 1885, 1886, 1887, 1888, 1889, 1890, 1891, 1892, 1893, 1894, 1895, 1896, 1897, 1898, 1899, 1900, 1901, 1902, 1903, 1904, 1905, 1906, 1907, 1908, 1909, 1910, 1911, 1912, 1913, 1914, 1915, 1916, 1917, 1918, 1919, 1920, 1921, 1922, 1923, 1924, 1925, 1926, 1927, 1928, 1929, 1930, 1931, 1932, 1933, 1934, 1935, 1936, 1937, 1938, 1939, 1940, 1941, 1942, 1943, 1944, 1945, 1946, 1947, 1948, 1949, 1950, 1951, 1952, 1953, 1954, 1955, 1956, 1957, 1958, 1959, 1960, 1961, 1962, 1963, 1964, 1965, 1966, 1967, 1968, 1969, 1970, 1971, 1972, 1973, 1974, 1975, 1976, 1977, 1978, 1979, 1980, 1981, 1982, 1983, 1984, 1985, 1986, 1987, 1988, 1989, 1990, 1991, 1992, 1993, 1994, 1995, 1996, 1997, 1998, 1999, 2000, 2001, 2002, 2003, 2004, 2005, 2006, 2007, 2008, 2009, 2010, 2011, 2012, 2013, 2014, 2015, 2016, 2017, 2018, 2019, 2020, 2021, 2022, 2023, 2024, 2025, 2026, 2027, 2028, 2029, 2030, 2031, 2032, 2033, 2034, 2035, 2036, 2037, 2038, 2039, 2040, 2041, 2042, 2043, 2044, 2045, 2046, 2047].

A sequence 2c is as follows:

Punc_Q_half=[0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 512, 513, 514, 515, 516, 517, 518, 519, 520, 521, 522, 523, 524, 525, 526, 527, 528, 529, 530, 531, 532, 533, 534, 535, 536, 537, 538, 539, 540, 541, 542, 543, 544, 545, 546, 547, 548, 549, 550, 551, 552, 553, 554, 555, 556, 557, 558, 559, 560, 561, 562, 563, 564, 565, 566, 567, 568, 569, 570, 571, 572, 573, 574, 575, 576, 577, 578, 579, 580, 581, 582, 583, 584, 585, 586, 587, 588, 589, 590, 591, 592, 593, 594, 595, 596, 597, 598, 599, 600, 601, 602, 603, 604, 605, 606, 607, 608, 609, 610, 611, 612, 613, 614, 615, 616, 617, 618, 619, 620, 621, 622, 623, 624, 625, 626, 627, 628, 629, 630, 631, 632, 633, 634, 635, 636, 637, 638, 639, 1024, 1025, 1026, 1027, 1028, 1029, 1030, 1031, 1032, 1033, 1034, 1035, 1036, 1037, 1038, 1039, 1040, 1041, 1042, 1043, 1044, 1045, 1046, 1047, 1048, 1049, 1050, 1051, 1052, 1053, 1054, 1055, 1056, 1057, 1058, 1059, 1060, 1061, 1062, 1063, 1064, 1065, 1066, 1067, 1068, 1069, 1070, 1071, 1072, 1073, 1074, 1075, 1076, 1077, 1078, 1079, 1080, 1081, 1082, 1083, 1084, 1085, 1086, 1087, 1088, 1089, 1090, 1091, 1092, 1093, 1094, 1095, 1096, 1097, 1098, 1099, 1100, 1101, 1102, 1103, 1104, 1105, 1106, 1107, 1108, 1109, 1110, 1111, 1112, 1113, 1114, 1115, 1116, 1117, 1118, 1119, 1120, 1121, 1122, 1123, 1124, 1125, 1126, 1127, 1128, 1129, 1130, 1131, 1132, 1133, 1134, 1135, 1136, 1137, 1138, 1139, 1140, 1141, 1142, 1143, 1144, 1145, 1146, 1147, 1148, 1149, 1150, 1151, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 501, 502, 503, 504, 505, 506, 507, 508, 509, 510, 511, 640, 641, 642, 643, 644, 645, 646, 647, 648, 649, 650, 651, 652, 653, 654, 655, 656, 657, 658, 659, 660, 661, 662, 663, 664, 665, 666, 667, 668, 669, 670, 671, 672, 673, 674, 675, 676, 677, 678, 679, 680, 681, 682, 683, 684, 685, 686, 687, 688, 689, 690, 691, 692, 693, 694, 695, 696, 697, 698, 699, 700, 701, 702, 703, 704, 705, 706, 707, 708, 709, 710, 711, 712, 713, 714, 715, 716, 717, 718, 719, 720, 721, 722, 723, 724, 725, 726, 727, 728, 729, 730, 731, 732, 733, 734, 735, 736, 737, 738, 739, 740, 741, 742, 743, 744, 745, 746, 747, 748, 749, 750, 751, 752, 753, 754, 755, 756, 757, 758, 759, 760, 761, 762, 763, 764, 765, 766, 767, 768, 769, 770, 771, 772, 773, 774, 775, 776, 777, 778, 779, 780, 781, 782, 783, 784, 785, 786, 787, 788, 789, 790, 791, 792, 793, 794, 795, 796, 797, 798, 799, 800, 801, 802, 803, 804, 805, 806, 807, 808, 809, 810, 811, 812, 813, 814, 815, 816, 817, 818, 819, 820, 821, 822, 823, 824, 825, 826, 827, 828, 829, 830, 831, 832, 833, 834, 835, 836, 837, 838, 839, 840, 841, 842, 843, 844, 845, 846, 847, 848, 849, 850, 851, 852, 853, 854, 855, 856, 857, 858, 859, 860, 861, 862, 863, 864, 865, 866, 867, 868, 869, 870, 871, 872, 873, 874, 875, 876, 877, 878, 879, 880, 881, 882, 883, 884, 885, 886, 887, 888, 889, 890, 891, 892, 893, 894, 895].

A sequence 3c is as follows:

Punc_Z=[0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 768, 769, 770, 771, 772, 773, 774, 775, 776, 777, 778, 779, 780, 781, 782, 783, 784, 785, 786, 787, 788, 789, 790, 791, 792, 793, 794, 795, 796, 797, 798, 799, 800, 801, 802, 803, 804, 805, 806, 807, 808, 809, 810, 811, 812, 813, 814, 815, 816, 817, 818, 819, 820, 821, 822, 823, 824, 825, 826, 827, 828, 829, 830, 831, 832, 833, 834, 835, 836, 837, 838, 839, 840, 841, 842, 843, 844, 845, 846, 847, 848, 849, 850, 851, 852, 853, 854, 855, 856, 857, 858, 859, 860, 861, 862, 863, 864, 865, 866, 867, 868, 869, 870, 871, 872, 873, 874, 875, 876, 877, 878, 879, 880, 881, 882, 883, 884, 885, 886, 887, 888, 889, 890, 891, 892, 893, 894, 895, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 501, 502, 503, 504, 505, 506, 507, 508, 509, 510, 511, 1024, 1025, 1026, 1027, 1028, 1029, 1030, 1031, 1032, 1033, 1034, 1035, 1036, 1037, 1038, 1039, 1040, 1041, 1042, 1043, 1044, 1045, 1046, 1047, 1048, 1049, 1050, 1051, 1052, 1053, 1054, 1055, 1056, 1057, 1058, 1059, 1060, 1061, 1062, 1063, 1064, 1065, 1066, 1067, 1068, 1069, 1070, 1071, 1072, 1073, 1074, 1075, 1076, 1077, 1078, 1079, 1080, 1081, 1082, 1083, 1084, 1085, 1086, 1087, 1088, 1089, 1090, 1091, 1092, 1093, 1094, 1095, 1096, 1097, 1098, 1099, 1100, 1101, 1102, 1103, 1104, 1105, 1106, 1107, 1108, 1109, 1110, 1111, 1112, 1113, 1114, 1115, 1116, 1117, 1118, 1119, 1120, 1121, 1122, 1123, 1124, 1125, 1126, 1127, 1128, 1129, 1130, 1131, 1132, 1133, 1134, 1135, 1136, 1137, 1138, 1139, 1140, 1141, 1142, 1143, 1144, 1145, 1146, 1147, 1148, 1149, 1150, 1151, 1152, 1153, 1154, 1155, 1156, 1157, 1158, 1159, 1160, 1161, 1162, 1163, 1164, 1165, 1166, 1167, 1168, 1169, 1170, 1171, 1172, 1173, 1174, 1175, 1176, 1177, 1178, 1179, 1180, 1181, 1182, 1183, 1184, 1185, 1186, 1187, 1188, 1189, 1190, 1191, 1192, 1193, 1194, 1195, 1196, 1197, 1198, 1199, 1200, 1201, 1202, 1203, 1204, 1205, 1206, 1207, 1208, 1209, 1210, 1211, 1212, 1213, 1214, 1215, 1216, 1217, 1218, 1219, 1220, 1221, 1222, 1223, 1224, 1225, 1226, 1227, 1228, 1229, 1230, 1231, 1232, 1233, 1234, 1235, 1236, 1237, 1238, 1239, 1240, 1241, 1242, 1243, 1244, 1245, 1246, 1247, 1248, 1249, 1250, 1251, 1252, 1253, 1254, 1255, 1256, 1257, 1258, 1259, 1260, 1261, 1262, 1263, 1264, 1265, 1266, 1267, 1268, 1269, 1270, 1271, 1272, 1273, 1274, 1275, 1276, 1277, 1278, 1279, 2304, 2305, 2306, 2307, 2308, 2309, 2310, 2311, 2312, 2313, 2314, 2315, 2316, 2317, 2318, 2319, 2320, 2321, 2322, 2323, 2324, 2325, 2326, 2327, 2328, 2329, 2330, 2331, 2332, 2333, 2334, 2335, 2336, 2337, 2338, 2339, 2340, 2341, 2342, 2343, 2344, 2345, 2346, 2347, 2348, 2349, 2350, 2351, 2352, 2353, 2354, 2355, 2356, 2357, 2358, 2359, 2360, 2361, 2362, 2363, 2364, 2365, 2366, 2367, 2368, 2369, 2370, 2371, 2372, 2373, 2374, 2375, 2376, 2377, 2378, 2379, 2380, 2381, 2382, 2383, 2384, 2385, 2386, 2387, 2388, 2389, 2390, 2391, 2392, 2393, 2394, 2395, 2396, 2397, 2398, 2399, 2400, 2401, 2402, 2403, 2404, 2405, 2406, 2407, 2408, 2409, 2410, 2411, 2412, 2413, 2414, 2415, 2416, 2417, 2418, 2419, 2420, 2421, 2422, 2423, 2424, 2425, 2426, 2427, 2428, 2429, 2430, 2431, 512, 513, 514, 515, 516, 517, 518, 519, 520, 521, 522, 523, 524, 525, 526, 527, 528, 529, 530, 531, 532, 533, 534, 535, 536, 537, 538, 539, 540, 541, 542, 543, 544, 545, 546, 547, 548, 549, 550, 551, 552, 553, 554, 555, 556, 557, 558, 559, 560, 561, 562, 563, 564, 565, 566, 567, 568, 569, 570, 571, 572, 573, 574, 575, 576, 577, 578, 579, 580, 581, 582, 583, 584, 585, 586, 587, 588, 589, 590, 591, 592, 593, 594, 595, 596, 597, 598, 599, 600, 601, 602, 603, 604, 605, 606, 607, 608, 609, 610, 611, 612, 613, 614, 615, 616, 617, 618, 619, 620, 621, 622, 623, 624, 625, 626, 627, 628, 629, 630, 631, 632, 633, 634, 635, 636, 637, 638, 639, 1280, 1281, 1282, 1283, 1284, 1285, 1286, 1287, 1288, 1289, 1290, 1291, 1292, 1293, 1294, 1295, 1296, 1297, 1298, 1299, 1300, 1301, 1302, 1303, 1304, 1305, 1306, 1307, 1308, 1309, 1310, 1311, 1312, 1313, 1314, 1315, 1316, 1317, 1318, 1319, 1320, 1321, 1322, 1323, 1324, 1325, 1326, 1327, 1328, 1329, 1330, 1331, 1332, 1333, 1334, 1335, 1336, 1337, 1338, 1339, 1340, 1341, 1342, 1343, 1344, 1345, 1346, 1347, 1348, 1349, 1350, 1351, 1352, 1353, 1354, 1355, 1356, 1357, 1358, 1359, 1360, 1361, 1362, 1363, 1364, 1365, 1366, 1367, 1368, 1369, 1370, 1371, 1372, 1373, 1374, 1375, 1376, 1377, 1378, 1379, 1380, 1381, 1382, 1383, 1384, 1385, 1386, 1387, 1388, 1389, 1390, 1391, 1392, 1393, 1394, 1395, 1396, 1397, 1398, 1399, 1400, 1401, 1402, 1403, 1404, 1405, 1406, 1407, 1408, 1409, 1410, 1411, 1412, 1413, 1414, 1415, 1416, 1417, 1418, 1419, 1420, 1421, 1422, 1423, 1424, 1425, 1426, 1427, 1428, 1429, 1430, 1431, 1432, 1433, 1434, 1435, 1436, 1437, 1438, 1439, 1440, 1441, 1442, 1443, 1444, 1445, 1446, 1447, 1448, 1449, 1450, 1451, 1452, 1453, 1454, 1455, 1456, 1457, 1458, 1459, 1460, 1461, 1462, 1463, 1464, 1465, 1466, 1467, 1468, 1469, 1470, 1471, 1472, 1473, 1474, 1475, 1476, 1477, 1478, 1479, 1480, 1481, 1482, 1483, 1484, 1485, 1486, 1487, 1488, 1489, 1490, 1491, 1492, 1493, 1494, 1495, 1496, 1497, 1498, 1499, 1500, 1501, 1502, 1503, 1504, 1505, 1506, 1507, 1508, 1509, 1510, 1511, 1512, 1513, 1514, 1515, 1516, 1517, 1518, 1519, 1520, 1521, 1522, 1523, 1524, 1525, 1526, 1527, 1528, 1529, 1530, 1531, 1532, 1533, 1534, 1535, 2688, 2689, 2690, 2691, 2692, 2693, 2694, 2695, 2696, 2697, 2698, 2699, 2700, 2701, 2702, 2703, 2704, 2705, 2706, 2707, 2708, 2709, 2710, 2711, 2712, 2713, 2714, 2715, 2716, 2717, 2718, 2719, 2720, 2721, 2722, 2723, 2724, 2725, 2726, 2727, 2728, 2729, 2730, 2731, 2732, 2733, 2734, 2735, 2736, 2737, 2738, 2739, 2740, 2741, 2742, 2743, 2744, 2745, 2746, 2747, 2748, 2749, 2750, 2751, 2752, 2753, 2754, 2755, 2756, 2757, 2758, 2759, 2760, 2761, 2762, 2763, 2764, 2765, 2766, 2767, 2768, 2769, 2770, 2771, 2772, 2773, 2774, 2775, 2776, 2777, 2778, 2779, 2780, 2781, 2782, 2783, 2784, 2785, 2786, 2787, 2788, 2789, 2790, 2791, 2792, 2793, 2794, 2795, 2796, 2797, 2798, 2799, 2800, 2801, 2802, 2803, 2804, 2805, 2806, 2807, 2808, 2809, 2810, 2811, 2812, 2813, 2814, 2815, 1664, 1665, 1666, 1667, 1668, 1669, 1670, 1671, 1672, 1673, 1674, 1675, 1676, 1677, 1678, 1679, 1680, 1681, 1682, 1683, 1684, 1685, 1686, 1687, 1688, 1689, 1690, 1691, 1692, 1693, 1694, 1695, 1696, 1697, 1698, 1699, 1700, 1701, 1702, 1703, 1704, 1705, 1706, 1707, 1708, 1709, 1710, 1711, 1712, 1713, 1714, 1715, 1716, 1717, 1718, 1719, 1720, 1721, 1722, 1723, 1724, 1725, 1726, 1727, 1728, 1729, 1730, 1731, 1732, 1733, 1734, 1735, 1736, 1737, 1738, 1739, 1740, 1741, 1742, 1743, 1744, 1745, 1746, 1747, 1748, 1749, 1750, 1751, 1752, 1753, 1754, 1755, 1756, 1757, 1758, 1759, 1760, 1761, 1762, 1763, 1764, 1765, 1766, 1767, 1768, 1769, 1770, 1771, 1772, 1773, 1774, 1775, 1776, 1777, 1778, 1779, 1780, 1781, 1782, 1783, 1784, 1785, 1786, 1787, 1788, 1789, 1790, 1791, 2944, 2945, 2946, 2947, 2948, 2949, 2950, 2951, 2952, 2953, 2954, 2955, 2956, 2957, 2958, 2959, 2960, 2961, 2962, 2963, 2964, 2965, 2966, 2967, 2968, 2969, 2970, 2971, 2972, 2973, 2974, 2975, 2976, 2977, 2978, 2979, 2980, 2981, 2982, 2983, 2984, 2985, 2986, 2987, 2988, 2989, 2990, 2991, 2992, 2993, 2994, 2995, 2996, 2997, 2998, 2999, 3000, 3001, 3002, 3003, 3004, 3005, 3006, 3007, 3008, 3009, 3010, 3011, 3012, 3013, 3014, 3015, 3016, 3017, 3018, 3019, 3020, 3021, 3022, 3023, 3024, 3025, 3026, 3027, 3028, 3029, 3030, 3031, 3032, 3033, 3034, 3035, 3036, 3037, 3038, 3039, 3040, 3041, 3042, 3043, 3044, 3045, 3046, 3047, 3048, 3049, 3050, 3051, 3052, 3053, 3054, 3055, 3056, 3057, 3058, 3059, 3060, 3061, 3062, 3063, 3064, 3065, 3066, 3067, 3068, 3069, 3070, 3071, 3200, 3201, 3202, 3203, 3204, 3205, 3206, 3207, 3208, 3209, 3210, 3211, 3212, 3213, 3214, 3215, 3216, 3217, 3218, 3219, 3220, 3221, 3222, 3223, 3224, 3225, 3226, 3227, 3228, 3229, 3230, 3231, 3232, 3233, 3234, 3235, 3236, 3237, 3238, 3239, 3240, 3241, 3242, 3243, 3244, 3245, 3246, 3247, 3248, 3249, 3250, 3251, 3252, 3253, 3254, 3255, 3256, 3257, 3258, 3259, 3260, 3261, 3262, 3263, 3264, 3265, 3266, 3267, 3268, 3269, 3270, 3271, 3272, 3273, 3274, 3275, 3276, 3277, 3278, 3279, 3280, 3281, 3282, 3283, 3284, 3285, 3286, 3287, 3288, 3289, 3290, 3291, 3292, 3293, 3294, 3295, 3296, 3297, 3298, 3299, 3300, 3301, 3302, 3303, 3304, 3305, 3306, 3307, 3308, 3309, 3310, 3311, 3312, 3313, 3314, 3315, 3316, 3317, 3318, 3319, 3320, 3321, 3322, 3323, 3324, 3325, 3326, 3327, 4736, 4737, 4738, 4739, 4740, 4741, 4742, 4743, 4744, 4745, 4746, 4747, 4748, 4749, 4750, 4751, 4752, 4753, 4754, 4755, 4756, 4757, 4758, 4759, 4760, 4761, 4762, 4763, 4764, 4765, 4766, 4767, 4768, 4769, 4770, 4771, 4772, 4773, 4774, 4775, 4776, 4777, 4778, 4779, 4780, 4781, 4782, 4783, 4784, 4785, 4786, 4787, 4788, 4789, 4790, 4791, 4792, 4793, 4794, 4795, 4796, 4797, 4798, 4799, 4800, 4801, 4802, 4803, 4804, 4805, 4806, 4807, 4808, 4809, 4810, 4811, 4812, 4813, 4814, 4815, 4816, 4817, 4818, 4819, 4820, 4821, 4822, 4823, 4824, 4825, 4826, 4827, 4828, 4829, 4830, 4831, 4832, 4833, 4834, 4835, 4836, 4837, 4838, 4839, 4840, 4841, 4842, 4843, 4844, 4845, 4846, 4847, 4848, 4849, 4850, 4851, 4852, 4853, 4854, 4855, 4856, 4857, 4858, 4859, 4860, 4861, 4862, 4863].

When N=1024:

A sequence 1d is as follows:

Punc_Q=[0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 512, 513, 514, 515, 516, 517, 518, 519, 520, 521, 522, 523, 524, 525, 526, 527, 528, 529, 530, 531, 532, 533, 534, 535, 536, 537, 538, 539, 540, 541, 542, 543, 544, 545, 546, 547, 548, 549, 550, 551, 552, 553, 554, 555, 556, 557, 558, 559, 560, 561, 562, 563, 564, 565, 566, 567, 568, 569, 570, 571, 572, 573, 574, 575, 576, 577, 578, 579, 580, 581, 582, 583, 584, 585, 586, 587, 588, 589, 590, 591, 592, 593, 594, 595, 596, 597, 598, 599, 600, 601, 602, 603, 604, 605, 606, 607, 608, 609, 610, 611, 612, 613, 614, 615, 616, 617, 618, 619, 620, 621, 622, 623, 624, 625, 626, 627, 628, 629, 630, 631, 632, 633, 634, 635, 636, 637, 638, 639, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 501, 502, 503, 504, 505, 506, 507, 508, 509, 510, 511, 640, 641, 642, 643, 644, 645, 646, 647, 648, 649, 650, 651, 652, 653, 654, 655, 656, 657, 658, 659, 660, 661, 662, 663, 664, 665, 666, 667, 668, 669, 670, 671, 672, 673, 674, 675, 676, 677, 678, 679, 680, 681, 682, 683, 684, 685, 686, 687, 688, 689, 690, 691, 692, 693, 694, 695, 696, 697, 698, 699, 700, 701, 702, 703, 704, 705, 706, 707, 708, 709, 710, 711, 712, 713, 714, 715, 716, 717, 718, 719, 720, 721, 722, 723, 724, 725, 726, 727, 728, 729, 730, 731, 732, 733, 734, 735, 736, 737, 738, 739, 740, 741, 742, 743, 744, 745, 746, 747, 748, 749, 750, 751, 752, 753, 754, 755, 756, 757, 758, 759, 760, 761, 762, 763, 764, 765, 766, 767, 768, 769, 770, 771, 772, 773, 774, 775, 776, 777, 778, 779, 780, 781, 782, 783, 784, 785, 786, 787, 788, 789, 790, 791, 792, 793, 794, 795, 796, 797, 798, 799, 800, 801, 802, 803, 804, 805, 806, 807, 808, 809, 810, 811, 812, 813, 814, 815, 816, 817, 818, 819, 820, 821, 822, 823, 824, 825, 826, 827, 828, 829, 830, 831, 832, 833, 834, 835, 836, 837, 838, 839, 840, 841, 842, 843, 844, 845, 846, 847, 848, 849, 850, 851, 852, 853, 854, 855, 856, 857, 858, 859, 860, 861, 862, 863, 864, 865, 866, 867, 868, 869, 870, 871, 872, 873, 874, 875, 876, 877, 878, 879, 880, 881, 882, 883, 884, 885, 886, 887, 888, 889, 890, 891, 892, 893, 894, 895, 896, 897, 898, 899, 900, 901, 902, 903, 904, 905, 906, 907, 908, 909, 910, 911, 912, 913, 914, 915, 916, 917, 918, 919, 920, 921, 922, 923, 924, 925, 926, 927, 928, 929, 930, 931, 932, 933, 934, 935, 936, 937, 938, 939, 940, 941, 942, 943, 944, 945, 946, 947, 948, 949, 950, 951, 952, 953, 954, 955, 956, 957, 958, 959, 960, 961, 962, 963, 964, 965, 966, 967, 968, 969, 970, 971, 972, 973, 974, 975, 976, 977, 978, 979, 980, 981, 982, 983, 984, 985, 986, 987, 988, 989, 990, 991, 992, 993, 994, 995, 996, 997, 998, 999, 1000, 1001, 1002, 1003, 1004, 1005, 1006, 1007, 1008, 1009, 1010, 1011, 1012, 1013, 1014, 1015, 1016, 1017, 1018, 1019, 1020, 1021, 1022, 1023].

A sequence 2d is as follows:

Punc_Q_half=[0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 512, 513, 514, 515, 516, 517, 518, 519, 520, 521, 522, 523, 524, 525, 526, 527, 528, 529, 530, 531, 532, 533, 534, 535, 536, 537, 538, 539, 540, 541, 542, 543, 544, 545, 546, 547, 548, 549, 550, 551, 552, 553, 554, 555, 556, 557, 558, 559, 560, 561, 562, 563, 564, 565, 566, 567, 568, 569, 570, 571, 572, 573, 574, 575, 576, 577, 578, 579, 580, 581, 582, 583, 584, 585, 586, 587, 588, 589, 590, 591, 592, 593, 594, 595, 596, 597, 598, 599, 600, 601, 602, 603, 604, 605, 606, 607, 608, 609, 610, 611, 612, 613, 614, 615, 616, 617, 618, 619, 620, 621, 622, 623, 624, 625, 626, 627, 628, 629, 630, 631, 632, 633, 634, 635, 636, 637, 638, 639].

A sequence 3d is as follows:

Punc_Z=[0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 768, 769, 770, 771, 772, 773, 774, 775, 776, 777, 778, 779, 780, 781, 782, 783, 784, 785, 786, 787, 788, 789, 790, 791, 792, 793, 794, 795, 796, 797, 798, 799, 800, 801, 802, 803, 804, 805, 806, 807, 808, 809, 810, 811, 812, 813, 814, 815, 816, 817, 818, 819, 820, 821, 822, 823, 824, 825, 826, 827, 828, 829, 830, 831, 832, 833, 834, 835, 836, 837, 838, 839, 840, 841, 842, 843, 844, 845, 846, 847, 848, 849, 850, 851, 852, 853, 854, 855, 856, 857, 858, 859, 860, 861, 862, 863, 864, 865, 866, 867, 868, 869, 870, 871, 872, 873, 874, 875, 876, 877, 878, 879, 880, 881, 882, 883, 884, 885, 886, 887, 888, 889, 890, 891, 892, 893, 894, 895, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 501, 502, 503, 504, 505, 506, 507, 508, 509, 510, 511, 1024, 1025, 1026, 1027, 1028, 1029, 1030, 1031, 1032, 1033, 1034, 1035, 1036, 1037, 1038, 1039, 1040, 1041, 1042, 1043, 1044, 1045, 1046, 1047, 1048, 1049, 1050, 1051, 1052, 1053, 1054, 1055, 1056, 1057, 1058, 1059, 1060, 1061, 1062, 1063, 1064, 1065, 1066, 1067, 1068, 1069, 1070, 1071, 1072, 1073, 1074, 1075, 1076, 1077, 1078, 1079, 1080, 1081, 1082, 1083, 1084, 1085, 1086, 1087, 1088, 1089, 1090, 1091, 1092, 1093, 1094, 1095, 1096, 1097, 1098, 1099, 1100, 1101, 1102, 1103, 1104, 1105, 1106, 1107, 1108, 1109, 1110, 1111, 1112, 1113, 1114, 1115, 1116, 1117, 1118, 1119, 1120, 1121, 1122, 1123, 1124, 1125, 1126, 1127, 1128, 1129, 1130, 1131, 1132, 1133, 1134, 1135, 1136, 1137, 1138, 1139, 1140, 1141, 1142, 1143, 1144, 1145, 1146, 1147, 1148, 1149, 1150, 1151, 1152, 1153, 1154, 1155, 1156, 1157, 1158, 1159, 1160, 1161, 1162, 1163, 1164, 1165, 1166, 1167, 1168, 1169, 1170, 1171, 1172, 1173, 1174, 1175, 1176, 1177, 1178, 1179, 1180, 1181, 1182, 1183, 1184, 1185, 1186, 1187, 1188, 1189, 1190, 1191, 1192, 1193, 1194, 1195, 1196, 1197, 1198, 1199, 1200, 1201, 1202, 1203, 1204, 1205, 1206, 1207, 1208, 1209, 1210, 1211, 1212, 1213, 1214, 1215, 1216, 1217, 1218, 1219, 1220, 1221, 1222, 1223, 1224, 1225, 1226, 1227, 1228, 1229, 1230, 1231, 1232, 1233, 1234, 1235, 1236, 1237, 1238, 1239, 1240, 1241, 1242, 1243, 1244, 1245, 1246, 1247, 1248, 1249, 1250, 1251, 1252, 1253, 1254, 1255, 1256, 1257, 1258, 1259, 1260, 1261, 1262, 1263, 1264, 1265, 1266, 1267, 1268, 1269, 1270, 1271, 1272, 1273, 1274, 1275, 1276, 1277, 1278, 1279, 2304, 2305, 2306, 2307, 2308, 2309, 2310, 2311, 2312, 2313, 2314, 2315, 2316, 2317, 2318, 2319, 2320, 2321, 2322, 2323, 2324, 2325, 2326, 2327, 2328, 2329, 2330, 2331, 2332, 2333, 2334, 2335, 2336, 2337, 2338, 2339, 2340, 2341, 2342, 2343, 2344, 2345, 2346, 2347, 2348, 2349, 2350, 2351, 2352, 2353, 2354, 2355, 2356, 2357, 2358, 2359, 2360, 2361, 2362, 2363, 2364, 2365, 2366, 2367, 2368, 2369, 2370, 2371, 2372, 2373, 2374, 2375, 2376, 2377, 2378, 2379, 2380, 2381, 2382, 2383, 2384, 2385, 2386, 2387, 2388, 2389, 2390, 2391, 2392, 2393, 2394, 2395, 2396, 2397, 2398, 2399, 2400, 2401, 2402, 2403, 2404, 2405, 2406, 2407, 2408, 2409, 2410, 2411, 2412, 2413, 2414, 2415, 2416, 2417, 2418, 2419, 2420, 2421, 2422, 2423, 2424, 2425, 2426, 2427, 2428, 2429, 2430, 2431].

When N=512:

A sequence 1e is as follows:

Punc_Q=[0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 501, 502, 503, 504, 505, 506, 507, 508, 509, 510, 511].

A sequence 2e is as follows:

Punc_Q_half=[0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255].

A sequence 3e is as follows:

Punc_Z=[0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 768, 769, 770, 771, 772, 773, 774, 775, 776, 777, 778, 779, 780, 781, 782, 783, 784, 785, 786, 787, 788, 789, 790, 791, 792, 793, 794, 795, 796, 797, 798, 799, 800, 801, 802, 803, 804, 805, 806, 807, 808, 809, 810, 811, 812, 813, 814, 815, 816, 817, 818, 819, 820, 821, 822, 823, 824, 825, 826, 827, 828, 829, 830, 831, 832, 833, 834, 835, 836, 837, 838, 839, 840, 841, 842, 843, 844, 845, 846, 847, 848, 849, 850, 851, 852, 853, 854, 855, 856, 857, 858, 859, 860, 861, 862, 863, 864, 865, 866, 867, 868, 869, 870, 871, 872, 873, 874, 875, 876, 877, 878, 879, 880, 881, 882, 883, 884, 885, 886, 887, 888, 889, 890, 891, 892, 893, 894, 895].

APPENDIX II: ANOTHER EXAMPLE OF A FIRST SEQUENCE

Sequence 1:

Shorten_Q=[0, 4096, 2048, 6144, 1024, 5120, 3072, 7168, 512, 4608, 2560, 6656, 1536, 5632, 3584, 7680, 256, 4352, 2304, 6400, 1280, 5376, 3328, 7424, 768, 4864, 2816, 6912, 1792, 5888, 3840, 7936, 128, 4224, 2176, 6272, 1152, 5248, 3200, 7296, 640, 4736, 2688, 6784, 1664, 5760, 3712, 7808, 384, 4480, 2432, 6528, 1408, 5504, 3456, 7552, 896, 4992, 2944, 7040, 1920, 6016, 3968, 8064, 64, 4160, 2112, 6208, 1088, 5184, 3136, 7232, 576, 4672, 2624, 6720, 1600, 5696, 3648, 7744, 320, 4416, 2368, 6464, 1344, 5440, 3392, 7488, 832, 4928, 2880, 6976, 1856, 5952, 3904, 8000, 192, 4288, 2240, 6336, 1216, 5312, 3264, 7360, 704, 4800, 2752, 6848, 1728, 5824, 3776, 7872, 448, 4544, 2496, 6592, 1472, 5568, 3520, 7616, 960, 5056, 3008, 7104, 1984, 6080, 4032, 8128, 32, 4128, 2080, 6176, 1056, 5152, 3104, 7200, 544, 4640, 2592, 6688, 1568, 5664, 3616, 7712, 288, 4384, 2336, 6432, 1312, 5408, 3360, 7456, 800, 4896, 2848, 6944, 1824, 5920, 3872, 7968, 160, 4256, 2208, 6304, 1184, 5280, 3232, 7328, 672, 4768, 2720, 6816, 1696, 5792, 3744, 7840, 416, 4512, 2464, 6560, 1440, 5536, 3488, 7584, 928, 5024, 2976, 7072, 1952, 6048, 4000, 8096, 96, 4192, 2144, 6240, 1120, 5216, 3168, 7264, 608, 4704, 2656, 6752, 1632, 5728, 3680, 7776, 352, 4448, 2400, 6496, 1376, 5472, 3424, 7520, 864, 4960, 2912, 7008, 1888, 5984, 3936, 8032, 224, 4320, 2272, 6368, 1248, 5344, 3296, 7392, 736, 4832, 2784, 6880, 1760, 5856, 3808, 7904, 480, 4576, 2528, 6624, 1504, 5600, 3552, 7648, 992, 5088, 3040, 7136, 2016, 6112, 4064, 8160, 16, 4112, 2064, 6160, 1040, 5136, 3088, 7184, 528, 4624, 2576, 6672, 1552, 5648, 3600, 7696, 272, 4368, 2320, 6416, 1296, 5392, 3344, 7440, 784, 4880, 2832, 6928, 1808, 5904, 3856, 7952, 144, 4240, 2192, 6288, 1168, 5264, 3216, 7312, 656, 4752, 2704, 6800, 1680, 5776, 3728, 7824, 400, 4496, 2448, 6544, 1424, 5520, 3472, 7568, 912, 5008, 2960, 7056, 1936, 6032, 3984, 8080, 80, 4176, 2128, 6224, 1104, 5200, 3152, 7248, 592, 4688, 2640, 6736, 1616, 5712, 3664, 7760, 336, 4432, 2384, 6480, 1360, 5456, 3408, 7504, 848, 4944, 2896, 6992, 1872, 5968, 3920, 8016, 208, 4304, 2256, 6352, 1232, 5328, 3280, 7376, 720, 4816, 2768, 6864, 1744, 5840, 3792, 7888, 464, 4560, 2512, 6608, 1488, 5584, 3536, 7632, 976, 5072, 3024, 7120, 2000, 6096, 4048, 8144, 48, 4144, 2096, 6192, 1072, 5168, 3120, 7216, 560, 4656, 2608, 6704, 1584, 5680, 3632, 7728, 304, 4400, 2352, 6448, 1328, 5424, 3376, 7472, 816, 4912, 2864, 6960, 1840, 5936, 3888, 7984, 176, 4272, 2224, 6320, 1200, 5296, 3248, 7344, 688, 4784, 2736, 6832, 1712, 5808, 3760, 7856, 432, 4528, 2480, 6576, 1456, 5552, 3504, 7600, 944, 5040, 2992, 7088, 1968, 6064, 4016, 8112, 112, 4208, 2160, 6256, 1136, 5232, 3184, 7280, 624, 4720, 2672, 6768, 1648, 5744, 3696, 7792, 368, 4464, 2416, 6512, 1392, 5488, 3440, 7536, 880, 4976, 2928, 7024, 1904, 6000, 3952, 8048, 240, 4336, 2288, 6384, 1264, 5360, 3312, 7408, 752, 4848, 2800, 6896, 1776, 5872, 3824, 7920, 496, 4592, 2544, 6640, 1520, 5616, 3568, 7664, 1008, 5104, 3056, 7152, 2032, 6128, 4080, 8176, 8, 4104, 2056, 6152, 1032, 5128, 3080, 7176, 520, 4616, 2568, 6664, 1544, 5640, 3592, 7688, 264, 4360, 2312, 6408, 1288, 5384, 3336, 7432, 776, 4872, 2824, 6920, 1800, 5896, 3848, 7944, 136, 4232, 2184, 6280, 1160, 5256, 3208, 7304, 648, 4744, 2696, 6792, 1672, 5768, 3720, 7816, 392, 4488, 2440, 6536, 1416, 5512, 3464, 7560, 904, 5000, 2952, 7048, 1928, 6024, 3976, 8072, 72, 4168, 2120, 6216, 1096, 5192, 3144, 7240, 584, 4680, 2632, 6728, 1608, 5704, 3656, 7752, 328, 4424, 2376, 6472, 1352, 5448, 3400, 7496, 840, 4936, 2888, 6984, 1864, 5960, 3912, 8008, 200, 4296, 2248, 6344, 1224, 5320, 3272, 7368, 712, 4808, 2760, 6856, 1736, 5832, 3784, 7880, 456, 4552, 2504, 6600, 1480, 5576, 3528, 7624, 968, 5064, 3016, 7112, 1992, 6088, 4040, 8136, 40, 4136, 2088, 6184, 1064, 5160, 3112, 7208, 552, 4648, 2600, 6696, 1576, 5672, 3624, 7720, 296, 4392, 2344, 6440, 1320, 5416, 3368, 7464, 808, 4904, 2856, 6952, 1832, 5928, 3880, 7976, 168, 4264, 2216, 6312, 1192, 5288, 3240, 7336, 680, 4776, 2728, 6824, 1704, 5800, 3752, 7848, 424, 4520, 2472, 6568, 1448, 5544, 3496, 7592, 936, 5032, 2984, 7080, 1960, 6056, 4008, 8104, 104, 4200, 2152, 6248, 1128, 5224, 3176, 7272, 616, 4712, 2664, 6760, 1640, 5736, 3688, 7784, 360, 4456, 2408, 6504, 1384, 5480, 3432, 7528, 872, 4968, 2920, 7016, 1896, 5992, 3944, 8040, 232, 4328, 2280, 6376, 1256, 5352, 3304, 7400, 744, 4840, 2792, 6888, 1768, 5864, 3816, 7912, 488, 4584, 2536, 6632, 1512, 5608, 3560, 7656, 1000, 5096, 3048, 7144, 2024, 6120, 4072, 8168, 24, 4120, 2072, 6168, 1048, 5144, 3096, 7192, 536, 4632, 2584, 6680, 1560, 5656, 3608, 7704, 280, 4376, 2328, 6424, 1304, 5400, 3352, 7448, 792, 4888, 2840, 6936, 1816, 5912, 3864, 7960, 152, 4248, 2200, 6296, 1176, 5272, 3224, 7320, 664, 4760, 2712, 6808, 1688, 5784, 3736, 7832, 408, 4504, 2456, 6552, 1432, 5528, 3480, 7576, 920, 5016, 2968, 7064, 1944, 6040, 3992, 8088, 88, 4184, 2136, 6232, 1112, 5208, 3160, 7256, 600, 4696, 2648, 6744, 1624, 5720, 3672, 7768, 344, 4440, 2392, 6488, 1368, 5464, 3416, 7512, 856, 4952, 2904, 7000, 1880, 5976, 3928, 8024, 216, 4312, 2264, 6360, 1240, 5336, 3288, 7384, 728, 4824, 2776, 6872, 1752, 5848, 3800, 7896, 472, 4568, 2520, 6616, 1496, 5592, 3544, 7640, 984, 5080, 3032, 7128, 2008, 6104, 4056, 8152, 56, 4152, 2104, 6200, 1080, 5176, 3128, 7224, 568, 4664, 2616, 6712, 1592, 5688, 3640, 7736, 312, 4408, 2360, 6456, 1336, 5432, 3384, 7480, 824, 4920, 2872, 6968, 1848, 5944, 3896, 7992, 184, 4280, 2232, 6328, 1208, 5304, 3256, 7352, 696, 4792, 2744, 6840, 1720, 5816, 3768, 7864, 440, 4536, 2488, 6584, 1464, 5560, 3512, 7608, 952, 5048, 3000, 7096, 1976, 6072, 4024, 8120, 120, 4216, 2168, 6264, 1144, 5240, 3192, 7288, 632, 4728, 2680, 6776, 1656, 5752, 3704, 7800, 376, 4472, 2424, 6520, 1400, 5496, 3448, 7544, 888, 4984, 2936, 7032, 1912, 6008, 3960, 8056, 248, 4344, 2296, 6392, 1272, 5368, 3320, 7416, 760, 4856, 2808, 6904, 1784, 5880, 3832, 7928, 504, 4600, 2552, 6648, 1528, 5624, 3576, 7672, 1016, 5112, 3064, 7160, 2040, 6136, 4088, 8184, 4, 4100, 2052, 6148, 1028, 5124, 3076, 7172, 516, 4612, 2564, 6660, 1540, 5636, 3588, 7684, 260, 4356, 2308, 6404, 1284, 5380, 3332, 7428, 772, 4868, 2820, 6916, 1796, 5892, 3844, 7940, 132, 4228, 2180, 6276, 1156, 5252, 3204, 7300, 644, 4740, 2692, 6788, 1668, 5764, 3716, 7812, 388, 4484, 2436, 6532, 1412, 5508, 3460, 7556, 900, 4996, 2948, 7044, 1924, 6020, 3972, 8068, 68, 4164, 2116, 6212, 1092, 5188, 3140, 7236, 580, 4676, 2628, 6724, 1604, 5700, 3652, 7748, 324, 4420, 2372, 6468, 1348, 5444, 3396, 7492, 836, 4932, 2884, 6980, 1860, 5956, 3908, 8004, 196, 4292, 2244, 6340, 1220, 5316, 3268, 7364, 708, 4804, 2756, 6852, 1732, 5828, 3780, 7876, 452, 4548, 2500, 6596, 1476, 5572, 3524, 7620, 964, 5060, 3012, 7108, 1988, 6084, 4036, 8132, 36, 4132, 2084, 6180, 1060, 5156, 3108, 7204, 548, 4644, 2596, 6692, 1572, 5668, 3620, 7716, 292, 4388, 2340, 6436, 1316, 5412, 3364, 7460, 804, 4900, 2852, 6948, 1828, 5924, 3876, 7972, 164, 4260, 2212, 6308, 1188, 5284, 3236, 7332, 676, 4772, 2724, 6820, 1700, 5796, 3748, 7844, 420, 4516, 2468, 6564, 1444, 5540, 3492, 7588, 932, 5028, 2980, 7076, 1956, 6052, 4004, 8100, 100, 4196, 2148, 6244, 1124, 5220, 3172, 7268, 612, 4708, 2660, 6756, 1636, 5732, 3684, 7780, 356, 4452, 2404, 6500, 1380, 5476, 3428, 7524, 868, 4964, 2916, 7012, 1892, 5988, 3940, 8036, 228, 4324, 2276, 6372, 1252, 5348, 3300, 7396, 740, 4836, 2788, 6884, 1764, 5860, 3812, 7908, 484, 4580, 2532, 6628, 1508, 5604, 3556, 7652, 996, 5092, 3044, 7140, 2020, 6116, 4068, 8164, 20, 4116, 2068, 6164, 1044, 5140, 3092, 7188, 532, 4628, 2580, 6676, 1556, 5652, 3604, 7700, 276, 4372, 2324, 6420, 1300, 5396, 3348, 7444, 788, 4884, 2836, 6932, 1812, 5908, 3860, 7956, 148, 4244, 2196, 6292, 1172, 5268, 3220, 7316, 660, 4756, 2708, 6804, 1684, 5780, 3732, 7828, 404, 4500, 2452, 6548, 1428, 5524, 3476, 7572, 916, 5012, 2964, 7060, 1940, 6036, 3988, 8084, 84, 4180, 2132, 6228, 1108, 5204, 3156, 7252, 596, 4692, 2644, 6740, 1620, 5716, 3668, 7764, 340, 4436, 2388, 6484, 1364, 5460, 3412, 7508, 852, 4948, 2900, 6996, 1876, 5972, 3924, 8020, 212, 4308, 2260, 6356, 1236, 5332, 3284, 7380, 724, 4820, 2772, 6868, 1748, 5844, 3796, 7892, 468, 4564, 2516, 6612, 1492, 5588, 3540, 7636, 980, 5076, 3028, 7124, 2004, 6100, 4052, 8148, 52, 4148, 2100, 6196, 1076, 5172, 3124, 7220, 564, 4660, 2612, 6708, 1588, 5684, 3636, 7732, 308, 4404, 2356, 6452, 1332, 5428, 3380, 7476, 820, 4916, 2868, 6964, 1844, 5940, 3892, 7988, 180, 4276, 2228, 6324, 1204, 5300, 3252, 7348, 692, 4788, 2740, 6836, 1716, 5812, 3764, 7860, 436, 4532, 2484, 6580, 1460, 5556, 3508, 7604, 948, 5044, 2996, 7092, 1972, 6068, 4020, 8116, 116, 4212, 2164, 6260, 1140, 5236, 3188, 7284, 628, 4724, 2676, 6772, 1652, 5748, 3700, 7796, 372, 4468, 2420, 6516, 1396, 5492, 3444, 7540, 884, 4980, 2932, 7028, 1908, 6004, 3956, 8052, 244, 4340, 2292, 6388, 1268, 5364, 3316, 7412, 756, 4852, 2804, 6900, 1780, 5876, 3828, 7924, 500, 4596, 2548, 6644, 1524, 5620, 3572, 7668, 1012, 5108, 3060, 7156, 2036, 6132, 4084, 8180, 12, 4108, 2060, 6156, 1036, 5132, 3084, 7180, 524, 4620, 2572, 6668, 1548, 5644, 3596, 7692, 268, 4364, 2316, 6412, 1292, 5388, 3340, 7436, 780, 4876, 2828, 6924, 1804, 5900, 3852, 7948, 140, 4236, 2188, 6284, 1164, 5260, 3212, 7308, 652, 4748, 2700, 6796, 1676, 5772, 3724, 7820, 396, 4492, 2444, 6540, 1420, 5516, 3468, 7564, 908, 5004, 2956, 7052, 1932, 6028, 3980, 8076, 76, 4172, 2124, 6220, 1100, 5196, 3148, 7244, 588, 4684, 2636, 6732, 1612, 5708, 3660, 7756, 332, 4428, 2380, 6476, 1356, 5452, 3404, 7500, 844, 4940, 2892, 6988, 1868, 5964, 3916, 8012, 204, 4300, 2252, 6348, 1228, 5324, 3276, 7372, 716, 4812, 2764, 6860, 1740, 5836, 3788, 7884, 460, 4556, 2508, 6604, 1484, 5580, 3532, 7628, 972, 5068, 3020, 7116, 1996, 6092, 4044, 8140, 44, 4140, 2092, 6188, 1068, 5164, 3116, 7212, 556, 4652, 2604, 6700, 1580, 5676, 3628, 7724, 300, 4396, 2348, 6444, 1324, 5420, 3372, 7468, 812, 4908, 2860, 6956, 1836, 5932, 3884, 7980, 172, 4268, 2220, 6316, 1196, 5292, 3244, 7340, 684, 4780, 2732, 6828, 1708, 5804, 3756, 7852, 428, 4524, 2476, 6572, 1452, 5548, 3500, 7596, 940, 5036, 2988, 7084, 1964, 6060, 4012, 8108, 108, 4204, 2156, 6252, 1132, 5228, 3180, 7276, 620, 4716, 2668, 6764, 1644, 5740, 3692, 7788, 364, 4460, 2412, 6508, 1388, 5484, 3436, 7532, 876, 4972, 2924, 7020, 1900, 5996, 3948, 8044, 236, 4332, 2284, 6380, 1260, 5356, 3308, 7404, 748, 4844, 2796, 6892, 1772, 5868, 3820, 7916, 492, 4588, 2540, 6636, 1516, 5612, 3564, 7660, 1004, 5100, 3052, 7148, 2028, 6124, 4076, 8172, 28, 4124, 2076, 6172, 1052, 5148, 3100, 7196, 540, 4636, 2588, 6684, 1564, 5660, 3612, 7708, 284, 4380, 2332, 6428, 1308, 5404, 3356, 7452, 796, 4892, 2844, 6940, 1820, 5916, 3868, 7964, 156, 4252, 2204, 6300, 1180, 5276, 3228, 7324, 668, 4764, 2716, 6812, 1692, 5788, 3740, 7836, 412, 4508, 2460, 6556, 1436, 5532, 3484, 7580, 924, 5020, 2972, 7068, 1948, 6044, 3996, 8092, 92, 4188, 2140, 6236, 1116, 5212, 3164, 7260, 604, 4700, 2652, 6748, 1628, 5724, 3676, 7772, 348, 4444, 2396, 6492, 1372, 5468, 3420, 7516, 860, 4956, 2908, 7004, 1884, 5980, 3932, 8028, 220, 4316, 2268, 6364, 1244, 5340, 3292, 7388, 732, 4828, 2780, 6876, 1756, 5852, 3804, 7900, 476, 4572, 2524, 6620, 1500, 5596, 3548, 7644, 988, 5084, 3036, 7132, 2012, 6108, 4060, 8156, 60, 4156, 2108, 6204, 1084, 5180, 3132, 7228, 572, 4668, 2620, 6716, 1596, 5692, 3644, 7740, 316, 4412, 2364, 6460, 1340, 5436, 3388, 7484, 828, 4924, 2876, 6972, 1852, 5948, 3900, 7996, 188, 4284, 2236, 6332, 1212, 5308, 3260, 7356, 700, 4796, 2748, 6844, 1724, 5820, 3772, 7868, 444, 4540, 2492, 6588, 1468, 5564, 3516, 7612, 956, 5052, 3004, 7100, 1980, 6076, 4028, 8124, 124, 4220, 2172, 6268, 1148, 5244, 3196, 7292, 636, 4732, 2684, 6780, 1660, 5756, 3708, 7804, 380, 4476, 2428, 6524, 1404, 5500, 3452, 7548, 892, 4988, 2940, 7036, 1916, 6012, 3964, 8060, 252, 4348, 2300, 6396, 1276, 5372, 3324, 7420, 764, 4860, 2812, 6908, 1788, 5884, 3836, 7932, 508, 4604, 2556, 6652, 1532, 5628, 3580, 7676, 1020, 5116, 3068, 7164, 2044, 6140, 4092, 8188, 2, 4098, 2050, 6146, 1026, 5122, 3074, 7170, 514, 4610, 2562, 6658, 1538, 5634, 3586, 7682, 258, 4354, 2306, 6402, 1282, 5378, 3330, 7426, 770, 4866, 2818, 6914, 1794, 5890, 3842, 7938, 130, 4226, 2178, 6274, 1154, 5250, 3202, 7298, 642, 4738, 2690, 6786, 1666, 5762, 3714, 7810, 386, 4482, 2434, 6530, 1410, 5506, 3458, 7554, 898, 4994, 2946, 7042, 1922, 6018, 3970, 8066, 66, 4162, 2114, 6210, 1090, 5186, 3138, 7234, 578, 4674, 2626, 6722, 1602, 5698, 3650, 7746, 322, 4418, 2370, 6466, 1346, 5442, 3394, 7490, 834, 4930, 2882, 6978, 1858, 5954, 3906, 8002, 194, 4290, 2242, 6338, 1218, 5314, 3266, 7362, 706, 4802, 2754, 6850, 1730, 5826, 3778, 7874, 450, 4546, 2498, 6594, 1474, 5570, 3522, 7618, 962, 5058, 3010, 7106, 1986, 6082, 4034, 8130, 34, 4130, 2082, 6178, 1058, 5154, 3106, 7202, 546, 4642, 2594, 6690, 1570, 5666, 3618, 7714, 290, 4386, 2338, 6434, 1314, 5410, 3362, 7458, 802, 4898, 2850, 6946, 1826, 5922, 3874, 7970, 162, 4258, 2210, 6306, 1186, 5282, 3234, 7330, 674, 4770, 2722, 6818, 1698, 5794, 3746, 7842, 418, 4514, 2466, 6562, 1442, 5538, 3490, 7586, 930, 5026, 2978, 7074, 1954, 6050, 4002, 8098, 98, 4194, 2146, 6242, 1122, 5218, 3170, 7266, 610, 4706, 2658, 6754, 1634, 5730, 3682, 7778, 354, 4450, 2402, 6498, 1378, 5474, 3426, 7522, 866, 4962, 2914, 7010, 1890, 5986, 3938, 8034, 226, 4322, 2274, 6370, 1250, 5346, 3298, 7394, 738, 4834, 2786, 6882, 1762, 5858, 3810, 7906, 482, 4578, 2530, 6626, 1506, 5602, 3554, 7650, 994, 5090, 3042, 7138, 2018, 6114, 4066, 8162, 18, 4114, 2066, 6162, 1042, 5138, 3090, 7186, 530, 4626, 2578, 6674, 1554, 5650, 3602, 7698, 274, 4370, 2322, 6418, 1298, 5394, 3346, 7442, 786, 4882, 2834, 6930, 1810, 5906, 3858, 7954, 146, 4242, 2194, 6290, 1170, 5266, 3218, 7314, 658, 4754, 2706, 6802, 1682, 5778, 3730, 7826, 402, 4498, 2450, 6546, 1426, 5522, 3474, 7570, 914, 5010, 2962, 7058, 1938, 6034, 3986, 8082, 82, 4178, 2130, 6226, 1106, 5202, 3154, 7250, 594, 4690, 2642, 6738, 1618, 5714, 3666, 7762, 338, 4434, 2386, 6482, 1362, 5458, 3410, 7506, 850, 4946, 2898, 6994, 1874, 5970, 3922, 8018, 210, 4306, 2258, 6354, 1234, 5330, 3282, 7378, 722, 4818, 2770, 6866, 1746, 5842, 3794, 7890, 466, 4562, 2514, 6610, 1490, 5586, 3538, 7634, 978, 5074, 3026, 7122, 2002, 6098, 4050, 8146, 50, 4146, 2098, 6194, 1074, 5170, 3122, 7218, 562, 4658, 2610, 6706, 1586, 5682, 3634, 7730, 306, 4402, 2354, 6450, 1330, 5426, 3378, 7474, 818, 4914, 2866, 6962, 1842, 5938, 3890, 7986, 178, 4274, 2226, 6322, 1202, 5298, 3250, 7346, 690, 4786, 2738, 6834, 1714, 5810, 3762, 7858, 434, 4530, 2482, 6578, 1458, 5554, 3506, 7602, 946, 5042, 2994, 7090, 1970, 6066, 4018, 8114, 114, 4210, 2162, 6258, 1138, 5234, 3186, 7282, 626, 4722, 2674, 6770, 1650, 5746, 3698, 7794, 370, 4466, 2418, 6514, 1394, 5490, 3442, 7538, 882, 4978, 2930, 7026, 1906, 6002, 3954, 8050, 242, 4338, 2290, 6386, 1266, 5362, 3314, 7410, 754, 4850, 2802, 6898, 1778, 5874, 3826, 7922, 498, 4594, 2546, 6642, 1522, 5618, 3570, 7666, 1010, 5106, 3058, 7154, 2034, 6130, 4082, 8178, 10, 4106, 2058, 6154, 1034, 5130, 3082, 7178, 522, 4618, 2570, 6666, 1546, 5642, 3594, 7690, 266, 4362, 2314, 6410, 1290, 5386, 3338, 7434, 778, 4874, 2826, 6922, 1802, 5898, 3850, 7946, 138, 4234, 2186, 6282, 1162, 5258, 3210, 7306, 650, 4746, 2698, 6794, 1674, 5770, 3722, 7818, 394, 4490, 2442, 6538, 1418, 5514, 3466, 7562, 906, 5002, 2954, 7050, 1930, 6026, 3978, 8074, 74, 4170, 2122, 6218, 1098, 5194, 3146, 7242, 586, 4682, 2634, 6730, 1610, 5706, 3658, 7754, 330, 4426, 2378, 6474, 1354, 5450, 3402, 7498, 842, 4938, 2890, 6986, 1866, 5962, 3914, 8010, 202, 4298, 2250, 6346, 1226, 5322, 3274, 7370, 714, 4810, 2762, 6858, 1738, 5834, 3786, 7882, 458, 4554, 2506, 6602, 1482, 5578, 3530, 7626, 970, 5066, 3018, 7114, 1994, 6090, 4042, 8138, 42, 4138, 2090, 6186, 1066, 5162, 3114, 7210, 554, 4650, 2602, 6698, 1578, 5674, 3626, 7722, 298, 4394, 2346, 6442, 1322, 5418, 3370, 7466, 810, 4906, 2858, 6954, 1834, 5930, 3882, 7978, 170, 4266, 2218, 6314, 1194, 5290, 3242, 7338, 682, 4778, 2730, 6826, 1706, 5802, 3754, 7850, 426, 4522, 2474, 6570, 1450, 5546, 3498, 7594, 938, 5034, 2986, 7082, 1962, 6058, 4010, 8106, 106, 4202, 2154, 6250, 1130, 5226, 3178, 7274, 618, 4714, 2666, 6762, 1642, 5738, 3690, 7786, 362, 4458, 2410, 6506, 1386, 5482, 3434, 7530, 874, 4970, 2922, 7018, 1898, 5994, 3946, 8042, 234, 4330, 2282, 6378, 1258, 5354, 3306, 7402, 746, 4842, 2794, 6890, 1770, 5866, 3818, 7914, 490, 4586, 2538, 6634, 1514, 5610, 3562, 7658, 1002, 5098, 3050, 7146, 2026, 6122, 4074, 8170, 26, 4122, 2074, 6170, 1050, 5146, 3098, 7194, 538, 4634, 2586, 6682, 1562, 5658, 3610, 7706, 282, 4378, 2330, 6426, 1306, 5402, 3354, 7450, 794, 4890, 2842, 6938, 1818, 5914, 3866, 7962, 154, 4250, 2202, 6298, 1178, 5274, 3226, 7322, 666, 4762, 2714, 6810, 1690, 5786, 3738, 7834, 410, 4506, 2458, 6554, 1434, 5530, 3482, 7578, 922, 5018, 2970, 7066, 1946, 6042, 3994, 8090, 90, 4186, 2138, 6234, 1114, 5210, 3162, 7258, 602, 4698, 2650, 6746, 1626, 5722, 3674, 7770, 346, 4442, 2394, 6490, 1370, 5466, 3418, 7514, 858, 4954, 2906, 7002, 1882, 5978, 3930, 8026, 218, 4314, 2266, 6362, 1242, 5338, 3290, 7386, 730, 4826, 2778, 6874, 1754, 5850, 3802, 7898, 474, 4570, 2522, 6618, 1498, 5594, 3546, 7642, 986, 5082, 3034, 7130, 2010, 6106, 4058, 8154, 58, 4154, 2106, 6202, 1082, 5178, 3130, 7226, 570, 4666, 2618, 6714, 1594, 5690, 3642, 7738, 314, 4410, 2362, 6458, 1338, 5434, 3386, 7482, 826, 4922, 2874, 6970, 1850, 5946, 3898, 7994, 186, 4282, 2234, 6330, 1210, 5306, 3258, 7354, 698, 4794, 2746, 6842, 1722, 5818, 3770, 7866, 442, 4538, 2490, 6586, 1466, 5562, 3514, 7610, 954, 5050, 3002, 7098, 1978, 6074, 4026, 8122, 122, 4218, 2170, 6266, 1146, 5242, 3194, 7290, 634, 4730, 2682, 6778, 1658, 5754, 3706, 7802, 378, 4474, 2426, 6522, 1402, 5498, 3450, 7546, 890, 4986, 2938, 7034, 1914, 6010, 3962, 8058, 250, 4346, 2298, 6394, 1274, 5370, 3322, 7418, 762, 4858, 2810, 6906, 1786, 5882, 3834, 7930, 506, 4602, 2554, 6650, 1530, 5626, 3578, 7674, 1018, 5114, 3066, 7162, 2042, 6138, 4090, 8186, 6, 4102, 2054, 6150, 1030, 5126, 3078, 7174, 518, 4614, 2566, 6662, 1542, 5638, 3590, 7686, 262, 4358, 2310, 6406, 1286, 5382, 3334, 7430, 774, 4870, 2822, 6918, 1798, 5894, 3846, 7942, 134, 4230, 2182, 6278, 1158, 5254, 3206, 7302, 646, 4742, 2694, 6790, 1670, 5766, 3718, 7814, 390, 4486, 2438, 6534, 1414, 5510, 3462, 7558, 902, 4998, 2950, 7046, 1926, 6022, 3974, 8070, 70, 4166, 2118, 6214, 1094, 5190, 3142, 7238, 582, 4678, 2630, 6726, 1606, 5702, 3654, 7750, 326, 4422, 2374, 6470, 1350, 5446, 3398, 7494, 838, 4934, 2886, 6982, 1862, 5958, 3910, 8006, 198, 4294, 2246, 6342, 1222, 5318, 3270, 7366, 710, 4806, 2758, 6854, 1734, 5830, 3782, 7878, 454, 4550, 2502, 6598, 1478, 5574, 3526, 7622, 966, 5062, 3014, 7110, 1990, 6086, 4038, 8134, 38, 4134, 2086, 6182, 1062, 5158, 3110, 7206, 550, 4646, 2598, 6694, 1574, 5670, 3622, 7718, 294, 4390, 2342, 6438, 1318, 5414, 3366, 7462, 806, 4902, 2854, 6950, 1830, 5926, 3878, 7974, 166, 4262, 2214, 6310, 1190, 5286, 3238, 7334, 678, 4774, 2726, 6822, 1702, 5798, 3750, 7846, 422, 4518, 2470, 6566, 1446, 5542, 3494, 7590, 934, 5030, 2982, 7078, 1958, 6054, 4006, 8102, 102, 4198, 2150, 6246, 1126, 5222, 3174, 7270, 614, 4710, 2662, 6758, 1638, 5734, 3686, 7782, 358, 4454, 2406, 6502, 1382, 5478, 3430, 7526, 870, 4966, 2918, 7014, 1894, 5990, 3942, 8038, 230, 4326, 2278, 6374, 1254, 5350, 3302, 7398, 742, 4838, 2790, 6886, 1766, 5862, 3814, 7910, 486, 4582, 2534, 6630, 1510, 5606, 3558, 7654, 998, 5094, 3046, 7142, 2022, 6118, 4070, 8166, 22, 4118, 2070, 6166, 1046, 5142, 3094, 7190, 534, 4630, 2582, 6678, 1558, 5654, 3606, 7702, 278, 4374, 2326, 6422, 1302, 5398, 3350, 7446, 790, 4886, 2838, 6934, 1814, 5910, 3862, 7958, 150, 4246, 2198, 6294, 1174, 5270, 3222, 7318, 662, 4758, 2710, 6806, 1686, 5782, 3734, 7830, 406, 4502, 2454, 6550, 1430, 5526, 3478, 7574, 918, 5014, 2966, 7062, 1942, 6038, 3990, 8086, 86, 4182, 2134, 6230, 1110, 5206, 3158, 7254, 598, 4694, 2646, 6742, 1622, 5718, 3670, 7766, 342, 4438, 2390, 6486, 1366, 5462, 3414, 7510, 854, 4950, 2902, 6998, 1878, 5974, 3926, 8022, 214, 4310, 2262, 6358, 1238, 5334, 3286, 7382, 726, 4822, 2774, 6870, 1750, 5846, 3798, 7894, 470, 4566, 2518, 6614, 1494, 5590, 3542, 7638, 982, 5078, 3030, 7126, 2006, 6102, 4054, 8150, 54, 4150, 2102, 6198, 1078, 5174, 3126, 7222, 566, 4662, 2614, 6710, 1590, 5686, 3638, 7734, 310, 4406, 2358, 6454, 1334, 5430, 3382, 7478, 822, 4918, 2870, 6966, 1846, 5942, 3894, 7990, 182, 4278, 2230, 6326, 1206, 5302, 3254, 7350, 694, 4790, 2742, 6838, 1718, 5814, 3766, 7862, 438, 4534, 2486, 6582, 1462, 5558, 3510, 7606, 950, 5046, 2998, 7094, 1974, 6070, 4022, 8118, 118, 4214, 2166, 6262, 1142, 5238, 3190, 7286, 630, 4726, 2678, 6774, 1654, 5750, 3702, 7798, 374, 4470, 2422, 6518, 1398, 5494, 3446, 7542, 886, 4982, 2934, 7030, 1910, 6006, 3958, 8054, 246, 4342, 2294, 6390, 1270, 5366, 3318, 7414, 758, 4854, 2806, 6902, 1782, 5878, 3830, 7926, 502, 4598, 2550, 6646, 1526, 5622, 3574, 7670, 1014, 5110, 3062, 7158, 2038, 6134, 4086, 8182, 14, 4110, 2062, 6158, 1038, 5134, 3086, 7182, 526, 4622, 2574, 6670, 1550, 5646, 3598, 7694, 270, 4366, 2318, 6414, 1294, 5390, 3342, 7438, 782, 4878, 2830, 6926, 1806, 5902, 3854, 7950, 142, 4238, 2190, 6286, 1166, 5262, 3214, 7310, 654, 4750, 2702, 6798, 1678, 5774, 3726, 7822, 398, 4494, 2446, 6542, 1422, 5518, 3470, 7566, 910, 5006, 2958, 7054, 1934, 6030, 3982, 8078, 78, 4174, 2126, 6222, 1102, 5198, 3150, 7246, 590, 4686, 2638, 6734, 1614, 5710, 3662, 7758, 334, 4430, 2382, 6478, 1358, 5454, 3406, 7502, 846, 4942, 2894, 6990, 1870, 5966, 3918, 8014, 206, 4302, 2254, 6350, 1230, 5326, 3278, 7374, 718, 4814, 2766, 6862, 1742, 5838, 3790, 7886, 462, 4558, 2510, 6606, 1486, 5582, 3534, 7630, 974, 5070, 3022, 7118, 1998, 6094, 4046, 8142, 46, 4142, 2094, 6190, 1070, 5166, 3118, 7214, 558, 4654, 2606, 6702, 1582, 5678, 3630, 7726, 302, 4398, 2350, 6446, 1326, 5422, 3374, 7470, 814, 4910, 2862, 6958, 1838, 5934, 3886, 7982, 174, 4270, 2222, 6318, 1198, 5294, 3246, 7342, 686, 4782, 2734, 6830, 1710, 5806, 3758, 7854, 430, 4526, 2478, 6574, 1454, 5550, 3502, 7598, 942, 5038, 2990, 7086, 1966, 6062, 4014, 8110, 110, 4206, 2158, 6254, 1134, 5230, 3182, 7278, 622, 4718, 2670, 6766, 1646, 5742, 3694, 7790, 366, 4462, 2414, 6510, 1390, 5486, 3438, 7534, 878, 4974, 2926, 7022, 1902, 5998, 3950, 8046, 238, 4334, 2286, 6382, 1262, 5358, 3310, 7406, 750, 4846, 2798, 6894, 1774, 5870, 3822, 7918, 494, 4590, 2542, 6638, 1518, 5614, 3566, 7662, 1006, 5102, 3054, 7150, 2030, 6126, 4078, 8174, 30, 4126, 2078, 6174, 1054, 5150, 3102, 7198, 542, 4638, 2590, 6686, 1566, 5662, 3614, 7710, 286, 4382, 2334, 6430, 1310, 5406, 3358, 7454, 798, 4894, 2846, 6942, 1822, 5918, 3870, 7966, 158, 4254, 2206, 6302, 1182, 5278, 3230, 7326, 670, 4766, 2718, 6814, 1694, 5790, 3742, 7838, 414, 4510, 2462, 6558, 1438, 5534, 3486, 7582, 926, 5022, 2974, 7070, 1950, 6046, 3998, 8094, 94, 4190, 2142, 6238, 1118, 5214, 3166, 7262, 606, 4702, 2654, 6750, 1630, 5726, 3678, 7774, 350, 4446, 2398, 6494, 1374, 5470, 3422, 7518, 862, 4958, 2910, 7006, 1886, 5982, 3934, 8030, 222, 4318, 2270, 6366, 1246, 5342, 3294, 7390, 734, 4830, 2782, 6878, 1758, 5854, 3806, 7902, 478, 4574, 2526, 6622, 1502, 5598, 3550, 7646, 990, 5086, 3038, 7134, 2014, 6110, 4062, 8158, 62, 4158, 2110, 6206, 1086, 5182, 3134, 7230, 574, 4670, 2622, 6718, 1598, 5694, 3646, 7742, 318, 4414, 2366, 6462, 1342, 5438, 3390, 7486, 830, 4926, 2878, 6974, 1854, 5950, 3902, 7998, 190, 4286, 2238, 6334, 1214, 5310, 3262, 7358, 702, 4798, 2750, 6846, 1726, 5822, 3774, 7870, 446, 4542, 2494, 6590, 1470, 5566, 3518, 7614, 958, 5054, 3006, 7102, 1982, 6078, 4030, 8126, 126, 4222, 2174, 6270, 1150, 5246, 3198, 7294, 638, 4734, 2686, 6782, 1662, 5758, 3710, 7806, 382, 4478, 2430, 6526, 1406, 5502, 3454, 7550, 894, 4990, 2942, 7038, 1918, 6014, 3966, 8062, 254, 4350, 2302, 6398, 1278, 5374, 3326, 7422, 766, 4862, 2814, 6910, 1790, 5886, 3838, 7934, 510, 4606, 2558, 6654, 1534, 5630, 3582, 7678, 1022, 5118, 3070, 7166, 2046, 6142, 4094, 8190, 1, 4097, 2049, 6145, 1025, 5121, 3073, 7169, 513, 4609, 2561, 6657, 1537, 5633, 3585, 7681, 257, 4353, 2305, 6401, 1281, 5377, 3329, 7425, 769, 4865, 2817, 6913, 1793, 5889, 3841, 7937, 129, 4225, 2177, 6273, 1153, 5249, 3201, 7297, 641, 4737, 2689, 6785, 1665, 5761, 3713, 7809, 385, 4481, 2433, 6529, 1409, 5505, 3457, 7553, 897, 4993, 2945, 7041, 1921, 6017, 3969, 8065, 65, 4161, 2113, 6209, 1089, 5185, 3137, 7233, 577, 4673, 2625, 6721, 1601, 5697, 3649, 7745, 321, 4417, 2369, 6465, 1345, 5441, 3393, 7489, 833, 4929, 2881, 6977, 1857, 5953, 3905, 8001, 193, 4289, 2241, 6337, 1217, 5313, 3265, 7361, 705, 4801, 2753, 6849, 1729, 5825, 3777, 7873, 449, 4545, 2497, 6593, 1473, 5569, 3521, 7617, 961, 5057, 3009, 7105, 1985, 6081, 4033, 8129, 33, 4129, 2081, 6177, 1057, 5153, 3105, 7201, 545, 4641, 2593, 6689, 1569, 5665, 3617, 7713, 289, 4385, 2337, 6433, 1313, 5409, 3361, 7457, 801, 4897, 2849, 6945, 1825, 5921, 3873, 7969, 161, 4257, 2209, 6305, 1185, 5281, 3233, 7329, 673, 4769, 2721, 6817, 1697, 5793, 3745, 7841, 417, 4513, 2465, 6561, 1441, 5537, 3489, 7585, 929, 5025, 2977, 7073, 1953, 6049, 4001, 8097, 97, 4193, 2145, 6241, 1121, 5217, 3169, 7265, 609, 4705, 2657, 6753, 1633, 5729, 3681, 7777, 353, 4449, 2401, 6497, 1377, 5473, 3425, 7521, 865, 4961, 2913, 7009, 1889, 5985, 3937, 8033, 225, 4321, 2273, 6369, 1249, 5345, 3297, 7393, 737, 4833, 2785, 6881, 1761, 5857, 3809, 7905, 481, 4577, 2529, 6625, 1505, 5601, 3553, 7649, 993, 5089, 3041, 7137, 2017, 6113, 4065, 8161, 17, 4113, 2065, 6161, 1041, 5137, 3089, 7185, 529, 4625, 2577, 6673, 1553, 5649, 3601, 7697, 273, 4369, 2321, 6417, 1297, 5393, 3345, 7441, 785, 4881, 2833, 6929, 1809, 5905, 3857, 7953, 145, 4241, 2193, 6289, 1169, 5265, 3217, 7313, 657, 4753, 2705, 6801, 1681, 5777, 3729, 7825, 401, 4497, 2449, 6545, 1425, 5521, 3473, 7569, 913, 5009, 2961, 7057, 1937, 6033, 3985, 8081, 81, 4177, 2129, 6225, 1105, 5201, 3153, 7249, 593, 4689, 2641, 6737, 1617, 5713, 3665, 7761, 337, 4433, 2385, 6481, 1361, 5457, 3409, 7505, 849, 4945, 2897, 6993, 1873, 5969, 3921, 8017, 209, 4305, 2257, 6353, 1233, 5329, 3281, 7377, 721, 4817, 2769, 6865, 1745, 5841, 3793, 7889, 465, 4561, 2513, 6609, 1489, 5585, 3537, 7633, 977, 5073, 3025, 7121, 2001, 6097, 4049, 8145, 49, 4145, 2097, 6193, 1073, 5169, 3121, 7217, 561, 4657, 2609, 6705, 1585, 5681, 3633, 7729, 305, 4401, 2353, 6449, 1329, 5425, 3377, 7473, 817, 4913, 2865, 6961, 1841, 5937, 3889, 7985, 177, 4273, 2225, 6321, 1201, 5297, 3249, 7345, 689, 4785, 2737, 6833, 1713, 5809, 3761, 7857, 433, 4529, 2481, 6577, 1457, 5553, 3505, 7601, 945, 5041, 2993, 7089, 1969, 6065, 4017, 8113, 113, 4209, 2161, 6257, 1137, 5233, 3185, 7281, 625, 4721, 2673, 6769, 1649, 5745, 3697, 7793, 369, 4465, 2417, 6513, 1393, 5489, 3441, 7537, 881, 4977, 2929, 7025, 1905, 6001, 3953, 8049, 241, 4337, 2289, 6385, 1265, 5361, 3313, 7409, 753, 4849, 2801, 6897, 1777, 5873, 3825, 7921, 497, 4593, 2545, 6641, 1521, 5617, 3569, 7665, 1009, 5105, 3057, 7153, 2033, 6129, 4081, 8177, 9, 4105, 2057, 6153, 1033, 5129, 3081, 7177, 521, 4617, 2569, 6665, 1545, 5641, 3593, 7689, 265, 4361, 2313, 6409, 1289, 5385, 3337, 7433, 777, 4873, 2825, 6921, 1801, 5897, 3849, 7945, 137, 4233, 2185, 6281, 1161, 5257, 3209, 7305, 649, 4745, 2697, 6793, 1673, 5769, 3721, 7817, 393, 4489, 2441, 6537, 1417, 5513, 3465, 7561, 905, 5001, 2953, 7049, 1929, 6025, 3977, 8073, 73, 4169, 2121, 6217, 1097, 5193, 3145, 7241, 585, 4681, 2633, 6729, 1609, 5705, 3657, 7753, 329, 4425, 2377, 6473, 1353, 5449, 3401, 7497, 841, 4937, 2889, 6985, 1865, 5961, 3913, 8009, 201, 4297, 2249, 6345, 1225, 5321, 3273, 7369, 713, 4809, 2761, 6857, 1737, 5833, 3785, 7881, 457, 4553, 2505, 6601, 1481, 5577, 3529, 7625, 969, 5065, 3017, 7113, 1993, 6089, 4041, 8137, 41, 4137, 2089, 6185, 1065, 5161, 3113, 7209, 553, 4649, 2601, 6697, 1577, 5673, 3625, 7721, 297, 4393, 2345, 6441, 1321, 5417, 3369, 7465, 809, 4905, 2857, 6953, 1833, 5929, 3881, 7977, 169, 4265, 2217, 6313, 1193, 5289, 3241, 7337, 681, 4777, 2729, 6825, 1705, 5801, 3753, 7849, 425, 4521, 2473, 6569, 1449, 5545, 3497, 7593, 937, 5033, 2985, 7081, 1961, 6057, 4009, 8105, 105, 4201, 2153, 6249, 1129, 5225, 3177, 7273, 617, 4713, 2665, 6761, 1641, 5737, 3689, 7785, 361, 4457, 2409, 6505, 1385, 5481, 3433, 7529, 873, 4969, 2921, 7017, 1897, 5993, 3945, 8041, 233, 4329, 2281, 6377, 1257, 5353, 3305, 7401, 745, 4841, 2793, 6889, 1769, 5865, 3817, 7913, 489, 4585, 2537, 6633, 1513, 5609, 3561, 7657, 1001, 5097, 3049, 7145, 2025, 6121, 4073, 8169, 25, 4121, 2073, 6169, 1049, 5145, 3097, 7193, 537, 4633, 2585, 6681, 1561, 5657, 3609, 7705, 281, 4377, 2329, 6425, 1305, 5401, 3353, 7449, 793, 4889, 2841, 6937, 1817, 5913, 3865, 7961, 153, 4249, 2201, 6297, 1177, 5273, 3225, 7321, 665, 4761, 2713, 6809, 1689, 5785, 3737, 7833, 409, 4505, 2457, 6553, 1433, 5529, 3481, 7577, 921, 5017, 2969, 7065, 1945, 6041, 3993, 8089, 89, 4185, 2137, 6233, 1113, 5209, 3161, 7257, 601, 4697, 2649, 6745, 1625, 5721, 3673, 7769, 345, 4441, 2393, 6489, 1369, 5465, 3417, 7513, 857, 4953, 2905, 7001, 1881, 5977, 3929, 8025, 217, 4313, 2265, 6361, 1241, 5337, 3289, 7385, 729, 4825, 2777, 6873, 1753, 5849, 3801, 7897, 473, 4569, 2521, 6617, 1497, 5593, 3545, 7641, 985, 5081, 3033, 7129, 2009, 6105, 4057, 8153, 57, 4153, 2105, 6201, 1081, 5177, 3129, 7225, 569, 4665, 2617, 6713, 1593, 5689, 3641, 7737, 313, 4409, 2361, 6457, 1337, 5433, 3385, 7481, 825, 4921, 2873, 6969, 1849, 5945, 3897, 7993, 185, 4281, 2233, 6329, 1209, 5305, 3257, 7353, 697, 4793, 2745, 6841, 1721, 5817, 3769, 7865, 441, 4537, 2489, 6585, 1465, 5561, 3513, 7609, 953, 5049, 3001, 7097, 1977, 6073, 4025, 8121, 121, 4217, 2169, 6265, 1145, 5241, 3193, 7289, 633, 4729, 2681, 6777, 1657, 5753, 3705, 7801, 377, 4473, 2425, 6521, 1401, 5497, 3449, 7545, 889, 4985, 2937, 7033, 1913, 6009, 3961, 8057, 249, 4345, 2297, 6393, 1273, 5369, 3321, 7417, 761, 4857, 2809, 6905, 1785, 5881, 3833, 7929, 505, 4601, 2553, 6649, 1529, 5625, 3577, 7673, 1017, 5113, 3065, 7161, 2041, 6137, 4089, 8185, 5, 4101, 2053, 6149, 1029, 5125, 3077, 7173, 517, 4613, 2565, 6661, 1541, 5637, 3589, 7685, 261, 4357, 2309, 6405, 1285, 5381, 3333, 7429, 773, 4869, 2821, 6917, 1797, 5893, 3845, 7941, 133, 4229, 2181, 6277, 1157, 5253, 3205, 7301, 645, 4741, 2693, 6789, 1669, 5765, 3717, 7813, 389, 4485, 2437, 6533, 1413, 5509, 3461, 7557, 901, 4997, 2949, 7045, 1925, 6021, 3973, 8069, 69, 4165, 2117, 6213, 1093, 5189, 3141, 7237, 581, 4677, 2629, 6725, 1605, 5701, 3653, 7749, 325, 4421, 2373, 6469, 1349, 5445, 3397, 7493, 837, 4933, 2885, 6981, 1861, 5957, 3909, 8005, 197, 4293, 2245, 6341, 1221, 5317, 3269, 7365, 709, 4805, 2757, 6853, 1733, 5829, 3781, 7877, 453, 4549, 2501, 6597, 1477, 5573, 3525, 7621, 965, 5061, 3013, 7109, 1989, 6085, 4037, 8133, 37, 4133, 2085, 6181, 1061, 5157, 3109, 7205, 549, 4645, 2597, 6693, 1573, 5669, 3621, 7717, 293, 4389, 2341, 6437, 1317, 5413, 3365, 7461, 805, 4901, 2853, 6949, 1829, 5925, 3877, 7973, 165, 4261, 2213, 6309, 1189, 5285, 3237, 7333, 677, 4773, 2725, 6821, 1701, 5797, 3749, 7845, 421, 4517, 2469, 6565, 1445, 5541, 3493, 7589, 933, 5029, 2981, 7077, 1957, 6053, 4005, 8101, 101, 4197, 2149, 6245, 1125, 5221, 3173, 7269, 613, 4709, 2661, 6757, 1637, 5733, 3685, 7781, 357, 4453, 2405, 6501, 1381, 5477, 3429, 7525, 869, 4965, 2917, 7013, 1893, 5989, 3941, 8037, 229, 4325, 2277, 6373, 1253, 5349, 3301, 7397, 741, 4837, 2789, 6885, 1765, 5861, 3813, 7909, 485, 4581, 2533, 6629, 1509, 5605, 3557, 7653, 997, 5093, 3045, 7141, 2021, 6117, 4069, 8165, 21, 4117, 2069, 6165, 1045, 5141, 3093, 7189, 533, 4629, 2581, 6677, 1557, 5653, 3605, 7701, 277, 4373, 2325, 6421, 1301, 5397, 3349, 7445, 789, 4885, 2837, 6933, 1813, 5909, 3861, 7957, 149, 4245, 2197, 6293, 1173, 5269, 3221, 7317, 661, 4757, 2709, 6805, 1685, 5781, 3733, 7829, 405, 4501, 2453, 6549, 1429, 5525, 3477, 7573, 917, 5013, 2965, 7061, 1941, 6037, 3989, 8085, 85, 4181, 2133, 6229, 1109, 5205, 3157, 7253, 597, 4693, 2645, 6741, 1621, 5717, 3669, 7765, 341, 4437, 2389, 6485, 1365, 5461, 3413, 7509, 853, 4949, 2901, 6997, 1877, 5973, 3925, 8021, 213, 4309, 2261, 6357, 1237, 5333, 3285, 7381, 725, 4821, 2773, 6869, 1749, 5845, 3797, 7893, 469, 4565, 2517, 6613, 1493, 5589, 3541, 7637, 981, 5077, 3029, 7125, 2005, 6101, 4053, 8149, 53, 4149, 2101, 6197, 1077, 5173, 3125, 7221, 565, 4661, 2613, 6709, 1589, 5685, 3637, 7733, 309, 4405, 2357, 6453, 1333, 5429, 3381, 7477, 821, 4917, 2869, 6965, 1845, 5941, 3893, 7989, 181, 4277, 2229, 6325, 1205, 5301, 3253, 7349, 693, 4789, 2741, 6837, 1717, 5813, 3765, 7861, 437, 4533, 2485, 6581, 1461, 5557, 3509, 7605, 949, 5045, 2997, 7093, 1973, 6069, 4021, 8117, 117, 4213, 2165, 6261, 1141, 5237, 3189, 7285, 629, 4725, 2677, 6773, 1653, 5749, 3701, 7797, 373, 4469, 2421, 6517, 1397, 5493, 3445, 7541, 885, 4981, 2933, 7029, 1909, 6005, 3957, 8053, 245, 4341, 2293, 6389, 1269, 5365, 3317, 7413, 757, 4853, 2805, 6901, 1781, 5877, 3829, 7925, 501, 4597, 2549, 6645, 1525, 5621, 3573, 7669, 1013, 5109, 3061, 7157, 2037, 6133, 4085, 8181, 13, 4109, 2061, 6157, 1037, 5133, 3085, 7181, 525, 4621, 2573, 6669, 1549, 5645, 3597, 7693, 269, 4365, 2317, 6413, 1293, 5389, 3341, 7437, 781, 4877, 2829, 6925, 1805, 5901, 3853, 7949, 141, 4237, 2189, 6285, 1165, 5261, 3213, 7309, 653, 4749, 2701, 6797, 1677, 5773, 3725, 7821, 397, 4493, 2445, 6541, 1421, 5517, 3469, 7565, 909, 5005, 2957, 7053, 1933, 6029, 3981, 8077, 77, 4173, 2125, 6221, 1101, 5197, 3149, 7245, 589, 4685, 2637, 6733, 1613, 5709, 3661, 7757, 333, 4429, 2381, 6477, 1357, 5453, 3405, 7501, 845, 4941, 2893, 6989, 1869, 5965, 3917, 8013, 205, 4301, 2253, 6349, 1229, 5325, 3277, 7373, 717, 4813, 2765, 6861, 1741, 5837, 3789, 7885, 461, 4557, 2509, 6605, 1485, 5581, 3533, 7629, 973, 5069, 3021, 7117, 1997, 6093, 4045, 8141, 45, 4141, 2093, 6189, 1069, 5165, 3117, 7213, 557, 4653, 2605, 6701, 1581, 5677, 3629, 7725, 301, 4397, 2349, 6445, 1325, 5421, 3373, 7469, 813, 4909, 2861, 6957, 1837, 5933, 3885, 7981, 173, 4269, 2221, 6317, 1197, 5293, 3245, 7341, 685, 4781, 2733, 6829, 1709, 5805, 3757, 7853, 429, 4525, 2477, 6573, 1453, 5549, 3501, 7597, 941, 5037, 2989, 7085, 1965, 6061, 4013, 8109, 109, 4205, 2157, 6253, 1133, 5229, 3181, 7277, 621, 4717, 2669, 6765, 1645, 5741, 3693, 7789, 365, 4461, 2413, 6509, 1389, 5485, 3437, 7533, 877, 4973, 2925, 7021, 1901, 5997, 3949, 8045, 237, 4333, 2285, 6381, 1261, 5357, 3309, 7405, 749, 4845, 2797, 6893, 1773, 5869, 3821, 7917, 493, 4589, 2541, 6637, 1517, 5613, 3565, 7661, 1005, 5101, 3053, 7149, 2029, 6125, 4077, 8173, 29, 4125, 2077, 6173, 1053, 5149, 3101, 7197, 541, 4637, 2589, 6685, 1565, 5661, 3613, 7709, 285, 4381, 2333, 6429, 1309, 5405, 3357, 7453, 797, 4893, 2845, 6941, 1821, 5917, 3869, 7965, 157, 4253, 2205, 6301, 1181, 5277, 3229, 7325, 669, 4765, 2717, 6813, 1693, 5789, 3741, 7837, 413, 4509, 2461, 6557, 1437, 5533, 3485, 7581, 925, 5021, 2973, 7069, 1949, 6045, 3997, 8093, 93, 4189, 2141, 6237, 1117, 5213, 3165, 7261, 605, 4701, 2653, 6749, 1629, 5725, 3677, 7773, 349, 4445, 2397, 6493, 1373, 5469, 3421, 7517, 861, 4957, 2909, 7005, 1885, 5981, 3933, 8029, 221, 4317, 2269, 6365, 1245, 5341, 3293, 7389, 733, 4829, 2781, 6877, 1757, 5853, 3805, 7901, 477, 4573, 2525, 6621, 1501, 5597, 3549, 7645, 989, 5085, 3037, 7133, 2013, 6109, 4061, 8157, 61, 4157, 2109, 6205, 1085, 5181, 3133, 7229, 573, 4669, 2621, 6717, 1597, 5693, 3645, 7741, 317, 4413, 2365, 6461, 1341, 5437, 3389, 7485, 829, 4925, 2877, 6973, 1853, 5949, 3901, 7997, 189, 4285, 2237, 6333, 1213, 5309, 3261, 7357, 701, 4797, 2749, 6845, 1725, 5821, 3773, 7869, 445, 4541, 2493, 6589, 1469, 5565, 3517, 7613, 957, 5053, 3005, 7101, 1981, 6077, 4029, 8125, 125, 4221, 2173, 6269, 1149, 5245, 3197, 7293, 637, 4733, 2685, 6781, 1661, 5757, 3709, 7805, 381, 4477, 2429, 6525, 1405, 5501, 3453, 7549, 893, 4989, 2941, 7037, 1917, 6013, 3965, 8061, 253, 4349, 2301, 6397, 1277, 5373, 3325, 7421, 765, 4861, 2813, 6909, 1789, 5885, 3837, 7933, 509, 4605, 2557, 6653, 1533, 5629, 3581, 7677, 1021, 5117, 3069, 7165, 2045, 6141, 4093, 8189, 3, 4099, 2051, 6147, 1027, 5123, 3075, 7171, 515, 4611, 2563, 6659, 1539, 5635, 3587, 7683, 259, 4355, 2307, 6403, 1283, 5379, 3331, 7427, 771, 4867, 2819, 6915, 1795, 5891, 3843, 7939, 131, 4227, 2179, 6275, 1155, 5251, 3203, 7299, 643, 4739, 2691, 6787, 1667, 5763, 3715, 7811, 387, 4483, 2435, 6531, 1411, 5507, 3459, 7555, 899, 4995, 2947, 7043, 1923, 6019, 3971, 8067, 67, 4163, 2115, 6211, 1091, 5187, 3139, 7235, 579, 4675, 2627, 6723, 1603, 5699, 3651, 7747, 323, 4419, 2371, 6467, 1347, 5443, 3395, 7491, 835, 4931, 2883, 6979, 1859, 5955, 3907, 8003, 195, 4291, 2243, 6339, 1219, 5315, 3267, 7363, 707, 4803, 2755, 6851, 1731, 5827, 3779, 7875, 451, 4547, 2499, 6595, 1475, 5571, 3523, 7619, 963, 5059, 3011, 7107, 1987, 6083, 4035, 8131, 35, 4131, 2083, 6179, 1059, 5155, 3107, 7203, 547, 4643, 2595, 6691, 1571, 5667, 3619, 7715, 291, 4387, 2339, 6435, 1315, 5411, 3363, 7459, 803, 4899, 2851, 6947, 1827, 5923, 3875, 7971, 163, 4259, 2211, 6307, 1187, 5283, 3235, 7331, 675, 4771, 2723, 6819, 1699, 5795, 3747, 7843, 419, 4515, 2467, 6563, 1443, 5539, 3491, 7587, 931, 5027, 2979, 7075, 1955, 6051, 4003, 8099, 99, 4195, 2147, 6243, 1123, 5219, 3171, 7267, 611, 4707, 2659, 6755, 1635, 5731, 3683, 7779, 355, 4451, 2403, 6499, 1379, 5475, 3427, 7523, 867, 4963, 2915, 7011, 1891, 5987, 3939, 8035, 227, 4323, 2275, 6371, 1251, 5347, 3299, 7395, 739, 4835, 2787, 6883, 1763, 5859, 3811, 7907, 483, 4579, 2531, 6627, 1507, 5603, 3555, 7651, 995, 5091, 3043, 7139, 2019, 6115, 4067, 8163, 19, 4115, 2067, 6163, 1043, 5139, 3091, 7187, 531, 4627, 2579, 6675, 1555, 5651, 3603, 7699, 275, 4371, 2323, 6419, 1299, 5395, 3347, 7443, 787, 4883, 2835, 6931, 1811, 5907, 3859, 7955, 147, 4243, 2195, 6291, 1171, 5267, 3219, 7315, 659, 4755, 2707, 6803, 1683, 5779, 3731, 7827, 403, 4499, 2451, 6547, 1427, 5523, 3475, 7571, 915, 5011, 2963, 7059, 1939, 6035, 3987, 8083, 83, 4179, 2131, 6227, 1107, 5203, 3155, 7251, 595, 4691, 2643, 6739, 1619, 5715, 3667, 7763, 339, 4435, 2387, 6483, 1363, 5459, 3411, 7507, 851, 4947, 2899, 6995, 1875, 5971, 3923, 8019, 211, 4307, 2259, 6355, 1235, 5331, 3283, 7379, 723, 4819, 2771, 6867, 1747, 5843, 3795, 7891, 467, 4563, 2515, 6611, 1491, 5587, 3539, 7635, 979, 5075, 3027, 7123, 2003, 6099, 4051, 8147, 51, 4147, 2099, 6195, 1075, 5171, 3123, 7219, 563, 4659, 2611, 6707, 1587, 5683, 3635, 7731, 307, 4403, 2355, 6451, 1331, 5427, 3379, 7475, 819, 4915, 2867, 6963, 1843, 5939, 3891, 7987, 179, 4275, 2227, 6323, 1203, 5299, 3251, 7347, 691, 4787, 2739, 6835, 1715, 5811, 3763, 7859, 435, 4531, 2483, 6579, 1459, 5555, 3507, 7603, 947, 5043, 2995, 7091, 1971, 6067, 4019, 8115, 115, 4211, 2163, 6259, 1139, 5235, 3187, 7283, 627, 4723, 2675, 6771, 1651, 5747, 3699, 7795, 371, 4467, 2419, 6515, 1395, 5491, 3443, 7539, 883, 4979, 2931, 7027, 1907, 6003, 3955, 8051, 243, 4339, 2291, 6387, 1267, 5363, 3315, 7411, 755, 4851, 2803, 6899, 1779, 5875, 3827, 7923, 499, 4595, 2547, 6643, 1523, 5619, 3571, 7667, 1011, 5107, 3059, 7155, 2035, 6131, 4083, 8179, 11, 4107, 2059, 6155, 1035, 5131, 3083, 7179, 523, 4619, 2571, 6667, 1547, 5643, 3595, 7691, 267, 4363, 2315, 6411, 1291, 5387, 3339, 7435, 779, 4875, 2827, 6923, 1803, 5899, 3851, 7947, 139, 4235, 2187, 6283, 1163, 5259, 3211, 7307, 651, 4747, 2699, 6795, 1675, 5771, 3723, 7819, 395, 4491, 2443, 6539, 1419, 5515, 3467, 7563, 907, 5003, 2955, 7051, 1931, 6027, 3979, 8075, 75, 4171, 2123, 6219, 1099, 5195, 3147, 7243, 587, 4683, 2635, 6731, 1611, 5707, 3659, 7755, 331, 4427, 2379, 6475, 1355, 5451, 3403, 7499, 843, 4939, 2891, 6987, 1867, 5963, 3915, 8011, 203, 4299, 2251, 6347, 1227, 5323, 3275, 7371, 715, 4811, 2763, 6859, 1739, 5835, 3787, 7883, 459, 4555, 2507, 6603, 1483, 5579, 3531, 7627, 971, 5067, 3019, 7115, 1995, 6091, 4043, 8139, 43, 4139, 2091, 6187, 1067, 5163, 3115, 7211, 555, 4651, 2603, 6699, 1579, 5675, 3627, 7723, 299, 4395, 2347, 6443, 1323, 5419, 3371, 7467, 811, 4907, 2859, 6955, 1835, 5931, 3883, 7979, 171, 4267, 2219, 6315, 1195, 5291, 3243, 7339, 683, 4779, 2731, 6827, 1707, 5803, 3755, 7851, 427, 4523, 2475, 6571, 1451, 5547, 3499, 7595, 939, 5035, 2987, 7083, 1963, 6059, 4011, 8107, 107, 4203, 2155, 6251, 1131, 5227, 3179, 7275, 619, 4715, 2667, 6763, 1643, 5739, 3691, 7787, 363, 4459, 2411, 6507, 1387, 5483, 3435, 7531, 875, 4971, 2923, 7019, 1899, 5995, 3947, 8043, 235, 4331, 2283, 6379, 1259, 5355, 3307, 7403, 747, 4843, 2795, 6891, 1771, 5867, 3819, 7915, 491, 4587, 2539, 6635, 1515, 5611, 3563, 7659, 1003, 5099, 3051, 7147, 2027, 6123, 4075, 8171, 27, 4123, 2075, 6171, 1051, 5147, 3099, 7195, 539, 4635, 2587, 6683, 1563, 5659, 3611, 7707, 283, 4379, 2331, 6427, 1307, 5403, 3355, 7451, 795, 4891, 2843, 6939, 1819, 5915, 3867, 7963, 155, 4251, 2203, 6299, 1179, 5275, 3227, 7323, 667, 4763, 2715, 6811, 1691, 5787, 3739, 7835, 411, 4507, 2459, 6555, 1435, 5531, 3483, 7579, 923, 5019, 2971, 7067, 1947, 6043, 3995, 8091, 91, 4187, 2139, 6235, 1115, 5211, 3163, 7259, 603, 4699, 2651, 6747, 1627, 5723, 3675, 7771, 347, 4443, 2395, 6491, 1371, 5467, 3419, 7515, 859, 4955, 2907, 7003, 1883, 5979, 3931, 8027, 219, 4315, 2267, 6363, 1243, 5339, 3291, 7387, 731, 4827, 2779, 6875, 1755, 5851, 3803, 7899, 475, 4571, 2523, 6619, 1499, 5595, 3547, 7643, 987, 5083, 3035, 7131, 2011, 6107, 4059, 8155, 59, 4155, 2107, 6203, 1083, 5179, 3131, 7227, 571, 4667, 2619, 6715, 1595, 5691, 3643, 7739, 315, 4411, 2363, 6459, 1339, 5435, 3387, 7483, 827, 4923, 2875, 6971, 1851, 5947, 3899, 7995, 187, 4283, 2235, 6331, 1211, 5307, 3259, 7355, 699, 4795, 2747, 6843, 1723, 5819, 3771, 7867, 443, 4539, 2491, 6587, 1467, 5563, 3515, 7611, 955, 5051, 3003, 7099, 1979, 6075, 4027, 8123, 123, 4219, 2171, 6267, 1147, 5243, 3195, 7291, 635, 4731, 2683, 6779, 1659, 5755, 3707, 7803, 379, 4475, 2427, 6523, 1403, 5499, 3451, 7547, 891, 4987, 2939, 7035, 1915, 6011, 3963, 8059, 251, 4347, 2299, 6395, 1275, 5371, 3323, 7419, 763, 4859, 2811, 6907, 1787, 5883, 3835, 7931, 507, 4603, 2555, 6651, 1531, 5627, 3579, 7675, 1019, 5115, 3067, 7163, 2043, 6139, 4091, 8187, 7, 4103, 2055, 6151, 1031, 5127, 3079, 7175, 519, 4615, 2567, 6663, 1543, 5639, 3591, 7687, 263, 4359, 2311, 6407, 1287, 5383, 3335, 7431, 775, 4871, 2823, 6919, 1799, 5895, 3847, 7943, 135, 4231, 2183, 6279, 1159, 5255, 3207, 7303, 647, 4743, 2695, 6791, 1671, 5767, 3719, 7815, 391, 4487, 2439, 6535, 1415, 5511, 3463, 7559, 903, 4999, 2951, 7047, 1927, 6023, 3975, 8071, 71, 4167, 2119, 6215, 1095, 5191, 3143, 7239, 583, 4679, 2631, 6727, 1607, 5703, 3655, 7751, 327, 4423, 2375, 6471, 1351, 5447, 3399, 7495, 839, 4935, 2887, 6983, 1863, 5959, 3911, 8007, 199, 4295, 2247, 6343, 1223, 5319, 3271, 7367, 711, 4807, 2759, 6855, 1735, 5831, 3783, 7879, 455, 4551, 2503, 6599, 1479, 5575, 3527, 7623, 967, 5063, 3015, 7111, 1991, 6087, 4039, 8135, 39, 4135, 2087, 6183, 1063, 5159, 3111, 7207, 551, 4647, 2599, 6695, 1575, 5671, 3623, 7719, 295, 4391, 2343, 6439, 1319, 5415, 3367, 7463, 807, 4903, 2855, 6951, 1831, 5927, 3879, 7975, 167, 4263, 2215, 6311, 1191, 5287, 3239, 7335, 679, 4775, 2727, 6823, 1703, 5799, 3751, 7847, 423, 4519, 2471, 6567, 1447, 5543, 3495, 7591, 935, 5031, 2983, 7079, 1959, 6055, 4007, 8103, 103, 4199, 2151, 6247, 1127, 5223, 3175, 7271, 615, 4711, 2663, 6759, 1639, 5735, 3687, 7783, 359, 4455, 2407, 6503, 1383, 5479, 3431, 7527, 871, 4967, 2919, 7015, 1895, 5991, 3943, 8039, 231, 4327, 2279, 6375, 1255, 5351, 3303, 7399, 743, 4839, 2791, 6887, 1767, 5863, 3815, 7911, 487, 4583, 2535, 6631, 1511, 5607, 3559, 7655, 999, 5095, 3047, 7143, 2023, 6119, 4071, 8167, 23, 4119, 2071, 6167, 1047, 5143, 3095, 7191, 535, 4631, 2583, 6679, 1559, 5655, 3607, 7703, 279, 4375, 2327, 6423, 1303, 5399, 3351, 7447, 791, 4887, 2839, 6935, 1815, 5911, 3863, 7959, 151, 4247, 2199, 6295, 1175, 5271, 3223, 7319, 663, 4759, 2711, 6807, 1687, 5783, 3735, 7831, 407, 4503, 2455, 6551, 1431, 5527, 3479, 7575, 919, 5015, 2967, 7063, 1943, 6039, 3991, 8087, 87, 4183, 2135, 6231, 1111, 5207, 3159, 7255, 599, 4695, 2647, 6743, 1623, 5719, 3671, 7767, 343, 4439, 2391, 6487, 1367, 5463, 3415, 7511, 855, 4951, 2903, 6999, 1879, 5975, 3927, 8023, 215, 4311, 2263, 6359, 1239, 5335, 3287, 7383, 727, 4823, 2775, 6871, 1751, 5847, 3799, 7895, 471, 4567, 2519, 6615, 1495, 5591, 3543, 7639, 983, 5079, 3031, 7127, 2007, 6103, 4055, 8151, 55, 4151, 2103, 6199, 1079, 5175, 3127, 7223, 567, 4663, 2615, 6711, 1591, 5687, 3639, 7735, 311, 4407, 2359, 6455, 1335, 5431, 3383, 7479, 823, 4919, 2871, 6967, 1847, 5943, 3895, 7991, 183, 4279, 2231, 6327, 1207, 5303, 3255, 7351, 695, 4791, 2743, 6839, 1719, 5815, 3767, 7863, 439, 4535, 2487, 6583, 1463, 5559, 3511, 7607, 951, 5047, 2999, 7095, 1975, 6071, 4023, 8119, 119, 4215, 2167, 6263, 1143, 5239, 3191, 7287, 631, 4727, 2679, 6775, 1655, 5751, 3703, 7799, 375, 4471, 2423, 6519, 1399, 5495, 3447, 7543, 887, 4983, 2935, 7031, 1911, 6007, 3959, 8055, 247, 4343, 2295, 6391, 1271, 5367, 3319, 7415, 759, 4855, 2807, 6903, 1783, 5879, 3831, 7927, 503, 4599, 2551, 6647, 1527, 5623, 3575, 7671, 1015, 5111, 3063, 7159, 2039, 6135, 4087, 8183, 15, 4111, 2063, 6159, 1039, 5135, 3087, 7183, 527, 4623, 2575, 6671, 1551, 5647, 3599, 7695, 271, 4367, 2319, 6415, 1295, 5391, 3343, 7439, 783, 4879, 2831, 6927, 1807, 5903, 3855, 7951, 143, 4239, 2191, 6287, 1167, 5263, 3215, 7311, 655, 4751, 2703, 6799, 1679, 5775, 3727, 7823, 399, 4495, 2447, 6543, 1423, 5519, 3471, 7567, 911, 5007, 2959, 7055, 1935, 6031, 3983, 8079, 79, 4175, 2127, 6223, 1103, 5199, 3151, 7247, 591, 4687, 2639, 6735, 1615, 5711, 3663, 7759, 335, 4431, 2383, 6479, 1359, 5455, 3407, 7503, 847, 4943, 2895, 6991, 1871, 5967, 3919, 8015, 207, 4303, 2255, 6351, 1231, 5327, 3279, 7375, 719, 4815, 2767, 6863, 1743, 5839, 3791, 7887, 463, 4559, 2511, 6607, 1487, 5583, 3535, 7631, 975, 5071, 3023, 7119, 1999, 6095, 4047, 8143, 47, 4143, 2095, 6191, 1071, 5167, 3119, 7215, 559, 4655, 2607, 6703, 1583, 5679, 3631, 7727, 303, 4399, 2351, 6447, 1327, 5423, 3375, 7471, 815, 4911, 2863, 6959, 1839, 5935, 3887, 7983, 175, 4271, 2223, 6319, 1199, 5295, 3247, 7343, 687, 4783, 2735, 6831, 1711, 5807, 3759, 7855, 431, 4527, 2479, 6575, 1455, 5551, 3503, 7599, 943, 5039, 2991, 7087, 1967, 6063, 4015, 8111, 111, 4207, 2159, 6255, 1135, 5231, 3183, 7279, 623, 4719, 2671, 6767, 1647, 5743, 3695, 7791, 367, 4463, 2415, 6511, 1391, 5487, 3439, 7535, 879, 4975, 2927, 7023, 1903, 5999, 3951, 8047, 239, 4335, 2287, 6383, 1263, 5359, 3311, 7407, 751, 4847, 2799, 6895, 1775, 5871, 3823, 7919, 495, 4591, 2543, 6639, 1519, 5615, 3567, 7663, 1007, 5103, 3055, 7151, 2031, 6127, 4079, 8175, 31, 4127, 2079, 6175, 1055, 5151, 3103, 7199, 543, 4639, 2591, 6687, 1567, 5663, 3615, 7711, 287, 4383, 2335, 6431, 1311, 5407, 3359, 7455, 799, 4895, 2847, 6943, 1823, 5919, 3871, 7967, 159, 4255, 2207, 6303, 1183, 5279, 3231, 7327, 671, 4767, 2719, 6815, 1695, 5791, 3743, 7839, 415, 4511, 2463, 6559, 1439, 5535, 3487, 7583, 927, 5023, 2975, 7071, 1951, 6047, 3999, 8095, 95, 4191, 2143, 6239, 1119, 5215, 3167, 7263, 607, 4703, 2655, 6751, 1631, 5727, 3679, 7775, 351, 4447, 2399, 6495, 1375, 5471, 3423, 7519, 863, 4959, 2911, 7007, 1887, 5983, 3935, 8031, 223, 4319, 2271, 6367, 1247, 5343, 3295, 7391, 735, 4831, 2783, 6879, 1759, 5855, 3807, 7903, 479, 4575, 2527, 6623, 1503, 5599, 3551, 7647, 991, 5087, 3039, 7135, 2015, 6111, 4063, 8159, 63, 4159, 2111, 6207, 1087, 5183, 3135, 7231, 575, 4671, 2623, 6719, 1599, 5695, 3647, 7743, 319, 4415, 2367, 6463, 1343, 5439, 3391, 7487, 831, 4927, 2879, 6975, 1855, 5951, 3903, 7999, 191, 4287, 2239, 6335, 1215, 5311, 3263, 7359, 703, 4799, 2751, 6847, 1727, 5823, 3775, 7871, 447, 4543, 2495, 6591, 1471, 5567, 3519, 7615, 959, 5055, 3007, 7103, 1983, 6079, 4031, 8127, 127, 4223, 2175, 6271, 1151, 5247, 3199, 7295, 639, 4735, 2687, 6783, 1663, 5759, 3711, 7807, 383, 4479, 2431, 6527, 1407, 5503, 3455, 7551, 895, 4991, 2943, 7039, 1919, 6015, 3967, 8063, 255, 4351, 2303, 6399, 1279, 5375, 3327, 7423, 767, 4863, 2815, 6911, 1791, 5887, 3839, 7935, 511, 4607, 2559, 6655, 1535, 5631, 3583, 7679, 1023, 5119, 3071, 7167, 2047, 6143, 4095, 8191].

Sequence 2:

Shorten_Q_half=[1, 4097, 2049, 6145, 1025, 5121, 3073, 7169, 513, 4609, 2561, 6657, 1537, 5633, 3585, 7681, 257, 4353, 2305, 6401, 1281, 5377, 3329, 7425, 769, 4865, 2817, 6913, 1793, 5889, 3841, 7937, 129, 4225, 2177, 6273, 1153, 5249, 3201, 7297, 641, 4737, 2689, 6785, 1665, 5761, 3713, 7809, 385, 4481, 2433, 6529, 1409, 5505, 3457, 7553, 897, 4993, 2945, 7041, 1921, 6017, 3969, 8065, 65, 4161, 2113, 6209, 1089, 5185, 3137, 7233, 577, 4673, 2625, 6721, 1601, 5697, 3649, 7745, 321, 4417, 2369, 6465, 1345, 5441, 3393, 7489, 833, 4929, 2881, 6977, 1857, 5953, 3905, 8001, 193, 4289, 2241, 6337, 1217, 5313, 3265, 7361, 705, 4801, 2753, 6849, 1729, 5825, 3777, 7873, 449, 4545, 2497, 6593, 1473, 5569, 3521, 7617, 961, 5057, 3009, 7105, 1985, 6081, 4033, 8129, 33, 4129, 2081, 6177, 1057, 5153, 3105, 7201, 545, 4641, 2593, 6689, 1569, 5665, 3617, 7713, 289, 4385, 2337, 6433, 1313, 5409, 3361, 7457, 801, 4897, 2849, 6945, 1825, 5921, 3873, 7969, 161, 4257, 2209, 6305, 1185, 5281, 3233, 7329, 673, 4769, 2721, 6817, 1697, 5793, 3745, 7841, 417, 4513, 2465, 6561, 1441, 5537, 3489, 7585, 929, 5025, 2977, 7073, 1953, 6049, 4001, 8097, 97, 4193, 2145, 6241, 1121, 5217, 3169, 7265, 609, 4705, 2657, 6753, 1633, 5729, 3681, 7777, 353, 4449, 2401, 6497, 1377, 5473, 3425, 7521, 865, 4961, 2913, 7009, 1889, 5985, 3937, 8033, 225, 4321, 2273, 6369, 1249, 5345, 3297, 7393, 737, 4833, 2785, 6881, 1761, 5857, 3809, 7905, 481, 4577, 2529, 6625, 1505, 5601, 3553, 7649, 993, 5089, 3041, 7137, 2017, 6113, 4065, 8161, 17, 4113, 2065, 6161, 1041, 5137, 3089, 7185, 529, 4625, 2577, 6673, 1553, 5649, 3601, 7697, 273, 4369, 2321, 6417, 1297, 5393, 3345, 7441, 785, 4881, 2833, 6929, 1809, 5905, 3857, 7953, 145, 4241, 2193, 6289, 1169, 5265, 3217, 7313, 657, 4753, 2705, 6801, 1681, 5777, 3729, 7825, 401, 4497, 2449, 6545, 1425, 5521, 3473, 7569, 913, 5009, 2961, 7057, 1937, 6033, 3985, 8081, 81, 4177, 2129, 6225, 1105, 5201, 3153, 7249, 593, 4689, 2641, 6737, 1617, 5713, 3665, 7761, 337, 4433, 2385, 6481, 1361, 5457, 3409, 7505, 849, 4945, 2897, 6993, 1873, 5969, 3921, 8017, 209, 4305, 2257, 6353, 1233, 5329, 3281, 7377, 721, 4817, 2769, 6865, 1745, 5841, 3793, 7889, 465, 4561, 2513, 6609, 1489, 5585, 3537, 7633, 977, 5073, 3025, 7121, 2001, 6097, 4049, 8145, 49, 4145, 2097, 6193, 1073, 5169, 3121, 7217, 561, 4657, 2609, 6705, 1585, 5681, 3633, 7729, 305, 4401, 2353, 6449, 1329, 5425, 3377, 7473, 817, 4913, 2865, 6961, 1841, 5937, 3889, 7985, 177, 4273, 2225, 6321, 1201, 5297, 3249, 7345, 689, 4785, 2737, 6833, 1713, 5809, 3761, 7857, 433, 4529, 2481, 6577, 1457, 5553, 3505, 7601, 945, 5041, 2993, 7089, 1969, 6065, 4017, 8113, 113, 4209, 2161, 6257, 1137, 5233, 3185, 7281, 625, 4721, 2673, 6769, 1649, 5745, 3697, 7793, 369, 4465, 2417, 6513, 1393, 5489, 3441, 7537, 881, 4977, 2929, 7025, 1905, 6001, 3953, 8049, 241, 4337, 2289, 6385, 1265, 5361, 3313, 7409, 753, 4849, 2801, 6897, 1777, 5873, 3825, 7921, 497, 4593, 2545, 6641, 1521, 5617, 3569, 7665, 1009, 5105, 3057, 7153, 2033, 6129, 4081, 8177, 9, 4105, 2057, 6153, 1033, 5129, 3081, 7177, 521, 4617, 2569, 6665, 1545, 5641, 3593, 7689, 265, 4361, 2313, 6409, 1289, 5385, 3337, 7433, 777, 4873, 2825, 6921, 1801, 5897, 3849, 7945, 137, 4233, 2185, 6281, 1161, 5257, 3209, 7305, 649, 4745, 2697, 6793, 1673, 5769, 3721, 7817, 393, 4489, 2441, 6537, 1417, 5513, 3465, 7561, 905, 5001, 2953, 7049, 1929, 6025, 3977, 8073, 73, 4169, 2121, 6217, 1097, 5193, 3145, 7241, 585, 4681, 2633, 6729, 1609, 5705, 3657, 7753, 329, 4425, 2377, 6473, 1353, 5449, 3401, 7497, 841, 4937, 2889, 6985, 1865, 5961, 3913, 8009, 201, 4297, 2249, 6345, 1225, 5321, 3273, 7369, 713, 4809, 2761, 6857, 1737, 5833, 3785, 7881, 457, 4553, 2505, 6601, 1481, 5577, 3529, 7625, 969, 5065, 3017, 7113, 1993, 6089, 4041, 8137, 41, 4137, 2089, 6185, 1065, 5161, 3113, 7209, 553, 4649, 2601, 6697, 1577, 5673, 3625, 7721, 297, 4393, 2345, 6441, 1321, 5417, 3369, 7465, 809, 4905, 2857, 6953, 1833, 5929, 3881, 7977, 169, 4265, 2217, 6313, 1193, 5289, 3241, 7337, 681, 4777, 2729, 6825, 1705, 5801, 3753, 7849, 425, 4521, 2473, 6569, 1449, 5545, 3497, 7593, 937, 5033, 2985, 7081, 1961, 6057, 4009, 8105, 105, 4201, 2153, 6249, 1129, 5225, 3177, 7273, 617, 4713, 2665, 6761, 1641, 5737, 3689, 7785, 361, 4457, 2409, 6505, 1385, 5481, 3433, 7529, 873, 4969, 2921, 7017, 1897, 5993, 3945, 8041, 233, 4329, 2281, 6377, 1257, 5353, 3305, 7401, 745, 4841, 2793, 6889, 1769, 5865, 3817, 7913, 489, 4585, 2537, 6633, 1513, 5609, 3561, 7657, 1001, 5097, 3049, 7145, 2025, 6121, 4073, 8169, 25, 4121, 2073, 6169, 1049, 5145, 3097, 7193, 537, 4633, 2585, 6681, 1561, 5657, 3609, 7705, 281, 4377, 2329, 6425, 1305, 5401, 3353, 7449, 793, 4889, 2841, 6937, 1817, 5913, 3865, 7961, 153, 4249, 2201, 6297, 1177, 5273, 3225, 7321, 665, 4761, 2713, 6809, 1689, 5785, 3737, 7833, 409, 4505, 2457, 6553, 1433, 5529, 3481, 7577, 921, 5017, 2969, 7065, 1945, 6041, 3993, 8089, 89, 4185, 2137, 6233, 1113, 5209, 3161, 7257, 601, 4697, 2649, 6745, 1625, 5721, 3673, 7769, 345, 4441, 2393, 6489, 1369, 5465, 3417, 7513, 857, 4953, 2905, 7001, 1881, 5977, 3929, 8025, 217, 4313, 2265, 6361, 1241, 5337, 3289, 7385, 729, 4825, 2777, 6873, 1753, 5849, 3801, 7897, 473, 4569, 2521, 6617, 1497, 5593, 3545, 7641, 985, 5081, 3033, 7129, 2009, 6105, 4057, 8153, 57, 4153, 2105, 6201, 1081, 5177, 3129, 7225, 569, 4665, 2617, 6713, 1593, 5689, 3641, 7737, 313, 4409, 2361, 6457, 1337, 5433, 3385, 7481, 825, 4921, 2873, 6969, 1849, 5945, 3897, 7993, 185, 4281, 2233, 6329, 1209, 5305, 3257, 7353, 697, 4793, 2745, 6841, 1721, 5817, 3769, 7865, 441, 4537, 2489, 6585, 1465, 5561, 3513, 7609, 953, 5049, 3001, 7097, 1977, 6073, 4025, 8121, 121, 4217, 2169, 6265, 1145, 5241, 3193, 7289, 633, 4729, 2681, 6777, 1657, 5753, 3705, 7801, 377, 4473, 2425, 6521, 1401, 5497, 3449, 7545, 889, 4985, 2937, 7033, 1913, 6009, 3961, 8057, 249, 4345, 2297, 6393, 1273, 5369, 3321, 7417, 761, 4857, 2809, 6905, 1785, 5881, 3833, 7929, 505, 4601, 2553, 6649, 1529, 5625, 3577, 7673, 1017, 5113, 3065, 7161, 2041, 6137, 4089, 8185, 5, 4101, 2053, 6149, 1029, 5125, 3077, 7173, 517, 4613, 2565, 6661, 1541, 5637, 3589, 7685, 261, 4357, 2309, 6405, 1285, 5381, 3333, 7429, 773, 4869, 2821, 6917, 1797, 5893, 3845, 7941, 133, 4229, 2181, 6277, 1157, 5253, 3205, 7301, 645, 4741, 2693, 6789, 1669, 5765, 3717, 7813, 389, 4485, 2437, 6533, 1413, 5509, 3461, 7557, 901, 4997, 2949, 7045, 1925, 6021, 3973, 8069, 69, 4165, 2117, 6213, 1093, 5189, 3141, 7237, 581, 4677, 2629, 6725, 1605, 5701, 3653, 7749, 325, 4421, 2373, 6469, 1349, 5445, 3397, 7493, 837, 4933, 2885, 6981, 1861, 5957, 3909, 8005, 197, 4293, 2245, 6341, 1221, 5317, 3269, 7365, 709, 4805, 2757, 6853, 1733, 5829, 3781, 7877, 453, 4549, 2501, 6597, 1477, 5573, 3525, 7621, 965, 5061, 3013, 7109, 1989, 6085, 4037, 8133, 37, 4133, 2085, 6181, 1061, 5157, 3109, 7205, 549, 4645, 2597, 6693, 1573, 5669, 3621, 7717, 293, 4389, 2341, 6437, 1317, 5413, 3365, 7461, 805, 4901, 2853, 6949, 1829, 5925, 3877, 7973, 165, 4261, 2213, 6309, 1189, 5285, 3237, 7333, 677, 4773, 2725, 6821, 1701, 5797, 3749, 7845, 421, 4517, 2469, 6565, 1445, 5541, 3493, 7589, 933, 5029, 2981, 7077, 1957, 6053, 4005, 8101, 101, 4197, 2149, 6245, 1125, 5221, 3173, 7269, 613, 4709, 2661, 6757, 1637, 5733, 3685, 7781, 357, 4453, 2405, 6501, 1381, 5477, 3429, 7525, 869, 4965, 2917, 7013, 1893, 5989, 3941, 8037, 229, 4325, 2277, 6373, 1253, 5349, 3301, 7397, 741, 4837, 2789, 6885, 1765, 5861, 3813, 7909, 485, 4581, 2533, 6629, 1509, 5605, 3557, 7653, 997, 5093, 3045, 7141, 2021, 6117, 4069, 8165, 21, 4117, 2069, 6165, 1045, 5141, 3093, 7189, 533, 4629, 2581, 6677, 1557, 5653, 3605, 7701, 277, 4373, 2325, 6421, 1301, 5397, 3349, 7445, 789, 4885, 2837, 6933, 1813, 5909, 3861, 7957, 149, 4245, 2197, 6293, 1173, 5269, 3221, 7317, 661, 4757, 2709, 6805, 1685, 5781, 3733, 7829, 405, 4501, 2453, 6549, 1429, 5525, 3477, 7573, 917, 5013, 2965, 7061, 1941, 6037, 3989, 8085, 85, 4181, 2133, 6229, 1109, 5205, 3157, 7253, 597, 4693, 2645, 6741, 1621, 5717, 3669, 7765, 341, 4437, 2389, 6485, 1365, 5461, 3413, 7509, 853, 4949, 2901, 6997, 1877, 5973, 3925, 8021, 213, 4309, 2261, 6357, 1237, 5333, 3285, 7381, 725, 4821, 2773, 6869, 1749, 5845, 3797, 7893, 469, 4565, 2517, 6613, 1493, 5589, 3541, 7637, 981, 5077, 3029, 7125, 2005, 6101, 4053, 8149, 53, 4149, 2101, 6197, 1077, 5173, 3125, 7221, 565, 4661, 2613, 6709, 1589, 5685, 3637, 7733, 309, 4405, 2357, 6453, 1333, 5429, 3381, 7477, 821, 4917, 2869, 6965, 1845, 5941, 3893, 7989, 181, 4277, 2229, 6325, 1205, 5301, 3253, 7349, 693, 4789, 2741, 6837, 1717, 5813, 3765, 7861, 437, 4533, 2485, 6581, 1461, 5557, 3509, 7605, 949, 5045, 2997, 7093, 1973, 6069, 4021, 8117, 117, 4213, 2165, 6261, 1141, 5237, 3189, 7285, 629, 4725, 2677, 6773, 1653, 5749, 3701, 7797, 373, 4469, 2421, 6517, 1397, 5493, 3445, 7541, 885, 4981, 2933, 7029, 1909, 6005, 3957, 8053, 245, 4341, 2293, 6389, 1269, 5365, 3317, 7413, 757, 4853, 2805, 6901, 1781, 5877, 3829, 7925, 501, 4597, 2549, 6645, 1525, 5621, 3573, 7669, 1013, 5109, 3061, 7157, 2037, 6133, 4085, 8181, 13, 4109, 2061, 6157, 1037, 5133, 3085, 7181, 525, 4621, 2573, 6669, 1549, 5645, 3597, 7693, 269, 4365, 2317, 6413, 1293, 5389, 3341, 7437, 781, 4877, 2829, 6925, 1805, 5901, 3853, 7949, 141, 4237, 2189, 6285, 1165, 5261, 3213, 7309, 653, 4749, 2701, 6797, 1677, 5773, 3725, 7821, 397, 4493, 2445, 6541, 1421, 5517, 3469, 7565, 909, 5005, 2957, 7053, 1933, 6029, 3981, 8077, 77, 4173, 2125, 6221, 1101, 5197, 3149, 7245, 589, 4685, 2637, 6733, 1613, 5709, 3661, 7757, 333, 4429, 2381, 6477, 1357, 5453, 3405, 7501, 845, 4941, 2893, 6989, 1869, 5965, 3917, 8013, 205, 4301, 2253, 6349, 1229, 5325, 3277, 7373, 717, 4813, 2765, 6861, 1741, 5837, 3789, 7885, 461, 4557, 2509, 6605, 1485, 5581, 3533, 7629, 973, 5069, 3021, 7117, 1997, 6093, 4045, 8141, 45, 4141, 2093, 6189, 1069, 5165, 3117, 7213, 557, 4653, 2605, 6701, 1581, 5677, 3629, 7725, 301, 4397, 2349, 6445, 1325, 5421, 3373, 7469, 813, 4909, 2861, 6957, 1837, 5933, 3885, 7981, 173, 4269, 2221, 6317, 1197, 5293, 3245, 7341, 685, 4781, 2733, 6829, 1709, 5805, 3757, 7853, 429, 4525, 2477, 6573, 1453, 5549, 3501, 7597, 941, 5037, 2989, 7085, 1965, 6061, 4013, 8109, 109, 4205, 2157, 6253, 1133, 5229, 3181, 7277, 621, 4717, 2669, 6765, 1645, 5741, 3693, 7789, 365, 4461, 2413, 6509, 1389, 5485, 3437, 7533, 877, 4973, 2925, 7021, 1901, 5997, 3949, 8045, 237, 4333, 2285, 6381, 1261, 5357, 3309, 7405, 749, 4845, 2797, 6893, 1773, 5869, 3821, 7917, 493, 4589, 2541, 6637, 1517, 5613, 3565, 7661, 1005, 5101, 3053, 7149, 2029, 6125, 4077, 8173, 29, 4125, 2077, 6173, 1053, 5149, 3101, 7197, 541, 4637, 2589, 6685, 1565, 5661, 3613, 7709, 285, 4381, 2333, 6429, 1309, 5405, 3357, 7453, 797, 4893, 2845, 6941, 1821, 5917, 3869, 7965, 157, 4253, 2205, 6301, 1181, 5277, 3229, 7325, 669, 4765, 2717, 6813, 1693, 5789, 3741, 7837, 413, 4509, 2461, 6557, 1437, 5533, 3485, 7581, 925, 5021, 2973, 7069, 1949, 6045, 3997, 8093, 93, 4189, 2141, 6237, 1117, 5213, 3165, 7261, 605, 4701, 2653, 6749, 1629, 5725, 3677, 7773, 349, 4445, 2397, 6493, 1373, 5469, 3421, 7517, 861, 4957, 2909, 7005, 1885, 5981, 3933, 8029, 221, 4317, 2269, 6365, 1245, 5341, 3293, 7389, 733, 4829, 2781, 6877, 1757, 5853, 3805, 7901, 477, 4573, 2525, 6621, 1501, 5597, 3549, 7645, 989, 5085, 3037, 7133, 2013, 6109, 4061, 8157, 61, 4157, 2109, 6205, 1085, 5181, 3133, 7229, 573, 4669, 2621, 6717, 1597, 5693, 3645, 7741, 317, 4413, 2365, 6461, 1341, 5437, 3389, 7485, 829, 4925, 2877, 6973, 1853, 5949, 3901, 7997, 189, 4285, 2237, 6333, 1213, 5309, 3261, 7357, 701, 4797, 2749, 6845, 1725, 5821, 3773, 7869, 445, 4541, 2493, 6589, 1469, 5565, 3517, 7613, 957, 5053, 3005, 7101, 1981, 6077, 4029, 8125, 125, 4221, 2173, 6269, 1149, 5245, 3197, 7293, 637, 4733, 2685, 6781, 1661, 5757, 3709, 7805, 381, 4477, 2429, 6525, 1405, 5501, 3453, 7549, 893, 4989, 2941, 7037, 1917, 6013, 3965, 8061, 253, 4349, 2301, 6397, 1277, 5373, 3325, 7421, 765, 4861, 2813, 6909, 1789, 5885, 3837, 7933, 509, 4605, 2557, 6653, 1533, 5629, 3581, 7677, 1021, 5117, 3069, 7165, 2045, 6141, 4093, 8189, 3, 4099, 2051, 6147, 1027, 5123, 3075, 7171, 515, 4611, 2563, 6659, 1539, 5635, 3587, 7683, 259, 4355, 2307, 6403, 1283, 5379, 3331, 7427, 771, 4867, 2819, 6915, 1795, 5891, 3843, 7939, 131, 4227, 2179, 6275, 1155, 5251, 3203, 7299, 643, 4739, 2691, 6787, 1667, 5763, 3715, 7811, 387, 4483, 2435, 6531, 1411, 5507, 3459, 7555, 899, 4995, 2947, 7043, 1923, 6019, 3971, 8067, 67, 4163, 2115, 6211, 1091, 5187, 3139, 7235, 579, 4675, 2627, 6723, 1603, 5699, 3651, 7747, 323, 4419, 2371, 6467, 1347, 5443, 3395, 7491, 835, 4931, 2883, 6979, 1859, 5955, 3907, 8003, 195, 4291, 2243, 6339, 1219, 5315, 3267, 7363, 707, 4803, 2755, 6851, 1731, 5827, 3779, 7875, 451, 4547, 2499, 6595, 1475, 5571, 3523, 7619, 963, 5059, 3011, 7107, 1987, 6083, 4035, 8131, 35, 4131, 2083, 6179, 1059, 5155, 3107, 7203, 547, 4643, 2595, 6691, 1571, 5667, 3619, 7715, 291, 4387, 2339, 6435, 1315, 5411, 3363, 7459, 803, 4899, 2851, 6947, 1827, 5923, 3875, 7971, 163, 4259, 2211, 6307, 1187, 5283, 3235, 7331, 675, 4771, 2723, 6819, 1699, 5795, 3747, 7843, 419, 4515, 2467, 6563, 1443, 5539, 3491, 7587, 931, 5027, 2979, 7075, 1955, 6051, 4003, 8099, 99, 4195, 2147, 6243, 1123, 5219, 3171, 7267, 611, 4707, 2659, 6755, 1635, 5731, 3683, 7779, 355, 4451, 2403, 6499, 1379, 5475, 3427, 7523, 867, 4963, 2915, 7011, 1891, 5987, 3939, 8035, 227, 4323, 2275, 6371, 1251, 5347, 3299, 7395, 739, 4835, 2787, 6883, 1763, 5859, 3811, 7907, 483, 4579, 2531, 6627, 1507, 5603, 3555, 7651, 995, 5091, 3043, 7139, 2019, 6115, 4067, 8163, 19, 4115, 2067, 6163, 1043, 5139, 3091, 7187, 531, 4627, 2579, 6675, 1555, 5651, 3603, 7699, 275, 4371, 2323, 6419, 1299, 5395, 3347, 7443, 787, 4883, 2835, 6931, 1811, 5907, 3859, 7955, 147, 4243, 2195, 6291, 1171, 5267, 3219, 7315, 659, 4755, 2707, 6803, 1683, 5779, 3731, 7827, 403, 4499, 2451, 6547, 1427, 5523, 3475, 7571, 915, 5011, 2963, 7059, 1939, 6035, 3987, 8083, 83, 4179, 2131, 6227, 1107, 5203, 3155, 7251, 595, 4691, 2643, 6739, 1619, 5715, 3667, 7763, 339, 4435, 2387, 6483, 1363, 5459, 3411, 7507, 851, 4947, 2899, 6995, 1875, 5971, 3923, 8019, 211, 4307, 2259, 6355, 1235, 5331, 3283, 7379, 723, 4819, 2771, 6867, 1747, 5843, 3795, 7891, 467, 4563, 2515, 6611, 1491, 5587, 3539, 7635, 979, 5075, 3027, 7123, 2003, 6099, 4051, 8147, 51, 4147, 2099, 6195, 1075, 5171, 3123, 7219, 563, 4659, 2611, 6707, 1587, 5683, 3635, 7731, 307, 4403, 2355, 6451, 1331, 5427, 3379, 7475, 819, 4915, 2867, 6963, 1843, 5939, 3891, 7987, 179, 4275, 2227, 6323, 1203, 5299, 3251, 7347, 691, 4787, 2739, 6835, 1715, 5811, 3763, 7859, 435, 4531, 2483, 6579, 1459, 5555, 3507, 7603, 947, 5043, 2995, 7091, 1971, 6067, 4019, 8115, 115, 4211, 2163, 6259, 1139, 5235, 3187, 7283, 627, 4723, 2675, 6771, 1651, 5747, 3699, 7795, 371, 4467, 2419, 6515, 1395, 5491, 3443, 7539, 883, 4979, 2931, 7027, 1907, 6003, 3955, 8051, 243, 4339, 2291, 6387, 1267, 5363, 3315, 7411, 755, 4851, 2803, 6899, 1779, 5875, 3827, 7923, 499, 4595, 2547, 6643, 1523, 5619, 3571, 7667, 1011, 5107, 3059, 7155, 2035, 6131, 4083, 8179, 11, 4107, 2059, 6155, 1035, 5131, 3083, 7179, 523, 4619, 2571, 6667, 1547, 5643, 3595, 7691, 267, 4363, 2315, 6411, 1291, 5387, 3339, 7435, 779, 4875, 2827, 6923, 1803, 5899, 3851, 7947, 139, 4235, 2187, 6283, 1163, 5259, 3211, 7307, 651, 4747, 2699, 6795, 1675, 5771, 3723, 7819, 395, 4491, 2443, 6539, 1419, 5515, 3467, 7563, 907, 5003, 2955, 7051, 1931, 6027, 3979, 8075, 75, 4171, 2123, 6219, 1099, 5195, 3147, 7243, 587, 4683, 2635, 6731, 1611, 5707, 3659, 7755, 331, 4427, 2379, 6475, 1355, 5451, 3403, 7499, 843, 4939, 2891, 6987, 1867, 5963, 3915, 8011, 203, 4299, 2251, 6347, 1227, 5323, 3275, 7371, 715, 4811, 2763, 6859, 1739, 5835, 3787, 7883, 459, 4555, 2507, 6603, 1483, 5579, 3531, 7627, 971, 5067, 3019, 7115, 1995, 6091, 4043, 8139, 43, 4139, 2091, 6187, 1067, 5163, 3115, 7211, 555, 4651, 2603, 6699, 1579, 5675, 3627, 7723, 299, 4395, 2347, 6443, 1323, 5419, 3371, 7467, 811, 4907, 2859, 6955, 1835, 5931, 3883, 7979, 171, 4267, 2219, 6315, 1195, 5291, 3243, 7339, 683, 4779, 2731, 6827, 1707, 5803, 3755, 7851, 427, 4523, 2475, 6571, 1451, 5547, 3499, 7595, 939, 5035, 2987, 7083, 1963, 6059, 4011, 8107, 107, 4203, 2155, 6251, 1131, 5227, 3179, 7275, 619, 4715, 2667, 6763, 1643, 5739, 3691, 7787, 363, 4459, 2411, 6507, 1387, 5483, 3435, 7531, 875, 4971, 2923, 7019, 1899, 5995, 3947, 8043, 235, 4331, 2283, 6379, 1259, 5355, 3307, 7403, 747, 4843, 2795, 6891, 1771, 5867, 3819, 7915, 491, 4587, 2539, 6635, 1515, 5611, 3563, 7659, 1003, 5099, 3051, 7147, 2027, 6123, 4075, 8171, 27, 4123, 2075, 6171, 1051, 5147, 3099, 7195, 539, 4635, 2587, 6683, 1563, 5659, 3611, 7707, 283, 4379, 2331, 6427, 1307, 5403, 3355, 7451, 795, 4891, 2843, 6939, 1819, 5915, 3867, 7963, 155, 4251, 2203, 6299, 1179, 5275, 3227, 7323, 667, 4763, 2715, 6811, 1691, 5787, 3739, 7835, 411, 4507, 2459, 6555, 1435, 5531, 3483, 7579, 923, 5019, 2971, 7067, 1947, 6043, 3995, 8091, 91, 4187, 2139, 6235, 1115, 5211, 3163, 7259, 603, 4699, 2651, 6747, 1627, 5723, 3675, 7771, 347, 4443, 2395, 6491, 1371, 5467, 3419, 7515, 859, 4955, 2907, 7003, 1883, 5979, 3931, 8027, 219, 4315, 2267, 6363, 1243, 5339, 3291, 7387, 731, 4827, 2779, 6875, 1755, 5851, 3803, 7899, 475, 4571, 2523, 6619, 1499, 5595, 3547, 7643, 987, 5083, 3035, 7131, 2011, 6107, 4059, 8155, 59, 4155, 2107, 6203, 1083, 5179, 3131, 7227, 571, 4667, 2619, 6715, 1595, 5691, 3643, 7739, 315, 4411, 2363, 6459, 1339, 5435, 3387, 7483, 827, 4923, 2875, 6971, 1851, 5947, 3899, 7995, 187, 4283, 2235, 6331, 1211, 5307, 3259, 7355, 699, 4795, 2747, 6843, 1723, 5819, 3771, 7867, 443, 4539, 2491, 6587, 1467, 5563, 3515, 7611, 955, 5051, 3003, 7099, 1979, 6075, 4027, 8123, 123, 4219, 2171, 6267, 1147, 5243, 3195, 7291, 635, 4731, 2683, 6779, 1659, 5755, 3707, 7803, 379, 4475, 2427, 6523, 1403, 5499, 3451, 7547, 891, 4987, 2939, 7035, 1915, 6011, 3963, 8059, 251, 4347, 2299, 6395, 1275, 5371, 3323, 7419, 763, 4859, 2811, 6907, 1787, 5883, 3835, 7931, 507, 4603, 2555, 6651, 1531, 5627, 3579, 7675, 1019, 5115, 3067, 7163, 2043, 6139, 4091, 8187, 7, 4103, 2055, 6151, 1031, 5127, 3079, 7175, 519, 4615, 2567, 6663, 1543, 5639, 3591, 7687, 263, 4359, 2311, 6407, 1287, 5383, 3335, 7431, 775, 4871, 2823, 6919, 1799, 5895, 3847, 7943, 135, 4231, 2183, 6279, 1159, 5255, 3207, 7303, 647, 4743, 2695, 6791, 1671, 5767, 3719, 7815, 391, 4487, 2439, 6535, 1415, 5511, 3463, 7559, 903, 4999, 2951, 7047, 1927, 6023, 3975, 8071, 71, 4167, 2119, 6215, 1095, 5191, 3143, 7239, 583, 4679, 2631, 6727, 1607, 5703, 3655, 7751, 327, 4423, 2375, 6471, 1351, 5447, 3399, 7495, 839, 4935, 2887, 6983, 1863, 5959, 3911, 8007, 199, 4295, 2247, 6343, 1223, 5319, 3271, 7367, 711, 4807, 2759, 6855, 1735, 5831, 3783, 7879, 455, 4551, 2503, 6599, 1479, 5575, 3527, 7623, 967, 5063, 3015, 7111, 1991, 6087, 4039, 8135, 39, 4135, 2087, 6183, 1063, 5159, 3111, 7207, 551, 4647, 2599, 6695, 1575, 5671, 3623, 7719, 295, 4391, 2343, 6439, 1319, 5415, 3367, 7463, 807, 4903, 2855, 6951, 1831, 5927, 3879, 7975, 167, 4263, 2215, 6311, 1191, 5287, 3239, 7335, 679, 4775, 2727, 6823, 1703, 5799, 3751, 7847, 423, 4519, 2471, 6567, 1447, 5543, 3495, 7591, 935, 5031, 2983, 7079, 1959, 6055, 4007, 8103, 103, 4199, 2151, 6247, 1127, 5223, 3175, 7271, 615, 4711, 2663, 6759, 1639, 5735, 3687, 7783, 359, 4455, 2407, 6503, 1383, 5479, 3431, 7527, 871, 4967, 2919, 7015, 1895, 5991, 3943, 8039, 231, 4327, 2279, 6375, 1255, 5351, 3303, 7399, 743, 4839, 2791, 6887, 1767, 5863, 3815, 7911, 487, 4583, 2535, 6631, 1511, 5607, 3559, 7655, 999, 5095, 3047, 7143, 2023, 6119, 4071, 8167, 23, 4119, 2071, 6167, 1047, 5143, 3095, 7191, 535, 4631, 2583, 6679, 1559, 5655, 3607, 7703, 279, 4375, 2327, 6423, 1303, 5399, 3351, 7447, 791, 4887, 2839, 6935, 1815, 5911, 3863, 7959, 151, 4247, 2199, 6295, 1175, 5271, 3223, 7319, 663, 4759, 2711, 6807, 1687, 5783, 3735, 7831, 407, 4503, 2455, 6551, 1431, 5527, 3479, 7575, 919, 5015, 2967, 7063, 1943, 6039, 3991, 8087, 87, 4183, 2135, 6231, 1111, 5207, 3159, 7255, 599, 4695, 2647, 6743, 1623, 5719, 3671, 7767, 343, 4439, 2391, 6487, 1367, 5463, 3415, 7511, 855, 4951, 2903, 6999, 1879, 5975, 3927, 8023, 215, 4311, 2263, 6359, 1239, 5335, 3287, 7383, 727, 4823, 2775, 6871, 1751, 5847, 3799, 7895, 471, 4567, 2519, 6615, 1495, 5591, 3543, 7639, 983, 5079, 3031, 7127, 2007, 6103, 4055, 8151, 55, 4151, 2103, 6199, 1079, 5175, 3127, 7223, 567, 4663, 2615, 6711, 1591, 5687, 3639, 7735, 311, 4407, 2359, 6455, 1335, 5431, 3383, 7479, 823, 4919, 2871, 6967, 1847, 5943, 3895, 7991, 183, 4279, 2231, 6327, 1207, 5303, 3255, 7351, 695, 4791, 2743, 6839, 1719, 5815, 3767, 7863, 439, 4535, 2487, 6583, 1463, 5559, 3511, 7607, 951, 5047, 2999, 7095, 1975, 6071, 4023, 8119, 119, 4215, 2167, 6263, 1143, 5239, 3191, 7287, 631, 4727, 2679, 6775, 1655, 5751, 3703, 7799, 375, 4471, 2423, 6519, 1399, 5495, 3447, 7543, 887, 4983, 2935, 7031, 1911, 6007, 3959, 8055, 247, 4343, 2295, 6391, 1271, 5367, 3319, 7415, 759, 4855, 2807, 6903, 1783, 5879, 3831, 7927, 503, 4599, 2551, 6647, 1527, 5623, 3575, 7671, 1015, 5111, 3063, 7159, 2039, 6135, 4087, 8183, 15, 4111, 2063, 6159, 1039, 5135, 3087, 7183, 527, 4623, 2575, 6671, 1551, 5647, 3599, 7695, 271, 4367, 2319, 6415, 1295, 5391, 3343, 7439, 783, 4879, 2831, 6927, 1807, 5903, 3855, 7951, 143, 4239, 2191, 6287, 1167, 5263, 3215, 7311, 655, 4751, 2703, 6799, 1679, 5775, 3727, 7823, 399, 4495, 2447, 6543, 1423, 5519, 3471, 7567, 911, 5007, 2959, 7055, 1935, 6031, 3983, 8079, 79, 4175, 2127, 6223, 1103, 5199, 3151, 7247, 591, 4687, 2639, 6735, 1615, 5711, 3663, 7759, 335, 4431, 2383, 6479, 1359, 5455, 3407, 7503, 847, 4943, 2895, 6991, 1871, 5967, 3919, 8015, 207, 4303, 2255, 6351, 1231, 5327, 3279, 7375, 719, 4815, 2767, 6863, 1743, 5839, 3791, 7887, 463, 4559, 2511, 6607, 1487, 5583, 3535, 7631, 975, 5071, 3023, 7119, 1999, 6095, 4047, 8143, 47, 4143, 2095, 6191, 1071, 5167, 3119, 7215, 559, 4655, 2607, 6703, 1583, 5679, 3631, 7727, 303, 4399, 2351, 6447, 1327, 5423, 3375, 7471, 815, 4911, 2863, 6959, 1839, 5935, 3887, 7983, 175, 4271, 2223, 6319, 1199, 5295, 3247, 7343, 687, 4783, 2735, 6831, 1711, 5807, 3759, 7855, 431, 4527, 2479, 6575, 1455, 5551, 3503, 7599, 943, 5039, 2991, 7087, 1967, 6063, 4015, 8111, 111, 4207, 2159, 6255, 1135, 5231, 3183, 7279, 623, 4719, 2671, 6767, 1647, 5743, 3695, 7791, 367, 4463, 2415, 6511, 1391, 5487, 3439, 7535, 879, 4975, 2927, 7023, 1903, 5999, 3951, 8047, 239, 4335, 2287, 6383, 1263, 5359, 3311, 7407, 751, 4847, 2799, 6895, 1775, 5871, 3823, 7919, 495, 4591, 2543, 6639, 1519, 5615, 3567, 7663, 1007, 5103, 3055, 7151, 2031, 6127, 4079, 8175, 31, 4127, 2079, 6175, 1055, 5151, 3103, 7199, 543, 4639, 2591, 6687, 1567, 5663, 3615, 7711, 287, 4383, 2335, 6431, 1311, 5407, 3359, 7455, 799, 4895, 2847, 6943, 1823, 5919, 3871, 7967, 159, 4255, 2207, 6303, 1183, 5279, 3231, 7327, 671, 4767, 2719, 6815, 1695, 5791, 3743, 7839, 415, 4511, 2463, 6559, 1439, 5535, 3487, 7583, 927, 5023, 2975, 7071, 1951, 6047, 3999, 8095, 95, 4191, 2143, 6239, 1119, 5215, 3167, 7263, 607, 4703, 2655, 6751, 1631, 5727, 3679, 7775, 351, 4447, 2399, 6495, 1375, 5471, 3423, 7519, 863, 4959, 2911, 7007, 1887, 5983, 3935, 8031, 223, 4319, 2271, 6367, 1247, 5343, 3295, 7391, 735, 4831, 2783, 6879, 1759, 5855, 3807, 7903, 479, 4575, 2527, 6623, 1503, 5599, 3551, 7647, 991, 5087, 3039, 7135, 2015, 6111, 4063, 8159, 63, 4159, 2111, 6207, 1087, 5183, 3135, 7231, 575, 4671, 2623, 6719, 1599, 5695, 3647, 7743, 319, 4415, 2367, 6463, 1343, 5439, 3391, 7487, 831, 4927, 2879, 6975, 1855, 5951, 3903, 7999, 191, 4287, 2239, 6335, 1215, 5311, 3263, 7359, 703, 4799, 2751, 6847, 1727, 5823, 3775, 7871, 447, 4543, 2495, 6591, 1471, 5567, 3519, 7615, 959, 5055, 3007, 7103, 1983, 6079, 4031, 8127, 127, 4223, 2175, 6271, 1151, 5247, 3199, 7295, 639, 4735, 2687, 6783, 1663, 5759, 3711, 7807, 383, 4479, 2431, 6527, 1407, 5503, 3455, 7551, 895, 4991, 2943, 7039, 1919, 6015, 3967, 8063, 255, 4351, 2303, 6399, 1279, 5375, 3327, 7423, 767, 4863, 2815, 6911, 1791, 5887, 3839, 7935, 511, 4607, 2559, 6655, 1535, 5631, 3583, 7679, 1023, 5119, 3071, 7167, 2047, 6143, 4095, 8191].

Sequence 3:

Shorten_Z=[0, 4096, 2048, 6144, 1024, 5120, 3072, 7168, 512, 4608, 2560, 6656, 1536, 5632, 3584, 7680, 256, 4352, 2304, 6400, 1280, 5376, 3328, 7424, 768, 4864, 2816, 6912, 1792, 5888, 3840, 7936, 128, 4224, 2176, 6272, 1152, 5248, 3200, 7296, 640, 4736, 2688, 6784, 1664, 5760, 3712, 7808, 384, 4480, 2432, 6528, 1408, 5504, 3456, 7552, 896, 4992, 2944, 7040, 1920, 6016, 3968, 8064, 64, 4160, 2112, 6208, 1088, 5184, 3136, 7232, 576, 4672, 2624, 6720, 1600, 5696, 3648, 7744, 320, 4416, 2368, 6464, 1344, 5440, 3392, 7488, 832, 4928, 2880, 6976, 1856, 5952, 3904, 8000, 192, 4288, 2240, 6336, 1216, 5312, 3264, 7360, 704, 4800, 2752, 6848, 1728, 5824, 3776, 7872, 448, 4544, 2496, 6592, 1472, 5568, 3520, 7616, 960, 5056, 3008, 7104, 1984, 6080, 4032, 8128, 32, 4128, 2080, 6176, 1056, 5152, 3104, 7200, 544, 4640, 2592, 6688, 1568, 5664, 3616, 7712, 288, 4384, 2336, 6432, 1312, 5408, 3360, 7456, 800, 4896, 2848, 6944, 1824, 5920, 3872, 7968, 160, 4256, 2208, 6304, 1184, 5280, 3232, 7328, 672, 4768, 2720, 6816, 1696, 5792, 3744, 7840, 416, 4512, 2464, 6560, 1440, 5536, 3488, 7584, 928, 5024, 2976, 7072, 1952, 6048, 4000, 8096, 96, 4192, 2144, 6240, 1120, 5216, 3168, 7264, 608, 4704, 2656, 6752, 1632, 5728, 3680, 7776, 352, 4448, 2400, 6496, 1376, 5472, 3424, 7520, 864, 4960, 2912, 7008, 1888, 5984, 3936, 8032, 224, 4320, 2272, 6368, 1248, 5344, 3296, 7392, 736, 4832, 2784, 6880, 1760, 5856, 3808, 7904, 480, 4576, 2528, 6624, 1504, 5600, 3552, 7648, 992, 5088, 3040, 7136, 2016, 6112, 4064, 8160, 16, 4112, 2064, 6160, 1040, 5136, 3088, 7184, 528, 4624, 2576, 6672, 1552, 5648, 3600, 7696, 272, 4368, 2320, 6416, 1296, 5392, 3344, 7440, 784, 4880, 2832, 6928, 1808, 5904, 3856, 7952, 144, 4240, 2192, 6288, 1168, 5264, 3216, 7312, 656, 4752, 2704, 6800, 1680, 5776, 3728, 7824, 400, 4496, 2448, 6544, 1424, 5520, 3472, 7568, 912, 5008, 2960, 7056, 1936, 6032, 3984, 8080, 80, 4176, 2128, 6224, 1104, 5200, 3152, 7248, 592, 4688, 2640, 6736, 1616, 5712, 3664, 7760, 336, 4432, 2384, 6480, 1360, 5456, 3408, 7504, 848, 4944, 2896, 6992, 1872, 5968, 3920, 8016, 208, 4304, 2256, 6352, 1232, 5328, 3280, 7376, 720, 4816, 2768, 6864, 1744, 5840, 3792, 7888, 464, 4560, 2512, 6608, 1488, 5584, 3536, 7632, 976, 5072, 3024, 7120, 2000, 6096, 4048, 8144, 48, 4144, 2096, 6192, 1072, 5168, 3120, 7216, 560, 4656, 2608, 6704, 1584, 5680, 3632, 7728, 304, 4400, 2352, 6448, 1328, 5424, 3376, 7472, 816, 4912, 2864, 6960, 1840, 5936, 3888, 7984, 176, 4272, 2224, 6320, 1200, 5296, 3248, 7344, 688, 4784, 2736, 6832, 1712, 5808, 3760, 7856, 432, 4528, 2480, 6576, 1456, 5552, 3504, 7600, 944, 5040, 2992, 7088, 1968, 6064, 4016, 8112, 112, 4208, 2160, 6256, 1136, 5232, 3184, 7280, 624, 4720, 2672, 6768, 1648, 5744, 3696, 7792, 368, 4464, 2416, 6512, 1392, 5488, 3440, 7536, 880, 4976, 2928, 7024, 1904, 6000, 3952, 8048, 240, 4336, 2288, 6384, 1264, 5360, 3312, 7408, 752, 4848, 2800, 6896, 1776, 5872, 3824, 7920, 496, 4592, 2544, 6640, 1520, 5616, 3568, 7664, 1008, 5104, 3056, 7152, 2032, 6128, 4080, 8176, 8, 4104, 2056, 6152, 1032, 5128, 3080, 7176, 520, 4616, 2568, 6664, 1544, 5640, 3592, 7688, 264, 4360, 2312, 6408, 1288, 5384, 3336, 7432, 776, 4872, 2824, 6920, 1800, 5896, 3848, 7944, 136, 4232, 2184, 6280, 1160, 5256, 3208, 7304, 648, 4744, 2696, 6792, 1672, 5768, 3720, 7816, 392, 4488, 2440, 6536, 1416, 5512, 3464, 7560, 904, 5000, 2952, 7048, 1928, 6024, 3976, 8072, 72, 4168, 2120, 6216, 1096, 5192, 3144, 7240, 584, 4680, 2632, 6728, 1608, 5704, 3656, 7752, 328, 4424, 2376, 6472, 1352, 5448, 3400, 7496, 840, 4936, 2888, 6984, 1864, 5960, 3912, 8008, 200, 4296, 2248, 6344, 1224, 5320, 3272, 7368, 712, 4808, 2760, 6856, 1736, 5832, 3784, 7880, 456, 4552, 2504, 6600, 1480, 5576, 3528, 7624, 968, 5064, 3016, 7112, 1992, 6088, 4040, 8136, 40, 4136, 2088, 6184, 1064, 5160, 3112, 7208, 552, 4648, 2600, 6696, 1576, 5672, 3624, 7720, 296, 4392, 2344, 6440, 1320, 5416, 3368, 7464, 808, 4904, 2856, 6952, 1832, 5928, 3880, 7976, 168, 4264, 2216, 6312, 1192, 5288, 3240, 7336, 680, 4776, 2728, 6824, 1704, 5800, 3752, 7848, 424, 4520, 2472, 6568, 1448, 5544, 3496, 7592, 936, 5032, 2984, 7080, 1960, 6056, 4008, 8104, 104, 4200, 2152, 6248, 1128, 5224, 3176, 7272, 616, 4712, 2664, 6760, 1640, 5736, 3688, 7784, 360, 4456, 2408, 6504, 1384, 5480, 3432, 7528, 872, 4968, 2920, 7016, 1896, 5992, 3944, 8040, 232, 4328, 2280, 6376, 1256, 5352, 3304, 7400, 744, 4840, 2792, 6888, 1768, 5864, 3816, 7912, 488, 4584, 2536, 6632, 1512, 5608, 3560, 7656, 1000, 5096, 3048, 7144, 2024, 6120, 4072, 8168, 24, 4120, 2072, 6168, 1048, 5144, 3096, 7192, 536, 4632, 2584, 6680, 1560, 5656, 3608, 7704, 280, 4376, 2328, 6424, 1304, 5400, 3352, 7448, 792, 4888, 2840, 6936, 1816, 5912, 3864, 7960, 152, 4248, 2200, 6296, 1176, 5272, 3224, 7320, 664, 4760, 2712, 6808, 1688, 5784, 3736, 7832, 408, 4504, 2456, 6552, 1432, 5528, 3480, 7576, 920, 5016, 2968, 7064, 1944, 6040, 3992, 8088, 88, 4184, 2136, 6232, 1112, 5208, 3160, 7256, 600, 4696, 2648, 6744, 1624, 5720, 3672, 7768, 344, 4440, 2392, 6488, 1368, 5464, 3416, 7512, 856, 4952, 2904, 7000, 1880, 5976, 3928, 8024, 216, 4312, 2264, 6360, 1240, 5336, 3288, 7384, 728, 4824, 2776, 6872, 1752, 5848, 3800, 7896, 472, 4568, 2520, 6616, 1496, 5592, 3544, 7640, 984, 5080, 3032, 7128, 2008, 6104, 4056, 8152, 56, 4152, 2104, 6200, 1080, 5176, 3128, 7224, 568, 4664, 2616, 6712, 1592, 5688, 3640, 7736, 312, 4408, 2360, 6456, 1336, 5432, 3384, 7480, 824, 4920, 2872, 6968, 1848, 5944, 3896, 7992, 184, 4280, 2232, 6328, 1208, 5304, 3256, 7352, 696, 4792, 2744, 6840, 1720, 5816, 3768, 7864, 440, 4536, 2488, 6584, 1464, 5560, 3512, 7608, 952, 5048, 3000, 7096, 1976, 6072, 4024, 8120, 120, 4216, 2168, 6264, 1144, 5240, 3192, 7288, 632, 4728, 2680, 6776, 1656, 5752, 3704, 7800, 376, 4472, 2424, 6520, 1400, 5496, 3448, 7544, 888, 4984, 2936, 7032, 1912, 6008, 3960, 8056, 248, 4344, 2296, 6392, 1272, 5368, 3320, 7416, 760, 4856, 2808, 6904, 1784, 5880, 3832, 7928, 504, 4600, 2552, 6648, 1528, 5624, 3576, 7672, 1016, 5112, 3064, 7160, 2040, 6136, 4088, 8184, 4, 4100, 2052, 6148, 1028, 5124, 3076, 7172, 516, 4612, 2564, 6660, 1540, 5636, 3588, 7684, 260, 4356, 2308, 6404, 1284, 5380, 3332, 7428, 772, 4868, 2820, 6916, 1796, 5892, 3844, 7940, 132, 4228, 2180, 6276, 1156, 5252, 3204, 7300, 644, 4740, 2692, 6788, 1668, 5764, 3716, 7812, 388, 4484, 2436, 6532, 1412, 5508, 3460, 7556, 900, 4996, 2948, 7044, 1924, 6020, 3972, 8068, 68, 4164, 2116, 6212, 1092, 5188, 3140, 7236, 580, 4676, 2628, 6724, 1604, 5700, 3652, 7748, 324, 4420, 2372, 6468, 1348, 5444, 3396, 7492, 836, 4932, 2884, 6980, 1860, 5956, 3908, 8004, 196, 4292, 2244, 6340, 1220, 5316, 3268, 7364, 708, 4804, 2756, 6852, 1732, 5828, 3780, 7876, 452, 4548, 2500, 6596, 1476, 5572, 3524, 7620, 964, 5060, 3012, 7108, 1988, 6084, 4036, 8132, 36, 4132, 2084, 6180, 1060, 5156, 3108, 7204, 548, 4644, 2596, 6692, 1572, 5668, 3620, 7716, 292, 4388, 2340, 6436, 1316, 5412, 3364, 7460, 804, 4900, 2852, 6948, 1828, 5924, 3876, 7972, 164, 4260, 2212, 6308, 1188, 5284, 3236, 7332, 676, 4772, 2724, 6820, 1700, 5796, 3748, 7844, 420, 4516, 2468, 6564, 1444, 5540, 3492, 7588, 932, 5028, 2980, 7076, 1956, 6052, 4004, 8100, 100, 4196, 2148, 6244, 1124, 5220, 3172, 7268, 612, 4708, 2660, 6756, 1636, 5732, 3684, 7780, 356, 4452, 2404, 6500, 1380, 5476, 3428, 7524, 868, 4964, 2916, 7012, 1892, 5988, 3940, 8036, 228, 4324, 2276, 6372, 1252, 5348, 3300, 7396, 740, 4836, 2788, 6884, 1764, 5860, 3812, 7908, 484, 4580, 2532, 6628, 1508, 5604, 3556, 7652, 996, 5092, 3044, 7140, 2020, 6116, 4068, 8164, 20, 4116, 2068, 6164, 1044, 5140, 3092, 7188, 532, 4628, 2580, 6676, 1556, 5652, 3604, 7700, 276, 4372, 2324, 6420, 1300, 5396, 3348, 7444, 788, 4884, 2836, 6932, 1812, 5908, 3860, 7956, 148, 4244, 2196, 6292, 1172, 5268, 3220, 7316, 660, 4756, 2708, 6804, 1684, 5780, 3732, 7828, 404, 4500, 2452, 6548, 1428, 5524, 3476, 7572, 916, 5012, 2964, 7060, 1940, 6036, 3988, 8084, 84, 4180, 2132, 6228, 1108, 5204, 3156, 7252, 596, 4692, 2644, 6740, 1620, 5716, 3668, 7764, 340, 4436, 2388, 6484, 1364, 5460, 3412, 7508, 852, 4948, 2900, 6996, 1876, 5972, 3924, 8020, 212, 4308, 2260, 6356, 1236, 5332, 3284, 7380, 724, 4820, 2772, 6868, 1748, 5844, 3796, 7892, 468, 4564, 2516, 6612, 1492, 5588, 3540, 7636, 980, 5076, 3028, 7124, 2004, 6100, 4052, 8148, 52, 4148, 2100, 6196, 1076, 5172, 3124, 7220, 564, 4660, 2612, 6708, 1588, 5684, 3636, 7732, 308, 4404, 2356, 6452, 1332, 5428, 3380, 7476, 820, 4916, 2868, 6964, 1844, 5940, 3892, 7988, 180, 4276, 2228, 6324, 1204, 5300, 3252, 7348, 692, 4788, 2740, 6836, 1716, 5812, 3764, 7860, 436, 4532, 2484, 6580, 1460, 5556, 3508, 7604, 948, 5044, 2996, 7092, 1972, 6068, 4020, 8116, 116, 4212, 2164, 6260, 1140, 5236, 3188, 7284, 628, 4724, 2676, 6772, 1652, 5748, 3700, 7796, 372, 4468, 2420, 6516, 1396, 5492, 3444, 7540, 884, 4980, 2932, 7028, 1908, 6004, 3956, 8052, 244, 4340, 2292, 6388, 1268, 5364, 3316, 7412, 756, 4852, 2804, 6900, 1780, 5876, 3828, 7924, 500, 4596, 2548, 6644, 1524, 5620, 3572, 7668, 1012, 5108, 3060, 7156, 2036, 6132, 4084, 8180, 12, 4108, 2060, 6156, 1036, 5132, 3084, 7180, 524, 4620, 2572, 6668, 1548, 5644, 3596, 7692, 268, 4364, 2316, 6412, 1292, 5388, 3340, 7436, 780, 4876, 2828, 6924, 1804, 5900, 3852, 7948, 140, 4236, 2188, 6284, 1164, 5260, 3212, 7308, 652, 4748, 2700, 6796, 1676, 5772, 3724, 7820, 396, 4492, 2444, 6540, 1420, 5516, 3468, 7564, 908, 5004, 2956, 7052, 1932, 6028, 3980, 8076, 76, 4172, 2124, 6220, 1100, 5196, 3148, 7244, 588, 4684, 2636, 6732, 1612, 5708, 3660, 7756, 332, 4428, 2380, 6476, 1356, 5452, 3404, 7500, 844, 4940, 2892, 6988, 1868, 5964, 3916, 8012, 204, 4300, 2252, 6348, 1228, 5324, 3276, 7372, 716, 4812, 2764, 6860, 1740, 5836, 3788, 7884, 460, 4556, 2508, 6604, 1484, 5580, 3532, 7628, 972, 5068, 3020, 7116, 1996, 6092, 4044, 8140, 44, 4140, 2092, 6188, 1068, 5164, 3116, 7212, 556, 4652, 2604, 6700, 1580, 5676, 3628, 7724, 300, 4396, 2348, 6444, 1324, 5420, 3372, 7468, 812, 4908, 2860, 6956, 1836, 5932, 3884, 7980, 172, 4268, 2220, 6316, 1196, 5292, 3244, 7340, 684, 4780, 2732, 6828, 1708, 5804, 3756, 7852, 428, 4524, 2476, 6572, 1452, 5548, 3500, 7596, 940, 5036, 2988, 7084, 1964, 6060, 4012, 8108, 108, 4204, 2156, 6252, 1132, 5228, 3180, 7276, 620, 4716, 2668, 6764, 1644, 5740, 3692, 7788, 364, 4460, 2412, 6508, 1388, 5484, 3436, 7532, 876, 4972, 2924, 7020, 1900, 5996, 3948, 8044, 236, 4332, 2284, 6380, 1260, 5356, 3308, 7404, 748, 4844, 2796, 6892, 1772, 5868, 3820, 7916, 492, 4588, 2540, 6636, 1516, 5612, 3564, 7660, 1004, 5100, 3052, 7148, 2028, 6124, 4076, 8172, 28, 4124, 2076, 6172, 1052, 5148, 3100, 7196, 540, 4636, 2588, 6684, 1564, 5660, 3612, 7708, 284, 4380, 2332, 6428, 1308, 5404, 3356, 7452, 796, 4892, 2844, 6940, 1820, 5916, 3868, 7964, 156, 4252, 2204, 6300, 1180, 5276, 3228, 7324, 668, 4764, 2716, 6812, 1692, 5788, 3740, 7836, 412, 4508, 2460, 6556, 1436, 5532, 3484, 7580, 924, 5020, 2972, 7068, 1948, 6044, 3996, 8092, 92, 4188, 2140, 6236, 1116, 5212, 3164, 7260, 604, 4700, 2652, 6748, 1628, 5724, 3676, 7772, 348, 4444, 2396, 6492, 1372, 5468, 3420, 7516, 860, 4956, 2908, 7004, 1884, 5980, 3932, 8028, 220, 4316, 2268, 6364, 1244, 5340, 3292, 7388, 732, 4828, 2780, 6876, 1756, 5852, 3804, 7900, 476, 4572, 2524, 6620, 1500, 5596, 3548, 7644, 988, 5084, 3036, 7132, 2012, 6108, 4060, 8156, 60, 4156, 2108, 6204, 1084, 5180, 3132, 7228, 572, 4668, 2620, 6716, 1596, 5692, 3644, 7740, 316, 4412, 2364, 6460, 1340, 5436, 3388, 7484, 828, 4924, 2876, 6972, 1852, 5948, 3900, 7996, 188, 4284, 2236, 6332, 1212, 5308, 3260, 7356, 700, 4796, 2748, 6844, 1724, 5820, 3772, 7868, 444, 4540, 2492, 6588, 1468, 5564, 3516, 7612, 956, 5052, 3004, 7100, 1980, 6076, 4028, 8124, 124, 4220, 2172, 6268, 1148, 5244, 3196, 7292, 636, 4732, 2684, 6780, 1660, 5756, 3708, 7804, 380, 4476, 2428, 6524, 1404, 5500, 3452, 7548, 892, 4988, 2940, 7036, 1916, 6012, 3964, 8060, 252, 4348, 2300, 6396, 1276, 5372, 3324, 7420, 764, 4860, 2812, 6908, 1788, 5884, 3836, 7932, 508, 4604, 2556, 6652, 1532, 5628, 3580, 7676, 1020, 5116, 3068, 7164, 2044, 6140, 4092, 8188, 2, 4098, 2050, 6146, 1026, 5122, 3074, 7170, 514, 4610, 2562, 6658, 1538, 5634, 3586, 7682, 258, 4354, 2306, 6402, 1282, 5378, 3330, 7426, 770, 4866, 2818, 6914, 1794, 5890, 3842, 7938, 130, 4226, 2178, 6274, 1154, 5250, 3202, 7298, 642, 4738, 2690, 6786, 1666, 5762, 3714, 7810, 386, 4482, 2434, 6530, 1410, 5506, 3458, 7554, 898, 4994, 2946, 7042, 1922, 6018, 3970, 8066, 66, 4162, 2114, 6210, 1090, 5186, 3138, 7234, 578, 4674, 2626, 6722, 1602, 5698, 3650, 7746, 322, 4418, 2370, 6466, 1346, 5442, 3394, 7490, 834, 4930, 2882, 6978, 1858, 5954, 3906, 8002, 194, 4290, 2242, 6338, 1218, 5314, 3266, 7362, 706, 4802, 2754, 6850, 1730, 5826, 3778, 7874, 450, 4546, 2498, 6594, 1474, 5570, 3522, 7618, 962, 5058, 3010, 7106, 1986, 6082, 4034, 8130, 34, 4130, 2082, 6178, 1058, 5154, 3106, 7202, 546, 4642, 2594, 6690, 1570, 5666, 3618, 7714, 290, 4386, 2338, 6434, 1314, 5410, 3362, 7458, 802, 4898, 2850, 6946, 1826, 5922, 3874, 7970, 162, 4258, 2210, 6306, 1186, 5282, 3234, 7330, 674, 4770, 2722, 6818, 1698, 5794, 3746, 7842, 418, 4514, 2466, 6562, 1442, 5538, 3490, 7586, 930, 5026, 2978, 7074, 1954, 6050, 4002, 8098, 98, 4194, 2146, 6242, 1122, 5218, 3170, 7266, 610, 4706, 2658, 6754, 1634, 5730, 3682, 7778, 354, 4450, 2402, 6498, 1378, 5474, 3426, 7522, 866, 4962, 2914, 7010, 1890, 5986, 3938, 8034, 226, 4322, 2274, 6370, 1250, 5346, 3298, 7394, 738, 4834, 2786, 6882, 1762, 5858, 3810, 7906, 482, 4578, 2530, 6626, 1506, 5602, 3554, 7650, 994, 5090, 3042, 7138, 2018, 6114, 4066, 8162, 18, 4114, 2066, 6162, 1042, 5138, 3090, 7186, 530, 4626, 2578, 6674, 1554, 5650, 3602, 7698, 274, 4370, 2322, 6418, 1298, 5394, 3346, 7442, 786, 4882, 2834, 6930, 1810, 5906, 3858, 7954, 146, 4242, 2194, 6290, 1170, 5266, 3218, 7314, 658, 4754, 2706, 6802, 1682, 5778, 3730, 7826, 402, 4498, 2450, 6546, 1426, 5522, 3474, 7570, 914, 5010, 2962, 7058, 1938, 6034, 3986, 8082, 82, 4178, 2130, 6226, 1106, 5202, 3154, 7250, 594, 4690, 2642, 6738, 1618, 5714, 3666, 7762, 338, 4434, 2386, 6482, 1362, 5458, 3410, 7506, 850, 4946, 2898, 6994, 1874, 5970, 3922, 8018, 210, 4306, 2258, 6354, 1234, 5330, 3282, 7378, 722, 4818, 2770, 6866, 1746, 5842, 3794, 7890, 466, 4562, 2514, 6610, 1490, 5586, 3538, 7634, 978, 5074, 3026, 7122, 2002, 6098, 4050, 8146, 50, 4146, 2098, 6194, 1074, 5170, 3122, 7218, 562, 4658, 2610, 6706, 1586, 5682, 3634, 7730, 306, 4402, 2354, 6450, 1330, 5426, 3378, 7474, 818, 4914, 2866, 6962, 1842, 5938, 3890, 7986, 178, 4274, 2226, 6322, 1202, 5298, 3250, 7346, 690, 4786, 2738, 6834, 1714, 5810, 3762, 7858, 434, 4530, 2482, 6578, 1458, 5554, 3506, 7602, 946, 5042, 2994, 7090, 1970, 6066, 4018, 8114, 114, 4210, 2162, 6258, 1138, 5234, 3186, 7282, 626, 4722, 2674, 6770, 1650, 5746, 3698, 7794, 370, 4466, 2418, 6514, 1394, 5490, 3442, 7538, 882, 4978, 2930, 7026, 1906, 6002, 3954, 8050, 242, 4338, 2290, 6386, 1266, 5362, 3314, 7410, 754, 4850, 2802, 6898, 1778, 5874, 3826, 7922, 498, 4594, 2546, 6642, 1522, 5618, 3570, 7666, 1010, 5106, 3058, 7154, 2034, 6130, 4082, 8178, 10, 4106, 2058, 6154, 1034, 5130, 3082, 7178, 522, 4618, 2570, 6666, 1546, 5642, 3594, 7690, 266, 4362, 2314, 6410, 1290, 5386, 3338, 7434, 778, 4874, 2826, 6922, 1802, 5898, 3850, 7946, 138, 4234, 2186, 6282, 1162, 5258, 3210, 7306, 650, 4746, 2698, 6794, 1674, 5770, 3722, 7818, 394, 4490, 2442, 6538, 1418, 5514, 3466, 7562, 906, 5002, 2954, 7050, 1930, 6026, 3978, 8074, 74, 4170, 2122, 6218, 1098, 5194, 3146, 7242, 586, 4682, 2634, 6730, 1610, 5706, 3658, 7754, 330, 4426, 2378, 6474, 1354, 5450, 3402, 7498, 842, 4938, 2890, 6986, 1866, 5962, 3914, 8010, 202, 4298, 2250, 6346, 1226, 5322, 3274, 7370, 714, 4810, 2762, 6858, 1738, 5834, 3786, 7882, 458, 4554, 2506, 6602, 1482, 5578, 3530, 7626, 970, 5066, 3018, 7114, 1994, 6090, 4042, 8138, 42, 4138, 2090, 6186, 1066, 5162, 3114, 7210, 554, 4650, 2602, 6698, 1578, 5674, 3626, 7722, 298, 4394, 2346, 6442, 1322, 5418, 3370, 7466, 810, 4906, 2858, 6954, 1834, 5930, 3882, 7978, 170, 4266, 2218, 6314, 1194, 5290, 3242, 7338, 682, 4778, 2730, 6826, 1706, 5802, 3754, 7850, 426, 4522, 2474, 6570, 1450, 5546, 3498, 7594, 938, 5034, 2986, 7082, 1962, 6058, 4010, 8106, 106, 4202, 2154, 6250, 1130, 5226, 3178, 7274, 618, 4714, 2666, 6762, 1642, 5738, 3690, 7786, 362, 4458, 2410, 6506, 1386, 5482, 3434, 7530, 874, 4970, 2922, 7018, 1898, 5994, 3946, 8042, 234, 4330, 2282, 6378, 1258, 5354, 3306, 7402, 746, 4842, 2794, 6890, 1770, 5866, 3818, 7914, 490, 4586, 2538, 6634, 1514, 5610, 3562, 7658, 1002, 5098, 3050, 7146, 2026, 6122, 4074, 8170, 26, 4122, 2074, 6170, 1050, 5146, 3098, 7194, 538, 4634, 2586, 6682, 1562, 5658, 3610, 7706, 282, 4378, 2330, 6426, 1306, 5402, 3354, 7450, 794, 4890, 2842, 6938, 1818, 5914, 3866, 7962, 154, 4250, 2202, 6298, 1178, 5274, 3226, 7322, 666, 4762, 2714, 6810, 1690, 5786, 3738, 7834, 410, 4506, 2458, 6554, 1434, 5530, 3482, 7578, 922, 5018, 2970, 7066, 1946, 6042, 3994, 8090, 90, 4186, 2138, 6234, 1114, 5210, 3162, 7258, 602, 4698, 2650, 6746, 1626, 5722, 3674, 7770, 346, 4442, 2394, 6490, 1370, 5466, 3418, 7514, 858, 4954, 2906, 7002, 1882, 5978, 3930, 8026, 218, 4314, 2266, 6362, 1242, 5338, 3290, 7386, 730, 4826, 2778, 6874, 1754, 5850, 3802, 7898, 474, 4570, 2522, 6618, 1498, 5594, 3546, 7642, 986, 5082, 3034, 7130, 2010, 6106, 4058, 8154, 58, 4154, 2106, 6202, 1082, 5178, 3130, 7226, 570, 4666, 2618, 6714, 1594, 5690, 3642, 7738, 314, 4410, 2362, 6458, 1338, 5434, 3386, 7482, 826, 4922, 2874, 6970, 1850, 5946, 3898, 7994, 186, 4282, 2234, 6330, 1210, 5306, 3258, 7354, 698, 4794, 2746, 6842, 1722, 5818, 3770, 7866, 442, 4538, 2490, 6586, 1466, 5562, 3514, 7610, 954, 5050, 3002, 7098, 1978, 6074, 4026, 8122, 122, 4218, 2170, 6266, 1146, 5242, 3194, 7290, 634, 4730, 2682, 6778, 1658, 5754, 3706, 7802, 378, 4474, 2426, 6522, 1402, 5498, 3450, 7546, 890, 4986, 2938, 7034, 1914, 6010, 3962, 8058, 250, 4346, 2298, 6394, 1274, 5370, 3322, 7418, 762, 4858, 2810, 6906, 1786, 5882, 3834, 7930, 506, 4602, 2554, 6650, 1530, 5626, 3578, 7674, 1018, 5114, 3066, 7162, 2042, 6138, 4090, 8186, 6, 4102, 2054, 6150, 1030, 5126, 3078, 7174, 518, 4614, 2566, 6662, 1542, 5638, 3590, 7686, 262, 4358, 2310, 6406, 1286, 5382, 3334, 7430, 774, 4870, 2822, 6918, 1798, 5894, 3846, 7942, 134, 4230, 2182, 6278, 1158, 5254, 3206, 7302, 646, 4742, 2694, 6790, 1670, 5766, 3718, 7814, 390, 4486, 2438, 6534, 1414, 5510, 3462, 7558, 902, 4998, 2950, 7046, 1926, 6022, 3974, 8070, 70, 4166, 2118, 6214, 1094, 5190, 3142, 7238, 582, 4678, 2630, 6726, 1606, 5702, 3654, 7750, 326, 4422, 2374, 6470, 1350, 5446, 3398, 7494, 838, 4934, 2886, 6982, 1862, 5958, 3910, 8006, 198, 4294, 2246, 6342, 1222, 5318, 3270, 7366, 710, 4806, 2758, 6854, 1734, 5830, 3782, 7878, 454, 4550, 2502, 6598, 1478, 5574, 3526, 7622, 966, 5062, 3014, 7110, 1990, 6086, 4038, 8134, 38, 4134, 2086, 6182, 1062, 5158, 3110, 7206, 550, 4646, 2598, 6694, 1574, 5670, 3622, 7718, 294, 4390, 2342, 6438, 1318, 5414, 3366, 7462, 806, 4902, 2854, 6950, 1830, 5926, 3878, 7974, 166, 4262, 2214, 6310, 1190, 5286, 3238, 7334, 678, 4774, 2726, 6822, 1702, 5798, 3750, 7846, 422, 4518, 2470, 6566, 1446, 5542, 3494, 7590, 934, 5030, 2982, 7078, 1958, 6054, 4006, 8102, 102, 4198, 2150, 6246, 1126, 5222, 3174, 7270, 614, 4710, 2662, 6758, 1638, 5734, 3686, 7782, 358, 4454, 2406, 6502, 1382, 5478, 3430, 7526, 870, 4966, 2918, 7014, 1894, 5990, 3942, 8038, 230, 4326, 2278, 6374, 1254, 5350, 3302, 7398, 742, 4838, 2790, 6886, 1766, 5862, 3814, 7910, 486, 4582, 2534, 6630, 1510, 5606, 3558, 7654, 998, 5094, 3046, 7142, 2022, 6118, 4070, 8166, 22, 4118, 2070, 6166, 1046, 5142, 3094, 7190, 534, 4630, 2582, 6678, 1558, 5654, 3606, 7702, 278, 4374, 2326, 6422, 1302, 5398, 3350, 7446, 790, 4886, 2838, 6934, 1814, 5910, 3862, 7958, 150, 4246, 2198, 6294, 1174, 5270, 3222, 7318, 662, 4758, 2710, 6806, 1686, 5782, 3734, 7830, 406, 4502, 2454, 6550, 1430, 5526, 3478, 7574, 918, 5014, 2966, 7062, 1942, 6038, 3990, 8086, 86, 4182, 2134, 6230, 1110, 5206, 3158, 7254, 598, 4694, 2646, 6742, 1622, 5718, 3670, 7766, 342, 4438, 2390, 6486, 1366, 5462, 3414, 7510, 854, 4950, 2902, 6998, 1878, 5974, 3926, 8022, 214, 4310, 2262, 6358, 1238, 5334, 3286, 7382, 726, 4822, 2774, 6870, 1750, 5846, 3798, 7894, 470, 4566, 2518, 6614, 1494, 5590, 3542, 7638, 982, 5078, 3030, 7126, 2006, 6102, 4054, 8150, 54, 4150, 2102, 6198, 1078, 5174, 3126, 7222, 566, 4662, 2614, 6710, 1590, 5686, 3638, 7734, 310, 4406, 2358, 6454, 1334, 5430, 3382, 7478, 822, 4918, 2870, 6966, 1846, 5942, 3894, 7990, 182, 4278, 2230, 6326, 1206, 5302, 3254, 7350, 694, 4790, 2742, 6838, 1718, 5814, 3766, 7862, 438, 4534, 2486, 6582, 1462, 5558, 3510, 7606, 950, 5046, 2998, 7094, 1974, 6070, 4022, 8118, 118, 4214, 2166, 6262, 1142, 5238, 3190, 7286, 630, 4726, 2678, 6774, 1654, 5750, 3702, 7798, 374, 4470, 2422, 6518, 1398, 5494, 3446, 7542, 886, 4982, 2934, 7030, 1910, 6006, 3958, 8054, 246, 4342, 2294, 6390, 1270, 5366, 3318, 7414, 758, 4854, 2806, 6902, 1782, 5878, 3830, 7926, 502, 4598, 2550, 6646, 1526, 5622, 3574, 7670, 1014, 5110, 3062, 7158, 2038, 6134, 4086, 8182, 14, 4110, 2062, 6158, 1038, 5134, 3086, 7182, 526, 4622, 2574, 6670, 1550, 5646, 3598, 7694, 270, 4366, 2318, 6414, 1294, 5390, 3342, 7438, 782, 4878, 2830, 6926, 1806, 5902, 3854, 7950, 142, 4238, 2190, 6286, 1166, 5262, 3214, 7310, 654, 4750, 2702, 6798, 1678, 5774, 3726, 7822, 398, 4494, 2446, 6542, 1422, 5518, 3470, 7566, 910, 5006, 2958, 7054, 1934, 6030, 3982, 8078, 78, 4174, 2126, 6222, 1102, 5198, 3150, 7246, 590, 4686, 2638, 6734, 1614, 5710, 3662, 7758, 334, 4430, 2382, 6478, 1358, 5454, 3406, 7502, 846, 4942, 2894, 6990, 1870, 5966, 3918, 8014, 206, 4302, 2254, 6350, 1230, 5326, 3278, 7374, 718, 4814, 2766, 6862, 1742, 5838, 3790, 7886, 462, 4558, 2510, 6606, 1486, 5582, 3534, 7630, 974, 5070, 3022, 7118, 1998, 6094, 4046, 8142, 46, 4142, 2094, 6190, 1070, 5166, 3118, 7214, 558, 4654, 2606, 6702, 1582, 5678, 3630, 7726, 302, 4398, 2350, 6446, 1326, 5422, 3374, 7470, 814, 4910, 2862, 6958, 1838, 5934, 3886, 7982, 174, 4270, 2222, 6318, 1198, 5294, 3246, 7342, 686, 4782, 2734, 6830, 1710, 5806, 3758, 7854, 430, 4526, 2478, 6574, 1454, 5550, 3502, 7598, 942, 5038, 2990, 7086, 1966, 6062, 4014, 8110, 110, 4206, 2158, 6254, 1134, 5230, 3182, 7278, 622, 4718, 2670, 6766, 1646, 5742, 3694, 7790, 366, 4462, 2414, 6510, 1390, 5486, 3438, 7534, 878, 4974, 2926, 7022, 1902, 5998, 3950, 8046, 238, 4334, 2286, 6382, 1262, 5358, 3310, 7406, 750, 4846, 2798, 6894, 1774, 5870, 3822, 7918, 494, 4590, 2542, 6638, 1518, 5614, 3566, 7662, 1006, 5102, 3054, 7150, 2030, 6126, 4078, 8174, 30, 4126, 2078, 6174, 1054, 5150, 3102, 7198, 542, 4638, 2590, 6686, 1566, 5662, 3614, 7710, 286, 4382, 2334, 6430, 1310, 5406, 3358, 7454, 798, 4894, 2846, 6942, 1822, 5918, 3870, 7966, 158, 4254, 2206, 6302, 1182, 5278, 3230, 7326, 670, 4766, 2718, 6814, 1694, 5790, 3742, 7838, 414, 4510, 2462, 6558, 1438, 5534, 3486, 7582, 926, 5022, 2974, 7070, 1950, 6046, 3998, 8094, 94, 4190, 2142, 6238, 1118, 5214, 3166, 7262, 606, 4702, 2654, 6750, 1630, 5726, 3678, 7774, 350, 4446, 2398, 6494, 1374, 5470, 3422, 7518, 862, 4958, 2910, 7006, 1886, 5982, 3934, 8030, 222, 4318, 2270, 6366, 1246, 5342, 3294, 7390, 734, 4830, 2782, 6878, 1758, 5854, 3806, 7902, 478, 4574, 2526, 6622, 1502, 5598, 3550, 7646, 990, 5086, 3038, 7134, 2014, 6110, 4062, 8158, 62, 4158, 2110, 6206, 1086, 5182, 3134, 7230, 574, 4670, 2622, 6718, 1598, 5694, 3646, 7742, 318, 4414, 2366, 6462, 1342, 5438, 3390, 7486, 830, 4926, 2878, 6974, 1854, 5950, 3902, 7998, 190, 4286, 2238, 6334, 1214, 5310, 3262, 7358, 702, 4798, 2750, 6846, 1726, 5822, 3774, 7870, 446, 4542, 2494, 6590, 1470, 5566, 3518, 7614, 958, 5054, 3006, 7102, 1982, 6078, 4030, 8126, 126, 4222, 2174, 6270, 1150, 5246, 3198, 7294, 638, 4734, 2686, 6782, 1662, 5758, 3710, 7806, 382, 4478, 2430, 6526, 1406, 5502, 3454, 7550, 894, 4990, 2942, 7038, 1918, 6014, 3966, 8062, 254, 4350, 2302, 6398, 1278, 5374, 3326, 7422, 766, 4862, 2814, 6910, 1790, 5886, 3838, 7934, 510, 4606, 2558, 6654, 1534, 5630, 3582, 7678, 1022, 5118, 3070, 7166, 2046, 6142, 4094, 8190, 1, 4097, 2049, 6145, 1025, 5121, 3073, 7169, 513, 4609, 2561, 6657, 1537, 5633, 3585, 7681, 257, 4353, 2305, 6401, 1281, 5377, 3329, 7425, 769, 4865, 2817, 6913, 1793, 5889, 3841, 7937, 129, 4225, 2177, 6273, 1153, 5249, 3201, 7297, 641, 4737, 2689, 6785, 1665, 5761, 3713, 7809, 385, 4481, 2433, 6529, 1409, 5505, 3457, 7553, 897, 4993, 2945, 7041, 1921, 6017, 3969, 8065, 65, 4161, 2113, 6209, 1089, 5185, 3137, 7233, 577, 4673, 2625, 6721, 1601, 5697, 3649, 7745, 321, 4417, 2369, 6465, 1345, 5441, 3393, 7489, 833, 4929, 2881, 6977, 1857, 5953, 3905, 8001, 193, 4289, 2241, 6337, 1217, 5313, 3265, 7361, 705, 4801, 2753, 6849, 1729, 5825, 3777, 7873, 449, 4545, 2497, 6593, 1473, 5569, 3521, 7617, 961, 5057, 3009, 7105, 1985, 6081, 4033, 8129, 33, 4129, 2081, 6177, 1057, 5153, 3105, 7201, 545, 4641, 2593, 6689, 1569, 5665, 3617, 7713, 289, 4385, 2337, 6433, 1313, 5409, 3361, 7457, 801, 4897, 2849, 6945, 1825, 5921, 3873, 7969, 161, 4257, 2209, 6305, 1185, 5281, 3233, 7329, 673, 4769, 2721, 6817, 1697, 5793, 3745, 7841, 417, 4513, 2465, 6561, 1441, 5537, 3489, 7585, 929, 5025, 2977, 7073, 1953, 6049, 4001, 8097, 97, 4193, 2145, 6241, 1121, 5217, 3169, 7265, 609, 4705, 2657, 6753, 1633, 5729, 3681, 7777, 353, 4449, 2401, 6497, 1377, 5473, 3425, 7521, 865, 4961, 2913, 7009, 1889, 5985, 3937, 8033, 225, 4321, 2273, 6369, 1249, 5345, 3297, 7393, 737, 4833, 2785, 6881, 1761, 5857, 3809, 7905, 481, 4577, 2529, 6625, 1505, 5601, 3553, 7649, 993, 5089, 3041, 7137, 2017, 6113, 4065, 8161, 17, 4113, 2065, 6161, 1041, 5137, 3089, 7185, 529, 4625, 2577, 6673, 1553, 5649, 3601, 7697, 273, 4369, 2321, 6417, 1297, 5393, 3345, 7441, 785, 4881, 2833, 6929, 1809, 5905, 3857, 7953, 145, 4241, 2193, 6289, 1169, 5265, 3217, 7313, 657, 4753, 2705, 6801, 1681, 5777, 3729, 7825, 401, 4497, 2449, 6545, 1425, 5521, 3473, 7569, 913, 5009, 2961, 7057, 1937, 6033, 3985, 8081, 81, 4177, 2129, 6225, 1105, 5201, 3153, 7249, 593, 4689, 2641, 6737, 1617, 5713, 3665, 7761, 337, 4433, 2385, 6481, 1361, 5457, 3409, 7505, 849, 4945, 2897, 6993, 1873, 5969, 3921, 8017, 209, 4305, 2257, 6353, 1233, 5329, 3281, 7377, 721, 4817, 2769, 6865, 1745, 5841, 3793, 7889, 465, 4561, 2513, 6609, 1489, 5585, 3537, 7633, 977, 5073, 3025, 7121, 2001, 6097, 4049, 8145, 49, 4145, 2097, 6193, 1073, 5169, 3121, 7217, 561, 4657, 2609, 6705, 1585, 5681, 3633, 7729, 305, 4401, 2353, 6449, 1329, 5425, 3377, 7473, 817, 4913, 2865, 6961, 1841, 5937, 3889, 7985, 177, 4273, 2225, 6321, 1201, 5297, 3249, 7345, 689, 4785, 2737, 6833, 1713, 5809, 3761, 7857, 433, 4529, 2481, 6577, 1457, 5553, 3505, 7601, 945, 5041, 2993, 7089, 1969, 6065, 4017, 8113, 113, 4209, 2161, 6257, 1137, 5233, 3185, 7281, 625, 4721, 2673, 6769, 1649, 5745, 3697, 7793, 369, 4465, 2417, 6513, 1393, 5489, 3441, 7537, 881, 4977, 2929, 7025, 1905, 6001, 3953, 8049, 241, 4337, 2289, 6385, 1265, 5361, 3313, 7409, 753, 4849, 2801, 6897, 1777, 5873, 3825, 7921, 497, 4593, 2545, 6641, 1521, 5617, 3569, 7665, 1009, 5105, 3057, 7153, 2033, 6129, 4081, 8177, 9, 4105, 2057, 6153, 1033, 5129, 3081, 7177, 521, 4617, 2569, 6665, 1545, 5641, 3593, 7689, 265, 4361, 2313, 6409, 1289, 5385, 3337, 7433, 777, 4873, 2825, 6921, 1801, 5897, 3849, 7945, 137, 4233, 2185, 6281, 1161, 5257, 3209, 7305, 649, 4745, 2697, 6793, 1673, 5769, 3721, 7817, 393, 4489, 2441, 6537, 1417, 5513, 3465, 7561, 905, 5001, 2953, 7049, 1929, 6025, 3977, 8073, 73, 4169, 2121, 6217, 1097, 5193, 3145, 7241, 585, 4681, 2633, 6729, 1609, 5705, 3657, 7753, 329, 4425, 2377, 6473, 1353, 5449, 3401, 7497, 841, 4937, 2889, 6985, 1865, 5961, 3913, 8009, 201, 4297, 2249, 6345, 1225, 5321, 3273, 7369, 713, 4809, 2761, 6857, 1737, 5833, 3785, 7881, 457, 4553, 2505, 6601, 1481, 5577, 3529, 7625, 969, 5065, 3017, 7113, 1993, 6089, 4041, 8137, 41, 4137, 2089, 6185, 1065, 5161, 3113, 7209, 553, 4649, 2601, 6697, 1577, 5673, 3625, 7721, 297, 4393, 2345, 6441, 1321, 5417, 3369, 7465, 809, 4905, 2857, 6953, 1833, 5929, 3881, 7977, 169, 4265, 2217, 6313, 1193, 5289, 3241, 7337, 681, 4777, 2729, 6825, 1705, 5801, 3753, 7849, 425, 4521, 2473, 6569, 1449, 5545, 3497, 7593, 937, 5033, 2985, 7081, 1961, 6057, 4009, 8105, 105, 4201, 2153, 6249, 1129, 5225, 3177, 7273, 617, 4713, 2665, 6761, 1641, 5737, 3689, 7785, 361, 4457, 2409, 6505, 1385, 5481, 3433, 7529, 873, 4969, 2921, 7017, 1897, 5993, 3945, 8041, 233, 4329, 2281, 6377, 1257, 5353, 3305, 7401, 745, 4841, 2793, 6889, 1769, 5865, 3817, 7913, 489, 4585, 2537, 6633, 1513, 5609, 3561, 7657, 1001, 5097, 3049, 7145, 2025, 6121, 4073, 8169, 25, 4121, 2073, 6169, 1049, 5145, 3097, 7193, 537, 4633, 2585, 6681, 1561, 5657, 3609, 7705, 281, 4377, 2329, 6425, 1305, 5401, 3353, 7449, 793, 4889, 2841, 6937, 1817, 5913, 3865, 7961, 153, 4249, 2201, 6297, 1177, 5273, 3225, 7321, 665, 4761, 2713, 6809, 1689, 5785, 3737, 7833, 409, 4505, 2457, 6553, 1433, 5529, 3481, 7577, 921, 5017, 2969, 7065, 1945, 6041, 3993, 8089, 89, 4185, 2137, 6233, 1113, 5209, 3161, 7257, 601, 4697, 2649, 6745, 1625, 5721, 3673, 7769, 345, 4441, 2393, 6489, 1369, 5465, 3417, 7513, 857, 4953, 2905, 7001, 1881, 5977, 3929, 8025, 217, 4313, 2265, 6361, 1241, 5337, 3289, 7385, 729, 4825, 2777, 6873, 1753, 5849, 3801, 7897, 473, 4569, 2521, 6617, 1497, 5593, 3545, 7641, 985, 5081, 3033, 7129, 2009, 6105, 4057, 8153, 57, 4153, 2105, 6201, 1081, 5177, 3129, 7225, 569, 4665, 2617, 6713, 1593, 5689, 3641, 7737, 313, 4409, 2361, 6457, 1337, 5433, 3385, 7481, 825, 4921, 2873, 6969, 1849, 5945, 3897, 7993, 185, 4281, 2233, 6329, 1209, 5305, 3257, 7353, 697, 4793, 2745, 6841, 1721, 5817, 3769, 7865, 441, 4537, 2489, 6585, 1465, 5561, 3513, 7609, 953, 5049, 3001, 7097, 1977, 6073, 4025, 8121, 121, 4217, 2169, 6265, 1145, 5241, 3193, 7289, 633, 4729, 2681, 6777, 1657, 5753, 3705, 7801, 377, 4473, 2425, 6521, 1401, 5497, 3449, 7545, 889, 4985, 2937, 7033, 1913, 6009, 3961, 8057, 249, 4345, 2297, 6393, 1273, 5369, 3321, 7417, 761, 4857, 2809, 6905, 1785, 5881, 3833, 7929, 505, 4601, 2553, 6649, 1529, 5625, 3577, 7673, 1017, 5113, 3065, 7161, 2041, 6137, 4089, 8185, 5, 4101, 2053, 6149, 1029, 5125, 3077, 7173, 517, 4613, 2565, 6661, 1541, 5637, 3589, 7685, 261, 4357, 2309, 6405, 1285, 5381, 3333, 7429, 773, 4869, 2821, 6917, 1797, 5893, 3845, 7941, 133, 4229, 2181, 6277, 1157, 5253, 3205, 7301, 645, 4741, 2693, 6789, 1669, 5765, 3717, 7813, 389, 4485, 2437, 6533, 1413, 5509, 3461, 7557, 901, 4997, 2949, 7045, 1925, 6021, 3973, 8069, 69, 4165, 2117, 6213, 1093, 5189, 3141, 7237, 581, 4677, 2629, 6725, 1605, 5701, 3653, 7749, 325, 4421, 2373, 6469, 1349, 5445, 3397, 7493, 837, 4933, 2885, 6981, 1861, 5957, 3909, 8005, 197, 4293, 2245, 6341, 1221, 5317, 3269, 7365, 709, 4805, 2757, 6853, 1733, 5829, 3781, 7877, 453, 4549, 2501, 6597, 1477, 5573, 3525, 7621, 965, 5061, 3013, 7109, 1989, 6085, 4037, 8133, 37, 4133, 2085, 6181, 1061, 5157, 3109, 7205, 549, 4645, 2597, 6693, 1573, 5669, 3621, 7717, 293, 4389, 2341, 6437, 1317, 5413, 3365, 7461, 805, 4901, 2853, 6949, 1829, 5925, 3877, 7973, 165, 4261, 2213, 6309, 1189, 5285, 3237, 7333, 677, 4773, 2725, 6821, 1701, 5797, 3749, 7845, 421, 4517, 2469, 6565, 1445, 5541, 3493, 7589, 933, 5029, 2981, 7077, 1957, 6053, 4005, 8101, 101, 4197, 2149, 6245, 1125, 5221, 3173, 7269, 613, 4709, 2661, 6757, 1637, 5733, 3685, 7781, 357, 4453, 2405, 6501, 1381, 5477, 3429, 7525, 869, 4965, 2917, 7013, 1893, 5989, 3941, 8037, 229, 4325, 2277, 6373, 1253, 5349, 3301, 7397, 741, 4837, 2789, 6885, 1765, 5861, 3813, 7909, 485, 4581, 2533, 6629, 1509, 5605, 3557, 7653, 997, 5093, 3045, 7141, 2021, 6117, 4069, 8165, 21, 4117, 2069, 6165, 1045, 5141, 3093, 7189, 533, 4629, 2581, 6677, 1557, 5653, 3605, 7701, 277, 4373, 2325, 6421, 1301, 5397, 3349, 7445, 789, 4885, 2837, 6933, 1813, 5909, 3861, 7957, 149, 4245, 2197, 6293, 1173, 5269, 3221, 7317, 661, 4757, 2709, 6805, 1685, 5781, 3733, 7829, 405, 4501, 2453, 6549, 1429, 5525, 3477, 7573, 917, 5013, 2965, 7061, 1941, 6037, 3989, 8085, 85, 4181, 2133, 6229, 1109, 5205, 3157, 7253, 597, 4693, 2645, 6741, 1621, 5717, 3669, 7765, 341, 4437, 2389, 6485, 1365, 5461, 3413, 7509, 853, 4949, 2901, 6997, 1877, 5973, 3925, 8021, 213, 4309, 2261, 6357, 1237, 5333, 3285, 7381, 725, 4821, 2773, 6869, 1749, 5845, 3797, 7893, 469, 4565, 2517, 6613, 1493, 5589, 3541, 7637, 981, 5077, 3029, 7125, 2005, 6101, 4053, 8149, 53, 4149, 2101, 6197, 1077, 5173, 3125, 7221, 565, 4661, 2613, 6709, 1589, 5685, 3637, 7733, 309, 4405, 2357, 6453, 1333, 5429, 3381, 7477, 821, 4917, 2869, 6965, 1845, 5941, 3893, 7989, 181, 4277, 2229, 6325, 1205, 5301, 3253, 7349, 693, 4789, 2741, 6837, 1717, 5813, 3765, 7861, 437, 4533, 2485, 6581, 1461, 5557, 3509, 7605, 949, 5045, 2997, 7093, 1973, 6069, 4021, 8117, 117, 4213, 2165, 6261, 1141, 5237, 3189, 7285, 629, 4725, 2677, 6773, 1653, 5749, 3701, 7797, 373, 4469, 2421, 6517, 1397, 5493, 3445, 7541, 885, 4981, 2933, 7029, 1909, 6005, 3957, 8053, 245, 4341, 2293, 6389, 1269, 5365, 3317, 7413, 757, 4853, 2805, 6901, 1781, 5877, 3829, 7925, 501, 4597, 2549, 6645, 1525, 5621, 3573, 7669, 1013, 5109, 3061, 7157, 2037, 6133, 4085, 8181, 13, 4109, 2061, 6157, 1037, 5133, 3085, 7181, 525, 4621, 2573, 6669, 1549, 5645, 3597, 7693, 269, 4365, 2317, 6413, 1293, 5389, 3341, 7437, 781, 4877, 2829, 6925, 1805, 5901, 3853, 7949, 141, 4237, 2189, 6285, 1165, 5261, 3213, 7309, 653, 4749, 2701, 6797, 1677, 5773, 3725, 7821, 397, 4493, 2445, 6541, 1421, 5517, 3469, 7565, 909, 5005, 2957, 7053, 1933, 6029, 3981, 8077, 77, 4173, 2125, 6221, 1101, 5197, 3149, 7245, 589, 4685, 2637, 6733, 1613, 5709, 3661, 7757, 333, 4429, 2381, 6477, 1357, 5453, 3405, 7501, 845, 4941, 2893, 6989, 1869, 5965, 3917, 8013, 205, 4301, 2253, 6349, 1229, 5325, 3277, 7373, 717, 4813, 2765, 6861, 1741, 5837, 3789, 7885, 461, 4557, 2509, 6605, 1485, 5581, 3533, 7629, 973, 5069, 3021, 7117, 1997, 6093, 4045, 8141, 45, 4141, 2093, 6189, 1069, 5165, 3117, 7213, 557, 4653, 2605, 6701, 1581, 5677, 3629, 7725, 301, 4397, 2349, 6445, 1325, 5421, 3373, 7469, 813, 4909, 2861, 6957, 1837, 5933, 3885, 7981, 173, 4269, 2221, 6317, 1197, 5293, 3245, 7341, 685, 4781, 2733, 6829, 1709, 5805, 3757, 7853, 429, 4525, 2477, 6573, 1453, 5549, 3501, 7597, 941, 5037, 2989, 7085, 1965, 6061, 4013, 8109, 109, 4205, 2157, 6253, 1133, 5229, 3181, 7277, 621, 4717, 2669, 6765, 1645, 5741, 3693, 7789, 365, 4461, 2413, 6509, 1389, 5485, 3437, 7533, 877, 4973, 2925, 7021, 1901, 5997, 3949, 8045, 237, 4333, 2285, 6381, 1261, 5357, 3309, 7405, 749, 4845, 2797, 6893, 1773, 5869, 3821, 7917, 493, 4589, 2541, 6637, 1517, 5613, 3565, 7661, 1005, 5101, 3053, 7149, 2029, 6125, 4077, 8173, 29, 4125, 2077, 6173, 1053, 5149, 3101, 7197, 541, 4637, 2589, 6685, 1565, 5661, 3613, 7709, 285, 4381, 2333, 6429, 1309, 5405, 3357, 7453, 797, 4893, 2845, 6941, 1821, 5917, 3869, 7965, 157, 4253, 2205, 6301, 1181, 5277, 3229, 7325, 669, 4765, 2717, 6813, 1693, 5789, 3741, 7837, 413, 4509, 2461, 6557, 1437, 5533, 3485, 7581, 925, 5021, 2973, 7069, 1949, 6045, 3997, 8093, 93, 4189, 2141, 6237, 1117, 5213, 3165, 7261, 605, 4701, 2653, 6749, 1629, 5725, 3677, 7773, 349, 4445, 2397, 6493, 1373, 5469, 3421, 7517, 861, 4957, 2909, 7005, 1885, 5981, 3933, 8029, 221, 4317, 2269, 6365, 1245, 5341, 3293, 7389, 733, 4829, 2781, 6877, 1757, 5853, 3805, 7901, 477, 4573, 2525, 6621, 1501, 5597, 3549, 7645, 989, 5085, 3037, 7133, 2013, 6109, 4061, 8157, 61, 4157, 2109, 6205, 1085, 5181, 3133, 7229, 573, 4669, 2621, 6717, 1597, 5693, 3645, 7741, 317, 4413, 2365, 6461, 1341, 5437, 3389, 7485, 829, 4925, 2877, 6973, 1853, 5949, 3901, 7997, 189, 4285, 2237, 6333, 1213, 5309, 3261, 7357, 701, 4797, 2749, 6845, 1725, 5821, 3773, 7869, 445, 4541, 2493, 6589, 1469, 5565, 3517, 7613, 957, 5053, 3005, 7101, 1981, 6077, 4029, 8125, 125, 4221, 2173, 6269, 1149, 5245, 3197, 7293, 637, 4733, 2685, 6781, 1661, 5757, 3709, 7805, 381, 4477, 2429, 6525, 1405, 5501, 3453, 7549, 893, 4989, 2941, 7037, 1917, 6013, 3965, 8061, 253, 4349, 2301, 6397, 1277, 5373, 3325, 7421, 765, 4861, 2813, 6909, 1789, 5885, 3837, 7933, 509, 4605, 2557, 6653, 1533, 5629, 3581, 7677, 1021, 5117, 3069, 7165, 2045, 6141, 4093, 8189, 3, 4099, 2051, 6147, 1027, 5123, 3075, 7171, 515, 4611, 2563, 6659, 1539, 5635, 3587, 7683, 259, 4355, 2307, 6403, 1283, 5379, 3331, 7427, 771, 4867, 2819, 6915, 1795, 5891, 3843, 7939, 131, 4227, 2179, 6275, 1155, 5251, 3203, 7299, 643, 4739, 2691, 6787, 1667, 5763, 3715, 7811, 387, 4483, 2435, 6531, 1411, 5507, 3459, 7555, 899, 4995, 2947, 7043, 1923, 6019, 3971, 8067, 67, 4163, 2115, 6211, 1091, 5187, 3139, 7235, 579, 4675, 2627, 6723, 1603, 5699, 3651, 7747, 323, 4419, 2371, 6467, 1347, 5443, 3395, 7491, 835, 4931, 2883, 6979, 1859, 5955, 3907, 8003, 195, 4291, 2243, 6339, 1219, 5315, 3267, 7363, 707, 4803, 2755, 6851, 1731, 5827, 3779, 7875, 451, 4547, 2499, 6595, 1475, 5571, 3523, 7619, 963, 5059, 3011, 7107, 1987, 6083, 4035, 8131, 35, 4131, 2083, 6179, 1059, 5155, 3107, 7203, 547, 4643, 2595, 6691, 1571, 5667, 3619, 7715, 291, 4387, 2339, 6435, 1315, 5411, 3363, 7459, 803, 4899, 2851, 6947, 1827, 5923, 3875, 7971, 163, 4259, 2211, 6307, 1187, 5283, 3235, 7331, 675, 4771, 2723, 6819, 1699, 5795, 3747, 7843, 419, 4515, 2467, 6563, 1443, 5539, 3491, 7587, 931, 5027, 2979, 7075, 1955, 6051, 4003, 8099, 99, 4195, 2147, 6243, 1123, 5219, 3171, 7267, 611, 4707, 2659, 6755, 1635, 5731, 3683, 7779, 355, 4451, 2403, 6499, 1379, 5475, 3427, 7523, 867, 4963, 2915, 7011, 1891, 5987, 3939, 8035, 227, 4323, 2275, 6371, 1251, 5347, 3299, 7395, 739, 4835, 2787, 6883, 1763, 5859, 3811, 7907, 483, 4579, 2531, 6627, 1507, 5603, 3555, 7651, 995, 5091, 3043, 7139, 2019, 6115, 4067, 8163, 19, 4115, 2067, 6163, 1043, 5139, 3091, 7187, 531, 4627, 2579, 6675, 1555, 5651, 3603, 7699, 275, 4371, 2323, 6419, 1299, 5395, 3347, 7443, 787, 4883, 2835, 6931, 1811, 5907, 3859, 7955, 147, 4243, 2195, 6291, 1171, 5267, 3219, 7315, 659, 4755, 2707, 6803, 1683, 5779, 3731, 7827, 403, 4499, 2451, 6547, 1427, 5523, 3475, 7571, 915, 5011, 2963, 7059, 1939, 6035, 3987, 8083, 83, 4179, 2131, 6227, 1107, 5203, 3155, 7251, 595, 4691, 2643, 6739, 1619, 5715, 3667, 7763, 339, 4435, 2387, 6483, 1363, 5459, 3411, 7507, 851, 4947, 2899, 6995, 1875, 5971, 3923, 8019, 211, 4307, 2259, 6355, 1235, 5331, 3283, 7379, 723, 4819, 2771, 6867, 1747, 5843, 3795, 7891, 467, 4563, 2515, 6611, 1491, 5587, 3539, 7635, 979, 5075, 3027, 7123, 2003, 6099, 4051, 8147, 51, 4147, 2099, 6195, 1075, 5171, 3123, 7219, 563, 4659, 2611, 6707, 1587, 5683, 3635, 7731, 307, 4403, 2355, 6451, 1331, 5427, 3379, 7475, 819, 4915, 2867, 6963, 1843, 5939, 3891, 7987, 179, 4275, 2227, 6323, 1203, 5299, 3251, 7347, 691, 4787, 2739, 6835, 1715, 5811, 3763, 7859, 435, 4531, 2483, 6579, 1459, 5555, 3507, 7603, 947, 5043, 2995, 7091, 1971, 6067, 4019, 8115, 115, 4211, 2163, 6259, 1139, 5235, 3187, 7283, 627, 4723, 2675, 6771, 1651, 5747, 3699, 7795, 371, 4467, 2419, 6515, 1395, 5491, 3443, 7539, 883, 4979, 2931, 7027, 1907, 6003, 3955, 8051, 243, 4339, 2291, 6387, 1267, 5363, 3315, 7411, 755, 4851, 2803, 6899, 1779, 5875, 3827, 7923, 499, 4595, 2547, 6643, 1523, 5619, 3571, 7667, 1011, 5107, 3059, 7155, 2035, 6131, 4083, 8179, 11, 4107, 2059, 6155, 1035, 5131, 3083, 7179, 523, 4619, 2571, 6667, 1547, 5643, 3595, 7691, 267, 4363, 2315, 6411, 1291, 5387, 3339, 7435, 779, 4875, 2827, 6923, 1803, 5899, 3851, 7947, 139, 4235, 2187, 6283, 1163, 5259, 3211, 7307, 651, 4747, 2699, 6795, 1675, 5771, 3723, 7819, 395, 4491, 2443, 6539, 1419, 5515, 3467, 7563, 907, 5003, 2955, 7051, 1931, 6027, 3979, 8075, 75, 4171, 2123, 6219, 1099, 5195, 3147, 7243, 587, 4683, 2635, 6731, 1611, 5707, 3659, 7755, 331, 4427, 2379, 6475, 1355, 5451, 3403, 7499, 843, 4939, 2891, 6987, 1867, 5963, 3915, 8011, 203, 4299, 2251, 6347, 1227, 5323, 3275, 7371, 715, 4811, 2763, 6859, 1739, 5835, 3787, 7883, 459, 4555, 2507, 6603, 1483, 5579, 3531, 7627, 971, 5067, 3019, 7115, 1995, 6091, 4043, 8139, 43, 4139, 2091, 6187, 1067, 5163, 3115, 7211, 555, 4651, 2603, 6699, 1579, 5675, 3627, 7723, 299, 4395, 2347, 6443, 1323, 5419, 3371, 7467, 811, 4907, 2859, 6955, 1835, 5931, 3883, 7979, 171, 4267, 2219, 6315, 1195, 5291, 3243, 7339, 683, 4779, 2731, 6827, 1707, 5803, 3755, 7851, 427, 4523, 2475, 6571, 1451, 5547, 3499, 7595, 939, 5035, 2987, 7083, 1963, 6059, 4011, 8107, 107, 4203, 2155, 6251, 1131, 5227, 3179, 7275, 619, 4715, 2667, 6763, 1643, 5739, 3691, 7787, 363, 4459, 2411, 6507, 1387, 5483, 3435, 7531, 875, 4971, 2923, 7019, 1899, 5995, 3947, 8043, 235, 4331, 2283, 6379, 1259, 5355, 3307, 7403, 747, 4843, 2795, 6891, 1771, 5867, 3819, 7915, 491, 4587, 2539, 6635, 1515, 5611, 3563, 7659, 1003, 5099, 3051, 7147, 2027, 6123, 4075, 8171, 27, 4123, 2075, 6171, 1051, 5147, 3099, 7195, 539, 4635, 2587, 6683, 1563, 5659, 3611, 7707, 283, 4379, 2331, 6427, 1307, 5403, 3355, 7451, 795, 4891, 2843, 6939, 1819, 5915, 3867, 7963, 155, 4251, 2203, 6299, 1179, 5275, 3227, 7323, 667, 4763, 2715, 6811, 1691, 5787, 3739, 7835, 411, 4507, 2459, 6555, 1435, 5531, 3483, 7579, 923, 5019, 2971, 7067, 1947, 6043, 3995, 8091, 91, 4187, 2139, 6235, 1115, 5211, 3163, 7259, 603, 4699, 2651, 6747, 1627, 5723, 3675, 7771, 347, 4443, 2395, 6491, 1371, 5467, 3419, 7515, 859, 4955, 2907, 7003, 1883, 5979, 3931, 8027, 219, 4315, 2267, 6363, 1243, 5339, 3291, 7387, 731, 4827, 2779, 6875, 1755, 5851, 3803, 7899, 475, 4571, 2523, 6619, 1499, 5595, 3547, 7643, 987, 5083, 3035, 7131, 2011, 6107, 4059, 8155, 59, 4155, 2107, 6203, 1083, 5179, 3131, 7227, 571, 4667, 2619, 6715, 1595, 5691, 3643, 7739, 315, 4411, 2363, 6459, 1339, 5435, 3387, 7483, 827, 4923, 2875, 6971, 1851, 5947, 3899, 7995, 187, 4283, 2235, 6331, 1211, 5307, 3259, 7355, 699, 4795, 2747, 6843, 1723, 5819, 3771, 7867, 443, 4539, 2491, 6587, 1467, 5563, 3515, 7611, 955, 5051, 3003, 7099, 1979, 6075, 4027, 8123, 123, 4219, 2171, 6267, 1147, 5243, 3195, 7291, 635, 4731, 2683, 6779, 1659, 5755, 3707, 7803, 379, 4475, 2427, 6523, 1403, 5499, 3451, 7547, 891, 4987, 2939, 7035, 1915, 6011, 3963, 8059, 251, 4347, 2299, 6395, 1275, 5371, 3323, 7419, 763, 4859, 2811, 6907, 1787, 5883, 3835, 7931, 507, 4603, 2555, 6651, 1531, 5627, 3579, 7675, 1019, 5115, 3067, 7163, 2043, 6139, 4091, 8187, 7, 4103, 2055, 6151, 1031, 5127, 3079, 7175, 519, 4615, 2567, 6663, 1543, 5639, 3591, 7687, 263, 4359, 2311, 6407, 1287, 5383, 3335, 7431, 775, 4871, 2823, 6919, 1799, 5895, 3847, 7943, 135, 4231, 2183, 6279, 1159, 5255, 3207, 7303, 647, 4743, 2695, 6791, 1671, 5767, 3719, 7815, 391, 4487, 2439, 6535, 1415, 5511, 3463, 7559, 903, 4999, 2951, 7047, 1927, 6023, 3975, 8071, 71, 4167, 2119, 6215, 1095, 5191, 3143, 7239, 583, 4679, 2631, 6727, 1607, 5703, 3655, 7751, 327, 4423, 2375, 6471, 1351, 5447, 3399, 7495, 839, 4935, 2887, 6983, 1863, 5959, 3911, 8007, 199, 4295, 2247, 6343, 1223, 5319, 3271, 7367, 711, 4807, 2759, 6855, 1735, 5831, 3783, 7879, 455, 4551, 2503, 6599, 1479, 5575, 3527, 7623, 967, 5063, 3015, 7111, 1991, 6087, 4039, 8135, 39, 4135, 2087, 6183, 1063, 5159, 3111, 7207, 551, 4647, 2599, 6695, 1575, 5671, 3623, 7719, 295, 4391, 2343, 6439, 1319, 5415, 3367, 7463, 807, 4903, 2855, 6951, 1831, 5927, 3879, 7975, 167, 4263, 2215, 6311, 1191, 5287, 3239, 7335, 679, 4775, 2727, 6823, 1703, 5799, 3751, 7847, 423, 4519, 2471, 6567, 1447, 5543, 3495, 7591, 935, 5031, 2983, 7079, 1959, 6055, 4007, 8103, 103, 4199, 2151, 6247, 1127, 5223, 3175, 7271, 615, 4711, 2663, 6759, 1639, 5735, 3687, 7783, 359, 4455, 2407, 6503, 1383, 5479, 3431, 7527, 871, 4967, 2919, 7015, 1895, 5991, 3943, 8039, 231, 4327, 2279, 6375, 1255, 5351, 3303, 7399, 743, 4839, 2791, 6887, 1767, 5863, 3815, 7911, 487, 4583, 2535, 6631, 1511, 5607, 3559, 7655, 999, 5095, 3047, 7143, 2023, 6119, 4071, 8167, 23, 4119, 2071, 6167, 1047, 5143, 3095, 7191, 535, 4631, 2583, 6679, 1559, 5655, 3607, 7703, 279, 4375, 2327, 6423, 1303, 5399, 3351, 7447, 791, 4887, 2839, 6935, 1815, 5911, 3863, 7959, 151, 4247, 2199, 6295, 1175, 5271, 3223, 7319, 663, 4759, 2711, 6807, 1687, 5783, 3735, 7831, 407, 4503, 2455, 6551, 1431, 5527, 3479, 7575, 919, 5015, 2967, 7063, 1943, 6039, 3991, 8087, 87, 4183, 2135, 6231, 1111, 5207, 3159, 7255, 599, 4695, 2647, 6743, 1623, 5719, 3671, 7767, 343, 4439, 2391, 6487, 1367, 5463, 3415, 7511, 855, 4951, 2903, 6999, 1879, 5975, 3927, 8023, 215, 4311, 2263, 6359, 1239, 5335, 3287, 7383, 727, 4823, 2775, 6871, 1751, 5847, 3799, 7895, 471, 4567, 2519, 6615, 1495, 5591, 3543, 7639, 983, 5079, 3031, 7127, 2007, 6103, 4055, 8151, 55, 4151, 2103, 6199, 1079, 5175, 3127, 7223, 567, 4663, 2615, 6711, 1591, 5687, 3639, 7735, 311, 4407, 2359, 6455, 1335, 5431, 3383, 7479, 823, 4919, 2871, 6967, 1847, 5943, 3895, 7991, 183, 4279, 2231, 6327, 1207, 5303, 3255, 7351, 695, 4791, 2743, 6839, 1719, 5815, 3767, 7863, 439, 4535, 2487, 6583, 1463, 5559, 3511, 7607, 951, 5047, 2999, 7095, 1975, 6071, 4023, 8119, 119, 4215, 2167, 6263, 1143, 5239, 3191, 7287, 631, 4727, 2679, 6775, 1655, 5751, 3703, 7799, 375, 4471, 2423, 6519, 1399, 5495, 3447, 7543, 887, 4983, 2935, 7031, 1911, 6007, 3959, 8055, 247, 4343, 2295, 6391, 1271, 5367, 3319, 7415, 759, 4855, 2807, 6903, 1783, 5879, 3831, 7927, 503, 4599, 2551, 6647, 1527, 5623, 3575, 7671, 1015, 5111, 3063, 7159, 2039, 6135, 4087, 8183, 15, 4111, 2063, 6159, 1039, 5135, 3087, 7183, 527, 4623, 2575, 6671, 1551, 5647, 3599, 7695, 271, 4367, 2319, 6415, 1295, 5391, 3343, 7439, 783, 4879, 2831, 6927, 1807, 5903, 3855, 7951, 143, 4239, 2191, 6287, 1167, 5263, 3215, 7311, 655, 4751, 2703, 6799, 1679, 5775, 3727, 7823, 399, 4495, 2447, 6543, 1423, 5519, 3471, 7567, 911, 5007, 2959, 7055, 1935, 6031, 3983, 8079, 79, 4175, 2127, 6223, 1103, 5199, 3151, 7247, 591, 4687, 2639, 6735, 1615, 5711, 3663, 7759, 335, 4431, 2383, 6479, 1359, 5455, 3407, 7503, 847, 4943, 2895, 6991, 1871, 5967, 3919, 8015, 207, 4303, 2255, 6351, 1231, 5327, 3279, 7375, 719, 4815, 2767, 6863, 1743, 5839, 3791, 7887, 463, 4559, 2511, 6607, 1487, 5583, 3535, 7631, 975, 5071, 3023, 7119, 1999, 6095, 4047, 8143, 47, 4143, 2095, 6191, 1071, 5167, 3119, 7215, 559, 4655, 2607, 6703, 1583, 5679, 3631, 7727, 303, 4399, 2351, 6447, 1327, 5423, 3375, 7471, 815, 4911, 2863, 6959, 1839, 5935, 3887, 7983, 175, 4271, 2223, 6319, 1199, 5295, 3247, 7343, 687, 4783, 2735, 6831, 1711, 5807, 3759, 7855, 431, 4527, 2479, 6575, 1455, 5551, 3503, 7599, 943, 5039, 2991, 7087, 1967, 6063, 4015, 8111, 111, 4207, 2159, 6255, 1135, 5231, 3183, 7279, 623, 4719, 2671, 6767, 1647, 5743, 3695, 7791, 367, 4463, 2415, 6511, 1391, 5487, 3439, 7535, 879, 4975, 2927, 7023, 1903, 5999, 3951, 8047, 239, 4335, 2287, 6383, 1263, 5359, 3311, 7407, 751, 4847, 2799, 6895, 1775, 5871, 3823, 7919, 495, 4591, 2543, 6639, 1519, 5615, 3567, 7663, 1007, 5103, 3055, 7151, 2031, 6127, 4079, 8175, 31, 4127, 2079, 6175, 1055, 5151, 3103, 7199, 543, 4639, 2591, 6687, 1567, 5663, 3615, 7711, 287, 4383, 2335, 6431, 1311, 5407, 3359, 7455, 799, 4895, 2847, 6943, 1823, 5919, 3871, 7967, 159, 4255, 2207, 6303, 1183, 5279, 3231, 7327, 671, 4767, 2719, 6815, 1695, 5791, 3743, 7839, 415, 4511, 2463, 6559, 1439, 5535, 3487, 7583, 927, 5023, 2975, 7071, 1951, 6047, 3999, 8095, 95, 4191, 2143, 6239, 1119, 5215, 3167, 7263, 607, 4703, 2655, 6751, 1631, 5727, 3679, 7775, 351, 4447, 2399, 6495, 1375, 5471, 3423, 7519, 863, 4959, 2911, 7007, 1887, 5983, 3935, 8031, 223, 4319, 2271, 6367, 1247, 5343, 3295, 7391, 735, 4831, 2783, 6879, 1759, 5855, 3807, 7903, 479, 4575, 2527, 6623, 1503, 5599, 3551, 7647, 991, 5087, 3039, 7135, 2015, 6111, 4063, 8159, 63, 4159, 2111, 6207, 1087, 5183, 3135, 7231, 575, 4671, 2623, 6719, 1599, 5695, 3647, 7743, 319, 4415, 2367, 6463, 1343, 5439, 3391, 7487, 831, 4927, 2879, 6975, 1855, 5951, 3903, 7999, 191, 4287, 2239, 6335, 1215, 5311, 3263, 7359, 703, 4799, 2751, 6847, 1727, 5823, 3775, 7871, 447, 4543, 2495, 6591, 1471, 5567, 3519, 7615, 959, 5055, 3007, 7103, 1983, 6079, 4031, 8127, 127, 4223, 2175, 6271, 1151, 5247, 3199, 7295, 639, 4735, 2687, 6783, 1663, 5759, 3711, 7807, 383, 4479, 2431, 6527, 1407, 5503, 3455, 7551, 895, 4991, 2943, 7039, 1919, 6015, 3967, 8063, 255, 4351, 2303, 6399, 1279, 5375, 3327, 7423, 767, 4863, 2815, 6911, 1791, 5887, 3839, 7935, 511, 4607, 2559, 6655, 1535, 5631, 3583, 7679, 1023, 5119, 3071, 7167, 2047, 6143, 4095, 8191].

When N=8192, a sequence 1a is the sequence 1, a sequence 2a is the sequence 2, and a sequence 3a is the sequence 3.

When N=4096:

A sequence 1b is as follows:

Shorten_Q=[0, 2048, 1024, 3072, 512, 2560, 1536, 3584, 256, 2304, 1280, 3328, 768, 2816, 1792, 3840, 128, 2176, 1152, 3200, 640, 2688, 1664, 3712, 384, 2432, 1408, 3456, 896, 2944, 1920, 3968, 64, 2112, 1088, 3136, 576, 2624, 1600, 3648, 320, 2368, 1344, 3392, 832, 2880, 1856, 3904, 192, 2240, 1216, 3264, 704, 2752, 1728, 3776, 448, 2496, 1472, 3520, 960, 3008, 1984, 4032, 32, 2080, 1056, 3104, 544, 2592, 1568, 3616, 288, 2336, 1312, 3360, 800, 2848, 1824, 3872, 160, 2208, 1184, 3232, 672, 2720, 1696, 3744, 416, 2464, 1440, 3488, 928, 2976, 1952, 4000, 96, 2144, 1120, 3168, 608, 2656, 1632, 3680, 352, 2400, 1376, 3424, 864, 2912, 1888, 3936, 224, 2272, 1248, 3296, 736, 2784, 1760, 3808, 480, 2528, 1504, 3552, 992, 3040, 2016, 4064, 16, 2064, 1040, 3088, 528, 2576, 1552, 3600, 272, 2320, 1296, 3344, 784, 2832, 1808, 3856, 144, 2192, 1168, 3216, 656, 2704, 1680, 3728, 400, 2448, 1424, 3472, 912, 2960, 1936, 3984, 80, 2128, 1104, 3152, 592, 2640, 1616, 3664, 336, 2384, 1360, 3408, 848, 2896, 1872, 3920, 208, 2256, 1232, 3280, 720, 2768, 1744, 3792, 464, 2512, 1488, 3536, 976, 3024, 2000, 4048, 48, 2096, 1072, 3120, 560, 2608, 1584, 3632, 304, 2352, 1328, 3376, 816, 2864, 1840, 3888, 176, 2224, 1200, 3248, 688, 2736, 1712, 3760, 432, 2480, 1456, 3504, 944, 2992, 1968, 4016, 112, 2160, 1136, 3184, 624, 2672, 1648, 3696, 368, 2416, 1392, 3440, 880, 2928, 1904, 3952, 240, 2288, 1264, 3312, 752, 2800, 1776, 3824, 496, 2544, 1520, 3568, 1008, 3056, 2032, 4080, 8, 2056, 1032, 3080, 520, 2568, 1544, 3592, 264, 2312, 1288, 3336, 776, 2824, 1800, 3848, 136, 2184, 1160, 3208, 648, 2696, 1672, 3720, 392, 2440, 1416, 3464, 904, 2952, 1928, 3976, 72, 2120, 1096, 3144, 584, 2632, 1608, 3656, 328, 2376, 1352, 3400, 840, 2888, 1864, 3912, 200, 2248, 1224, 3272, 712, 2760, 1736, 3784, 456, 2504, 1480, 3528, 968, 3016, 1992, 4040, 40, 2088, 1064, 3112, 552, 2600, 1576, 3624, 296, 2344, 1320, 3368, 808, 2856, 1832, 3880, 168, 2216, 1192, 3240, 680, 2728, 1704, 3752, 424, 2472, 1448, 3496, 936, 2984, 1960, 4008, 104, 2152, 1128, 3176, 616, 2664, 1640, 3688, 360, 2408, 1384, 3432, 872, 2920, 1896, 3944, 232, 2280, 1256, 3304, 744, 2792, 1768, 3816, 488, 2536, 1512, 3560, 1000, 3048, 2024, 4072, 24, 2072, 1048, 3096, 536, 2584, 1560, 3608, 280, 2328, 1304, 3352, 792, 2840, 1816, 3864, 152, 2200, 1176, 3224, 664, 2712, 1688, 3736, 408, 2456, 1432, 3480, 920, 2968, 1944, 3992, 88, 2136, 1112, 3160, 600, 2648, 1624, 3672, 344, 2392, 1368, 3416, 856, 2904, 1880, 3928, 216, 2264, 1240, 3288, 728, 2776, 1752, 3800, 472, 2520, 1496, 3544, 984, 3032, 2008, 4056, 56, 2104, 1080, 3128, 568, 2616, 1592, 3640, 312, 2360, 1336, 3384, 824, 2872, 1848, 3896, 184, 2232, 1208, 3256, 696, 2744, 1720, 3768, 440, 2488, 1464, 3512, 952, 3000, 1976, 4024, 120, 2168, 1144, 3192, 632, 2680, 1656, 3704, 376, 2424, 1400, 3448, 888, 2936, 1912, 3960, 248, 2296, 1272, 3320, 760, 2808, 1784, 3832, 504, 2552, 1528, 3576, 1016, 3064, 2040, 4088, 4, 2052, 1028, 3076, 516, 2564, 1540, 3588, 260, 2308, 1284, 3332, 772, 2820, 1796, 3844, 132, 2180, 1156, 3204, 644, 2692, 1668, 3716, 388, 2436, 1412, 3460, 900, 2948, 1924, 3972, 68, 2116, 1092, 3140, 580, 2628, 1604, 3652, 324, 2372, 1348, 3396, 836, 2884, 1860, 3908, 196, 2244, 1220, 3268, 708, 2756, 1732, 3780, 452, 2500, 1476, 3524, 964, 3012, 1988, 4036, 36, 2084, 1060, 3108, 548, 2596, 1572, 3620, 292, 2340, 1316, 3364, 804, 2852, 1828, 3876, 164, 2212, 1188, 3236, 676, 2724, 1700, 3748, 420, 2468, 1444, 3492, 932, 2980, 1956, 4004, 100, 2148, 1124, 3172, 612, 2660, 1636, 3684, 356, 2404, 1380, 3428, 868, 2916, 1892, 3940, 228, 2276, 1252, 3300, 740, 2788, 1764, 3812, 484, 2532, 1508, 3556, 996, 3044, 2020, 4068, 20, 2068, 1044, 3092, 532, 2580, 1556, 3604, 276, 2324, 1300, 3348, 788, 2836, 1812, 3860, 148, 2196, 1172, 3220, 660, 2708, 1684, 3732, 404, 2452, 1428, 3476, 916, 2964, 1940, 3988, 84, 2132, 1108, 3156, 596, 2644, 1620, 3668, 340, 2388, 1364, 3412, 852, 2900, 1876, 3924, 212, 2260, 1236, 3284, 724, 2772, 1748, 3796, 468, 2516, 1492, 3540, 980, 3028, 2004, 4052, 52, 2100, 1076, 3124, 564, 2612, 1588, 3636, 308, 2356, 1332, 3380, 820, 2868, 1844, 3892, 180, 2228, 1204, 3252, 692, 2740, 1716, 3764, 436, 2484, 1460, 3508, 948, 2996, 1972, 4020, 116, 2164, 1140, 3188, 628, 2676, 1652, 3700, 372, 2420, 1396, 3444, 884, 2932, 1908, 3956, 244, 2292, 1268, 3316, 756, 2804, 1780, 3828, 500, 2548, 1524, 3572, 1012, 3060, 2036, 4084, 12, 2060, 1036, 3084, 524, 2572, 1548, 3596, 268, 2316, 1292, 3340, 780, 2828, 1804, 3852, 140, 2188, 1164, 3212, 652, 2700, 1676, 3724, 396, 2444, 1420, 3468, 908, 2956, 1932, 3980, 76, 2124, 1100, 3148, 588, 2636, 1612, 3660, 332, 2380, 1356, 3404, 844, 2892, 1868, 3916, 204, 2252, 1228, 3276, 716, 2764, 1740, 3788, 460, 2508, 1484, 3532, 972, 3020, 1996, 4044, 44, 2092, 1068, 3116, 556, 2604, 1580, 3628, 300, 2348, 1324, 3372, 812, 2860, 1836, 3884, 172, 2220, 1196, 3244, 684, 2732, 1708, 3756, 428, 2476, 1452, 3500, 940, 2988, 1964, 4012, 108, 2156, 1132, 3180, 620, 2668, 1644, 3692, 364, 2412, 1388, 3436, 876, 2924, 1900, 3948, 236, 2284, 1260, 3308, 748, 2796, 1772, 3820, 492, 2540, 1516, 3564, 1004, 3052, 2028, 4076, 28, 2076, 1052, 3100, 540, 2588, 1564, 3612, 284, 2332, 1308, 3356, 796, 2844, 1820, 3868, 156, 2204, 1180, 3228, 668, 2716, 1692, 3740, 412, 2460, 1436, 3484, 924, 2972, 1948, 3996, 92, 2140, 1116, 3164, 604, 2652, 1628, 3676, 348, 2396, 1372, 3420, 860, 2908, 1884, 3932, 220, 2268, 1244, 3292, 732, 2780, 1756, 3804, 476, 2524, 1500, 3548, 988, 3036, 2012, 4060, 60, 2108, 1084, 3132, 572, 2620, 1596, 3644, 316, 2364, 1340, 3388, 828, 2876, 1852, 3900, 188, 2236, 1212, 3260, 700, 2748, 1724, 3772, 444, 2492, 1468, 3516, 956, 3004, 1980, 4028, 124, 2172, 1148, 3196, 636, 2684, 1660, 3708, 380, 2428, 1404, 3452, 892, 2940, 1916, 3964, 252, 2300, 1276, 3324, 764, 2812, 1788, 3836, 508, 2556, 1532, 3580, 1020, 3068, 2044, 4092, 2, 2050, 1026, 3074, 514, 2562, 1538, 3586, 258, 2306, 1282, 3330, 770, 2818, 1794, 3842, 130, 2178, 1154, 3202, 642, 2690, 1666, 3714, 386, 2434, 1410, 3458, 898, 2946, 1922, 3970, 66, 2114, 1090, 3138, 578, 2626, 1602, 3650, 322, 2370, 1346, 3394, 834, 2882, 1858, 3906, 194, 2242, 1218, 3266, 706, 2754, 1730, 3778, 450, 2498, 1474, 3522, 962, 3010, 1986, 4034, 34, 2082, 1058, 3106, 546, 2594, 1570, 3618, 290, 2338, 1314, 3362, 802, 2850, 1826, 3874, 162, 2210, 1186, 3234, 674, 2722, 1698, 3746, 418, 2466, 1442, 3490, 930, 2978, 1954, 4002, 98, 2146, 1122, 3170, 610, 2658, 1634, 3682, 354, 2402, 1378, 3426, 866, 2914, 1890, 3938, 226, 2274, 1250, 3298, 738, 2786, 1762, 3810, 482, 2530, 1506, 3554, 994, 3042, 2018, 4066, 18, 2066, 1042, 3090, 530, 2578, 1554, 3602, 274, 2322, 1298, 3346, 786, 2834, 1810, 3858, 146, 2194, 1170, 3218, 658, 2706, 1682, 3730, 402, 2450, 1426, 3474, 914, 2962, 1938, 3986, 82, 2130, 1106, 3154, 594, 2642, 1618, 3666, 338, 2386, 1362, 3410, 850, 2898, 1874, 3922, 210, 2258, 1234, 3282, 722, 2770, 1746, 3794, 466, 2514, 1490, 3538, 978, 3026, 2002, 4050, 50, 2098, 1074, 3122, 562, 2610, 1586, 3634, 306, 2354, 1330, 3378, 818, 2866, 1842, 3890, 178, 2226, 1202, 3250, 690, 2738, 1714, 3762, 434, 2482, 1458, 3506, 946, 2994, 1970, 4018, 114, 2162, 1138, 3186, 626, 2674, 1650, 3698, 370, 2418, 1394, 3442, 882, 2930, 1906, 3954, 242, 2290, 1266, 3314, 754, 2802, 1778, 3826, 498, 2546, 1522, 3570, 1010, 3058, 2034, 4082, 10, 2058, 1034, 3082, 522, 2570, 1546, 3594, 266, 2314, 1290, 3338, 778, 2826, 1802, 3850, 138, 2186, 1162, 3210, 650, 2698, 1674, 3722, 394, 2442, 1418, 3466, 906, 2954, 1930, 3978, 74, 2122, 1098, 3146, 586, 2634, 1610, 3658, 330, 2378, 1354, 3402, 842, 2890, 1866, 3914, 202, 2250, 1226, 3274, 714, 2762, 1738, 3786, 458, 2506, 1482, 3530, 970, 3018, 1994, 4042, 42, 2090, 1066, 3114, 554, 2602, 1578, 3626, 298, 2346, 1322, 3370, 810, 2858, 1834, 3882, 170, 2218, 1194, 3242, 682, 2730, 1706, 3754, 426, 2474, 1450, 3498, 938, 2986, 1962, 4010, 106, 2154, 1130, 3178, 618, 2666, 1642, 3690, 362, 2410, 1386, 3434, 874, 2922, 1898, 3946, 234, 2282, 1258, 3306, 746, 2794, 1770, 3818, 490, 2538, 1514, 3562, 1002, 3050, 2026, 4074, 26, 2074, 1050, 3098, 538, 2586, 1562, 3610, 282, 2330, 1306, 3354, 794, 2842, 1818, 3866, 154, 2202, 1178, 3226, 666, 2714, 1690, 3738, 410, 2458, 1434, 3482, 922, 2970, 1946, 3994, 90, 2138, 1114, 3162, 602, 2650, 1626, 3674, 346, 2394, 1370, 3418, 858, 2906, 1882, 3930, 218, 2266, 1242, 3290, 730, 2778, 1754, 3802, 474, 2522, 1498, 3546, 986, 3034, 2010, 4058, 58, 2106, 1082, 3130, 570, 2618, 1594, 3642, 314, 2362, 1338, 3386, 826, 2874, 1850, 3898, 186, 2234, 1210, 3258, 698, 2746, 1722, 3770, 442, 2490, 1466, 3514, 954, 3002, 1978, 4026, 122, 2170, 1146, 3194, 634, 2682, 1658, 3706, 378, 2426, 1402, 3450, 890, 2938, 1914, 3962, 250, 2298, 1274, 3322, 762, 2810, 1786, 3834, 506, 2554, 1530, 3578, 1018, 3066, 2042, 4090, 6, 2054, 1030, 3078, 518, 2566, 1542, 3590, 262, 2310, 1286, 3334, 774, 2822, 1798, 3846, 134, 2182, 1158, 3206, 646, 2694, 1670, 3718, 390, 2438, 1414, 3462, 902, 2950, 1926, 3974, 70, 2118, 1094, 3142, 582, 2630, 1606, 3654, 326, 2374, 1350, 3398, 838, 2886, 1862, 3910, 198, 2246, 1222, 3270, 710, 2758, 1734, 3782, 454, 2502, 1478, 3526, 966, 3014, 1990, 4038, 38, 2086, 1062, 3110, 550, 2598, 1574, 3622, 294, 2342, 1318, 3366, 806, 2854, 1830, 3878, 166, 2214, 1190, 3238, 678, 2726, 1702, 3750, 422, 2470, 1446, 3494, 934, 2982, 1958, 4006, 102, 2150, 1126, 3174, 614, 2662, 1638, 3686, 358, 2406, 1382, 3430, 870, 2918, 1894, 3942, 230, 2278, 1254, 3302, 742, 2790, 1766, 3814, 486, 2534, 1510, 3558, 998, 3046, 2022, 4070, 22, 2070, 1046, 3094, 534, 2582, 1558, 3606, 278, 2326, 1302, 3350, 790, 2838, 1814, 3862, 150, 2198, 1174, 3222, 662, 2710, 1686, 3734, 406, 2454, 1430, 3478, 918, 2966, 1942, 3990, 86, 2134, 1110, 3158, 598, 2646, 1622, 3670, 342, 2390, 1366, 3414, 854, 2902, 1878, 3926, 214, 2262, 1238, 3286, 726, 2774, 1750, 3798, 470, 2518, 1494, 3542, 982, 3030, 2006, 4054, 54, 2102, 1078, 3126, 566, 2614, 1590, 3638, 310, 2358, 1334, 3382, 822, 2870, 1846, 3894, 182, 2230, 1206, 3254, 694, 2742, 1718, 3766, 438, 2486, 1462, 3510, 950, 2998, 1974, 4022, 118, 2166, 1142, 3190, 630, 2678, 1654, 3702, 374, 2422, 1398, 3446, 886, 2934, 1910, 3958, 246, 2294, 1270, 3318, 758, 2806, 1782, 3830, 502, 2550, 1526, 3574, 1014, 3062, 2038, 4086, 14, 2062, 1038, 3086, 526, 2574, 1550, 3598, 270, 2318, 1294, 3342, 782, 2830, 1806, 3854, 142, 2190, 1166, 3214, 654, 2702, 1678, 3726, 398, 2446, 1422, 3470, 910, 2958, 1934, 3982, 78, 2126, 1102, 3150, 590, 2638, 1614, 3662, 334, 2382, 1358, 3406, 846, 2894, 1870, 3918, 206, 2254, 1230, 3278, 718, 2766, 1742, 3790, 462, 2510, 1486, 3534, 974, 3022, 1998, 4046, 46, 2094, 1070, 3118, 558, 2606, 1582, 3630, 302, 2350, 1326, 3374, 814, 2862, 1838, 3886, 174, 2222, 1198, 3246, 686, 2734, 1710, 3758, 430, 2478, 1454, 3502, 942, 2990, 1966, 4014, 110, 2158, 1134, 3182, 622, 2670, 1646, 3694, 366, 2414, 1390, 3438, 878, 2926, 1902, 3950, 238, 2286, 1262, 3310, 750, 2798, 1774, 3822, 494, 2542, 1518, 3566, 1006, 3054, 2030, 4078, 30, 2078, 1054, 3102, 542, 2590, 1566, 3614, 286, 2334, 1310, 3358, 798, 2846, 1822, 3870, 158, 2206, 1182, 3230, 670, 2718, 1694, 3742, 414, 2462, 1438, 3486, 926, 2974, 1950, 3998, 94, 2142, 1118, 3166, 606, 2654, 1630, 3678, 350, 2398, 1374, 3422, 862, 2910, 1886, 3934, 222, 2270, 1246, 3294, 734, 2782, 1758, 3806, 478, 2526, 1502, 3550, 990, 3038, 2014, 4062, 62, 2110, 1086, 3134, 574, 2622, 1598, 3646, 318, 2366, 1342, 3390, 830, 2878, 1854, 3902, 190, 2238, 1214, 3262, 702, 2750, 1726, 3774, 446, 2494, 1470, 3518, 958, 3006, 1982, 4030, 126, 2174, 1150, 3198, 638, 2686, 1662, 3710, 382, 2430, 1406, 3454, 894, 2942, 1918, 3966, 254, 2302, 1278, 3326, 766, 2814, 1790, 3838, 510, 2558, 1534, 3582, 1022, 3070, 2046, 4094, 1, 2049, 1025, 3073, 513, 2561, 1537, 3585, 257, 2305, 1281, 3329, 769, 2817, 1793, 3841, 129, 2177, 1153, 3201, 641, 2689, 1665, 3713, 385, 2433, 1409, 3457, 897, 2945, 1921, 3969, 65, 2113, 1089, 3137, 577, 2625, 1601, 3649, 321, 2369, 1345, 3393, 833, 2881, 1857, 3905, 193, 2241, 1217, 3265, 705, 2753, 1729, 3777, 449, 2497, 1473, 3521, 961, 3009, 1985, 4033, 33, 2081, 1057, 3105, 545, 2593, 1569, 3617, 289, 2337, 1313, 3361, 801, 2849, 1825, 3873, 161, 2209, 1185, 3233, 673, 2721, 1697, 3745, 417, 2465, 1441, 3489, 929, 2977, 1953, 4001, 97, 2145, 1121, 3169, 609, 2657, 1633, 3681, 353, 2401, 1377, 3425, 865, 2913, 1889, 3937, 225, 2273, 1249, 3297, 737, 2785, 1761, 3809, 481, 2529, 1505, 3553, 993, 3041, 2017, 4065, 17, 2065, 1041, 3089, 529, 2577, 1553, 3601, 273, 2321, 1297, 3345, 785, 2833, 1809, 3857, 145, 2193, 1169, 3217, 657, 2705, 1681, 3729, 401, 2449, 1425, 3473, 913, 2961, 1937, 3985, 81, 2129, 1105, 3153, 593, 2641, 1617, 3665, 337, 2385, 1361, 3409, 849, 2897, 1873, 3921, 209, 2257, 1233, 3281, 721, 2769, 1745, 3793, 465, 2513, 1489, 3537, 977, 3025, 2001, 4049, 49, 2097, 1073, 3121, 561, 2609, 1585, 3633, 305, 2353, 1329, 3377, 817, 2865, 1841, 3889, 177, 2225, 1201, 3249, 689, 2737, 1713, 3761, 433, 2481, 1457, 3505, 945, 2993, 1969, 4017, 113, 2161, 1137, 3185, 625, 2673, 1649, 3697, 369, 2417, 1393, 3441, 881, 2929, 1905, 3953, 241, 2289, 1265, 3313, 753, 2801, 1777, 3825, 497, 2545, 1521, 3569, 1009, 3057, 2033, 4081, 9, 2057, 1033, 3081, 521, 2569, 1545, 3593, 265, 2313, 1289, 3337, 777, 2825, 1801, 3849, 137, 2185, 1161, 3209, 649, 2697, 1673, 3721, 393, 2441, 1417, 3465, 905, 2953, 1929, 3977, 73, 2121, 1097, 3145, 585, 2633, 1609, 3657, 329, 2377, 1353, 3401, 841, 2889, 1865, 3913, 201, 2249, 1225, 3273, 713, 2761, 1737, 3785, 457, 2505, 1481, 3529, 969, 3017, 1993, 4041, 41, 2089, 1065, 3113, 553, 2601, 1577, 3625, 297, 2345, 1321, 3369, 809, 2857, 1833, 3881, 169, 2217, 1193, 3241, 681, 2729, 1705, 3753, 425, 2473, 1449, 3497, 937, 2985, 1961, 4009, 105, 2153, 1129, 3177, 617, 2665, 1641, 3689, 361, 2409, 1385, 3433, 873, 2921, 1897, 3945, 233, 2281, 1257, 3305, 745, 2793, 1769, 3817, 489, 2537, 1513, 3561, 1001, 3049, 2025, 4073, 25, 2073, 1049, 3097, 537, 2585, 1561, 3609, 281, 2329, 1305, 3353, 793, 2841, 1817, 3865, 153, 2201, 1177, 3225, 665, 2713, 1689, 3737, 409, 2457, 1433, 3481, 921, 2969, 1945, 3993, 89, 2137, 1113, 3161, 601, 2649, 1625, 3673, 345, 2393, 1369, 3417, 857, 2905, 1881, 3929, 217, 2265, 1241, 3289, 729, 2777, 1753, 3801, 473, 2521, 1497, 3545, 985, 3033, 2009, 4057, 57, 2105, 1081, 3129, 569, 2617, 1593, 3641, 313, 2361, 1337, 3385, 825, 2873, 1849, 3897, 185, 2233, 1209, 3257, 697, 2745, 1721, 3769, 441, 2489, 1465, 3513, 953, 3001, 1977, 4025, 121, 2169, 1145, 3193, 633, 2681, 1657, 3705, 377, 2425, 1401, 3449, 889, 2937, 1913, 3961, 249, 2297, 1273, 3321, 761, 2809, 1785, 3833, 505, 2553, 1529, 3577, 1017, 3065, 2041, 4089, 5, 2053, 1029, 3077, 517, 2565, 1541, 3589, 261, 2309, 1285, 3333, 773, 2821, 1797, 3845, 133, 2181, 1157, 3205, 645, 2693, 1669, 3717, 389, 2437, 1413, 3461, 901, 2949, 1925, 3973, 69, 2117, 1093, 3141, 581, 2629, 1605, 3653, 325, 2373, 1349, 3397, 837, 2885, 1861, 3909, 197, 2245, 1221, 3269, 709, 2757, 1733, 3781, 453, 2501, 1477, 3525, 965, 3013, 1989, 4037, 37, 2085, 1061, 3109, 549, 2597, 1573, 3621, 293, 2341, 1317, 3365, 805, 2853, 1829, 3877, 165, 2213, 1189, 3237, 677, 2725, 1701, 3749, 421, 2469, 1445, 3493, 933, 2981, 1957, 4005, 101, 2149, 1125, 3173, 613, 2661, 1637, 3685, 357, 2405, 1381, 3429, 869, 2917, 1893, 3941, 229, 2277, 1253, 3301, 741, 2789, 1765, 3813, 485, 2533, 1509, 3557, 997, 3045, 2021, 4069, 21, 2069, 1045, 3093, 533, 2581, 1557, 3605, 277, 2325, 1301, 3349, 789, 2837, 1813, 3861, 149, 2197, 1173, 3221, 661, 2709, 1685, 3733, 405, 2453, 1429, 3477, 917, 2965, 1941, 3989, 85, 2133, 1109, 3157, 597, 2645, 1621, 3669, 341, 2389, 1365, 3413, 853, 2901, 1877, 3925, 213, 2261, 1237, 3285, 725, 2773, 1749, 3797, 469, 2517, 1493, 3541, 981, 3029, 2005, 4053, 53, 2101, 1077, 3125, 565, 2613, 1589, 3637, 309, 2357, 1333, 3381, 821, 2869, 1845, 3893, 181, 2229, 1205, 3253, 693, 2741, 1717, 3765, 437, 2485, 1461, 3509, 949, 2997, 1973, 4021, 117, 2165, 1141, 3189, 629, 2677, 1653, 3701, 373, 2421, 1397, 3445, 885, 2933, 1909, 3957, 245, 2293, 1269, 3317, 757, 2805, 1781, 3829, 501, 2549, 1525, 3573, 1013, 3061, 2037, 4085, 13, 2061, 1037, 3085, 525, 2573, 1549, 3597, 269, 2317, 1293, 3341, 781, 2829, 1805, 3853, 141, 2189, 1165, 3213, 653, 2701, 1677, 3725, 397, 2445, 1421, 3469, 909, 2957, 1933, 3981, 77, 2125, 1101, 3149, 589, 2637, 1613, 3661, 333, 2381, 1357, 3405, 845, 2893, 1869, 3917, 205, 2253, 1229, 3277, 717, 2765, 1741, 3789, 461, 2509, 1485, 3533, 973, 3021, 1997, 4045, 45, 2093, 1069, 3117, 557, 2605, 1581, 3629, 301, 2349, 1325, 3373, 813, 2861, 1837, 3885, 173, 2221, 1197, 3245, 685, 2733, 1709, 3757, 429, 2477, 1453, 3501, 941, 2989, 1965, 4013, 109, 2157, 1133, 3181, 621, 2669, 1645, 3693, 365, 2413, 1389, 3437, 877, 2925, 1901, 3949, 237, 2285, 1261, 3309, 749, 2797, 1773, 3821, 493, 2541, 1517, 3565, 1005, 3053, 2029, 4077, 29, 2077, 1053, 3101, 541, 2589, 1565, 3613, 285, 2333, 1309, 3357, 797, 2845, 1821, 3869, 157, 2205, 1181, 3229, 669, 2717, 1693, 3741, 413, 2461, 1437, 3485, 925, 2973, 1949, 3997, 93, 2141, 1117, 3165, 605, 2653, 1629, 3677, 349, 2397, 1373, 3421, 861, 2909, 1885, 3933, 221, 2269, 1245, 3293, 733, 2781, 1757, 3805, 477, 2525, 1501, 3549, 989, 3037, 2013, 4061, 61, 2109, 1085, 3133, 573, 2621, 1597, 3645, 317, 2365, 1341, 3389, 829, 2877, 1853, 3901, 189, 2237, 1213, 3261, 701, 2749, 1725, 3773, 445, 2493, 1469, 3517, 957, 3005, 1981, 4029, 125, 2173, 1149, 3197, 637, 2685, 1661, 3709, 381, 2429, 1405, 3453, 893, 2941, 1917, 3965, 253, 2301, 1277, 3325, 765, 2813, 1789, 3837, 509, 2557, 1533, 3581, 1021, 3069, 2045, 4093, 3, 2051, 1027, 3075, 515, 2563, 1539, 3587, 259, 2307, 1283, 3331, 771, 2819, 1795, 3843, 131, 2179, 1155, 3203, 643, 2691, 1667, 3715, 387, 2435, 1411, 3459, 899, 2947, 1923, 3971, 67, 2115, 1091, 3139, 579, 2627, 1603, 3651, 323, 2371, 1347, 3395, 835, 2883, 1859, 3907, 195, 2243, 1219, 3267, 707, 2755, 1731, 3779, 451, 2499, 1475, 3523, 963, 3011, 1987, 4035, 35, 2083, 1059, 3107, 547, 2595, 1571, 3619, 291, 2339, 1315, 3363, 803, 2851, 1827, 3875, 163, 2211, 1187, 3235, 675, 2723, 1699, 3747, 419, 2467, 1443, 3491, 931, 2979, 1955, 4003, 99, 2147, 1123, 3171, 611, 2659, 1635, 3683, 355, 2403, 1379, 3427, 867, 2915, 1891, 3939, 227, 2275, 1251, 3299, 739, 2787, 1763, 3811, 483, 2531, 1507, 3555, 995, 3043, 2019, 4067, 19, 2067, 1043, 3091, 531, 2579, 1555, 3603, 275, 2323, 1299, 3347, 787, 2835, 1811, 3859, 147, 2195, 1171, 3219, 659, 2707, 1683, 3731, 403, 2451, 1427, 3475, 915, 2963, 1939, 3987, 83, 2131, 1107, 3155, 595, 2643, 1619, 3667, 339, 2387, 1363, 3411, 851, 2899, 1875, 3923, 211, 2259, 1235, 3283, 723, 2771, 1747, 3795, 467, 2515, 1491, 3539, 979, 3027, 2003, 4051, 51, 2099, 1075, 3123, 563, 2611, 1587, 3635, 307, 2355, 1331, 3379, 819, 2867, 1843, 3891, 179, 2227, 1203, 3251, 691, 2739, 1715, 3763, 435, 2483, 1459, 3507, 947, 2995, 1971, 4019, 115, 2163, 1139, 3187, 627, 2675, 1651, 3699, 371, 2419, 1395, 3443, 883, 2931, 1907, 3955, 243, 2291, 1267, 3315, 755, 2803, 1779, 3827, 499, 2547, 1523, 3571, 1011, 3059, 2035, 4083, 11, 2059, 1035, 3083, 523, 2571, 1547, 3595, 267, 2315, 1291, 3339, 779, 2827, 1803, 3851, 139, 2187, 1163, 3211, 651, 2699, 1675, 3723, 395, 2443, 1419, 3467, 907, 2955, 1931, 3979, 75, 2123, 1099, 3147, 587, 2635, 1611, 3659, 331, 2379, 1355, 3403, 843, 2891, 1867, 3915, 203, 2251, 1227, 3275, 715, 2763, 1739, 3787, 459, 2507, 1483, 3531, 971, 3019, 1995, 4043, 43, 2091, 1067, 3115, 555, 2603, 1579, 3627, 299, 2347, 1323, 3371, 811, 2859, 1835, 3883, 171, 2219, 1195, 3243, 683, 2731, 1707, 3755, 427, 2475, 1451, 3499, 939, 2987, 1963, 4011, 107, 2155, 1131, 3179, 619, 2667, 1643, 3691, 363, 2411, 1387, 3435, 875, 2923, 1899, 3947, 235, 2283, 1259, 3307, 747, 2795, 1771, 3819, 491, 2539, 1515, 3563, 1003, 3051, 2027, 4075, 27, 2075, 1051, 3099, 539, 2587, 1563, 3611, 283, 2331, 1307, 3355, 795, 2843, 1819, 3867, 155, 2203, 1179, 3227, 667, 2715, 1691, 3739, 411, 2459, 1435, 3483, 923, 2971, 1947, 3995, 91, 2139, 1115, 3163, 603, 2651, 1627, 3675, 347, 2395, 1371, 3419, 859, 2907, 1883, 3931, 219, 2267, 1243, 3291, 731, 2779, 1755, 3803, 475, 2523, 1499, 3547, 987, 3035, 2011, 4059, 59, 2107, 1083, 3131, 571, 2619, 1595, 3643, 315, 2363, 1339, 3387, 827, 2875, 1851, 3899, 187, 2235, 1211, 3259, 699, 2747, 1723, 3771, 443, 2491, 1467, 3515, 955, 3003, 1979, 4027, 123, 2171, 1147, 3195, 635, 2683, 1659, 3707, 379, 2427, 1403, 3451, 891, 2939, 1915, 3963, 251, 2299, 1275, 3323, 763, 2811, 1787, 3835, 507, 2555, 1531, 3579, 1019, 3067, 2043, 4091, 7, 2055, 1031, 3079, 519, 2567, 1543, 3591, 263, 2311, 1287, 3335, 775, 2823, 1799, 3847, 135, 2183, 1159, 3207, 647, 2695, 1671, 3719, 391, 2439, 1415, 3463, 903, 2951, 1927, 3975, 71, 2119, 1095, 3143, 583, 2631, 1607, 3655, 327, 2375, 1351, 3399, 839, 2887, 1863, 3911, 199, 2247, 1223, 3271, 711, 2759, 1735, 3783, 455, 2503, 1479, 3527, 967, 3015, 1991, 4039, 39, 2087, 1063, 3111, 551, 2599, 1575, 3623, 295, 2343, 1319, 3367, 807, 2855, 1831, 3879, 167, 2215, 1191, 3239, 679, 2727, 1703, 3751, 423, 2471, 1447, 3495, 935, 2983, 1959, 4007, 103, 2151, 1127, 3175, 615, 2663, 1639, 3687, 359, 2407, 1383, 3431, 871, 2919, 1895, 3943, 231, 2279, 1255, 3303, 743, 2791, 1767, 3815, 487, 2535, 1511, 3559, 999, 3047, 2023, 4071, 23, 2071, 1047, 3095, 535, 2583, 1559, 3607, 279, 2327, 1303, 3351, 791, 2839, 1815, 3863, 151, 2199, 1175, 3223, 663, 2711, 1687, 3735, 407, 2455, 1431, 3479, 919, 2967, 1943, 3991, 87, 2135, 1111, 3159, 599, 2647, 1623, 3671, 343, 2391, 1367, 3415, 855, 2903, 1879, 3927, 215, 2263, 1239, 3287, 727, 2775, 1751, 3799, 471, 2519, 1495, 3543, 983, 3031, 2007, 4055, 55, 2103, 1079, 3127, 567, 2615, 1591, 3639, 311, 2359, 1335, 3383, 823, 2871, 1847, 3895, 183, 2231, 1207, 3255, 695, 2743, 1719, 3767, 439, 2487, 1463, 3511, 951, 2999, 1975, 4023, 119, 2167, 1143, 3191, 631, 2679, 1655, 3703, 375, 2423, 1399, 3447, 887, 2935, 1911, 3959, 247, 2295, 1271, 3319, 759, 2807, 1783, 3831, 503, 2551, 1527, 3575, 1015, 3063, 2039, 4087, 15, 2063, 1039, 3087, 527, 2575, 1551, 3599, 271, 2319, 1295, 3343, 783, 2831, 1807, 3855, 143, 2191, 1167, 3215, 655, 2703, 1679, 3727, 399, 2447, 1423, 3471, 911, 2959, 1935, 3983, 79, 2127, 1103, 3151, 591, 2639, 1615, 3663, 335, 2383, 1359, 3407, 847, 2895, 1871, 3919, 207, 2255, 1231, 3279, 719, 2767, 1743, 3791, 463, 2511, 1487, 3535, 975, 3023, 1999, 4047, 47, 2095, 1071, 3119, 559, 2607, 1583, 3631, 303, 2351, 1327, 3375, 815, 2863, 1839, 3887, 175, 2223, 1199, 3247, 687, 2735, 1711, 3759, 431, 2479, 1455, 3503, 943, 2991, 1967, 4015, 111, 2159, 1135, 3183, 623, 2671, 1647, 3695, 367, 2415, 1391, 3439, 879, 2927, 1903, 3951, 239, 2287, 1263, 3311, 751, 2799, 1775, 3823, 495, 2543, 1519, 3567, 1007, 3055, 2031, 4079, 31, 2079, 1055, 3103, 543, 2591, 1567, 3615, 287, 2335, 1311, 3359, 799, 2847, 1823, 3871, 159, 2207, 1183, 3231, 671, 2719, 1695, 3743, 415, 2463, 1439, 3487, 927, 2975, 1951, 3999, 95, 2143, 1119, 3167, 607, 2655, 1631, 3679, 351, 2399, 1375, 3423, 863, 2911, 1887, 3935, 223, 2271, 1247, 3295, 735, 2783, 1759, 3807, 479, 2527, 1503, 3551, 991, 3039, 2015, 4063, 63, 2111, 1087, 3135, 575, 2623, 1599, 3647, 319, 2367, 1343, 3391, 831, 2879, 1855, 3903, 191, 2239, 1215, 3263, 703, 2751, 1727, 3775, 447, 2495, 1471, 3519, 959, 3007, 1983, 4031, 127, 2175, 1151, 3199, 639, 2687, 1663, 3711, 383, 2431, 1407, 3455, 895, 2943, 1919, 3967, 255, 2303, 1279, 3327, 767, 2815, 1791, 3839, 511, 2559, 1535, 3583, 1023, 3071, 2047, 4095].

A sequence 2b is as follows:

Shorten_Q_half=[1, 2049, 1025, 3073, 513, 2561, 1537, 3585, 257, 2305, 1281, 3329, 769, 2817, 1793, 3841, 129, 2177, 1153, 3201, 641, 2689, 1665, 3713, 385, 2433, 1409, 3457, 897, 2945, 1921, 3969, 65, 2113, 1089, 3137, 577, 2625, 1601, 3649, 321, 2369, 1345, 3393, 833, 2881, 1857, 3905, 193, 2241, 1217, 3265, 705, 2753, 1729, 3777, 449, 2497, 1473, 3521, 961, 3009, 1985, 4033, 33, 2081, 1057, 3105, 545, 2593, 1569, 3617, 289, 2337, 1313, 3361, 801, 2849, 1825, 3873, 161, 2209, 1185, 3233, 673, 2721, 1697, 3745, 417, 2465, 1441, 3489, 929, 2977, 1953, 4001, 97, 2145, 1121, 3169, 609, 2657, 1633, 3681, 353, 2401, 1377, 3425, 865, 2913, 1889, 3937, 225, 2273, 1249, 3297, 737, 2785, 1761, 3809, 481, 2529, 1505, 3553, 993, 3041, 2017, 4065, 17, 2065, 1041, 3089, 529, 2577, 1553, 3601, 273, 2321, 1297, 3345, 785, 2833, 1809, 3857, 145, 2193, 1169, 3217, 657, 2705, 1681, 3729, 401, 2449, 1425, 3473, 913, 2961, 1937, 3985, 81, 2129, 1105, 3153, 593, 2641, 1617, 3665, 337, 2385, 1361, 3409, 849, 2897, 1873, 3921, 209, 2257, 1233, 3281, 721, 2769, 1745, 3793, 465, 2513, 1489, 3537, 977, 3025, 2001, 4049, 49, 2097, 1073, 3121, 561, 2609, 1585, 3633, 305, 2353, 1329, 3377, 817, 2865, 1841, 3889, 177, 2225, 1201, 3249, 689, 2737, 1713, 3761, 433, 2481, 1457, 3505, 945, 2993, 1969, 4017, 113, 2161, 1137, 3185, 625, 2673, 1649, 3697, 369, 2417, 1393, 3441, 881, 2929, 1905, 3953, 241, 2289, 1265, 3313, 753, 2801, 1777, 3825, 497, 2545, 1521, 3569, 1009, 3057, 2033, 4081, 9, 2057, 1033, 3081, 521, 2569, 1545, 3593, 265, 2313, 1289, 3337, 777, 2825, 1801, 3849, 137, 2185, 1161, 3209, 649, 2697, 1673, 3721, 393, 2441, 1417, 3465, 905, 2953, 1929, 3977, 73, 2121, 1097, 3145, 585, 2633, 1609, 3657, 329, 2377, 1353, 3401, 841, 2889, 1865, 3913, 201, 2249, 1225, 3273, 713, 2761, 1737, 3785, 457, 2505, 1481, 3529, 969, 3017, 1993, 4041, 41, 2089, 1065, 3113, 553, 2601, 1577, 3625, 297, 2345, 1321, 3369, 809, 2857, 1833, 3881, 169, 2217, 1193, 3241, 681, 2729, 1705, 3753, 425, 2473, 1449, 3497, 937, 2985, 1961, 4009, 105, 2153, 1129, 3177, 617, 2665, 1641, 3689, 361, 2409, 1385, 3433, 873, 2921, 1897, 3945, 233, 2281, 1257, 3305, 745, 2793, 1769, 3817, 489, 2537, 1513, 3561, 1001, 3049, 2025, 4073, 25, 2073, 1049, 3097, 537, 2585, 1561, 3609, 281, 2329, 1305, 3353, 793, 2841, 1817, 3865, 153, 2201, 1177, 3225, 665, 2713, 1689, 3737, 409, 2457, 1433, 3481, 921, 2969, 1945, 3993, 89, 2137, 1113, 3161, 601, 2649, 1625, 3673, 345, 2393, 1369, 3417, 857, 2905, 1881, 3929, 217, 2265, 1241, 3289, 729, 2777, 1753, 3801, 473, 2521, 1497, 3545, 985, 3033, 2009, 4057, 57, 2105, 1081, 3129, 569, 2617, 1593, 3641, 313, 2361, 1337, 3385, 825, 2873, 1849, 3897, 185, 2233, 1209, 3257, 697, 2745, 1721, 3769, 441, 2489, 1465, 3513, 953, 3001, 1977, 4025, 121, 2169, 1145, 3193, 633, 2681, 1657, 3705, 377, 2425, 1401, 3449, 889, 2937, 1913, 3961, 249, 2297, 1273, 3321, 761, 2809, 1785, 3833, 505, 2553, 1529, 3577, 1017, 3065, 2041, 4089, 5, 2053, 1029, 3077, 517, 2565, 1541, 3589, 261, 2309, 1285, 3333, 773, 2821, 1797, 3845, 133, 2181, 1157, 3205, 645, 2693, 1669, 3717, 389, 2437, 1413, 3461, 901, 2949, 1925, 3973, 69, 2117, 1093, 3141, 581, 2629, 1605, 3653, 325, 2373, 1349, 3397, 837, 2885, 1861, 3909, 197, 2245, 1221, 3269, 709, 2757, 1733, 3781, 453, 2501, 1477, 3525, 965, 3013, 1989, 4037, 37, 2085, 1061, 3109, 549, 2597, 1573, 3621, 293, 2341, 1317, 3365, 805, 2853, 1829, 3877, 165, 2213, 1189, 3237, 677, 2725, 1701, 3749, 421, 2469, 1445, 3493, 933, 2981, 1957, 4005, 101, 2149, 1125, 3173, 613, 2661, 1637, 3685, 357, 2405, 1381, 3429, 869, 2917, 1893, 3941, 229, 2277, 1253, 3301, 741, 2789, 1765, 3813, 485, 2533, 1509, 3557, 997, 3045, 2021, 4069, 21, 2069, 1045, 3093, 533, 2581, 1557, 3605, 277, 2325, 1301, 3349, 789, 2837, 1813, 3861, 149, 2197, 1173, 3221, 661, 2709, 1685, 3733, 405, 2453, 1429, 3477, 917, 2965, 1941, 3989, 85, 2133, 1109, 3157, 597, 2645, 1621, 3669, 341, 2389, 1365, 3413, 853, 2901, 1877, 3925, 213, 2261, 1237, 3285, 725, 2773, 1749, 3797, 469, 2517, 1493, 3541, 981, 3029, 2005, 4053, 53, 2101, 1077, 3125, 565, 2613, 1589, 3637, 309, 2357, 1333, 3381, 821, 2869, 1845, 3893, 181, 2229, 1205, 3253, 693, 2741, 1717, 3765, 437, 2485, 1461, 3509, 949, 2997, 1973, 4021, 117, 2165, 1141, 3189, 629, 2677, 1653, 3701, 373, 2421, 1397, 3445, 885, 2933, 1909, 3957, 245, 2293, 1269, 3317, 757, 2805, 1781, 3829, 501, 2549, 1525, 3573, 1013, 3061, 2037, 4085, 13, 2061, 1037, 3085, 525, 2573, 1549, 3597, 269, 2317, 1293, 3341, 781, 2829, 1805, 3853, 141, 2189, 1165, 3213, 653, 2701, 1677, 3725, 397, 2445, 1421, 3469, 909, 2957, 1933, 3981, 77, 2125, 1101, 3149, 589, 2637, 1613, 3661, 333, 2381, 1357, 3405, 845, 2893, 1869, 3917, 205, 2253, 1229, 3277, 717, 2765, 1741, 3789, 461, 2509, 1485, 3533, 973, 3021, 1997, 4045, 45, 2093, 1069, 3117, 557, 2605, 1581, 3629, 301, 2349, 1325, 3373, 813, 2861, 1837, 3885, 173, 2221, 1197, 3245, 685, 2733, 1709, 3757, 429, 2477, 1453, 3501, 941, 2989, 1965, 4013, 109, 2157, 1133, 3181, 621, 2669, 1645, 3693, 365, 2413, 1389, 3437, 877, 2925, 1901, 3949, 237, 2285, 1261, 3309, 749, 2797, 1773, 3821, 493, 2541, 1517, 3565, 1005, 3053, 2029, 4077, 29, 2077, 1053, 3101, 541, 2589, 1565, 3613, 285, 2333, 1309, 3357, 797, 2845, 1821, 3869, 157, 2205, 1181, 3229, 669, 2717, 1693, 3741, 413, 2461, 1437, 3485, 925, 2973, 1949, 3997, 93, 2141, 1117, 3165, 605, 2653, 1629, 3677, 349, 2397, 1373, 3421, 861, 2909, 1885, 3933, 221, 2269, 1245, 3293, 733, 2781, 1757, 3805, 477, 2525, 1501, 3549, 989, 3037, 2013, 4061, 61, 2109, 1085, 3133, 573, 2621, 1597, 3645, 317, 2365, 1341, 3389, 829, 2877, 1853, 3901, 189, 2237, 1213, 3261, 701, 2749, 1725, 3773, 445, 2493, 1469, 3517, 957, 3005, 1981, 4029, 125, 2173, 1149, 3197, 637, 2685, 1661, 3709, 381, 2429, 1405, 3453, 893, 2941, 1917, 3965, 253, 2301, 1277, 3325, 765, 2813, 1789, 3837, 509, 2557, 1533, 3581, 1021, 3069, 2045, 4093, 3, 2051, 1027, 3075, 515, 2563, 1539, 3587, 259, 2307, 1283, 3331, 771, 2819, 1795, 3843, 131, 2179, 1155, 3203, 643, 2691, 1667, 3715, 387, 2435, 1411, 3459, 899, 2947, 1923, 3971, 67, 2115, 1091, 3139, 579, 2627, 1603, 3651, 323, 2371, 1347, 3395, 835, 2883, 1859, 3907, 195, 2243, 1219, 3267, 707, 2755, 1731, 3779, 451, 2499, 1475, 3523, 963, 3011, 1987, 4035, 35, 2083, 1059, 3107, 547, 2595, 1571, 3619, 291, 2339, 1315, 3363, 803, 2851, 1827, 3875, 163, 2211, 1187, 3235, 675, 2723, 1699, 3747, 419, 2467, 1443, 3491, 931, 2979, 1955, 4003, 99, 2147, 1123, 3171, 611, 2659, 1635, 3683, 355, 2403, 1379, 3427, 867, 2915, 1891, 3939, 227, 2275, 1251, 3299, 739, 2787, 1763, 3811, 483, 2531, 1507, 3555, 995, 3043, 2019, 4067, 19, 2067, 1043, 3091, 531, 2579, 1555, 3603, 275, 2323, 1299, 3347, 787, 2835, 1811, 3859, 147, 2195, 1171, 3219, 659, 2707, 1683, 3731, 403, 2451, 1427, 3475, 915, 2963, 1939, 3987, 83, 2131, 1107, 3155, 595, 2643, 1619, 3667, 339, 2387, 1363, 3411, 851, 2899, 1875, 3923, 211, 2259, 1235, 3283, 723, 2771, 1747, 3795, 467, 2515, 1491, 3539, 979, 3027, 2003, 4051, 51, 2099, 1075, 3123, 563, 2611, 1587, 3635, 307, 2355, 1331, 3379, 819, 2867, 1843, 3891, 179, 2227, 1203, 3251, 691, 2739, 1715, 3763, 435, 2483, 1459, 3507, 947, 2995, 1971, 4019, 115, 2163, 1139, 3187, 627, 2675, 1651, 3699, 371, 2419, 1395, 3443, 883, 2931, 1907, 3955, 243, 2291, 1267, 3315, 755, 2803, 1779, 3827, 499, 2547, 1523, 3571, 1011, 3059, 2035, 4083, 11, 2059, 1035, 3083, 523, 2571, 1547, 3595, 267, 2315, 1291, 3339, 779, 2827, 1803, 3851, 139, 2187, 1163, 3211, 651, 2699, 1675, 3723, 395, 2443, 1419, 3467, 907, 2955, 1931, 3979, 75, 2123, 1099, 3147, 587, 2635, 1611, 3659, 331, 2379, 1355, 3403, 843, 2891, 1867, 3915, 203, 2251, 1227, 3275, 715, 2763, 1739, 3787, 459, 2507, 1483, 3531, 971, 3019, 1995, 4043, 43, 2091, 1067, 3115, 555, 2603, 1579, 3627, 299, 2347, 1323, 3371, 811, 2859, 1835, 3883, 171, 2219, 1195, 3243, 683, 2731, 1707, 3755, 427, 2475, 1451, 3499, 939, 2987, 1963, 4011, 107, 2155, 1131, 3179, 619, 2667, 1643, 3691, 363, 2411, 1387, 3435, 875, 2923, 1899, 3947, 235, 2283, 1259, 3307, 747, 2795, 1771, 3819, 491, 2539, 1515, 3563, 1003, 3051, 2027, 4075, 27, 2075, 1051, 3099, 539, 2587, 1563, 3611, 283, 2331, 1307, 3355, 795, 2843, 1819, 3867, 155, 2203, 1179, 3227, 667, 2715, 1691, 3739, 411, 2459, 1435, 3483, 923, 2971, 1947, 3995, 91, 2139, 1115, 3163, 603, 2651, 1627, 3675, 347, 2395, 1371, 3419, 859, 2907, 1883, 3931, 219, 2267, 1243, 3291, 731, 2779, 1755, 3803, 475, 2523, 1499, 3547, 987, 3035, 2011, 4059, 59, 2107, 1083, 3131, 571, 2619, 1595, 3643, 315, 2363, 1339, 3387, 827, 2875, 1851, 3899, 187, 2235, 1211, 3259, 699, 2747, 1723, 3771, 443, 2491, 1467, 3515, 955, 3003, 1979, 4027, 123, 2, 171, 1147, 3195, 635, 2683, 1659, 3707, 379, 2427, 1403, 3451, 891, 2939, 1915, 3963, 251, 2299, 1275, 3323, 763, 2811, 1787, 3835, 507, 2555, 1531, 3579, 1019, 3067, 2043, 4091, 7, 2055, 1031, 3079, 519, 2567, 1543, 3591, 263, 2311, 1287, 3335, 775, 2823, 1799, 3847, 135, 2183, 1159, 3207, 647, 2695, 1671, 3719, 391, 2439, 1415, 3463, 903, 2951, 1927, 3975, 71, 2119, 1095, 3143, 583, 2631, 1607, 3655, 327, 2375, 1351, 3399, 839, 2887, 1863, 3911, 199, 2247, 1223, 3271, 711, 2759, 1735, 3783, 455, 2503, 1479, 3527, 967, 3015, 1991, 4039, 39, 2087, 1063, 3111, 551, 2599, 1575, 3623, 295, 2343, 1319, 3367, 807, 2855, 1831, 3879, 167, 2215, 1191, 3239, 679, 2727, 1703, 3751, 423, 2471, 1447, 3495, 935, 2983, 1959, 4007, 103, 2151, 1127, 3175, 615, 2663, 1639, 3687, 359, 2407, 1383, 3431, 871, 2919, 1895, 3943, 231, 2279, 1255, 3303, 743, 2791, 1767, 3815, 487, 2535, 1511, 3559, 999, 3047, 2023, 4071, 23, 2071, 1047, 3095, 535, 2583, 1559, 3607, 279, 2327, 1303, 3351, 791, 2839, 1815, 3863, 151, 2199, 1175, 3223, 663, 2711, 1687, 3735, 407, 2455, 1431, 3479, 919, 2967, 1943, 3991, 87, 2135, 1111, 3159, 599, 2647, 1623, 3671, 343, 2391, 1367, 3415, 855, 2903, 1879, 3927, 215, 2263, 1239, 3287, 727, 2775, 1751, 3799, 471, 2519, 1495, 3543, 983, 3031, 2007, 4055, 55, 2103, 1079, 3127, 567, 2615, 1591, 3639, 311, 2359, 1335, 3383, 823, 2871, 1847, 3895, 183, 2231, 1207, 3255, 695, 2743, 1719, 3767, 439, 2487, 1463, 3511, 951, 2999, 1975, 4023, 119, 2167, 1143, 3191, 631, 2679, 1655, 3703, 375, 2423, 1399, 3447, 887, 2935, 1911, 3959, 247, 2295, 1271, 3319, 759, 2807, 1783, 3831, 503, 2551, 1527, 3575, 1015, 3063, 2039, 4087, 15, 2063, 1039, 3087, 527, 2575, 1551, 3599, 271, 2319, 1295, 3343, 783, 2831, 1807, 3855, 143, 2191, 1167, 3215, 655, 2703, 1679, 3727, 399, 2447, 1423, 3471, 911, 2959, 1935, 3983, 79, 2127, 1103, 3151, 591, 2639, 1615, 3663, 335, 2383, 1359, 3407, 847, 2895, 1871, 3919, 207, 2255, 1231, 3279, 719, 2767, 1743, 3791, 463, 2511, 1487, 3535, 975, 3023, 1999, 4047, 47, 2095, 1071, 3119, 559, 2607, 1583, 3631, 303, 2351, 1327, 3375, 815, 2863, 1839, 3887, 175, 2223, 1199, 3247, 687, 2735, 1711, 3759, 431, 2479, 1455, 3503, 943, 2991, 1967, 4015, 111, 2159, 1135, 3183, 623, 2671, 1647, 3695, 367, 2415, 1391, 3439, 879, 2927, 1903, 3951, 239, 2287, 1263, 3311, 751, 2799, 1775, 3823, 495, 2543, 1519, 3567, 1007, 3055, 2031, 4079, 31, 2079, 1055, 3103, 543, 2591, 1567, 3615, 287, 2335, 1311, 3359, 799, 2847, 1823, 3871, 159, 2207, 1183, 3231, 671, 2719, 1695, 3743, 415, 2463, 1439, 3487, 927, 2975, 1951, 3999, 95, 2143, 1119, 3167, 607, 2655, 1631, 3679, 351, 2399, 1375, 3423, 863, 2911, 1887, 3935, 223, 2271, 1247, 3295, 735, 2783, 1759, 3807, 479, 2527, 1503, 3551, 991, 3039, 2015, 4063, 63, 2111, 1087, 3135, 575, 2623, 1599, 3647, 319, 2367, 1343, 3391, 831, 2879, 1855, 3903, 191, 2239, 1215, 3263, 703, 2751, 1727, 3775, 447, 2495, 1471, 3519, 959, 3007, 1983, 4031, 127, 2175, 1151, 3199, 639, 2687, 1663, 3711, 383, 2431, 1407, 3455, 895, 2943, 1919, 3967, 255, 2303, 1279, 3327, 767, 2815, 1791, 3839, 511, 2559, 1535, 3583, 1023, 3071, 2047, 4095].

A sequence 3b is as follows:

Shorten_Z=[0, 4096, 2048, 6144, 1024, 5120, 3072, 7168, 512, 4608, 2560, 6656, 1536, 5632, 3584, 7680, 256, 4352, 2304, 6400, 1280, 5376, 3328, 7424, 768, 4864, 2816, 6912, 1792, 5888, 3840, 7936, 128, 4224, 2176, 6272, 1152, 5248, 3200, 7296, 640, 4736, 2688, 6784, 1664, 5760, 3712, 7808, 384, 4480, 2432, 6528, 1408, 5504, 3456, 7552, 896, 4992, 2944, 7040, 1920, 6016, 3968, 8064, 64, 4160, 2112, 6208, 1088, 5184, 3136, 7232, 576, 4672, 2624, 6720, 1600, 5696, 3648, 7744, 320, 4416, 2368, 6464, 1344, 5440, 3392, 7488, 832, 4928, 2880, 6976, 1856, 5952, 3904, 8000, 192, 4288, 2240, 6336, 1216, 5312, 3264, 7360, 704, 4800, 2752, 6848, 1728, 5824, 3776, 7872, 448, 4544, 2496, 6592, 1472, 5568, 3520, 7616, 960, 5056, 3008, 7104, 1984, 6080, 4032, 8128, 32, 4128, 2080, 6176, 1056, 5152, 3104, 7200, 544, 4640, 2592, 6688, 1568, 5664, 3616, 7712, 288, 4384, 2336, 6432, 1312, 5408, 3360, 7456, 800, 4896, 2848, 6944, 1824, 5920, 3872, 7968, 160, 4256, 2208, 6304, 1184, 5280, 3232, 7328, 672, 4768, 2720, 6816, 1696, 5792, 3744, 7840, 416, 4512, 2464, 6560, 1440, 5536, 3488, 7584, 928, 5024, 2976, 7072, 1952, 6048, 4000, 8096, 96, 4192, 2144, 6240, 1120, 5216, 3168, 7264, 608, 4704, 2656, 6752, 1632, 5728, 3680, 7776, 352, 4448, 2400, 6496, 1376, 5472, 3424, 7520, 864, 4960, 2912, 7008, 1888, 5984, 3936, 8032, 224, 4320, 2272, 6368, 1248, 5344, 3296, 7392, 736, 4832, 2784, 6880, 1760, 5856, 3808, 7904, 480, 4576, 2528, 6624, 1504, 5600, 3552, 7648, 992, 5088, 3040, 7136, 2016, 6112, 4064, 8160, 16, 4112, 2064, 6160, 1040, 5136, 3088, 7184, 528, 4624, 2576, 6672, 1552, 5648, 3600, 7696, 272, 4368, 2320, 6416, 1296, 5392, 3344, 7440, 784, 4880, 2832, 6928, 1808, 5904, 3856, 7952, 144, 4240, 2192, 6288, 1168, 5264, 3216, 7312, 656, 4752, 2704, 6800, 1680, 5776, 3728, 7824, 400, 4496, 2448, 6544, 1424, 5520, 3472, 7568, 912, 5008, 2960, 7056, 1936, 6032, 3984, 8080, 80, 4176, 2128, 6224, 1104, 5200, 3152, 7248, 592, 4688, 2640, 6736, 1616, 5712, 3664, 7760, 336, 4432, 2384, 6480, 1360, 5456, 3408, 7504, 848, 4944, 2896, 6992, 1872, 5968, 3920, 8016, 208, 4304, 2256, 6352, 1232, 5328, 3280, 7376, 720, 4816, 2768, 6864, 1744, 5840, 3792, 7888, 464, 4560, 2512, 6608, 1488, 5584, 3536, 7632, 976, 5072, 3024, 7120, 2000, 6096, 4048, 8144, 48, 4144, 2096, 6192, 1072, 5168, 3120, 7216, 560, 4656, 2608, 6704, 1584, 5680, 3632, 7728, 304, 4400, 2352, 6448, 1328, 5424, 3376, 7472, 816, 4912, 2864, 6960, 1840, 5936, 3888, 7984, 176, 4272, 2224, 6320, 1200, 5296, 3248, 7344, 688, 4784, 2736, 6832, 1712, 5808, 3760, 7856, 432, 4528, 2480, 6576, 1456, 5552, 3504, 7600, 944, 5040, 2992, 7088, 1968, 6064, 4016, 8112, 112, 4208, 2160, 6256, 1136, 5232, 3184, 7280, 624, 4720, 2672, 6768, 1648, 5744, 3696, 7792, 368, 4464, 2416, 6512, 1392, 5488, 3440, 7536, 880, 4976, 2928, 7024, 1904, 6000, 3952, 8048, 240, 4336, 2288, 6384, 1264, 5360, 3312, 7408, 752, 4848, 2800, 6896, 1776, 5872, 3824, 7920, 496, 4592, 2544, 6640, 1520, 5616, 3568, 7664, 1008, 5104, 3056, 7152, 2032, 6128, 4080, 8176, 8, 4104, 2056, 6152, 1032, 5128, 3080, 7176, 520, 4616, 2568, 6664, 1544, 5640, 3592, 7688, 264, 4360, 2312, 6408, 1288, 5384, 3336, 7432, 776, 4872, 2824, 6920, 1800, 5896, 3848, 7944, 136, 4232, 2184, 6280, 1160, 5256, 3208, 7304, 648, 4744, 2696, 6792, 1672, 5768, 3720, 7816, 392, 4488, 2440, 6536, 1416, 5512, 3464, 7560, 904, 5000, 2952, 7048, 1928, 6024, 3976, 8072, 72, 4168, 2120, 6216, 1096, 5192, 3144, 7240, 584, 4680, 2632, 6728, 1608, 5704, 3656, 7752, 328, 4424, 2376, 6472, 1352, 5448, 3400, 7496, 840, 4936, 2888, 6984, 1864, 5960, 3912, 8008, 200, 4296, 2248, 6344, 1224, 5320, 3272, 7368, 712, 4808, 2760, 6856, 1736, 5832, 3784, 7880, 456, 4552, 2504, 6600, 1480, 5576, 3528, 7624, 968, 5064, 3016, 7112, 1992, 6088, 4040, 8136, 40, 4136, 2088, 6184, 1064, 5160, 3112, 7208, 552, 4648, 2600, 6696, 1576, 5672, 3624, 7720, 296, 4392, 2344, 6440, 1320, 5416, 3368, 7464, 808, 4904, 2856, 6952, 1832, 5928, 3880, 7976, 168, 4264, 2216, 6312, 1192, 5288, 3240, 7336, 680, 4776, 2728, 6824, 1704, 5800, 3752, 7848, 424, 4520, 2472, 6568, 1448, 5544, 3496, 7592, 936, 5032, 2984, 7080, 1960, 6056, 4008, 8104, 104, 4200, 2152, 6248, 1128, 5224, 3176, 7272, 616, 4712, 2664, 6760, 1640, 5736, 3688, 7784, 360, 4456, 2408, 6504, 1384, 5480, 3432, 7528, 872, 4968, 2920, 7016, 1896, 5992, 3944, 8040, 232, 4328, 2280, 6376, 1256, 5352, 3304, 7400, 744, 4840, 2792, 6888, 1768, 5864, 3816, 7912, 488, 4584, 2536, 6632, 1512, 5608, 3560, 7656, 1000, 5096, 3048, 7144, 2024, 6120, 4072, 8168, 24, 4120, 2072, 6168, 1048, 5144, 3096, 7192, 536, 4632, 2584, 6680, 1560, 5656, 3608, 7704, 280, 4376, 2328, 6424, 1304, 5400, 3352, 7448, 792, 4888, 2840, 6936, 1816, 5912, 3864, 7960, 152, 4248, 2200, 6296, 1176, 5272, 3224, 7320, 664, 4760, 2712, 6808, 1688, 5784, 3736, 7832, 408, 4504, 2456, 6552, 1432, 5528, 3480, 7576, 920, 5016, 2968, 7064, 1944, 6040, 3992, 8088, 88, 4184, 2136, 6232, 1112, 5208, 3160, 7256, 600, 4696, 2648, 6744, 1624, 5720, 3672, 7768, 344, 4440, 2392, 6488, 1368, 5464, 3416, 7512, 856, 4952, 2904, 7000, 1880, 5976, 3928, 8024, 216, 4312, 2264, 6360, 1240, 5336, 3288, 7384, 728, 4824, 2776, 6872, 1752, 5848, 3800, 7896, 472, 4568, 2520, 6616, 1496, 5592, 3544, 7640, 984, 5080, 3032, 7128, 2008, 6104, 4056, 8152, 56, 4152, 2104, 6200, 1080, 5176, 3128, 7224, 568, 4664, 2616, 6712, 1592, 5688, 3640, 7736, 312, 4408, 2360, 6456, 1336, 5432, 3384, 7480, 824, 4920, 2872, 6968, 1848, 5944, 3896, 7992, 184, 4280, 2232, 6328, 1208, 5304, 3256, 7352, 696, 4792, 2744, 6840, 1720, 5816, 3768, 7864, 440, 4536, 2488, 6584, 1464, 5560, 3512, 7608, 952, 5048, 3000, 7096, 1976, 6072, 4024, 8120, 120, 4216, 2168, 6264, 1144, 5240, 3192, 7288, 632, 4728, 2680, 6776, 1656, 5752, 3704, 7800, 376, 4472, 2424, 6520, 1400, 5496, 3448, 7544, 888, 4984, 2936, 7032, 1912, 6008, 3960, 8056, 248, 4344, 2296, 6392, 1272, 5368, 3320, 7416, 760, 4856, 2808, 6904, 1784, 5880, 3832, 7928, 504, 4600, 2552, 6648, 1528, 5624, 3576, 7672, 1016, 5112, 3064, 7160, 2040, 6136, 4088, 8184, 4, 4100, 2052, 6148, 1028, 5124, 3076, 7172, 516, 4612, 2564, 6660, 1540, 5636, 3588, 7684, 260, 4356, 2308, 6404, 1284, 5380, 3332, 7428, 772, 4868, 2820, 6916, 1796, 5892, 3844, 7940, 132, 4228, 2180, 6276, 1156, 5252, 3204, 7300, 644, 4740, 2692, 6788, 1668, 5764, 3716, 7812, 388, 4484, 2436, 6532, 1412, 5508, 3460, 7556, 900, 4996, 2948, 7044, 1924, 6020, 3972, 8068, 68, 4164, 2116, 6212, 1092, 5188, 3140, 7236, 580, 4676, 2628, 6724, 1604, 5700, 3652, 7748, 324, 4420, 2372, 6468, 1348, 5444, 3396, 7492, 836, 4932, 2884, 6980, 1860, 5956, 3908, 8004, 196, 4292, 2244, 6340, 1220, 5316, 3268, 7364, 708, 4804, 2756, 6852, 1732, 5828, 3780, 7876, 452, 4548, 2500, 6596, 1476, 5572, 3524, 7620, 964, 5060, 3012, 7108, 1988, 6084, 4036, 8132, 36, 4132, 2084, 6180, 1060, 5156, 3108, 7204, 548, 4644, 2596, 6692, 1572, 5668, 3620, 7716, 292, 4388, 2340, 6436, 1316, 5412, 3364, 7460, 804, 4900, 2852, 6948, 1828, 5924, 3876, 7972, 164, 4260, 2212, 6308, 1188, 5284, 3236, 7332, 676, 4772, 2724, 6820, 1700, 5796, 3748, 7844, 420, 4516, 2468, 6564, 1444, 5540, 3492, 7588, 932, 5028, 2980, 7076, 1956, 6052, 4004, 8100, 100, 4196, 2148, 6244, 1124, 5220, 3172, 7268, 612, 4708, 2660, 6756, 1636, 5732, 3684, 7780, 356, 4452, 2404, 6500, 1380, 5476, 3428, 7524, 868, 4964, 2916, 7012, 1892, 5988, 3940, 8036, 228, 4324, 2276, 6372, 1252, 5348, 3300, 7396, 740, 4836, 2788, 6884, 1764, 5860, 3812, 7908, 484, 4580, 2532, 6628, 1508, 5604, 3556, 7652, 996, 5092, 3044, 7140, 2020, 6116, 4068, 8164, 20, 4116, 2068, 6164, 1044, 5140, 3092, 7188, 532, 4628, 2580, 6676, 1556, 5652, 3604, 7700, 276, 4372, 2324, 6420, 1300, 5396, 3348, 7444, 788, 4884, 2836, 6932, 1812, 5908, 3860, 7956, 148, 4244, 2196, 6292, 1172, 5268, 3220, 7316, 660, 4756, 2708, 6804, 1684, 5780, 3732, 7828, 404, 4500, 2452, 6548, 1428, 5524, 3476, 7572, 916, 5012, 2964, 7060, 1940, 6036, 3988, 8084, 84, 4180, 2132, 6228, 1108, 5204, 3156, 7252, 596, 4692, 2644, 6740, 1620, 5716, 3668, 7764, 340, 4436, 2388, 6484, 1364, 5460, 3412, 7508, 852, 4948, 2900, 6996, 1876, 5972, 3924, 8020, 212, 4308, 2260, 6356, 1236, 5332, 3284, 7380, 724, 4820, 2772, 6868, 1748, 5844, 3796, 7892, 468, 4564, 2516, 6612, 1492, 5588, 3540, 7636, 980, 5076, 3028, 7124, 2004, 6100, 4052, 8148, 52, 4148, 2100, 6196, 1076, 5172, 3124, 7220, 564, 4660, 2612, 6708, 1588, 5684, 3636, 7732, 308, 4404, 2356, 6452, 1332, 5428, 3380, 7476, 820, 4916, 2868, 6964, 1844, 5940, 3892, 7988, 180, 4276, 2228, 6324, 1204, 5300, 3252, 7348, 692, 4788, 2740, 6836, 1716, 5812, 3764, 7860, 436, 4532, 2484, 6580, 1460, 5556, 3508, 7604, 948, 5044, 2996, 7092, 1972, 6068, 4020, 8116, 116, 4212, 2164, 6260, 1140, 5236, 3188, 7284, 628, 4724, 2676, 6772, 1652, 5748, 3700, 7796, 372, 4468, 2420, 6516, 1396, 5492, 3444, 7540, 884, 4980, 2932, 7028, 1908, 6004, 3956, 8052, 244, 4340, 2292, 6388, 1268, 5364, 3316, 7412, 756, 4852, 2804, 6900, 1780, 5876, 3828, 7924, 500, 4596, 2548, 6644, 1524, 5620, 3572, 7668, 1012, 5108, 3060, 7156, 2036, 6132, 4084, 8180, 12, 4108, 2060, 6156, 1036, 5132, 3084, 7180, 524, 4620, 2572, 6668, 1548, 5644, 3596, 7692, 268, 4364, 2316, 6412, 1292, 5388, 3340, 7436, 780, 4876, 2828, 6924, 1804, 5900, 3852, 7948, 140, 4236, 2188, 6284, 1164, 5260, 3212, 7308, 652, 4748, 2700, 6796, 1676, 5772, 3724, 7820, 396, 4492, 2444, 6540, 1420, 5516, 3468, 7564, 908, 5004, 2956, 7052, 1932, 6028, 3980, 8076, 76, 4172, 2124, 6220, 1100, 5196, 3148, 7244, 588, 4684, 2636, 6732, 1612, 5708, 3660, 7756, 332, 4428, 2380, 6476, 1356, 5452, 3404, 7500, 844, 4940, 2892, 6988, 1868, 5964, 3916, 8012, 204, 4300, 2252, 6348, 1228, 5324, 3276, 7372, 716, 4812, 2764, 6860, 1740, 5836, 3788, 7884, 460, 4556, 2508, 6604, 1484, 5580, 3532, 7628, 972, 5068, 3020, 7116, 1996, 6092, 4044, 8140, 44, 4140, 2092, 6188, 1068, 5164, 3116, 7212, 556, 4652, 2604, 6700, 1580, 5676, 3628, 7724, 300, 4396, 2348, 6444, 1324, 5420, 3372, 7468, 812, 4908, 2860, 6956, 1836, 5932, 3884, 7980, 172, 4268, 2220, 6316, 1196, 5292, 3244, 7340, 684, 4780, 2732, 6828, 1708, 5804, 3756, 7852, 428, 4524, 2476, 6572, 1452, 5548, 3500, 7596, 940, 5036, 2988, 7084, 1964, 6060, 4012, 8108, 108, 4204, 2156, 6252, 1132, 5228, 3180, 7276, 620, 4716, 2668, 6764, 1644, 5740, 3692, 7788, 364, 4460, 2412, 6508, 1388, 5484, 3436, 7532, 876, 4972, 2924, 7020, 1900, 5996, 3948, 8044, 236, 4332, 2284, 6380, 1260, 5356, 3308, 7404, 748, 4844, 2796, 6892, 1772, 5868, 3820, 7916, 492, 4588, 2540, 6636, 1516, 5612, 3564, 7660, 1004, 5100, 3052, 7148, 2028, 6124, 4076, 8172, 28, 4124, 2076, 6172, 1052, 5148, 3100, 7196, 540, 4636, 2588, 6684, 1564, 5660, 3612, 7708, 284, 4380, 2332, 6428, 1308, 5404, 3356, 7452, 796, 4892, 2844, 6940, 1820, 5916, 3868, 7964, 156, 4252, 2204, 6300, 1180, 5276, 3228, 7324, 668, 4764, 2716, 6812, 1692, 5788, 3740, 7836, 412, 4508, 2460, 6556, 1436, 5532, 3484, 7580, 924, 5020, 2972, 7068, 1948, 6044, 3996, 8092, 92, 4188, 2140, 6236, 1116, 5212, 3164, 7260, 604, 4700, 2652, 6748, 1628, 5724, 3676, 7772, 348, 4444, 2396, 6492, 1372, 5468, 3420, 7516, 860, 4956, 2908, 7004, 1884, 5980, 3932, 8028, 220, 4316, 2268, 6364, 1244, 5340, 3292, 7388, 732, 4828, 2780, 6876, 1756, 5852, 3804, 7900, 476, 4572, 2524, 6620, 1500, 5596, 3548, 7644, 988, 5084, 3036, 7132, 2012, 6108, 4060, 8156, 60, 4156, 2108, 6204, 1084, 5180, 3132, 7228, 572, 4668, 2620, 6716, 1596, 5692, 3644, 7740, 316, 4412, 2364, 6460, 1340, 5436, 3388, 7484, 828, 4924, 2876, 6972, 1852, 5948, 3900, 7996, 188, 4284, 2236, 6332, 1212, 5308, 3260, 7356, 700, 4796, 2748, 6844, 1724, 5820, 3772, 7868, 444, 4540, 2492, 6588, 1468, 5564, 3516, 7612, 956, 5052, 3004, 7100, 1980, 6076, 4028, 8124, 124, 4220, 2172, 6268, 1148, 5244, 3196, 7292, 636, 4732, 2684, 6780, 1660, 5756, 3708, 7804, 380, 4476, 2428, 6524, 1404, 5500, 3452, 7548, 892, 4988, 2940, 7036, 1916, 6012, 3964, 8060, 252, 4348, 2300, 6396, 1276, 5372, 3324, 7420, 764, 4860, 2812, 6908, 1788, 5884, 3836, 7932, 508, 4604, 2556, 6652, 1532, 5628, 3580, 7676, 1020, 5116, 3068, 7164, 2044, 6140, 4092, 8188, 2, 4098, 2050, 6146, 1026, 5122, 3074, 7170, 514, 4610, 2562, 6658, 1538, 5634, 3586, 7682, 258, 4354, 2306, 6402, 1282, 5378, 3330, 7426, 770, 4866, 2818, 6914, 1794, 5890, 3842, 7938, 130, 4226, 2178, 6274, 1154, 5250, 3202, 7298, 642, 4738, 2690, 6786, 1666, 5762, 3714, 7810, 386, 4482, 2434, 6530, 1410, 5506, 3458, 7554, 898, 4994, 2946, 7042, 1922, 6018, 3970, 8066, 66, 4162, 2114, 6210, 1090, 5186, 3138, 7234, 578, 4674, 2626, 6722, 1602, 5698, 3650, 7746, 322, 4418, 2370, 6466, 1346, 5442, 3394, 7490, 834, 4930, 2882, 6978, 1858, 5954, 3906, 8002, 194, 4290, 2242, 6338, 1218, 5314, 3266, 7362, 706, 4802, 2754, 6850, 1730, 5826, 3778, 7874, 450, 4546, 2498, 6594, 1474, 5570, 3522, 7618, 962, 5058, 3010, 7106, 1986, 6082, 4034, 8130, 34, 4130, 2082, 6178, 1058, 5154, 3106, 7202, 546, 4642, 2594, 6690, 1570, 5666, 3618, 7714, 290, 4386, 2338, 6434, 1314, 5410, 3362, 7458, 802, 4898, 2850, 6946, 1826, 5922, 3874, 7970, 162, 4258, 2210, 6306, 1186, 5282, 3234, 7330, 674, 4770, 2722, 6818, 1698, 5794, 3746, 7842, 418, 4514, 2466, 6562, 1442, 5538, 3490, 7586, 930, 5026, 2978, 7074, 1954, 6050, 4002, 8098, 98, 4194, 2146, 6242, 1122, 5218, 3170, 7266, 610, 4706, 2658, 6754, 1634, 5730, 3682, 7778, 354, 4450, 2402, 6498, 1378, 5474, 3426, 7522, 866, 4962, 2914, 7010, 1890, 5986, 3938, 8034, 226, 4322, 2274, 6370, 1250, 5346, 3298, 7394, 738, 4834, 2786, 6882, 1762, 5858, 3810, 7906, 482, 4578, 2530, 6626, 1506, 5602, 3554, 7650, 994, 5090, 3042, 7138, 2018, 6114, 4066, 8162, 18, 4114, 2066, 6162, 1042, 5138, 3090, 7186, 530, 4626, 2578, 6674, 1554, 5650, 3602, 7698, 274, 4370, 2322, 6418, 1298, 5394, 3346, 7442, 786, 4882, 2834, 6930, 1810, 5906, 3858, 7954, 146, 4242, 2194, 6290, 1170, 5266, 3218, 7314, 658, 4754, 2706, 6802, 1682, 5778, 3730, 7826, 402, 4498, 2450, 6546, 1426, 5522, 3474, 7570, 914, 5010, 2962, 7058, 1938, 6034, 3986, 8082, 82, 4178, 2130, 6226, 1106, 5202, 3154, 7250, 594, 4690, 2642, 6738, 1618, 5714, 3666, 7762, 338, 4434, 2386, 6482, 1362, 5458, 3410, 7506, 850, 4946, 2898, 6994, 1874, 5970, 3922, 8018, 210, 4306, 2258, 6354, 1234, 5330, 3282, 7378, 722, 4818, 2770, 6866, 1746, 5842, 3794, 7890, 466, 4562, 2514, 6610, 1490, 5586, 3538, 7634, 978, 5074, 3026, 7122, 2002, 6098, 4050, 8146, 50, 4146, 2098, 6194, 1074, 5170, 3122, 7218, 562, 4658, 2610, 6706, 1586, 5682, 3634, 7730, 306, 4402, 2354, 6450, 1330, 5426, 3378, 7474, 818, 4914, 2866, 6962, 1842, 5938, 3890, 7986, 178, 4274, 2226, 6322, 1202, 5298, 3250, 7346, 690, 4786, 2738, 6834, 1714, 5810, 3762, 7858, 434, 4530, 2482, 6578, 1458, 5554, 3506, 7602, 946, 5042, 2994, 7090, 1970, 6066, 4018, 8114, 114, 4210, 2162, 6258, 1138, 5234, 3186, 7282, 626, 4722, 2674, 6770, 1650, 5746, 3698, 7794, 370, 4466, 2418, 6514, 1394, 5490, 3442, 7538, 882, 4978, 2930, 7026, 1906, 6002, 3954, 8050, 242, 4338, 2290, 6386, 1266, 5362, 3314, 7410, 754, 4850, 2802, 6898, 1778, 5874, 3826, 7922, 498, 4594, 2546, 6642, 1522, 5618, 3570, 7666, 1010, 5106, 3058, 7154, 2034, 6130, 4082, 8178, 10, 4106, 2058, 6154, 1034, 5130, 3082, 7178, 522, 4618, 2570, 6666, 1546, 5642, 3594, 7690, 266, 4362, 2314, 6410, 1290, 5386, 3338, 7434, 778, 4874, 2826, 6922, 1802, 5898, 3850, 7946, 138, 4234, 2186, 6282, 1162, 5258, 3210, 7306, 650, 4746, 2698, 6794, 1674, 5770, 3722, 7818, 394, 4490, 2442, 6538, 1418, 5514, 3466, 7562, 906, 5002, 2954, 7050, 1930, 6026, 3978, 8074, 74, 4170, 2122, 6218, 1098, 5194, 3146, 7242, 586, 4682, 2634, 6730, 1610, 5706, 3658, 7754, 330, 4426, 2378, 6474, 1354, 5450, 3402, 7498, 842, 4938, 2890, 6986, 1866, 5962, 3914, 8010, 202, 4298, 2250, 6346, 1226, 5322, 3274, 7370, 714, 4810, 2762, 6858, 1738, 5834, 3786, 7882, 458, 4554, 2506, 6602, 1482, 5578, 3530, 7626, 970, 5066, 3018, 7114, 1994, 6090, 4042, 8138, 42, 4138, 2090, 6186, 1066, 5162, 3114, 7210, 554, 4650, 2602, 6698, 1578, 5674, 3626, 7722, 298, 4394, 2346, 6442, 1322, 5418, 3370, 7466, 810, 4906, 2858, 6954, 1834, 5930, 3882, 7978, 170, 4266, 2218, 6314, 1194, 5290, 3242, 7338, 682, 4778, 2730, 6826, 1706, 5802, 3754, 7850, 426, 4522, 2474, 6570, 1450, 5546, 3498, 7594, 938, 5034, 2986, 7082, 1962, 6058, 4010, 8106, 106, 4202, 2154, 6250, 1130, 5226, 3178, 7274, 618, 4714, 2666, 6762, 1642, 5738, 3690, 7786, 362, 4458, 2410, 6506, 1386, 5482, 3434, 7530, 874, 4970, 2922, 7018, 1898, 5994, 3946, 8042, 234, 4330, 2282, 6378, 1258, 5354, 3306, 7402, 746, 4842, 2794, 6890, 1770, 5866, 3818, 7914, 490, 4586, 2538, 6634, 1514, 5610, 3562, 7658, 1002, 5098, 3050, 7146, 2026, 6122, 4074, 8170, 26, 4122, 2074, 6170, 1050, 5146, 3098, 7194, 538, 4634, 2586, 6682, 1562, 5658, 3610, 7706, 282, 4378, 2330, 6426, 1306, 5402, 3354, 7450, 794, 4890, 2842, 6938, 1818, 5914, 3866, 7962, 154, 4250, 2202, 6298, 1178, 5274, 3226, 7322, 666, 4762, 2714, 6810, 1690, 5786, 3738, 7834, 410, 4506, 2458, 6554, 1434, 5530, 3482, 7578, 922, 5018, 2970, 7066, 1946, 6042, 3994, 8090, 90, 4186, 2138, 6234, 1114, 5210, 3162, 7258, 602, 4698, 2650, 6746, 1626, 5722, 3674, 7770, 346, 4442, 2394, 6490, 1370, 5466, 3418, 7514, 858, 4954, 2906, 7002, 1882, 5978, 3930, 8026, 218, 4314, 2266, 6362, 1242, 5338, 3290, 7386, 730, 4826, 2778, 6874, 1754, 5850, 3802, 7898, 474, 4570, 2522, 6618, 1498, 5594, 3546, 7642, 986, 5082, 3034, 7130, 2010, 6106, 4058, 8154, 58, 4154, 2106, 6202, 1082, 5178, 3130, 7226, 570, 4666, 2618, 6714, 1594, 5690, 3642, 7738, 314, 4410, 2362, 6458, 1338, 5434, 3386, 7482, 826, 4922, 2874, 6970, 1850, 5946, 3898, 7994, 186, 4282, 2234, 6330, 1210, 5306, 3258, 7354, 698, 4794, 2746, 6842, 1722, 5818, 3770, 7866, 442, 4538, 2490, 6586, 1466, 5562, 3514, 7610, 954, 5050, 3002, 7098, 1978, 6074, 4026, 8122, 122, 4218, 2170, 6266, 1146, 5242, 3194, 7290, 634, 4730, 2682, 6778, 1658, 5754, 3706, 7802, 378, 4474, 2426, 6522, 1402, 5498, 3450, 7546, 890, 4986, 2938, 7034, 1914, 6010, 3962, 8058, 250, 4346, 2298, 6394, 1274, 5370, 3322, 7418, 762, 4858, 2810, 6906, 1786, 5882, 3834, 7930, 506, 4602, 2554, 6650, 1530, 5626, 3578, 7674, 1018, 5114, 3066, 7162, 2042, 6138, 4090, 8186, 6, 4102, 2054, 6150, 1030, 5126, 3078, 7174, 518, 4614, 2566, 6662, 1542, 5638, 3590, 7686, 262, 4358, 2310, 6406, 1286, 5382, 3334, 7430, 774, 4870, 2822, 6918, 1798, 5894, 3846, 7942, 134, 4230, 2182, 6278, 1158, 5254, 3206, 7302, 646, 4742, 2694, 6790, 1670, 5766, 3718, 7814, 390, 4486, 2438, 6534, 1414, 5510, 3462, 7558, 902, 4998, 2950, 7046, 1926, 6022, 3974, 8070, 70, 4166, 2118, 6214, 1094, 5190, 3142, 7238, 582, 4678, 2630, 6726, 1606, 5702, 3654, 7750, 326, 4422, 2374, 6470, 1350, 5446, 3398, 7494, 838, 4934, 2886, 6982, 1862, 5958, 3910, 8006, 198, 4294, 2246, 6342, 1222, 5318, 3270, 7366, 710, 4806, 2758, 6854, 1734, 5830, 3782, 7878, 454, 4550, 2502, 6598, 1478, 5574, 3526, 7622, 966, 5062, 3014, 7110, 1990, 6086, 4038, 8134, 38, 4134, 2086, 6182, 1062, 5158, 3110, 7206, 550, 4646, 2598, 6694, 1574, 5670, 3622, 7718, 294, 4390, 2342, 6438, 1318, 5414, 3366, 7462, 806, 4902, 2854, 6950, 1830, 5926, 3878, 7974, 166, 4262, 2214, 6310, 1190, 5286, 3238, 7334, 678, 4774, 2726, 6822, 1702, 5798, 3750, 7846, 422, 4518, 2470, 6566, 1446, 5542, 3494, 7590, 934, 5030, 2982, 7078, 1958, 6054, 4006, 8102, 102, 4198, 2150, 6246, 1126, 5222, 3174, 7270, 614, 4710, 2662, 6758, 1638, 5734, 3686, 7782, 358, 4454, 2406, 6502, 1382, 5478, 3430, 7526, 870, 4966, 2918, 7014, 1894, 5990, 3942, 8038, 230, 4326, 2278, 6374, 1254, 5350, 3302, 7398, 742, 4838, 2790, 6886, 1766, 5862, 3814, 7910, 486, 4582, 2534, 6630, 1510, 5606, 3558, 7654, 998, 5094, 3046, 7142, 2022, 6118, 4070, 8166, 22, 4118, 2070, 6166, 1046, 5142, 3094, 7190, 534, 4630, 2582, 6678, 1558, 5654, 3606, 7702, 278, 4374, 2326, 6422, 1302, 5398, 3350, 7446, 790, 4886, 2838, 6934, 1814, 5910, 3862, 7958, 150, 4246, 2198, 6294, 1174, 5270, 3222, 7318, 662, 4758, 2710, 6806, 1686, 5782, 3734, 7830, 406, 4502, 2454, 6550, 1430, 5526, 3478, 7574, 918, 5014, 2966, 7062, 1942, 6038, 3990, 8086, 86, 4182, 2134, 6230, 1110, 5206, 3158, 7254, 598, 4694, 2646, 6742, 1622, 5718, 3670, 7766, 342, 4438, 2390, 6486, 1366, 5462, 3414, 7510, 854, 4950, 2902, 6998, 1878, 5974, 3926, 8022, 214, 4310, 2262, 6358, 1238, 5334, 3286, 7382, 726, 4822, 2774, 6870, 1750, 5846, 3798, 7894, 470, 4566, 2518, 6614, 1494, 5590, 3542, 7638, 982, 5078, 3030, 7126, 2006, 6102, 4054, 8150, 54, 4150, 2102, 6198, 1078, 5174, 3126, 7222, 566, 4662, 2614, 6710, 1590, 5686, 3638, 7734, 310, 4406, 2358, 6454, 1334, 5430, 3382, 7478, 822, 4918, 2870, 6966, 1846, 5942, 3894, 7990, 182, 4278, 2230, 6326, 1206, 5302, 3254, 7350, 694, 4790, 2742, 6838, 1718, 5814, 3766, 7862, 438, 4534, 2486, 6582, 1462, 5558, 3510, 7606, 950, 5046, 2998, 7094, 1974, 6070, 4022, 8118, 118, 4214, 2166, 6262, 1142, 5238, 3190, 7286, 630, 4726, 2678, 6774, 1654, 5750, 3702, 7798, 374, 4470, 2422, 6518, 1398, 5494, 3446, 7542, 886, 4982, 2934, 7030, 1910, 6006, 3958, 8054, 246, 4342, 2294, 6390, 1270, 5366, 3318, 7414, 758, 4854, 2806, 6902, 1782, 5878, 3830, 7926, 502, 4598, 2550, 6646, 1526, 5622, 3574, 7670, 1014, 5110, 3062, 7158, 2038, 6134, 4086, 8182, 14, 4110, 2062, 6158, 1038, 5134, 3086, 7182, 526, 4622, 2574, 6670, 1550, 5646, 3598, 7694, 270, 4366, 2318, 6414, 1294, 5390, 3342, 7438, 782, 4878, 2830, 6926, 1806, 5902, 3854, 7950, 142, 4238, 2190, 6286, 1166, 5262, 3214, 7310, 654, 4750, 2702, 6798, 1678, 5774, 3726, 7822, 398, 4494, 2446, 6542, 1422, 5518, 3470, 7566, 910, 5006, 2958, 7054, 1934, 6030, 3982, 8078, 78, 4174, 2126, 6222, 1102, 5198, 3150, 7246, 590, 4686, 2638, 6734, 1614, 5710, 3662, 7758, 334, 4430, 2382, 6478, 1358, 5454, 3406, 7502, 846, 4942, 2894, 6990, 1870, 5966, 3918, 8014, 206, 4302, 2254, 6350, 1230, 5326, 3278, 7374, 718, 4814, 2766, 6862, 1742, 5838, 3790, 7886, 462, 4558, 2510, 6606, 1486, 5582, 3534, 7630, 974, 5070, 3022, 7118, 1998, 6094, 4046, 8142, 46, 4142, 2094, 6190, 1070, 5166, 3118, 7214, 558, 4654, 2606, 6702, 1582, 5678, 3630, 7726, 302, 4398, 2350, 6446, 1326, 5422, 3374, 7470, 814, 4910, 2862, 6958, 1838, 5934, 3886, 7982, 174, 4270, 2222, 6318, 1198, 5294, 3246, 7342, 686, 4782, 2734, 6830, 1710, 5806, 3758, 7854, 430, 4526, 2478, 6574, 1454, 5550, 3502, 7598, 942, 5038, 2990, 7086, 1966, 6062, 4014, 8110, 110, 4206, 2158, 6254, 1134, 5230, 3182, 7278, 622, 4718, 2670, 6766, 1646, 5742, 3694, 7790, 366, 4462, 2414, 6510, 1390, 5486, 3438, 7534, 878, 4974, 2926, 7022, 1902, 5998, 3950, 8046, 238, 4334, 2286, 6382, 1262, 5358, 3310, 7406, 750, 4846, 2798, 6894, 1774, 5870, 3822, 7918, 494, 4590, 2542, 6638, 1518, 5614, 3566, 7662, 1006, 5102, 3054, 7150, 2030, 6126, 4078, 8174, 30, 4126, 2078, 6174, 1054, 5150, 3102, 7198, 542, 4638, 2590, 6686, 1566, 5662, 3614, 7710, 286, 4382, 2334, 6430, 1310, 5406, 3358, 7454, 798, 4894, 2846, 6942, 1822, 5918, 3870, 7966, 158, 4254, 2206, 6302, 1182, 5278, 3230, 7326, 670, 4766, 2718, 6814, 1694, 5790, 3742, 7838, 414, 4510, 2462, 6558, 1438, 5534, 3486, 7582, 926, 5022, 2974, 7070, 1950, 6046, 3998, 8094, 94, 4190, 2142, 6238, 1118, 5214, 3166, 7262, 606, 4702, 2654, 6750, 1630, 5726, 3678, 7774, 350, 4446, 2398, 6494, 1374, 5470, 3422, 7518, 862, 4958, 2910, 7006, 1886, 5982, 3934, 8030, 222, 4318, 2270, 6366, 1246, 5342, 3294, 7390, 734, 4830, 2782, 6878, 1758, 5854, 3806, 7902, 478, 4574, 2526, 6622, 1502, 5598, 3550, 7646, 990, 5086, 3038, 7134, 2014, 6110, 4062, 8158, 62, 4158, 2110, 6206, 1086, 5182, 3134, 7230, 574, 4670, 2622, 6718, 1598, 5694, 3646, 7742, 318, 4414, 2366, 6462, 1342, 5438, 3390, 7486, 830, 4926, 2878, 6974, 1854, 5950, 3902, 7998, 190, 4286, 2238, 6334, 1214, 5310, 3262, 7358, 702, 4798, 2750, 6846, 1726, 5822, 3774, 7870, 446, 4542, 2494, 6590, 1470, 5566, 3518, 7614, 958, 5054, 3006, 7102, 1982, 6078, 4030, 8126, 126, 4222, 2174, 6270, 1150, 5246, 3198, 7294, 638, 4734, 2686, 6782, 1662, 5758, 3710, 7806, 382, 4478, 2430, 6526, 1406, 5502, 3454, 7550, 894, 4990, 2942, 7038, 1918, 6014, 3966, 8062, 254, 4350, 2302, 6398, 1278, 5374, 3326, 7422, 766, 4862, 2814, 6910, 1790, 5886, 3838, 7934, 510, 4606, 2558, 6654, 1534, 5630, 3582, 7678, 1022, 5118, 3070, 7166, 2046, 6142, 4094, 8190].

When N=2048:

A sequence 1c is as follows:

Shorten_Q=[0, 1024, 512, 1536, 256, 1280, 768, 1792, 128, 1152, 640, 1664, 384, 1408, 896, 1920, 64, 1088, 576, 1600, 320, 1344, 832, 1856, 192, 1216, 704, 1728, 448, 1472, 960, 1984, 32, 1056, 544, 1568, 288, 1312, 800, 1824, 160, 1184, 672, 1696, 416, 1440, 928, 1952, 96, 1120, 608, 1632, 352, 1376, 864, 1888, 224, 1248, 736, 1760, 480, 1504, 992, 2016, 16, 1040, 528, 1552, 272, 1296, 784, 1808, 144, 1168, 656, 1680, 400, 1424, 912, 1936, 80, 1104, 592, 1616, 336, 1360, 848, 1872, 208, 1232, 720, 1744, 464, 1488, 976, 2000, 48, 1072, 560, 1584, 304, 1328, 816, 1840, 176, 1200, 688, 1712, 432, 1456, 944, 1968, 112, 1136, 624, 1648, 368, 1392, 880, 1904, 240, 1264, 752, 1776, 496, 1520, 1008, 2032, 8, 1032, 520, 1544, 264, 1288, 776, 1800, 136, 1160, 648, 1672, 392, 1416, 904, 1928, 72, 1096, 584, 1608, 328, 1352, 840, 1864, 200, 1224, 712, 1736, 456, 1480, 968, 1992, 40, 1064, 552, 1576, 296, 1320, 808, 1832, 168, 1192, 680, 1704, 424, 1448, 936, 1960, 104, 1128, 616, 1640, 360, 1384, 872, 1896, 232, 1256, 744, 1768, 488, 1512, 1000, 2024, 24, 1048, 536, 1560, 280, 1304, 792, 1816, 152, 1176, 664, 1688, 408, 1432, 920, 1944, 88, 1112, 600, 1624, 344, 1368, 856, 1880, 216, 1240, 728, 1752, 472, 1496, 984, 2008, 56, 1080, 568, 1592, 312, 1336, 824, 1848, 184, 1208, 696, 1720, 440, 1464, 952, 1976, 120, 1144, 632, 1656, 376, 1400, 888, 1912, 248, 1272, 760, 1784, 504, 1528, 1016, 2040, 4, 1028, 516, 1540, 260, 1284, 772, 1796, 132, 1156, 644, 1668, 388, 1412, 900, 1924, 68, 1092, 580, 1604, 324, 1348, 836, 1860, 196, 1220, 708, 1732, 452, 1476, 964, 1988, 36, 1060, 548, 1572, 292, 1316, 804, 1828, 164, 1188, 676, 1700, 420, 1444, 932, 1956, 100, 1124, 612, 1636, 356, 1380, 868, 1892, 228, 1252, 740, 1764, 484, 1508, 996, 2020, 20, 1044, 532, 1556, 276, 1300, 788, 1812, 148, 1172, 660, 1684, 404, 1428, 916, 1940, 84, 1108, 596, 1620, 340, 1364, 852, 1876, 212, 1236, 724, 1748, 468, 1492, 980, 2004, 52, 1076, 564, 1588, 308, 1332, 820, 1844, 180, 1204, 692, 1716, 436, 1460, 948, 1972, 116, 1140, 628, 1652, 372, 1396, 884, 1908, 244, 1268, 756, 1780, 500, 1524, 1012, 2036, 12, 1036, 524, 1548, 268, 1292, 780, 1804, 140, 1164, 652, 1676, 396, 1420, 908, 1932, 76, 1100, 588, 1612, 332, 1356, 844, 1868, 204, 1228, 716, 1740, 460, 1484, 972, 1996, 44, 1068, 556, 1580, 300, 1324, 812, 1836, 172, 1196, 684, 1708, 428, 1452, 940, 1964, 108, 1132, 620, 1644, 364, 1388, 876, 1900, 236, 1260, 748, 1772, 492, 1516, 1004, 2028, 28, 1052, 540, 1564, 284, 1308, 796, 1820, 156, 1180, 668, 1692, 412, 1436, 924, 1948, 92, 1116, 604, 1628, 348, 1372, 860, 1884, 220, 1244, 732, 1756, 476, 1500, 988, 2012, 60, 1084, 572, 1596, 316, 1340, 828, 1852, 188, 1212, 700, 1724, 444, 1468, 956, 1980, 124, 1148, 636, 1660, 380, 1404, 892, 1916, 252, 1276, 764, 1788, 508, 1532, 1020, 2044, 2, 1026, 514, 1538, 258, 1282, 770, 1794, 130, 1154, 642, 1666, 386, 1410, 898, 1922, 66, 1090, 578, 1602, 322, 1346, 834, 1858, 194, 1218, 706, 1730, 450, 1474, 962, 1986, 34, 1058, 546, 1570, 290, 1314, 802, 1826, 162, 1186, 674, 1698, 418, 1442, 930, 1954, 98, 1122, 610, 1634, 354, 1378, 866, 1890, 226, 1250, 738, 1762, 482, 1506, 994, 2018, 18, 1042, 530, 1554, 274, 1298, 786, 1810, 146, 1170, 658, 1682, 402, 1426, 914, 1938, 82, 1106, 594, 1618, 338, 1362, 850, 1874, 210, 1234, 722, 1746, 466, 1490, 978, 2002, 50, 1074, 562, 1586, 306, 1330, 818, 1842, 178, 1202, 690, 1714, 434, 1458, 946, 1970, 114, 1138, 626, 1650, 370, 1394, 882, 1906, 242, 1266, 754, 1778, 498, 1522, 1010, 2034, 10, 1034, 522, 1546, 266, 1290, 778, 1802, 138, 1162, 650, 1674, 394, 1418, 906, 1930, 74, 1098, 586, 1610, 330, 1354, 842, 1866, 202, 1226, 714, 1738, 458, 1482, 970, 1994, 42, 1066, 554, 1578, 298, 1322, 810, 1834, 170, 1194, 682, 1706, 426, 1450, 938, 1962, 106, 1130, 618, 1642, 362, 1386, 874, 1898, 234, 1258, 746, 1770, 490, 1514, 1002, 2026, 26, 1050, 538, 1562, 282, 1306, 794, 1818, 154, 1178, 666, 1690, 410, 1434, 922, 1946, 90, 1114, 602, 1626, 346, 1370, 858, 1882, 218, 1242, 730, 1754, 474, 1498, 986, 2010, 58, 1082, 570, 1594, 314, 1338, 826, 1850, 186, 1210, 698, 1722, 442, 1466, 954, 1978, 122, 1146, 634, 1658, 378, 1402, 890, 1914, 250, 1274, 762, 1786, 506,
1530, 1018, 2042, 6, 1030, 518, 1542, 262, 1286, 774, 1798,
134, 1158, 646, 1670, 390, 1414, 902, 1926, 70, 1094, 582,
1606, 326, 1350, 838, 1862, 198, 1222, 710, 1734, 454,
1478, 966, 1990, 38, 1062, 550, 1574, 294, 1318, 806, 1830,
166, 1190, 678, 1702, 422, 1446, 934, 1958, 102, 1126, 614,
1638, 358, 1382, 870, 1894, 230, 1254, 742, 1766, 486,
1510, 998, 2022, 22, 1046, 534, 1558, 278, 1302, 790, 1814,
150, 1174, 662, 1686, 406, 1430, 918, 1942, 86, 1110, 598,
1622, 342, 1366, 854, 1878, 214, 1238, 726, 1750, 470,
1494, 982, 2006, 54, 1078, 566, 1590, 310, 1334, 822, 1846,
182, 1206, 694, 1718, 438, 1462, 950, 1974, 118, 1142, 630,
1654, 374, 1398, 886, 1910, 246, 1270, 758, 1782, 502,
1526, 1014, 2038, 14, 1038, 526, 1550, 270, 1294, 782,
1806, 142, 1166, 654, 1678, 398, 1422, 910, 1934, 78, 1102,
590, 1614, 334, 1358, 846, 1870, 206, 1230, 718, 1742, 462,
1486, 974, 1998, 46, 1070, 558, 1582, 302, 1326, 814, 1838,
174, 1198, 686, 1710, 430, 1454, 942, 1966, 110, 1134, 622,
1646, 366, 1390, 878, 1902, 238, 1262, 750, 1774, 494,
1518, 1006, 2030, 30, 1054, 542, 1566, 286, 1310, 798,
1822, 158, 1182, 670, 1694, 414, 1438, 926, 1950, 94, 1118,
606, 1630, 350, 1374, 862, 1886, 222, 1246, 734, 1758, 478,
1502, 990, 2014, 62, 1086, 574, 1598, 318, 1342, 830, 1854,
190, 1214, 702, 1726, 446, 1470, 958, 1982, 126, 1150, 638,
1662, 382, 1406, 894, 1918, 254, 1278, 766, 1790, 510,
1534, 1022, 2046, 1, 1025, 513, 1537, 257, 1281, 769, 1793,
129, 1153, 641, 1665, 385, 1409, 897, 1921, 65, 1089, 577,
1601, 321, 1345, 833, 1857, 193, 1217, 705, 1729, 449,
1473, 961, 1985, 33, 1057, 545, 1569, 289, 1313, 801, 1825,
161, 1185, 673, 1697, 417, 1441, 929, 1953, 97, 1121, 609,
1633, 353, 1377, 865, 1889, 225, 1249, 737, 1761, 481,
1505, 993, 2017, 17, 1041, 529, 1553, 273, 1297, 785, 1809,
145, 1169, 657, 1681, 401, 1425, 913, 1937, 81, 1105, 593,
1617, 337, 1361, 849, 1873, 209, 1233, 721, 1745, 465,
1489, 977, 2001, 49, 1073, 561, 1585, 305, 1329, 817, 1841,
177, 1201, 689, 1713, 433, 1457, 945, 1969, 113, 1137, 625,
1649, 369, 1393, 881, 1905, 241, 1265, 753, 1777, 497,
1521, 1009, 2033, 9, 1033, 521, 1545, 265, 1289, 777, 1801,
137, 1161, 649, 1673, 393, 1417, 905, 1929, 73, 1097, 585,
1609, 329, 1353, 841, 1865, 201, 1225, 713, 1737, 457,
1481, 969, 1993, 41, 1065, 553, 1577, 297, 1321, 809, 1833,
169, 1193, 681, 1705, 425, 1449, 937, 1961, 105, 1129, 617,
1641, 361, 1385, 873, 1897, 233, 1257, 745, 1769, 489,
1513, 1001, 2025, 25, 1049, 537, 1561, 281, 1305, 793,
1817, 153, 1177, 665, 1689, 409, 1433, 921, 1945, 89, 1113,
601, 1625, 345, 1369, 857, 1881, 217, 1241, 729, 1753, 473,
1497, 985, 2009, 57, 1081, 569, 1593, 313, 1337, 825, 1849,
185, 1209, 697, 1721, 441, 1465, 953, 1977, 121, 1145, 633,
1657, 377, 1401, 889, 1913, 249, 1273, 761, 1785, 505,
1529, 1017, 2041, 5, 1029, 517, 1541, 261, 1285, 773, 1797,
133, 1157, 645, 1669, 389, 1413, 901, 1925, 69, 1093, 581,
1605, 325, 1349, 837, 1861, 197, 1221, 709, 1733, 453,
1477, 965, 1989, 37, 1061, 549, 1573, 293, 1317, 805, 1829,
165, 1189, 677, 1701, 421, 1445, 933, 1957, 101, 1125, 613,
1637, 357, 1381, 869, 1893, 229, 1253, 741, 1765, 485,
1509, 997, 2021, 21, 1045, 533, 1557, 277, 1301, 789, 1813,
149, 1173, 661, 1685, 405, 1429, 917, 1941, 85, 1109, 597,
1621, 341, 1365, 853, 1877, 213, 1237, 725, 1749, 469,
1493, 981, 2005, 53, 1077, 565, 1589, 309, 1333, 821, 1845,
181, 1205, 693, 1717, 437, 1461, 949, 1973, 117, 1141, 629,
1653, 373, 1397, 885, 1909, 245, 1269, 757, 1781, 501,
1525, 1013, 2037, 13, 1037, 525, 1549, 269, 1293, 781,
1805, 141, 1165, 653, 1677, 397, 1421, 909, 1933, 77, 1101,
589, 1613, 333, 1357, 845, 1869, 205, 1229, 717, 1741, 461,
1485, 973, 1997, 45, 1069, 557, 1581, 301, 1325, 813, 1837,
173, 1197, 685, 1709, 429, 1453, 941, 1965, 109, 1133, 621,
1645, 365, 1389, 877, 1901, 237, 1261, 749, 1773, 493,
1517, 1005, 2029, 29, 1053, 541, 1565, 285, 1309, 797,
1821, 157, 1181, 669, 1693, 413, 1437, 925, 1949, 93, 1117,
605, 1629, 349, 1373, 861, 1885, 221, 1245, 733, 1757, 477,
1501, 989, 2013, 61, 1085, 573, 1597, 317, 1341, 829, 1853,
189, 1213, 701, 1725, 445, 1469, 957, 1981, 125, 1149, 637,
1661, 381, 1405, 893, 1917, 253, 1277, 765, 1789, 509,
1533, 1021, 2045, 3, 1027, 515, 1539, 259, 1283, 771, 1795,
131, 1155, 643, 1667, 387, 1411, 899, 1923, 67, 1091, 579,
1603, 323, 1347, 835, 1859, 195, 1219, 707, 1731, 451,
1475, 963, 1987, 35, 1059, 547, 1571, 291, 1315, 803, 1827,
163, 1187, 675, 1699, 419, 1443, 931, 1955, 99, 1123, 611,
1635, 355, 1379, 867, 1891, 227, 1251, 739, 1763, 483,
1507, 995, 2019, 19, 1043, 531, 1555, 275, 1299, 787, 1811,
147, 1171, 659, 1683, 403, 1427, 915, 1939, 83, 1107, 595,
1619, 339, 1363, 851, 1875, 211, 1235, 723, 1747, 467,
1491, 979, 2003, 51, 1075, 563, 1587, 307, 1331, 819, 1843,
179, 1203, 691, 1715, 435, 1459, 947, 1971, 115, 1139, 627,
1651, 371, 1395, 883, 1907, 243, 1267, 755, 1779, 499,
1523, 1011, 2035, 11, 1035, 523, 1547, 267, 1291, 779,
1803, 139, 1163, 651, 1675, 395, 1419, 907, 1931, 75, 1099,
587, 1611, 331, 1355, 843, 1867, 203, 1227, 715, 1739, 459,
1483, 971, 1995, 43, 1067, 555, 1579, 299, 1323, 811, 1835,
171, 1195, 683, 1707, 427, 1451, 939, 1963, 107, 1131, 619,
1643, 363, 1387, 875, 1899, 235, 1259, 747, 1771, 491,
1515, 1003, 2027, 27, 1051, 539, 1563, 283, 1307, 795,
1819, 155, 1179, 667, 1691, 411, 1435, 923, 1947, 91, 1115,
603, 1627, 347, 1371, 859, 1883, 219, 1243, 731, 1755, 475,
1499, 987, 2011, 59, 1083, 571, 1595, 315, 1339, 827, 1851,
187, 1211, 699, 1723, 443, 1467, 955, 1979, 123, 1147, 635,
1659, 379, 1403, 891, 1915, 251, 1275, 763, 1787, 507,
1531, 1019, 2043, 7, 1031, 519, 1543, 263, 1287, 775, 1799,
135, 1159, 647, 1671, 391, 1415, 903, 1927, 71, 1095, 583,
1607, 327, 1351, 839, 1863, 199, 1223, 711, 1735, 455,
1479, 967, 1991, 39, 1063, 551, 1575, 295, 1319, 807, 1831,
167, 1191, 679, 1703, 423, 1447, 935, 1959, 103, 1127, 615,
1639, 359, 1383, 871, 1895, 231, 1255, 743, 1767, 487,
1511, 999, 2023, 23, 1047, 535, 1559, 279, 1303, 791, 1815,
151, 1175, 663, 1687, 407, 1431, 919, 1943, 87, 1111, 599,
1623, 343, 1367, 855, 1879, 215, 1239, 727, 1751, 471,
1495, 983, 2007, 55, 1079, 567, 1591, 311, 1335, 823, 1847,
183, 1207, 695, 1719, 439, 1463, 951, 1975, 119, 1143, 631,
1655, 375, 1399, 887, 1911, 247, 1271, 759, 1783, 503,
1527, 1015, 2039, 15, 1039, 527, 1551, 271, 1295, 783,
1807, 143, 1167, 655, 1679, 399, 1423, 911, 1935, 79, 1103,
591, 1615, 335, 1359, 847, 1871, 207, 1231, 719, 1743, 463,
1487, 975, 1999, 47, 1071, 559, 1583, 303, 1327, 815, 1839,
175, 1199, 687, 1711, 431, 1455, 943, 1967, 111, 1135, 623,
1647, 367, 1391, 879, 1903, 239, 1263, 751, 1775, 495,
1519, 1007, 2031, 31, 1055, 543, 1567, 287, 1311, 799,
1823, 159, 1183, 671, 1695, 415, 1439, 927, 1951, 95, 1119,
607, 1631, 351, 1375, 863, 1887, 223, 1247, 735, 1759, 479,
1503, 991, 2015, 63, 1087, 575, 1599, 319, 1343, 831, 1855,
191, 1215, 703, 1727, 447, 1471, 959, 1983, 127, 1151, 639,
1663, 383, 1407, 895, 1919, 255, 1279, 767, 1791, 511,
1535, 1023, 2047].

A sequence 2c is as follows:

Shorten_Q_half=[1, 1025, 513, 1537, 257, 1281, 769,
1793, 129, 1153, 641, 1665, 385, 1409, 897, 1921, 65, 1089,
577, 1601, 321, 1345, 833, 1857, 193, 1217, 705, 1729, 449,
1473, 961, 1985, 33, 1057, 545, 1569, 289, 1313, 801, 1825,
161, 1185, 673, 1697, 417, 1441, 929, 1953, 97, 1121, 609,
1633, 353, 1377, 865, 1889, 225, 1249, 737, 1761, 481,
1505, 993, 2017, 17, 1041, 529, 1553, 273, 1297, 785, 1809,
145, 1169, 657, 1681, 401, 1425, 913, 1937, 81, 1105, 593,
1617, 337, 1361, 849, 1873, 209, 1233, 721, 1745, 465,
1489, 977, 2001, 49, 1073, 561, 1585, 305, 1329, 817, 1841,
177, 1201, 689, 1713, 433, 1457, 945, 1969, 113, 1137, 625, 1649, 369, 1393, 881, 1905, 241, 1265, 753, 1777, 497,
1521, 1009, 2033, 9, 1033, 521, 1545, 265, 1289, 777, 1801,
137, 1161, 649, 1673, 393, 1417, 905, 1929, 73, 1097, 585,
1609, 329, 1353, 841, 1865, 201, 1225, 713, 1737, 457,
1481, 969, 1993, 41, 1065, 553, 1577, 297, 1321, 809, 1833,
169, 1193, 681, 1705, 425, 1449, 937, 1961, 105, 1129, 617,
1641, 361, 1385, 873, 1897, 233, 1257, 745, 1769, 489,
1513, 1001, 2025, 25, 1049, 537, 1561, 281, 1305, 793,
1817, 153, 1177, 665, 1689, 409, 1433, 921, 1945, 89, 1113,
601, 1625, 345, 1369, 857, 1881, 217, 1241, 729, 1753, 473,
1497, 985, 2009, 57, 1081, 569, 1593, 313, 1337, 825, 1849,
185, 1209, 697, 1721, 441, 1465, 953, 1977, 121, 1145, 633,
1657, 377, 1401, 889, 1913, 249, 1273, 761, 1785, 505,
1529, 1017, 2041, 5, 1029, 517, 1541, 261, 1285, 773, 1797,
133, 1157, 645, 1669, 389, 1413, 901, 1925, 69, 1093, 581,
1605, 325, 1349, 837, 1861, 197, 1221, 709, 1733, 453,
1477, 965, 1989, 37, 1061, 549, 1573, 293, 1317, 805, 1829,
165, 1189, 677, 1701, 421, 1445, 933, 1957, 101, 1125, 613,
1637, 357, 1381, 869, 1893, 229, 1253, 741, 1765, 485,
1509, 997, 2021, 21, 1045, 533, 1557, 277, 1301, 789, 1813,
149, 1173, 661, 1685, 405, 1429, 917, 1941, 85, 1109, 597,
1621, 341, 1365, 853, 1877, 213, 1237, 725, 1749, 469,
1493, 981, 2005, 53, 1077, 565, 1589, 309, 1333, 821, 1845,
181, 1205, 693, 1717, 437, 1461, 949, 1973, 117, 1141, 629,
1653, 373, 1397, 885, 1909, 245, 1269, 757, 1781, 501,
1525, 1013, 2037, 13, 1037, 525, 1549, 269, 1293, 781,
1805, 141, 1165, 653, 1677, 397, 1421, 909, 1933, 77, 1101,
589, 1613, 333, 1357, 845, 1869, 205, 1229, 717, 1741, 461,
1485, 973, 1997, 45, 1069, 557, 1581, 301, 1325, 813, 1837,
173, 1197, 685, 1709, 429, 1453, 941, 1965, 109, 1133, 621,
1645, 365, 1389, 877, 1901, 237, 1261, 749, 1773, 493,
1517, 1005, 2029, 29, 1053, 541, 1565, 285, 1309, 797,
1821, 157, 1181, 669, 1693, 413, 1437, 925, 1949, 93, 1117,
605, 1629, 349, 1373, 861, 1885, 221, 1245, 733, 1757, 477,
1501, 989, 2013, 61, 1085, 573, 1597, 317, 1341, 829, 1853,
189, 1213, 701, 1725, 445, 1469, 957, 1981, 125, 1149, 637,
1661, 381, 1405, 893, 1917, 253, 1277, 765, 1789, 509,
1533, 1021, 2045, 3, 1027, 515, 1539, 259, 1283, 771, 1795,
131, 1155, 643, 1667, 387, 1411, 899, 1923, 67, 1091, 579,
1603, 323, 1347, 835, 1859, 195, 1219, 707, 1731, 451,
1475, 963, 1987, 35, 1059, 547, 1571, 291, 1315, 803, 1827,
163, 1187, 675, 1699, 419, 1443, 931, 1955, 99, 1123, 611,
1635, 355, 1379, 867, 1891, 227, 1251, 739, 1763, 483,
1507, 995, 2019, 19, 1043, 531, 1555, 275, 1299, 787, 1811,
147, 1171, 659, 1683, 403, 1427, 915, 1939, 83, 1107, 595,
1619, 339, 1363, 851, 1875, 211, 1235, 723, 1747, 467,
1491, 979, 2003, 51, 1075, 563, 1587, 307, 1331, 819, 1843,
179, 1203, 691, 1715, 435, 1459, 947, 1971, 115, 1139, 627,
1651, 371, 1395, 883, 1907, 243, 1267, 755, 1779, 499,
1523, 1011, 2035, 11, 1035, 523, 1547, 267, 1291, 779,
1803, 139, 1163, 651, 1675, 395, 1419, 907, 1931, 75, 1099,
587, 1611, 331, 1355, 843, 1867, 203, 1227, 715, 1739, 459,
1483, 971, 1995, 43, 1067, 555, 1579, 299, 1323, 811, 1835,
171, 1195, 683, 1707, 427, 1451, 939, 1963, 107, 1131, 619,
1643, 363, 1387, 875, 1899, 235, 1259, 747, 1771, 491,
1515, 1003, 2027, 27, 1051, 539, 1563, 283, 1307, 795,
1819, 155, 1179, 667, 1691, 411, 1435, 923, 1947, 91, 1115,
603, 1627, 347, 1371, 859, 1883, 219, 1243, 731, 1755, 475,
1499, 987, 2011, 59, 1083, 571, 1595, 315, 1339, 827, 1851,
187, 1211, 699, 1723, 443, 1467, 955, 1979, 123, 1147, 635,
1659, 379, 1403, 891, 1915, 251, 1275, 763, 1787, 507,
1531, 1019, 2043, 7, 1031, 519, 1543, 263, 1287, 775, 1799,
135, 1159, 647, 1671, 391, 1415, 903, 1927, 71, 1095, 583,
1607, 327, 1351, 839, 1863, 199, 1223, 711, 1735, 455,
1479, 967, 1991, 39, 1063, 551, 1575, 295, 1319, 807, 1831,
167, 1191, 679, 1703, 423, 1447, 935, 1959, 103, 1127, 615,
1639, 359, 1383, 871, 1895, 231, 1255, 743, 1767, 487,
1511, 999, 2023, 23, 1047, 535, 1559, 279, 1303, 791, 1815,
151, 1175, 663, 1687, 407, 1431, 919, 1943, 87, 1111, 599,
1623, 343, 1367, 855, 1879, 215, 1239, 727, 1751, 471,
1495, 983, 2007, 55, 1079, 567, 1591, 311, 1335, 823, 1847,
183, 1207, 695, 1719, 439, 1463, 951, 1975, 119, 1143, 631,
1655, 375, 1399, 887, 1911, 247, 1271, 759, 1783, 503,
1527, 1015, 2039, 15, 1039, 527, 1551, 271, 1295, 783,
1807, 143, 1167, 655, 1679, 399, 1423, 911, 1935, 79, 1103,
591, 1615, 335, 1359, 847, 1871, 207, 1231, 719, 1743, 463,
1487, 975, 1999, 47, 1071, 559, 1583, 303, 1327, 815, 1839,
175, 1199, 687, 1711, 431, 1455, 943, 1967, 111, 1135, 623,
1647, 367, 1391, 879, 1903, 239, 1263, 751, 1775, 495,
1519, 1007, 2031, 31, 1055, 543, 1567, 287, 1311, 799,
1823, 159, 1183, 671, 1695, 415, 1439, 927, 1951, 95, 1119,
607, 1631, 351, 1375, 863, 1887, 223, 1247, 735, 1759, 479,
1503, 991, 2015, 63, 1087, 575, 1599, 319, 1343, 831, 1855,
191, 1215, 703, 1727, 447, 1471, 959, 1983, 127, 1151, 639,
1663, 383, 1407, 895, 1919, 255, 1279, 767, 1791, 511,
1535, 1023, 2047].

A sequence 3c is as follows:

Shorten_Z=[0, 4096, 2048, 6144, 1024, 5120, 3072,
7168, 512, 4608, 2560, 6656, 1536, 5632, 3584, 7680, 256,
4352, 2304, 6400, 1280, 5376, 3328, 7424, 768, 4864, 2816,
6912, 1792, 5888, 3840, 7936, 128, 4224, 2176, 6272, 1152,
5248, 3200, 7296, 640, 4736, 2688, 6784, 1664, 5760, 3712,
7808, 384, 4480, 2432, 6528, 1408, 5504, 3456, 7552, 896,
4992, 2944, 7040, 1920, 6016, 3968, 8064, 64, 4160, 2112,
6208, 1088, 5184, 3136, 7232, 576, 4672, 2624, 6720, 1600,
5696, 3648, 7744, 320, 4416, 2368, 6464, 1344, 5440, 3392,
7488, 832, 4928, 2880, 6976, 1856, 5952, 3904, 8000, 192,
4288, 2240, 6336, 1216, 5312, 3264, 7360, 704, 4800, 2752,
6848, 1728, 5824, 3776, 7872, 448, 4544, 2496, 6592, 1472,
5568, 3520, 7616, 960, 5056, 3008, 7104, 1984, 6080, 4032,
8128, 32, 4128, 2080, 6176, 1056, 5152, 3104, 7200, 544,
4640, 2592, 6688, 1568, 5664, 3616, 7712, 288, 4384, 2336,
6432, 1312, 5408, 3360, 7456, 800, 4896, 2848, 6944, 1824,
5920, 3872, 7968, 160, 4256, 2208, 6304, 1184, 5280, 3232,
7328, 672, 4768, 2720, 6816, 1696, 5792, 3744, 7840, 416,
4512, 2464, 6560, 1440, 5536, 3488, 7584, 928, 5024, 2976,
7072, 1952, 6048, 4000, 8096, 96, 4192, 2144, 6240, 1120,
5216, 3168, 7264, 608, 4704, 2656, 6752, 1632, 5728, 3680,
7776, 352, 4448, 2400, 6496, 1376, 5472, 3424, 7520, 864,
4960, 2912, 7008, 1888, 5984, 3936, 8032, 224, 4320, 2272,
6368, 1248, 5344, 3296, 7392, 736, 4832, 2784, 6880, 1760,
5856, 3808, 7904, 480, 4576, 2528, 6624, 1504, 5600, 3552,
7648, 992, 5088, 3040, 7136, 2016, 6112, 4064, 8160, 16,
4112, 2064, 6160, 1040, 5136, 3088, 7184, 528, 4624, 2576,
6672, 1552, 5648, 3600, 7696, 272, 4368, 2320, 6416, 1296,
5392, 3344, 7440, 784, 4880, 2832, 6928, 1808, 5904, 3856,
7952, 144, 4240, 2192, 6288, 1168, 5264, 3216, 7312, 656,
4752, 2704, 6800, 1680, 5776, 3728, 7824, 400, 4496, 2448,
6544, 1424, 5520, 3472, 7568, 912, 5008, 2960, 7056, 1936,
6032, 3984, 8080, 80, 4176, 2128, 6224, 1104, 5200, 3152,
7248, 592, 4688, 2640, 6736, 1616, 5712, 3664, 7760, 336,
4432, 2384, 6480, 1360, 5456, 3408, 7504, 848, 4944, 2896,
6992, 1872, 5968, 3920, 8016, 208, 4304, 2256, 6352, 1232,
5328, 3280, 7376, 720, 4816, 2768, 6864, 1744, 5840, 3792,
7888, 464, 4560, 2512, 6608, 1488, 5584, 3536, 7632, 976,
5072, 3024, 7120, 2000, 6096, 4048, 8144, 48, 4144, 2096,
6192, 1072, 5168, 3120, 7216, 560, 4656, 2608, 6704, 1584,
5680, 3632, 7728, 304, 4400, 2352, 6448, 1328, 5424, 3376,
7472, 816, 4912, 2864, 6960, 1840, 5936, 3888, 7984, 176,
4272, 2224, 6320, 1200, 5296, 3248, 7344, 688, 4784, 2736,
6832, 1712, 5808, 3760, 7856, 432, 4528, 2480, 6576, 1456,
5552, 3504, 7600, 944, 5040, 2992, 7088, 1968, 6064, 4016,
8112, 112, 4208, 2160, 6256, 1136, 5232, 3184, 7280, 624,
4720, 2672, 6768, 1648, 5744, 3696, 7792, 368, 4464, 2416, 6512, 1392, 5488, 3440, 7536, 880, 4976, 2928, 7024, 1904, 6000, 3952, 8048, 240, 4336, 2288, 6384, 1264, 5360, 3312, 7408, 752, 4848, 2800, 6896, 1776, 5872, 3824, 7920, 496, 4592, 2544, 6640, 1520, 5616, 3568, 7664, 1008, 5104, 3056, 7152, 2032, 6128, 4080, 8176, 8, 4104, 2056, 6152, 1032, 5128, 3080, 7176, 520, 4616, 2568, 6664, 1544, 5640, 3592, 7688, 264, 4360, 2312, 6408, 1288, 5384, 3336, 7432, 776, 4872, 2824, 6920, 1800, 5896, 3848, 7944, 136, 4232, 2184, 6280, 1160, 5256, 3208, 7304, 648, 4744, 2696, 6792, 1672, 5768, 3720, 7816, 392, 4488, 2440, 6536, 1416, 5512, 3464, 7560, 904, 5000, 2952, 7048, 1928, 6024, 3976, 8072, 72, 4168, 2120, 6216, 1096, 5192, 3144, 7240, 584, 4680, 2632, 6728, 1608, 5704, 3656, 7752, 328, 4424, 2376, 6472, 1352, 5448, 3400, 7496, 840, 4936, 2888, 6984, 1864, 5960, 3912, 8008, 200, 4296, 2248, 6344, 1224, 5320, 3272, 7368, 712, 4808, 2760, 6856, 1736, 5832, 3784, 7880, 456, 4552, 2504, 6600, 1480, 5576, 3528, 7624, 968, 5064, 3016, 7112, 1992, 6088, 4040, 8136, 40, 4136, 2088, 6184, 1064, 5160, 3112, 7208, 552, 4648, 2600, 6696, 1576, 5672, 3624, 7720, 296, 4392, 2344, 6440, 1320, 5416, 3368, 7464, 808, 4904, 2856, 6952, 1832, 5928, 3880, 7976, 168, 4264, 2216, 6312, 1192, 5288, 3240, 7336, 680, 4776, 2728, 6824, 1704, 5800, 3752, 7848, 424, 4520, 2472, 6568, 1448, 5544, 3496, 7592, 936, 5032, 2984, 7080, 1960, 6056, 4008, 8104, 104, 4200, 2152, 6248, 1128, 5224, 3176, 7272, 616, 4712, 2664, 6760, 1640, 5736, 3688, 7784, 360, 4456, 2408, 6504, 1384, 5480, 3432, 7528, 872, 4968, 2920, 7016, 1896, 5992, 3944, 8040, 232, 4328, 2280, 6376, 1256, 5352, 3304, 7400, 744, 4840, 2792, 6888, 1768, 5864, 3816, 7912, 488, 4584, 2536, 6632, 1512, 5608, 3560, 7656, 1000, 5096, 3048, 7144, 2024, 6120, 4072, 8168, 24, 4120, 2072, 6168, 1048, 5144, 3096, 7192, 536, 4632, 2584, 6680, 1560, 5656, 3608, 7704, 280, 4376, 2328, 6424, 1304, 5400, 3352, 7448, 792, 4888, 2840, 6936, 1816, 5912, 3864, 7960, 152, 4248, 2200, 6296, 1176, 5272, 3224, 7320, 664, 4760, 2712, 6808, 1688, 5784, 3736, 7832, 408, 4504, 2456, 6552, 1432, 5528, 3480, 7576, 920, 5016, 2968, 7064, 1944, 6040, 3992, 8088, 88, 4184, 2136, 6232, 1112, 5208, 3160, 7256, 600, 4696, 2648, 6744, 1624, 5720, 3672, 7768, 344, 4440, 2392, 6488, 1368, 5464, 3416, 7512, 856, 4952, 2904, 7000, 1880, 5976, 3928, 8024, 216, 4312, 2264, 6360, 1240, 5336, 3288, 7384, 728, 4824, 2776, 6872, 1752, 5848, 3800, 7896, 472, 4568, 2520, 6616, 1496, 5592, 3544, 7640, 984, 5080, 3032, 7128, 2008, 6104, 4056, 8152, 56, 4152, 2104, 6200, 1080, 5176, 3128, 7224, 568, 4664, 2616, 6712, 1592, 5688, 3640, 7736, 312, 4408, 2360, 6456, 1336, 5432, 3384, 7480, 824, 4920, 2872, 6968, 1848, 5944, 3896, 7992, 184, 4280, 2232, 6328, 1208, 5304, 3256, 7352, 696, 4792, 2744, 6840, 1720, 5816, 3768, 7864, 440, 4536, 2488, 6584, 1464, 5560, 3512, 7608, 952, 5048, 3000, 7096, 1976, 6072, 4024, 8120, 120, 4216, 2168, 6264, 1144, 5240, 3192, 7288, 632, 4728, 2680, 6776, 1656, 5752, 3704, 7800, 376, 4472, 2424, 6520, 1400, 5496, 3448, 7544, 888, 4984, 2936, 7032, 1912, 6008, 3960, 8056, 248, 4344, 2296, 6392, 1272, 5368, 3320, 7416, 760, 4856, 2808, 6904, 1784, 5880, 3832, 7928, 504, 4600, 2552, 6648, 1528, 5624, 3576, 7672, 1016, 5112, 3064, 7160, 2040, 6136, 4088, 8184, 4, 4100, 2052, 6148, 1028, 5124, 3076, 7172, 516, 4612, 2564, 6660, 1540, 5636, 3588, 7684, 260, 4356, 2308, 6404, 1284, 5380, 3332, 7428, 772, 4868, 2820, 6916, 1796, 5892, 3844, 7940, 132, 4228, 2180, 6276, 1156, 5252, 3204, 7300, 644, 4740, 2692, 6788, 1668, 5764, 3716, 7812, 388, 4484, 2436, 6532, 1412, 5508, 3460, 7556, 900, 4996, 2948, 7044, 1924, 6020, 3972, 8068, 68, 4164, 2116, 6212, 1092, 5188, 3140, 7236, 580, 4676, 2628, 6724, 1604, 5700, 3652, 7748, 324, 4420, 2372, 6468, 1348, 5444, 3396, 7492, 836, 4932, 2884, 6980, 1860, 5956, 3908, 8004, 196, 4292, 2244, 6340, 1220, 5316, 3268, 7364, 708, 4804, 2756, 6852, 1732, 5828, 3780, 7876, 452, 4548, 2500, 6596, 1476, 5572, 3524, 7620, 964, 5060, 3012, 7108, 1988, 6084, 4036, 8132, 36, 4132, 2084, 6180, 1060, 5156, 3108, 7204, 548, 4644, 2596, 6692, 1572, 5668, 3620, 7716, 292, 4388, 2340, 6436, 1316, 5412, 3364, 7460, 804, 4900, 2852, 6948, 1828, 5924, 3876, 7972, 164, 4260, 2212, 6308, 1188, 5284, 3236, 7332, 676, 4772, 2724, 6820, 1700, 5796, 3748, 7844, 420, 4516, 2468, 6564, 1444, 5540, 3492, 7588, 932, 5028, 2980, 7076, 1956, 6052, 4004, 8100, 100, 4196, 2148, 6244, 1124, 5220, 3172, 7268, 612, 4708, 2660, 6756, 1636, 5732, 3684, 7780, 356, 4452, 2404, 6500, 1380, 5476, 3428, 7524, 868, 4964, 2916, 7012, 1892, 5988, 3940, 8036, 228, 4324, 2276, 6372, 1252, 5348, 3300, 7396, 740, 4836, 2788, 6884, 1764, 5860, 3812, 7908, 484, 4580, 2532, 6628, 1508, 5604, 3556, 7652, 996, 5092, 3044, 7140, 2020, 6116, 4068, 8164, 20, 4116, 2068, 6164, 1044, 5140, 3092, 7188, 532, 4628, 2580, 6676, 1556, 5652, 3604, 7700, 276, 4372, 2324, 6420, 1300, 5396, 3348, 7444, 788, 4884, 2836, 6932, 1812, 5908, 3860, 7956, 148, 4244, 2196, 6292, 1172, 5268, 3220, 7316, 660, 4756, 2708, 6804, 1684, 5780, 3732, 7828, 404, 4500, 2452, 6548, 1428, 5524, 3476, 7572, 916, 5012, 2964, 7060, 1940, 6036, 3988, 8084, 84, 4180, 2132, 6228, 1108, 5204, 3156, 7252, 596, 4692, 2644, 6740, 1620, 5716, 3668, 7764, 340, 4436, 2388, 6484, 1364, 5460, 3412, 7508, 852, 4948, 2900, 6996, 1876, 5972, 3924, 8020, 212, 4308, 2260, 6356, 1236, 5332, 3284, 7380, 724, 4820, 2772, 6868, 1748, 5844, 3796, 7892, 468, 4564, 2516, 6612, 1492, 5588, 3540, 7636, 980, 5076, 3028, 7124, 2004, 6100, 4052, 8148, 52, 4148, 2100, 6196, 1076, 5172, 3124, 7220, 564, 4660, 2612, 6708, 1588, 5684, 3636, 7732, 308, 4404, 2356, 6452, 1332, 5428, 3380, 7476, 820, 4916, 2868, 6964, 1844, 5940, 3892, 7988, 180, 4276, 2228, 6324, 1204, 5300, 3252, 7348, 692, 4788, 2740, 6836, 1716, 5812, 3764, 7860, 436, 4532, 2484, 6580, 1460, 5556, 3508, 7604, 948, 5044, 2996, 7092, 1972, 6068, 4020, 8116, 116, 4212, 2164, 6260, 1140, 5236, 3188, 7284, 628, 4724, 2676, 6772, 1652, 5748, 3700, 7796, 372, 4468, 2420, 6516, 1396, 5492, 3444, 7540, 884, 4980, 2932, 7028, 1908, 6004, 3956, 8052, 244, 4340, 2292, 6388, 1268, 5364, 3316, 7412, 756, 4852, 2804, 6900, 1780, 5876, 3828, 7924, 500, 4596, 2548, 6644, 1524, 5620, 3572, 7668, 1012, 5108, 3060, 7156, 2036, 6132, 4084, 8180, 12, 4108, 2060, 6156, 1036, 5132, 3084, 7180, 524, 4620, 2572, 6668, 1548, 5644, 3596, 7692, 268, 4364, 2316, 6412, 1292, 5388, 3340, 7436, 780, 4876, 2828, 6924, 1804, 5900, 3852, 7948, 140, 4236, 2188, 6284, 1164, 5260, 3212, 7308, 652, 4748, 2700, 6796, 1676, 5772, 3724, 7820, 396, 4492, 2444, 6540, 1420, 5516, 3468, 7564, 908, 5004, 2956, 7052, 1932, 6028, 3980, 8076, 76, 4172, 2124, 6220, 1100, 5196, 3148, 7244, 588, 4684, 2636, 6732, 1612, 5708, 3660, 7756, 332, 4428, 2380, 6476, 1356, 5452, 3404, 7500, 844, 4940, 2892, 6988, 1868, 5964, 3916, 8012, 204, 4300, 2252, 6348, 1228, 5324, 3276, 7372, 716, 4812, 2764, 6860, 1740, 5836, 3788, 7884, 460, 4556, 2508, 6604, 1484, 5580, 3532, 7628, 972, 5068, 3020, 7116, 1996, 6092, 4044, 8140, 44, 4140, 2092, 6188, 1068, 5164, 3116, 7212, 556, 4652, 2604, 6700, 1580, 5676, 3628, 7724, 300, 4396, 2348, 6444, 1324, 5420, 3372, 7468, 812, 4908, 2860, 6956, 1836, 5932, 3884, 7980, 172, 4268, 2220, 6316, 1196, 5292, 3244, 7340, 684, 4780, 2732, 6828, 1708, 5804, 3756, 7852, 428, 4524, 2476, 6572, 1452, 5548, 3500, 7596, 940, 5036, 2988, 7084, 1964, 6060, 4012, 8108, 108, 4204, 2156, 6252, 1132, 5228, 3180, 7276, 620, 4716, 2668, 6764, 1644, 5740, 3692, 7788, 364, 4460, 2412, 6508, 1388, 5484, 3436, 7532, 876, 4972, 2924, 7020, 1900, 5996, 3948, 8044, 236, 4332, 2284, 6380, 1260, 5356, 3308, 7404, 748, 4844, 2796, 6892, 1772, 5868, 3820, 7916, 492, 4588, 2540, 6636, 1516, 5612, 3564, 7660, 1004, 5100, 3052, 7148, 2028, 6124, 4076, 8172, 28, 4124, 2076, 6172, 1052, 5148, 3100, 7196, 540, 4636, 2588, 6684, 1564, 5660, 3612, 7708, 284, 4380, 2332, 6428, 1308, 5404, 3356, 7452, 796, 4892, 2844, 6940, 1820, 5916, 3868, 7964, 156, 4252, 2204, 6300, 1180, 5276, 3228, 7324, 668, 4764, 2716, 6812, 1692, 5788, 3740, 7836, 412, 4508, 2460, 6556, 1436, 5532, 3484, 7580, 924, 5020, 2972, 7068, 1948, 6044, 3996, 8092, 92, 4188, 2140, 6236, 1116, 5212, 3164, 7260, 604, 4700, 2652, 6748, 1628, 5724, 3676, 7772, 348, 4444, 2396, 6492, 1372, 5468, 3420, 7516, 860, 4956, 2908, 7004, 1884, 5980, 3932, 8028, 220, 4316, 2268, 6364, 1244, 5340, 3292, 7388, 732, 4828, 2780, 6876, 1756, 5852, 3804, 7900, 476, 4572, 2524, 6620, 1500, 5596, 3548, 7644, 988, 5084, 3036, 7132, 2012, 6108, 4060, 8156, 60, 4156, 2108, 6204, 1084, 5180, 3132, 7228, 572, 4668, 2620, 6716, 1596, 5692, 3644, 7740, 316, 4412, 2364, 6460, 1340, 5436, 3388, 7484, 828, 4924, 2876, 6972, 1852, 5948, 3900, 7996, 188, 4284, 2236, 6332, 1212, 5308, 3260, 7356, 700, 4796, 2748, 6844, 1724, 5820, 3772, 7868, 444, 4540, 2492, 6588, 1468, 5564, 3516, 7612, 956, 5052, 3004, 7100, 1980, 6076, 4028, 8124, 124, 4220, 2172, 6268, 1148, 5244, 3196, 7292, 636, 4732, 2684, 6780, 1660, 5756, 3708, 7804, 380, 4476, 2428, 6524, 1404, 5500, 3452, 7548, 892, 4988, 2940, 7036, 1916, 6012, 3964, 8060, 252, 4348, 2300, 6396, 1276, 5372, 3324, 7420, 764, 4860, 2812, 6908, 1788, 5884, 3836, 7932, 508, 4604, 2556, 6652, 1532, 5628, 3580, 7676, 1020, 5116, 3068, 7164, 2044, 6140, 4092, 8188].

When N=1024:

A sequence 1d is as follows:

Shorten_Q=[0, 512, 256, 768, 128, 640, 384, 896, 64, 576, 320, 832, 192, 704, 448, 960, 32, 544, 288, 800, 160, 672, 416, 928, 96, 608, 352, 864, 224, 736, 480, 992, 16, 528, 272, 784, 144, 656, 400, 912, 80, 592, 336, 848, 208, 720, 464, 976, 48, 560, 304, 816, 176, 688, 432, 944, 112, 624, 368, 880, 240, 752, 496, 1008, 8, 520, 264, 776, 136, 648, 392, 904, 72, 584, 328, 840, 200, 712, 456, 968, 40, 552, 296, 808, 168, 680, 424, 936, 104, 616, 360, 872, 232, 744, 488, 1000, 24, 536, 280, 792, 152, 664, 408, 920, 88, 600, 344, 856, 216, 728, 472, 984, 56, 568, 312, 824, 184, 696, 440, 952, 120, 632, 376, 888, 248, 760, 504, 1016, 4, 516, 260, 772, 132, 644, 388, 900, 68, 580, 324, 836, 196, 708, 452, 964, 36, 548, 292, 804, 164, 676, 420, 932, 100, 612, 356, 868, 228, 740, 484, 996, 20, 532, 276, 788, 148, 660, 404, 916, 84, 596, 340, 852, 212, 724, 468, 980, 52, 564, 308, 820, 180, 692, 436, 948, 116, 628, 372, 884, 244, 756, 500, 1012, 12, 524, 268, 780, 140, 652, 396, 908, 76, 588, 332, 844, 204, 716, 460, 972, 44, 556, 300, 812, 172, 684, 428, 940, 108, 620, 364, 876, 236, 748, 492, 1004, 28, 540, 284, 796, 156, 668, 412, 924, 92, 604, 348, 860, 220, 732, 476, 988, 60, 572, 316, 828, 188, 700, 444, 956, 124, 636, 380, 892, 252, 764, 508, 1020, 2, 514, 258, 770, 130, 642, 386, 898, 66, 578, 322, 834, 194, 706, 450, 962, 34, 546, 290, 802, 162, 674, 418, 930, 98, 610, 354, 866, 226, 738, 482, 994, 18, 530, 274, 786, 146, 658, 402, 914, 82, 594, 338, 850, 210, 722, 466, 978, 50, 562, 306, 818, 178, 690, 434, 946, 114, 626, 370, 882, 242, 754, 498, 1010, 10, 522, 266, 778, 138, 650, 394, 906, 74, 586, 330, 842, 202, 714, 458, 970, 42, 554, 298, 810, 170, 682, 426, 938, 106, 618, 362, 874, 234, 746, 490, 1002, 26, 538, 282, 794, 154, 666, 410, 922, 90, 602, 346, 858, 218, 730, 474, 986, 58, 570, 314, 826, 186, 698, 442, 954, 122, 634, 378, 890, 250, 762, 506, 1018, 6, 518, 262, 774, 134, 646, 390, 902, 70, 582, 326, 838, 198, 710, 454, 966, 38, 550, 294, 806, 166, 678, 422, 934, 102, 614, 358, 870, 230, 742, 486, 998, 22, 534, 278, 790, 150, 662, 406, 918, 86, 598, 342, 854, 214, 726, 470, 982, 54, 566, 310, 822, 182, 694, 438, 950, 118, 630, 374, 886, 246, 758, 502, 1014, 14, 526, 270, 782, 142, 654, 398, 910, 78, 590, 334, 846, 206, 718, 462, 974, 46, 558, 302, 814, 174, 686, 430, 942, 110, 622, 366, 878, 238, 750, 494, 1006, 30, 542, 286, 798, 158, 670, 414, 926, 94, 606, 350, 862, 222, 734, 478, 990, 62, 574, 318, 830, 190, 702, 446, 958, 126, 638, 382, 894, 254, 766, 510, 1022, 1, 513, 257, 769, 129, 641, 385, 897, 65, 577, 321, 833, 193, 705, 449, 961, 33, 545, 289, 801, 161, 673, 417, 929, 97, 609, 353, 865, 225, 737, 481, 993, 17, 529, 273, 785, 145, 657, 401, 913, 81, 593, 337, 849, 209, 721, 465, 977, 49, 561, 305, 817, 177, 689, 433, 945, 113, 625, 369, 881, 241, 753, 497, 1009, 9, 521, 265, 777, 137, 649, 393, 905, 73, 585, 329, 841, 201, 713, 457, 969, 41, 553, 297, 809, 169, 681, 425, 937, 105, 617, 361, 873, 233, 745, 489, 1001, 25, 537, 281, 793, 153, 665, 409, 921, 89, 601, 345, 857, 217, 729, 473, 985, 57, 569, 313, 825, 185, 697, 441, 953, 121, 633, 377, 889, 249, 761, 505, 1017, 5, 517, 261, 773, 133, 645, 389, 901, 69, 581, 325, 837, 197, 709, 453, 965, 37, 549, 293, 805, 165, 677, 421, 933, 101, 613, 357, 869, 229, 741, 485, 997, 21, 533, 277, 789, 149, 661, 405, 917, 85, 597, 341, 853, 213, 725, 469, 981, 53, 565, 309, 821, 181, 693, 437, 949, 117, 629, 373, 885, 245, 757, 501, 1013, 13, 525, 269, 781, 141, 653, 397, 909, 77, 589, 333, 845, 205, 717, 461, 973, 45, 557, 301, 813, 173, 685, 429, 941, 109, 621, 365, 877, 237, 749, 493, 1005, 29, 541, 285, 797, 157, 669, 413, 925, 93, 605, 349, 861, 221, 733, 477, 989, 61, 573, 317, 829, 189, 701, 445, 957, 125, 637, 381, 893, 253, 765, 509, 1021, 3, 515, 259, 771, 131, 643, 387, 899, 67, 579, 323, 835, 195, 707, 451, 963, 35, 547, 291, 803, 163, 675, 419, 931, 99, 611, 355, 867, 227, 739, 483, 995, 19, 531, 275, 787, 147, 659, 403, 915, 83, 595, 339, 851, 211, 723, 467, 979, 51, 563, 307, 819, 179, 691, 435, 947, 115, 627, 371, 883, 243, 755, 499, 1011, 11, 523, 267, 779, 139, 651, 395, 907, 75, 587, 331, 843, 203, 715, 459, 971, 43, 555, 299, 811, 171, 683, 427, 939, 107, 619, 363, 875, 235, 747, 491, 1003, 27, 539, 283, 795, 155, 667, 411, 923, 91, 603, 347, 859, 219, 731, 475, 987, 59, 571, 315, 827, 187, 699, 443, 955, 123, 635, 379, 891, 251, 763, 507, 1019, 7, 519, 263, 775, 135, 647, 391, 903, 71, 583, 327, 839, 199, 711, 455, 967, 39, 551, 295, 807, 167, 679, 423, 935, 103, 615, 359, 871, 231, 743, 487, 999, 23, 535, 279, 791, 151, 663, 407, 919, 87, 599, 343, 855, 215, 727, 471, 983, 55, 567, 311, 823, 183, 695, 439, 951, 119, 631, 375, 887, 247, 759, 503, 1015, 15, 527, 271, 783, 143, 655, 399, 911, 79, 591, 335, 847, 207, 719, 463, 975, 47, 559, 303, 815, 175, 687, 431, 943, 111, 623, 367, 879, 239, 751, 495, 1007, 31, 543, 287, 799, 159, 671, 415, 927, 95, 607, 351, 863, 223, 735, 479, 991, 63, 575, 319, 831, 191, 703, 447, 959, 127, 639, 383, 895, 255, 767, 511, 1023].

A sequence 2d is as follows:

Shorten_Q_half=[1, 513, 257, 769, 129, 641, 385, 897, 65, 577, 321, 833, 193, 705, 449, 961, 33, 545, 289, 801, 161, 673, 417, 929, 97, 609, 353, 865, 225, 737, 481, 993, 17, 529, 273, 785, 145, 657, 401, 913, 81, 593, 337, 849, 209, 721, 465, 977, 49, 561, 305, 817, 177, 689, 433, 945, 113, 625, 369, 881, 241, 753, 497, 1009, 9, 521, 265, 777, 137, 649, 393, 905, 73, 585, 329, 841, 201, 713, 457, 969, 41, 553, 297, 809, 169, 681, 425, 937, 105, 617, 361, 873, 233, 745, 489, 1001, 25, 537, 281, 793, 153, 665, 409, 921, 89, 601, 345, 857, 217, 729, 473, 985, 57, 569, 313, 825, 185, 697, 441, 953, 121, 633, 377, 889, 249, 761, 505, 1017, 5, 517, 261, 773, 133, 645, 389, 901, 69, 581, 325, 837, 197, 709, 453, 965, 37, 549, 293, 805, 165, 677, 421, 933, 101, 613, 357, 869, 229, 741, 485, 997, 21, 533, 277, 789, 149, 661, 405, 917, 85, 597, 341, 853, 213, 725, 469, 981, 53, 565, 309, 821, 181, 693, 437, 949, 117, 629, 373, 885, 245, 757, 501, 1013, 13, 525, 269, 781, 141, 653, 397, 909, 77, 589, 333, 845, 205, 717, 461, 973, 45, 557, 301, 813, 173, 685, 429, 941, 109, 621, 365, 877, 237, 749, 493, 1005, 29, 541, 285, 797, 157, 669, 413, 925, 93, 605, 349, 861, 221, 733, 477, 989, 61, 573, 317, 829, 189, 701, 445, 957, 125, 637, 381, 893, 253, 765, 509, 1021, 3, 515, 259, 771, 131, 643, 387, 899, 67, 579, 323, 835, 195, 707, 451, 963, 35, 547, 291, 803, 163, 675, 419, 931, 99, 611, 355, 867, 227, 739, 483, 995, 19, 531, 275, 787, 147, 659, 403, 915, 83, 595, 339, 851, 211, 723, 467, 979, 51, 563, 307, 819, 179, 691, 435, 947, 115, 627, 371, 883, 243, 755, 499, 1011, 11, 523, 267, 779, 139, 651, 395, 907, 75, 587, 331, 843, 203, 715, 459, 971, 43, 555, 299, 811, 171, 683, 427, 939, 107, 619, 363, 875, 235, 747, 491, 1003, 27, 539, 283, 795, 155, 667, 411, 923, 91, 603, 347, 859, 219, 731, 475, 987, 59, 571, 315, 827, 187, 699, 443, 955, 123, 635, 379, 891, 251, 763, 507, 1019, 7, 519, 263, 775, 135, 647, 391, 903, 71, 583, 327, 839, 199, 711, 455, 967, 39, 551, 295, 807, 167, 679, 423, 935, 103, 615, 359, 871, 231, 743, 487, 999, 23, 535, 279, 791, 151, 663, 407, 919, 87, 599, 343, 855, 215, 727, 471, 983, 55, 567, 311, 823, 183, 695, 439, 951, 119, 631, 375, 887, 247, 759, 503, 1015, 15, 527, 271, 783, 143, 655, 399, 911, 79, 591, 335, 847, 207, 719, 463, 975, 47, 559, 303, 815, 175, 687, 431, 943, 111, 623, 367, 879, 239, 751, 495, 1007, 31, 543, 287, 799, 159, 671, 415, 927, 95, 607, 351, 863, 223, 735, 479, 991, 63, 575, 319, 831, 191, 703, 447, 959, 127, 639, 383, 895, 255, 767, 511, 1023].

A sequence 3d is as follows:

Shorten_Z=[0, 4096, 2048, 6144, 1024, 5120, 3072, 7168, 512, 4608, 2560, 6656, 1536, 5632, 3584, 7680, 256, 4352, 2304, 6400, 1280, 5376, 3328, 7424, 768, 4864, 2816, 6912, 1792, 5888, 3840, 7936, 128, 4224, 2176, 6272, 1152, 5248, 3200, 7296, 640, 4736, 2688, 6784, 1664, 5760, 3712, 7808, 384, 4480, 2432, 6528, 1408, 5504, 3456, 7552, 896, 4992, 2944, 7040, 1920, 6016, 3968, 8064, 64, 4160, 2112, 6208, 1088, 5184, 3136, 7232, 576, 4672, 2624, 6720, 1600, 5696, 3648, 7744, 320, 4416, 2368, 6464, 1344, 5440, 3392, 7488, 832, 4928, 2880, 6976, 1856, 5952, 3904, 8000, 192, 4288, 2240, 6336, 1216, 5312, 3264, 7360, 704, 4800, 2752, 6848, 1728, 5824, 3776, 7872, 448, 4544, 2496, 6592, 1472, 5568, 3520, 7616, 960, 5056, 3008, 7104, 1984, 6080, 4032, 8128, 32, 4128, 2080, 6176, 1056, 5152, 3104, 7200, 544, 4640, 2592, 6688, 1568, 5664, 3616, 7712, 288, 4384, 2336, 6432, 1312, 5408, 3360, 7456, 800, 4896, 2848, 6944, 1824, 5920, 3872, 7968, 160, 4256, 2208, 6304, 1184, 5280, 3232, 7328, 672, 4768, 2720, 6816, 1696, 5792, 3744, 7840, 416, 4512, 2464, 6560, 1440, 5536, 3488, 7584, 928, 5024, 2976, 7072, 1952, 6048, 4000, 8096, 96, 4192, 2144, 6240, 1120, 5216, 3168, 7264, 608, 4704, 2656, 6752, 1632, 5728, 3680, 7776, 352, 4448, 2400, 6496, 1376, 5472, 3424, 7520, 864, 4960, 2912, 7008, 1888, 5984, 3936, 8032, 224, 4320, 2272, 6368, 1248, 5344, 3296, 7392, 736, 4832, 2784, 6880, 1760, 5856, 3808, 7904, 480, 4576, 2528, 6624, 1504, 5600, 3552, 7648, 992, 5088, 3040, 7136, 2016, 6112, 4064, 8160, 16, 4112, 2064, 6160, 1040, 5136, 3088, 7184, 528, 4624, 2576, 6672, 1552, 5648, 3600, 7696, 272, 4368, 2320, 6416, 1296, 5392, 3344, 7440, 784, 4880, 2832, 6928, 1808, 5904, 3856, 7952, 144, 4240, 2192, 6288, 1168, 5264, 3216, 7312, 656, 4752, 2704, 6800, 1680, 5776, 3728, 7824, 400, 4496, 2448, 6544, 1424, 5520, 3472, 7568, 912, 5008, 2960, 7056, 1936, 6032, 3984, 8080, 80, 4176, 2128, 6224, 1104, 5200, 3152, 7248, 592, 4688, 2640, 6736, 1616, 5712, 3664, 7760, 336, 4432, 2384, 6480, 1360, 5456, 3408, 7504, 848, 4944, 2896, 6992, 1872, 5968, 3920, 8016, 208, 4304, 2256, 6352, 1232, 5328, 3280, 7376, 720, 4816, 2768, 6864, 1744, 5840, 3792, 7888, 464, 4560, 2512, 6608, 1488, 5584, 3536, 7632, 976, 5072, 3024, 7120, 2000, 6096, 4048, 8144, 48, 4144, 2096, 6192, 1072, 5168, 3120, 7216, 560, 4656, 2608, 6704, 1584, 5680, 3632, 7728, 304, 4400, 2352, 6448, 1328, 5424, 3376, 7472, 816, 4912, 2864, 6960, 1840, 5936, 3888, 7984, 176, 4272, 2224, 6320, 1200, 5296, 3248, 7344, 688, 4784, 2736, 6832, 1712, 5808, 3760, 7856, 432, 4528, 2480, 6576, 1456, 5552, 3504, 7600, 944, 5040, 2992, 7088, 1968, 6064, 4016, 8112, 112, 4208, 2160, 6256, 1136, 5232, 3184, 7280, 624, 4720, 2672, 6768, 1648, 5744, 3696, 7792, 368, 4464, 2416, 6512, 1392, 5488, 3440, 7536, 880, 4976, 2928, 7024, 1904, 6000, 3952, 8048, 240, 4336, 2288, 6384, 1264, 5360, 3312, 7408, 752, 4848, 2800, 6896, 1776, 5872, 3824, 7920, 496, 4592, 2544, 6640, 1520, 5616, 3568, 7664, 1008, 5104, 3056, 7152, 2032, 6128, 4080, 8176, 8, 4104, 2056, 6152, 1032, 5128, 3080, 7176, 520, 4616, 2568, 6664, 1544, 5640, 3592, 7688, 264, 4360, 2312, 6408, 1288, 5384, 3336, 7432, 776, 4872, 2824, 6920, 1800, 5896, 3848, 7944, 136, 4232, 2184, 6280, 1160, 5256, 3208, 7304, 648, 4744, 2696, 6792, 1672, 5768, 3720, 7816, 392, 4488, 2440, 6536, 1416, 5512, 3464, 7560, 904, 5000, 2952, 7048, 1928, 6024, 3976, 8072, 72, 4168, 2120, 6216, 1096, 5192, 3144, 7240, 584, 4680, 2632, 6728, 1608, 5704, 3656, 7752, 328, 4424, 2376, 6472, 1352, 5448, 3400, 7496, 840, 4936, 2888, 6984, 1864, 5960, 3912, 8008, 200, 4296, 2248, 6344, 1224, 5320, 3272, 7368, 712, 4808, 2760, 6856, 1736, 5832, 3784, 7880, 456, 4552, 2504, 6600, 1480, 5576, 3528, 7624, 968, 5064, 3016, 7112, 1992, 6088, 4040, 8136, 40, 4136, 2088, 6184, 1064, 5160, 3112, 7208, 552, 4648, 2600, 6696, 1576, 5672, 3624, 7720, 296, 4392, 2344, 6440, 1320, 5416, 3368, 7464, 808, 4904, 2856, 6952, 1832, 5928, 3880, 7976, 168, 4264, 2216, 6312, 1192, 5288, 3240, 7336, 680, 4776, 2728, 6824, 1704, 5800, 3752, 7848, 424, 4520, 2472, 6568, 1448, 5544, 3496, 7592, 936, 5032, 2984, 7080, 1960, 6056, 4008, 8104, 104, 4200, 2152, 6248, 1128, 5224, 3176, 7272, 616, 4712, 2664, 6760, 1640, 5736, 3688, 7784, 360, 4456, 2408, 6504, 1384, 5480, 3432, 7528, 872, 4968, 2920, 7016, 1896, 5992, 3944, 8040, 232, 4328, 2280, 6376, 1256, 5352, 3304, 7400, 744, 4840, 2792, 6888, 1768, 5864, 3816, 7912, 488, 4584, 2536, 6632, 1512, 5608, 3560, 7656, 1000, 5096, 3048, 7144, 2024, 6120, 4072, 8168, 24, 4120, 2072, 6168, 1048, 5144, 3096, 7192, 536, 4632, 2584, 6680, 1560, 5656, 3608, 7704, 280, 4376, 2328, 6424, 1304, 5400, 3352, 7448, 792, 4888, 2840, 6936, 1816, 5912, 3864, 7960, 152, 4248, 2200, 6296, 1176, 5272, 3224, 7320, 664, 4760, 2712, 6808, 1688, 5784, 3736, 7832, 408, 4504, 2456, 6552, 1432, 5528, 3480, 7576, 920, 5016, 2968, 7064, 1944, 6040, 3992, 8088, 88, 4184, 2136, 6232, 1112, 5208, 3160, 7256, 600, 4696, 2648, 6744, 1624, 5720, 3672, 7768, 344, 4440, 2392, 6488, 1368, 5464, 3416, 7512, 856, 4952, 2904, 7000, 1880, 5976, 3928, 8024, 216, 4312, 2264, 6360, 1240, 5336, 3288, 7384, 728, 4824, 2776, 6872, 1752, 5848, 3800, 7896, 472, 4568, 2520, 6616, 1496, 5592, 3544, 7640, 984, 5080, 3032, 7128, 2008, 6104, 4056, 8152, 56, 4152, 2104, 6200, 1080, 5176, 3128, 7224, 568, 4664, 2616, 6712, 1592, 5688, 3640, 7736, 312, 4408, 2360, 6456, 1336, 5432, 3384, 7480, 824, 4920, 2872, 6968, 1848, 5944, 3896, 7992, 184, 4280, 2232, 6328, 1208, 5304, 3256, 7352, 696, 4792, 2744, 6840, 1720, 5816, 3768, 7864, 440, 4536, 2488, 6584, 1464, 5560, 3512, 7608, 952, 5048, 3000, 7096, 1976, 6072, 4024, 8120, 120, 4216, 2168, 6264, 1144, 5240, 3192, 7288, 632, 4728, 2680, 6776, 1656, 5752, 3704, 7800, 376, 4472, 2424, 6520, 1400, 5496, 3448, 7544, 888, 4984, 2936, 7032, 1912, 6008, 3960, 8056, 248, 4344, 2296, 6392, 1272, 5368, 3320, 7416, 760, 4856, 2808, 6904, 1784, 5880, 3832, 7928, 504, 4600, 2552, 6648, 1528, 5624, 3576, 7672, 1016, 5112, 3064, 7160, 2040, 6136, 4088, 8184].

When N=512:

A sequence 1e is as follows:

Shorten_Q=[0, 256, 128, 384, 64, 320, 192, 448, 32, 288, 160, 416, 96, 352, 224, 480, 16, 272, 144, 400, 80, 336, 208, 464, 48, 304, 176, 432, 112, 368, 240, 496, 8, 264, 136, 392, 72, 328, 200, 456, 40, 296, 168, 424, 104, 360, 232, 488, 24, 280, 152, 408, 88, 344, 216, 472, 56, 312, 184, 440, 120, 376, 248, 504, 4, 260, 132, 388, 68, 324, 196, 452, 36, 292, 164, 420, 100, 356, 228, 484, 20, 276, 148, 404, 84, 340, 212, 468, 52, 308, 180, 436, 116, 372, 244, 500, 12, 268, 140, 396, 76, 332, 204, 460, 44, 300, 172, 428, 108, 364, 236, 492, 28, 284, 156, 412, 92, 348, 220, 476, 60, 316, 188, 444, 124, 380, 252, 508, 2, 258, 130, 386, 66, 322, 194, 450, 34, 290, 162, 418, 98, 354, 226, 482, 18, 274, 146, 402, 82, 338, 210, 466, 50, 306, 178, 434, 114, 370, 242, 498, 10, 266, 138, 394, 74, 330, 202, 458, 42, 298, 170, 426, 106, 362, 234, 490, 26, 282, 154, 410, 90, 346, 218, 474, 58, 314, 186, 442, 122, 378, 250, 506, 6, 262, 134, 390, 70, 326, 198, 454, 38, 294, 166, 422, 102, 358, 230, 486, 22, 278, 150, 406, 86, 342, 214, 470, 54, 310, 182, 438, 118, 374, 246, 502, 14, 270, 142, 398, 78, 334, 206, 462, 46, 302, 174, 430, 110, 366, 238, 494, 30, 286, 158, 414, 94, 350, 222, 478, 62, 318, 190, 446, 126, 382, 254, 510, 1, 257, 129, 385, 65, 321, 193, 449, 33, 289, 161, 417, 97, 353, 225, 481, 17, 273, 145, 401, 81, 337, 209, 465, 49, 305, 177, 433, 113, 369, 241, 497, 9, 265, 137, 393, 73, 329, 201, 457, 41, 297, 169, 425, 105, 361, 233, 489, 25, 281, 153, 409, 89, 345, 217, 473, 57, 313, 185, 441, 121, 377, 249, 505, 5, 261, 133, 389, 69, 325, 197, 453, 37, 293, 165, 421, 101, 357, 229, 485, 21, 277, 149, 405, 85, 341, 213, 469, 53, 309, 181, 437, 117, 373, 245, 501, 13, 269, 141, 397, 77, 333, 205, 461, 45, 301, 173, 429, 109, 365, 237, 493, 29, 285, 157, 413, 93, 349, 221, 477, 61, 317, 189, 445, 125, 381, 253, 509, 3, 259, 131, 387, 67, 323, 195, 451, 35, 291, 163, 419, 99, 355, 227, 483, 19, 275, 147, 403, 83, 339, 211, 467, 51, 307, 179, 435, 115, 371, 243, 499, 11, 267, 139, 395, 75, 331, 203, 459, 43, 299, 171, 427, 107, 363, 235, 491, 27, 283, 155, 411, 91, 347, 219, 475, 59, 315, 187, 443, 123, 379, 251, 507, 7, 263, 135, 391, 71, 327, 199, 455, 39, 295, 167, 423, 103, 359, 231, 487, 23, 279, 151, 407, 87, 343, 215, 471, 55, 311, 183, 439, 119, 375, 247, 503, 15, 271, 143, 399, 79, 335, 207, 463, 47, 303, 175, 431, 111, 367, 239, 495, 31, 287, 159, 415, 95, 351, 223, 479, 63, 319, 191, 447, 127, 383, 255, 511].

A sequence 2e is as follows:

Shorten_Q_half=[1, 257, 129, 385, 65, 321, 193, 449, 33, 289, 161, 417, 97, 353, 225, 481, 17, 273, 145, 401, 81, 337, 209, 465, 49, 305, 177, 433, 113, 369, 241, 497, 9, 265, 137, 393, 73, 329, 201, 457, 41, 297, 169, 425, 105, 361, 233, 489, 25, 281, 153, 409, 89, 345, 217, 473, 57, 313, 185, 441, 121, 377, 249, 505, 5, 261, 133, 389, 69, 325, 197, 453, 37, 293, 165, 421, 101, 357, 229, 485, 21, 277, 149, 405, 85, 341, 213, 469, 53, 309, 181, 437, 117, 373, 245, 501, 13, 269, 141, 397, 77, 333, 205, 461, 45, 301, 173, 429, 109, 365, 237, 493, 29, 285, 157, 413, 93, 349, 221, 477, 61, 317, 189, 445, 125, 381, 253, 509, 3, 259, 131, 387, 67, 323, 195, 451, 35, 291, 163, 419, 99, 355, 227, 483, 19, 275, 147, 403, 83, 339, 211, 467, 51, 307, 179, 435, 115, 371, 243, 499, 11, 267, 139, 395, 75, 331, 203, 459, 43, 299, 171, 427, 107, 363, 235, 491, 27, 283, 155, 411, 91, 347, 219, 475, 59, 315, 187, 443, 123, 379, 251, 507, 7, 263, 135, 391, 71, 327, 199, 455, 39, 295, 167, 423, 103, 359, 231, 487, 23, 279, 151, 407, 87, 343, 215, 471, 55, 311, 183, 439, 119, 375, 247, 503, 15, 271, 143, 399, 79, 335, 207, 463, 47, 303, 175, 431, 111, 367, 239, 495, 31, 287, 159, 415, 95, 351, 223, 479, 63, 319, 191, 447, 127, 383, 255, 511].

A sequence 3e is as follows:

Shorten_Z=[0, 4096, 2048, 6144, 1024, 5120, 3072, 7168, 512, 4608, 2560, 6656, 1536, 5632, 3584, 7680, 256, 4352, 2304, 6400, 1280, 5376, 3328, 7424, 768, 4864, 2816, 6912, 1792, 5888, 3840, 7936, 128, 4224, 2176, 6272, 1152, 5248, 3200, 7296, 640, 4736, 2688, 6784, 1664, 5760, 3712, 7808, 384, 4480, 2432, 6528, 1408, 5504, 3456, 7552, 896, 4992, 2944, 7040, 1920, 6016, 3968, 8064, 64, 4160, 2112, 6208, 1088, 5184, 3136, 7232, 576, 4672, 2624, 6720, 1600, 5696, 3648, 7744, 320, 4416, 2368, 6464, 1344, 5440, 3392, 7488, 832, 4928, 2880, 6976, 1856, 5952, 3904, 8000, 192, 4288, 2240, 6336, 1216, 5312, 3264, 7360, 704, 4800, 2752, 6848, 1728, 5824, 3776, 7872, 448, 4544, 2496, 6592, 1472, 5568, 3520, 7616, 960, 5056, 3008, 7104, 1984, 6080, 4032, 8128, 32, 4128, 2080, 6176, 1056, 5152, 3104, 7200, 544, 4640, 2592, 6688, 1568, 5664, 3616, 7712, 288, 4384, 2336, 6432, 1312, 5408, 3360, 7456, 800, 4896, 2848, 6944, 1824, 5920, 3872, 7968, 160, 4256, 2208, 6304, 1184, 5280, 3232, 7328, 672, 4768, 2720, 6816, 1696, 5792, 3744, 7840, 416, 4512, 2464, 6560, 1440, 5536, 3488, 7584, 928, 5024, 2976, 7072, 1952, 6048, 4000, 8096, 96, 4192, 2144, 6240, 1120, 5216, 3168, 7264, 608, 4704, 2656, 6752, 1632, 5728, 3680, 7776, 352, 4448, 2400, 6496, 1376, 5472, 3424, 7520, 864, 4960, 2912, 7008, 1888, 5984, 3936, 8032, 224, 4320, 2272, 6368, 1248, 5344, 3296, 7392, 736, 4832, 2784, 6880, 1760, 5856, 3808, 7904, 480, 4576, 2528, 6624, 1504, 5600, 3552, 7648, 992, 5088, 3040, 7136, 2016, 6112, 4064, 8160, 16, 4112, 2064, 6160, 1040, 5136, 3088, 7184, 528, 4624, 2576, 6672, 1552, 5648, 3600, 7696, 272, 4368, 2320, 6416, 1296, 5392, 3344, 7440, 784, 4880, 2832, 6928, 1808, 5904, 3856, 7952, 144, 4240, 2192, 6288, 1168, 5264, 3216, 7312, 656, 4752, 2704, 6800, 1680, 5776, 3728, 7824, 400, 4496, 2448, 6544, 1424, 5520, 3472, 7568, 912, 5008, 2960, 7056, 1936, 6032, 3984, 8080, 80, 4176, 2128, 6224, 1104, 5200, 3152, 7248, 592, 4688, 2640, 6736, 1616, 5712, 3664, 7760, 336, 4432, 2384, 6480, 1360, 5456, 3408, 7504, 848, 4944, 2896, 6992, 1872, 5968, 3920, 8016, 208, 4304, 2256, 6352, 1232, 5328, 3280, 7376, 720, 4816, 2768, 6864, 1744, 5840, 3792, 7888, 464, 4560, 2512, 6608, 1488, 5584, 3536, 7632, 976, 5072, 3024, 7120, 2000, 6096, 4048, 8144, 48, 4144, 2096, 6192, 1072, 5168, 3120, 7216, 560, 4656, 2608, 6704, 1584, 5680, 3632, 7728, 304, 4400, 2352, 6448, 1328, 5424, 3376, 7472, 816, 4912, 2864, 6960, 1840, 5936, 3888, 7984, 176, 4272, 2224, 6320, 1200, 5296, 3248, 7344, 688, 4784, 2736, 6832, 1712, 5808, 3760, 7856, 432, 4528, 2480, 6576, 1456, 5552, 3504, 7600, 944, 5040, 2992, 7088, 1968, 6064, 4016, 8112, 112, 4208, 2160, 6256, 1136, 5232, 3184, 7280, 624, 4720, 2672, 6768, 1648, 5744, 3696, 7792, 368, 4464, 2416, 6512, 1392, 5488, 3440, 7536, 880, 4976, 2928, 7024, 1904, 6000, 3952, 8048, 240, 4336, 2288, 6384, 1264, 5360, 3312, 7408, 752, 4848, 2800, 6896, 1776, 5872, 3824, 7920, 496, 4592, 2544, 6640, 1520, 5616, 3568, 7664, 1008, 5104, 3056, 7152, 2032, 6128, 4080, 8176].

What is claimed is:

1. A polar code encoding rate matching method, comprising:
   obtaining K to-be-encoded bits, a target code length M, and a mother code length N, wherein N=2$^n$, and M, K, n, and N are positive integers;
   performing polar code encoding on the K to-be-encoded bits based on the mother code length N to obtain an encoded bit sequence;
   performing rate matching on the encoded bit sequence based on a rate matching sequence to obtain a rate matched sequence, wherein the rate matching sequence is a subsequence of a first sequence, the first sequence is a sequence 1, a sequence 2, or a sequence 3 in Appendix I, the sequence 1 comprises $N_2$ polarized sub-channel sequence numbers starting from 0, the sequence 2 comprises $N_2/2$ polarized sub-channel sequence numbers starting from 0, the sequence 3 comprises $N_2$ different values, and $N_2$ is greater than or equal to N; and
   outputting the rate matched sequence.

2. The method according to claim 1, wherein performing the polar code encoding on the K to-be-encoded bits based on the mother code length N comprises:
mapping the K to-be-encoded bits to K polarized sub-channels in M-P non-punctured polarized sub-channels, wherein reliability of the K polarized sub-channels on which the K to-be-encoded bits are located is higher than reliability of remaining M-P-K polarized sub-channels, wherein P represents a quantity of pre-frozen polarized sub-channels, and wherein P is greater than or equal to 0.

3. The method according to claim 1, wherein before performing the rate matching on the encoded bit sequence based on the rate matching sequence to obtain the rate matched sequence, interleaving is performed on the encoded bit sequence.

4. The method according to claim 1, wherein a rate matching manner is a puncturing operation, wherein:
if the first sequence is the sequence 1, the puncturing operation comprises taking, based on the target code length M, bits carried by sub-channels corresponding to last M polarized sub-channel sequence numbers in the rate matching sequence, or deleting, based on the target code length M, bits carried by sub-channels corresponding to first N-M polarized sub-channel sequence numbers in the rate matching sequence;
if the first sequence is the sequence 2, the puncturing operation comprises deleting, based on the target code length M, bits carried by sub-channels corresponding to first N-M polarized sub-channel sequence numbers in the rate matching sequence; or
if the first sequence is the sequence 3, the puncturing operation comprises deleting, based on the target code length M, bits carried by polarized sub-channels at which N-M smallest values in the rate matching sequence are located, or taking, based on the target code length M, bits carried by polarized sub-channels corresponding to M largest values in the rate matching sequence.

5. The method according to claim 1, wherein:
when N=8192, the rate matching sequence is a sequence 1a, a sequence 2a, or a sequence 3a;
when N=4096, the rate matching sequence is a sequence 1b, a sequence 2b, or a sequence 3b;
when N=2048, the rate matching sequence is a sequence 1c, a sequence 2c, or a sequence 3c;
when N=1024, the rate matching sequence is a sequence 1d, a sequence 2d, or a sequence 3d; or
when N=512, the rate matching sequence is a sequence 1e, a sequence 2e, or a sequence 3e, wherein:
the sequence 1a, the sequence 1b, the sequence 1c, the sequence 1d, and the sequence 1e are subsequences of the sequence 1;
the sequence 2a, the sequence 2b, the sequence 2c, the sequence 2d, and the sequence 2e are subsequences of the sequence 2; and
the sequence 3a, the sequence 3b, the sequence 3c, the sequence 3d, and the sequence 3e are subsequences of the sequence 3.

6. The method according to claim 1, wherein the K to-be-encoded bits comprise cyclic redundancy check bits.

7. The method according to claim 1, wherein the K to-be-encoded bits comprise parity check bits.

8. A polar code rate dematching method, comprising:
obtaining a to-be-decoded information sequence of M bits, wherein the to-be-decoded information sequence comprises K to-be-decoded bits;
determining a mother code length N, wherein $N=2^n$, and M, K, n, and N are positive integers;
performing rate dematching and decoding on the to-be-decoded information sequence based on the mother code length N and a rate matching sequence to obtain a decoding result, wherein the rate matching sequence is a subsequence of a first sequence, the first sequence is a sequence 1, a sequence 2, or a sequence 3 in Appendix I, the sequence 1 comprises $N_2$ polarized sub-channel sequence numbers starting from 0, the sequence 2 comprises $N_2/2$ polarized sub-channel sequence numbers starting from 0, the sequence 3 comprises $N_2$ different values, and $N_2$ is greater than or equal to N; and
outputting the decoding result.

9. The method according to claim 8, wherein a rate matching manner is a puncturing operation, wherein
if the first sequence is the sequence 1, the puncturing operation comprises taking, based on a target code length M, bits carried by sub-channels corresponding to last M polarized sub-channel sequence numbers in the rate matching sequence, or deleting, based on the target code length M, bits carried by sub-channels corresponding to first N-M polarized sub-channel sequence numbers in the rate matching sequence;
if the first sequence is the sequence 2, the puncturing operation comprises deleting, based on the target code length M, bits carried by sub-channels corresponding to first N-M polarized sub-channel sequence numbers in the rate matching sequence; or
if the first sequence is the sequence 3, the puncturing operation comprises deleting, based on the target code length M, bits carried by polarized sub-channels at which N-M smallest values in the rate matching sequence are located, or taking, based on the target code length M, bits carried by polarized sub-channels corresponding to M largest values in the rate matching sequence.

10. The method according to claim 8, wherein:
when N=8192, the rate matching sequence is a sequence 1a, a sequence 2a, or a sequence 3a;
when N=4096, the rate matching sequence is a sequence 1b, a sequence 2b, or a sequence 3b;
when N=2048, the rate matching sequence is a sequence 1c, a sequence 2c, or a sequence 3c;
when N=1024, the rate matching sequence is a sequence 1d, a sequence 2d, or a sequence 3d; or
when N=512, the rate matching sequence is a sequence 1e, a sequence 2e, or a sequence 3e, wherein:
the sequence 1a, the sequence 1b, the sequence 1c, the sequence 1d, and the sequence 1e are subsequences of the sequence 1;
the sequence 2a, the sequence 2b, the sequence 2c, the sequence 2d, and the sequence 2e are subsequences of the sequence 2; and
the sequence 3a, the sequence 3b, the sequence 3c, the sequence 3d, and the sequence 3e are subsequences of the sequence 3.

11. The method according to claim 8, wherein the K bits comprise cyclic redundancy check bits.

12. The method according to claim 8, wherein the K bits comprise parity check bits.

13. A polar code rate matching apparatus, comprising:
at least one processor; and
one or more memories coupled to the at least one processor and storing programming instructions for execution by the at least one processor to:

obtain K to-be-encoded bits and a target code length M, wherein K is a positive integer;

determine a mother code length N, and perform polar code encoding on the K to-be-encoded bits based on the mother code length N to obtain an encoded bit sequence, wherein $N=2^n$, n is a positive integer, and $K \leq N$; and perform rate matching on the encoded bit sequence based on a rate matching sequence to obtain a rate matched bit sequence with a length of M, wherein the rate matching sequence is a subsequence of a first sequence, the first sequence is a sequence 1, a sequence 2, or a sequence 3 in Appendix I, the sequence 1 comprises $N_2$ polarized sub-channel sequence numbers starting from 0, the sequence 2 comprises $N_2/2$ polarized sub-channel sequence numbers starting from 0, the sequence 3 comprises $N_2$ different values, and $N_2$ is greater than or equal to N.

14. The apparatus according to claim 13, wherein performing the polar code encoding on the K to-be-encoded bits based on the mother code length N comprises:

mapping the K to-be-encoded bits to K polarized sub-channels in M-P non-punctured polarized sub-channels, wherein reliability of the K polarized sub-channels on which the K to-be-encoded bits are located is higher than reliability of remaining M-P-K polarized sub-channels, wherein P represents a quantity of pre-frozen polarized sub-channels, and wherein P is greater than or equal to 0.

15. The apparatus according to claim 13, wherein before performing the rate matching on the encoded bit sequence based on the rate matching sequence to obtain the rate matched bit sequence with a length of M, interleaving is performed on the encoded bit sequence.

16. The apparatus according to claim 13, wherein a rate matching manner is a puncturing operation, wherein:

if the first sequence is the sequence 1, the puncturing operation comprises taking, based on the target code length M, bits carried by sub-channels corresponding to last M polarized sub-channel sequence numbers in the rate matching sequence, or deleting, based on the target code length M, bits carried by sub-channels corresponding to first N-M polarized sub-channel sequence numbers in the rate matching sequence;

if the first sequence is the sequence 2, the puncturing operation comprises deleting, based on the target code length M, bits carried by sub-channels corresponding to first N-M polarized sub-channel sequence numbers in the rate matching sequence; or if the first sequence is the sequence 3, the puncturing operation comprises deleting, based on the target code length M, bits carried by polarized sub-channels at which N-M smallest values in the rate matching sequence are located, or taking, based on the target code length M, bits carried by polarized sub-channels corresponding to M largest values in the rate matching sequence.

17. The apparatus according to claim 13, wherein:

when N=8192, the rate matching sequence is a sequence 1a, a sequence 2a, or a sequence 3a;

when N=4096, the rate matching sequence is a sequence 1b, a sequence 2b, or a sequence 3b;

when N=2048, the rate matching sequence is a sequence 1c, a sequence 2c, or a sequence 3c;

when N=1024, the rate matching sequence is a sequence 1d, a sequence 2d, or a sequence 3d; or when N=512, the rate matching sequence is a sequence 1e, a sequence 2e, or a sequence 3e, wherein:

the sequence 1a, the sequence 1b, the sequence 1c, the sequence 1d, and the sequence 1e are subsequences of the sequence 1;

the sequence 2a, the sequence 2b, the sequence 2c, the sequence 2d, and the sequence 2e are subsequences of the sequence 2; and the sequence 3a, the sequence 3b, the sequence 3c, the sequence 3d, and the sequence 3e are subsequences of the sequence 3.

* * * * *